US011353621B2

(12) United States Patent
Khan et al.

(10) Patent No.: US 11,353,621 B2
(45) Date of Patent: Jun. 7, 2022

(54) METHOD AND ALARMING SYSTEM FOR $CO_2$ SEQUESTRATION

(71) Applicant: King Fahd University of Petroleum and Minerals, Dhahran (SA)

(72) Inventors: Sikandar Khan, Dhahran (SA); Yehia Abel Khulief, Dhahran (SA); Abdullatif Al-Shuhail, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 57 days.

(21) Appl. No.: 16/678,088

(22) Filed: Nov. 8, 2019

(65) Prior Publication Data
US 2020/0284945 A1 Sep. 10, 2020

Related U.S. Application Data

(60) Provisional application No. 62/813,473, filed on Mar. 4, 2019.

(51) Int. Cl.
*G01V 99/00* (2009.01)
*E21B 41/00* (2006.01)
(Continued)

(52) U.S. Cl.
CPC ........ *G01V 99/005* (2013.01); *E21B 41/0064* (2013.01); *G06F 30/20* (2020.01);
(Continued)

(58) Field of Classification Search
CPC .......... G01V 99/005; G01V 2210/624; G01V 2210/6242; G01V 2210/6244;
(Continued)

(56) References Cited

U.S. PATENT DOCUMENTS 7,289,909 B2   10/2007   Thomann et al.
8,434,354 B2    5/2013   Crow et al.
(Continued)

FOREIGN PATENT DOCUMENTS

WO   2010/109340 A2   9/2010
WO   2018/070875 A1   4/2018

OTHER PUBLICATIONS

Khan, Sikandar, Y. A. Khulief, and A. A. Al-Shuhail. "Numerical modeling of the geomechanical behavior of Biyadh Reservoir undergoing CO2 injection." International Journal of Geomechanics 17.8 (2017): 04017039. pp. 1-12. (Year: 2017).*

(Continued)

*Primary Examiner* — Kamini S Shah
*Assistant Examiner* — John E Johansen
(74) *Attorney, Agent, or Firm* — Oblon, McClelland, Maier & Neustadt, L.L.P.

(57) ABSTRACT

Methods and an alarming system for long-term carbon dioxide sequestration in a geologic reservoir are described. The geologic reservoir may be a water filled sandstone reservoir or a carbonate reservoir. A reservoir model is constructed to show the effects of varying injection pressures, the number of injection wells, the arrangement of injection wells, the boundary conditions and sizes of the reservoir on caprock uplift, fracture formation and fracture reactivation. The alarming system generates an alarm when caprock uplift that surpasses a threshold is detected. The injection pressures and the number of injection wells operating may be varied in response to the alarm.

20 Claims, 116 Drawing Sheets

(51) Int. Cl.
*G06F 30/20* (2020.01)
*G08B 5/22* (2006.01)
*G08B 21/18* (2006.01)

(52) U.S. Cl.
CPC .............. *G08B 5/22* (2013.01); *G08B 21/182* (2013.01); *E21B 2200/20* (2020.05); *G01V 2210/624* (2013.01); *G01V 2210/6242* (2013.01); *G01V 2210/6244* (2013.01); *G01V 2210/663* (2013.01); *Y02C 20/40* (2020.08)

(58) Field of Classification Search
CPC .............. G01V 2210/663; G06F 30/20; E21B 41/0064; E21B 2200/20; G08B 5/22; G08B 21/182; Y02C 20/40
USPC ............................................................ 703/10
See application file for complete search history.

(56) References Cited

U.S. PATENT DOCUMENTS

| | | |
|---|---|---|
| 8,454,268 B2 | 6/2013 | Wilkinson |
| 9,176,250 B2 | 11/2015 | Sinha et al. |
| 2011/0013986 A1 | 1/2011 | Zebrowski |
| 2013/0064604 A1* | 3/2013 | Han .................... E21B 41/0064 405/53 |

OTHER PUBLICATIONS

Juanes, Ruben, Christopher W. MacMinn, and Michael L. Szulczewski. "The footprint of the CO 2 plume during carbon dioxide storage in saline aquifers: storage efficiency for capillary trapping at the basin scale." Transport in porous media 82.1 (2010). pp. 19-30. (Year: 2010).*

Tran, David, Long Nghiem, and Lloyd Buchanan. "An overview of iterative coupling between geomechanical deformation and reservoir flow." SPE international thermal operations and heavy oil symposium. OnePetro, 2005. pp. 1-9. (Year: 2005).*

Kim, Guan Woo, et al. "Coupled Geomechanical-Flow Assessment of CO2 Leakage through Heterogeneous Caprock during CCS." Advances in Civil Engineering 2018 (2018). pp. 1-14. (Year: 2018).*

Mohanty, Manasi Manjari, and Bhatu Kumar Pal. "Sorption behavior of coal for implication in coal bed methane an overview." International Journal of Mining Science and Technology 27.2 (2017). pp. 307-314. (Year: 2017).*

Al Eidan, A. A., et al. "Technical challenges in the conversion of CO2-EOR projects to CO2 storage projects." SPE Asia Pacific Enhanced Oil Recovery Conference. OnePetro, 2015. pp. 1-18 (Year: 2015).*

Khan, et al. ; Numerical Modeling of the Geomechanical Behavior of Biyadh Reservoir Undergoing CO2 Injection ; International Journal of Geomechanics, vol. 17, Issue 8 ; Aug. 2017 ; Abstract Only ; 1 Page.

Khan, et al. ; The effect of injection well arrangement on CO2 injection into carbonate petroleum reservoir ; International Journal of Global Warming, vol. 14, No. 4 ; 2018 ; 27 Pages.

Shukla, et al. ; A review of studies on CO sequestration and caprock integrity ; Fuel, vol. 89, Issue 10 ; pp. 2651-2664 ; May 22, 2010 ; Abstract Only ; 2 Pages.

Edlmann, et al. ; Experimental investigation into the sealing capability of naturally fractured shale caprocks to supercritical carbon dioxide flow ; Environmental Earth Sciences ; Dec. 2013 ; 21 Pages.

Kim, et al. ; Geological CO2 storage: Incorporation of pore-pressure/ stress coupling and thermal effects to determine maximum sustainable pressure limit ; Energy Procedia 63 ; pp. 3339-3346 ; 2014 ; 8 Pages.

Khan ,et al. ; Mitigating climate change via CO2 sequestration into Biyadh reservoir: geomechanical modeling and caprock integrity ; Mitig Adapt Strateg Glob Change ; Feb. 12, 2018 ; 30 Pages.

Boonyasatphan ; Reservoir Characterization for Unconventional Resource Potential, Pitsanulok Basin, Onshore Thailand ; 2017 ; 122 Pages.

* cited by examiner

METHOD AND ALARMING SYSTEM FOR $CO_2$ SEQUESTRATION

CROSS-REFERENCE TO RELATED APPLICATIONS

The present application claims priority to Provisional Application No. 62/813,473 entitled "A Technique To Relate The Fracture Dimensions And Location In The Caprock With The Ground Uplift" filed on Mar. 4, 2019, the entire contents of which is incorporated herein in its entirety.

STATEMENT OF ACKNOWLEDGEMENT

The inventors would like to acknowledge the support of the Science & Technology Unit at King Fand University of Petroleum & Minerals (KFUPM), Award No. TIC-CCS-1 through the National Plan for Science, Technology and Innovation (MAARIFAH) - King Abdul-Aziz City for Science and Technology (KACST).

BACKGROUND

Technical Field

The present disclosure is directed to methods and an alarming system for carbon dioxide sequestration.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Global climate change has been of concern due to global temperature increases during the last few decades. One of the major causes of global warming is believed to be the excessive emission and accumulation of greenhouse gases in the atmosphere, especially carbon dioxide. The United Nations Intergovernmental Panel on Climate Change (IPCC) has tracked climate change since 1988. The IPCC 2005 report, which was prepared by 100 authors and reviewed by 200 experts from all over the world, stated that the potential of carbon dioxide storage capacity in geological formations is at least 2000 gigatons. Geological reservoirs are able to retain 99% of stored carbon dioxide over the first 100 years of the loading period, before the onset of leakage from the reservoir. (See Bert M et al., "IPCC special report on carbon dioxide capture and storage". 2005, Cambridge University Press, United States of America, incorporated herein by reference in its entirety).

An IPCC 2014 report suggested increasing research related to the geological storage of carbon dioxide, in order to slow down global warming. (See IPCC (2014) Climate Change 2014. "Observed changes and their causes". Intergovernmental panel on climate change, incorporated herein by reference in its entirety).

It has been proposed to capture the excess amount of $CO_2$ in the atmosphere and permanently store it in underground sedimentary reservoirs to mitigate the effect of global warming. (See Bruant R G J et al (2002) "Safe storage of $CO_2$ in deep saline aquifers". Environmental Science & Technology 36:240-245; Sams W, Grant B, Sinisha J, Turgay E, Duane HS (2005) "Field-Project Designs for Carbon Dioxide Sequestration and Enhanced Coal bed Methane Production". Energy & Fuels 19:2287-2297; Torvanger A K, Rypdal S (2005) "Geological $CO_2$ storage as a climate change mitigation option". Mitigation and Adaptation Strategies for Global Change 10(4):693-715; and Xiping W, Hongdou Z (2018) "Valuation of CCS investment in China's coal-fired power plants based on a compound real options model". Greenhouse gases-science and technology 10.1002/ghg.1809, 1-11, each incorporated herein by reference in their entirety).

One way to reduce global warming is to remove the already released carbon dioxide from the environment by introducing some external species such as liquid droplets and other particulate matters in the environment. The liquid droplets and the particulate maters will capture the gas and remove it by gravity. (See Shukla, J. B., Chauhan, M. S., Sundar, S. and Naresh, R. (2015) "Removal of carbon dioxide from the atmosphere to reduce global warming: a modelling study", International Journal of Global Warming, Vol. 7, No. 2, pp. 270-292b, incorporated herein by reference in its entirety).

Data centers have been cited as a cause of about 2% of global warming. The main sources of greenhouse gas emission in data centers are the servers used for data processing. (See Uddin, M., Memon, J., Rozan, M. Z. A., Alsaqour, R. and Rehman, A. (2015) "Virtualised load management algorithm to reduce $CO_2$ emissions in the data center industry", International Journal of Global Warming, Vol. 7, No. 1, pp. 3-20, incorporated herein by reference in its entirety).

Carbon dioxide has been captured from major emission sites, such as data centers, and stored in deep underground reservoirs. This capture and storage of carbon dioxide in geological reservoirs was introduced in the 1970s. Carbon capture and storage (CCS) has been focused on sources of $CO_2$ such as power plants, data centers and industrial processes. The process of carbon capture and storage (CCS) has been shown to be commercially viable and has been developed in many countries. (See Shukla R, Ranjith P, Choi S, Haque A (2011) "Study of Caprock integrity in geo-sequestration of carbon dioxide". Int J Geomech:294-301. https://doi.org/10.1061/(ASCE)GM.1943-5622.0000015, incorporated herein by reference in its entirety).

During the process of carbon capture and storage (CCS), carbon dioxide is captured from large point sources of carbon dioxide like power plants and industries and then transported to a storage location, where it is stored in deep underground geological reservoirs. $CO_2$ can be stored in depleted oil reservoirs, deep saline aquifers, or deep coal seams. (See Cristina, R., Maria, A. D. and Manuel, J. L. (2013) "Unconventional coal reservoir for $CO_2$ safe geological sequestration", International Journal of Global Warming, Vol. 5, No. 1, pp. 46-66; and Sally, M. B. and David, R. C. (2008) "Sequestration in deep sedimentary formations", Elements, Vol. 4, No. 1, pp. 325-331, each incorporated herein by reference in their entirety). The option of geological storage of $CO_2$ was proposed for the first time in the 1970s. Carbon dioxide was stored for the first time in Sleipner gas field in the North Sea in 1996. (See Torp, T.A. and Gale, J. (2003) "Demonstrating storage of $CO_2$ in geological reservoirs: the Sleipner and SACS projects", in Amsterdam 2003: Proceedings of the 6th International Conference on Greenhouse Gas Control Technologies, Pergamon, Amsterdam, pp. 311-316, incorporated herein by reference in its entirety).

During the process of carbon dioxide sequestration, $CO_2$ is injected at a high injection pressure which is greater than the reservoir pore pressure into a reservoir deep below the ground level. For efficient $CO_2$ sequestration, the reservoir should be at a depth greater than 800 meters, with high porosity for storing the incoming $CO_2$ and high permeability to ensure the $CO_2$ mobility in the reservoir even at low injection pressures. (See Anders, H. and Marten, B. (2009) "Expert opinions on carbon dioxide capture and storage—a framing of uncertainties and possibilities", Energy Policy, Vol. 7, No. 6, pp. 2273-2282, incorporated herein by reference in its entirety). At a depth more than 800 meters, $CO_2$ is in a denser form which increases the storage capacity as it has less volume. Moreover, the injection into deeper reservoirs minimizes leakage of $CO_2$ into ground water. The objective of the CCS process is to store a maximum amount of $CO_2$ in a reservoir without sacrificing the integrity of the reservoir, the under burden and over burden layers, and the environment above the ground level. (See Gibbins, J. and Chalmers, H. (2008) "Carbon capture and storage", Energy Policy, Vol. 36, No. 12, pp. 4317-4322; and Mark, D. Z. and Steven, M. G. (2012) "Earthquake triggering and large-scale geologic storage of carbon dioxide", National Academy of Sciences USA, Vol. 109, No. 26, pp. 10164-10168, each incorporated herein by reference in their entirety). Considering the maximum possible occupancy of the various types of sedimentary reservoirs, the depleted oil and gas reservoirs have a $CO_2$ storage capacity between 675 and 900 billion tons, while unmineable coal can store between 3 and 200 billion tons, and saline aquifers have a capacity between 1,000 and 10,000 billion tons. (See Sally and David, 2008). The $CO_2$ storage capacity estimation for a reservoir is mainly based on various factors like the available porosity of the reservoir, the reservoir pressure, and estimates of the changes in the density and volume of $CO_2$ at the reservoir pressure. At greater depths, the density of carbon dioxide increases and the volume decreases. (See Bachu, S. et al. (2007) "$CO_2$ storage capacity estimation: issues and development of standards", International Journal of Greenhouse Gas Control, Vol. 1, No. 1, pp. 62-68, incorporated herein by reference in its entirety).

Before injecting carbon dioxide, it must be confirmed that the reservoir is capped with impermeable caprock and that the reservoir has high permeability for the flow of the injected carbon dioxide. Depleted oil and gas reservoirs, coal seams, and saline aquifers are desirable sites for storing carbon dioxide for sufficiently longer periods of time. (See Ashkan B et al (2013) "Simulation study of $CO_2$ sequestration potential of the Mary Lee coal zone, Black Warrior basin". Environmental Earth Sciences 70:2501-2509; Cristina R, Maria A D, Manuel J L (2013) "Unconventional coal reservoir for $CO_2$ safe geological sequestration". International Journal of Global Warming 5(1):46-66; and Sung SP et al (2016) "Numerical modeling of the tensile fracture reactivation under the effects of rock geo-mechanical properties and heterogeneity during $CO_2$ storage". Environmental Earth Sciences, 75: 298-303, each incorporated herein by reference in their entirety).

Carbon dioxide injected into a sedimentary reservoir is adsorbed in the reservoir matrix grains. The adsorption of carbon dioxide in the reservoir causes deformation, which subsequently reduces the permeability of the porous medium. As the permeability of the reservoir is reduced the mobility of carbon dioxide is reduced in the reservoir and hence the reservoir becomes less receptive to storing more of the incoming carbon dioxide at the same injection rate. (See Perera, M. S. A. et al. (2011) "A review of coal properties pertinent to carbon dioxide sequestration in coal seams: with special reference to Victorian brown coals", Environmental Earth Sciences, Vol. 64, No. 1, pp. 223-235; and White, C. M., Smith, D. H., Jones, K. L., Goodman, A. L., Jikich, S. A., Lacount, R. B., Dubose, S. B., Ozdemir, E., Morsi, B. I. and Schroeder, K. T. (2005) "Sequestration of carbon dioxide in coal with enhanced coal bed methane recovery: a review", Energy & Fuels, Vol. 19, No. 3, pp. 659-724, each incorporated herein by reference in their entirety).

Among sedimentary reservoirs, the naturally fractured reservoirs, such as carbonate depleted oil and gas reservoirs, can store large amounts of carbon dioxide due to their highly porous structure. (See Stevens, S. H., Kuskraa, V. A., Gale, J. J. and Beecy, D. (2000) "$CO_2$ injection and sequestration in depleted oil and gas fields and deep coal seams: worldwide potential and costs", AAPG Bulletin, Vol. 84, pp. 1497-1498, incorporated herein by reference in its entirety). Depleted oil reservoirs and gas reservoirs are normally at depths greater than 800 meters, which implies that $CO_2$ will be stored in its supercritical form. (See Al-Shuhail, A.A., Al-Shuhail, A.A. and Khulief, Y.A . (2014) "$CO_2$ Leakage Detection using Geophysical Methods under Arid Near-surface Conditions", Progress Report of KACST TIC-CCS Project number TIC-CCS-1; and Qu, H. Y., Liu, J. S., Pan, Z. J. and Connell, L. (2010) "Impact of thermal processes on $CO_2$ injectivity into a coal seam", TOP Conference Series: Materials Science and Engineering, Vol. 10, pp. 1-10, each incorporated herein by reference in their entirety).

Further, $CO_2$ in its supercritical form causes greater swelling of the reservoir matrix than when in the sub-critical form, which may cause significant reduction in reservoir permeability. (See Kiyama, T. et al. (2011) "Coal swelling strain and permeability change with injecting liquid/supercritical $CO_2$ and $N_2$ at stress-constrained conditions", International Journal of Coal Geology, Vol. 85, No. 1, pp. 56-64; and Perera et al., 2011, each incorporated herein by reference in their entirety).

Although the maximum occupancy of a sedimentary reservoir can be calculated from the porous volume and the volume and density of $CO_2$ at the reservoir pressure, the reduction in permeability is due to the adsorption induced strain restricting the transport of $CO_2$ beyond a certain region around the injection well. (See Kiyama et al., 2011; and Wu, Y., Liu, J. and Elsworth, D. (2010) "Dual poroelastic response of a coal seam to $CO_2$ injection", Int. J. Green H. Gas Control, Vol. 4, No. 4, pp. 668-6'78, each incorporated herein by reference in their entirety). Increasing $CO_2$ injection pressure can increase the mobility of $CO_2$ to a certain limit, which is bounded by the maximum safe value of the injection pressure for reservoir stability.

The most practical way to transport $CO_2$ to all portions of the reservoir and to store the maximum safe volume of $CO_2$ is to utilize multiple injection wells. The optimum number and arrangement of the injection wells is unique for a given reservoir based on its size and geological description. (See Rutqvist, J., Vasco, D. W. and Myer L. (2010) "Coupled reservoir-geo-mechanical analysis of $CO_2$ injection and ground deformations in In Salah, Algeria", Int. J. Greenh. Gas Control, Vol. 4, No. 2, pp. 225-230; and Zhang, H. B., Liu, J. and Elsworth, D. (2008) "How sorption-induced matrix deformation affects gas flow in coal seams: a new FE model", Int. J. Rock Mech. Mining Sci., Vol. 45, No. 8, pp. 1226-1236, each incorporated herein by reference in their entirety).

Carbon dioxide storage projects at San Juan, Sardinia, and Ishikari basins, show a reduction in reservoir permeability due the adsorption induced strain; thus attesting to the significance of the role of multiple injection wells in attaining the maximum storage capacity. (See Reeves, S. (2001)

"Geological sequestration of $CO_2$ in deep, unmineable coal beds: an integrated research and commercial-scale field demonstration project", SPE 71749: Presented at SPE Annual Technical Conference and Exhibition, New Orleans, Louisiana; Amorino, C. (2005) "$CO_2$ geological storage by ECBM techniques in the Sulcis area (SW Sardinia Region, Italy)", Paper presented at Second International Conference on Clean Coal Technologies for our Future, Sardinia, Italy; and Botnen, L. S. et al. (2009) "Field test of $CO_2$ injection and storage in lignite coal seam in North Dakota", Energy Procedia, Vol. 1, pp. 2013-2019, each incorporated herein by reference in their entirety).

Modelling tools which have been utilized for the coupled carbon dioxide flow and reservoir deformation analyses for both single porosity and naturally fractured reservoirs are COMSOL, CMG, COMET3, TOUGH2 and ECLIPS. (See COMSOL [Computer software]. COMSOL Inc., Burlington, Mass.; CMG-GEM [Computer software]. Computer Modelling Group, Calgary, Alberta, Canada; Godec M, Koperna G, Petrusak R, Oudinot A (2013) "Assessment of Factors Influencing CO2 Storage Capacity and Injectivity in Eastern U.S". Gas Shale Energy Proceeding 37:6644-6655; Guo C, Wei M, Chen H, Xiaoming H, Bai B (2014) "Improved Numerical Simulation for Shale Gas Reservoirs". Proc., Offshore Technology Conf.-Asia, OTC-24913, Offshore Technology Conference, Kuala Lumpur, Malaysia, 1-17; Pruess K, Nordbotten J (2011) "Numerical simulation studies of the long-term evolution of a $CO_2$ plume in a saline aquifer with a sloping caprock". Transport in Porous Media 90(1):135-151; Wang et al (2016) "Impacts of stratum dip angle on $CO_2$ geological storage amount and security". Greenhouse gases-science and technology 6(1):682-694; Amirlatifi, A. (2013) "Coupled Geomechanical Reservoir Simulation", Dissertation, Missouri University of Science and Technology, Print; Rutqvist et al., 2010; and Tran, D., Buchanan, W. L. and Nghiem, L. X. (2010) "Improved gridding technique for coupling geomechanics to reservoir flow", SPE Journal, Vol. 15, No. 1, pp. 64-75, each incorporated herein by reference in their entirety).

COMSOL allows conventional physics-based user interfaces and coupled systems of partial differential equations for modeling the flow of carbon dioxide in the reservoir and the corresponding deformation of the reservoir. COMSOL multiphysics software can be used to perform equation-based modeling in which a set of equations determine the gas flow and reservoir deformation. For modeling the geo-mechanical behavior of a reservoir undergoing carbon dioxide injection, a representative model of the reservoir is needed. Suitable boundary conditions are needed to solve the carbon dioxide flow and reservoir deformation equations. During the geo-mechanical modeling of the reservoir, different types of boundary conditions must be applied to the simulation models.

Conventionally, separate simulators have been used for flow of carbon dioxide and reservoir geo-mechanical analysis. Using separate tools creates new challenges for simulator interfacing because the output from the flow simulator is used in the deformation simulator and similarly the output of deformation simulator is used in the flow simulator for each time interval. Using two simulators also increases the processing time. The equation-based modelling option in COMSOL multiphysics solves the above mentioned problems and also has the capability of using newer mathematical models for flow and geo-mechanical analysis of naturally fractured reservoirs. (See Holzbecher, E. (2013) "Poroelasticity benchmarking for FEM on analytical solutions", Excerpt from the Proceedings of the COMSOL Conference, Rotterdam, pp. 1-7; Tore, B., Eyvind, A. and Elin, S. (2009) "Safe storage parameters during $CO_2$ injection using coupled reservoir geo-mechanical analysis", Excerpt from the Proceedings of the COMSOL Conference, Milan, pp. 1-7; COMSOL Multiphysics (1998-2016) "Introduction to COMSOL Multiphysics", pp. 1-194, https://cdn.comsol-.com/documentation/5.2.1.262/IntroductionToCOMSOL-Multiphysics.pdf; and Bogdanov, El Ganaoui, K. and Kamp, A. M. (2007) "COMSOL 2D simulation of heavy oil recovery by steam assisted gravity drainage", in Proceedings of the European COMSOL Conference, each incorporated herein by reference in their entirety).

Before starting the injection process, a feasibility study of the target reservoir by means of geo-mechanical modeling has been recommended to provide for the safety of the reservoir during carbon dioxide injection. Safe storage means that buoyant carbon dioxide and associated gases, collectively referred to as gaseous emissions injected into a fluid filled subterranean formation will not leak upwards, over the long term, to either the potable ground water (usually near the surface) or to the atmosphere.

Carbon dioxide may be injected into different types of geological formations, e.g., depleted oil reservoirs, carbonate reservoirs, deep saline aquifers and deep coal seams. (See Ashkan B et al (2013) "Simulation study of $CO_2$ sequestration potential of the Mary Lee coal zone, Black Warrior basin". Environ Earth Sci 70:2501-2509; and Witkowski A, Majkut M, Rulik S (2014) "Analysis of pipeline transportation systems for carbon dioxide sequestration". Arch Thermodyn 35:117-140, each incorporated herein by reference in their entirety).

In September 1996, the offshore gas field Sleipner, located in the North Sea about 250 km west of Norway, started injecting 1 million tons of carbon dioxide into a saline aquifer at a depth of 1000 m. (See Baklid A, Korbol R, Owren G (1996) "Sleipner Vest $CO_2$ disposal, $CO_2$ injection into a shallow underground aquifer". Soc Pet Eng. https://doi.org/10.2118/36600-MS; and Torp and Gale 2004, each incorporated herein by reference in their entirety). Following the Sleipner project, two more carbon dioxide sequestration projects were initiated in Canada and Algeria. In the Algerian gas project (In Salah), 0.5-1 million tons of carbon dioxide were injected into a water-filled sandstone reservoir. The carbon dioxide injection continued for five years, which caused a ground uplift of 5 mm per year, as measured by satellite-based Interferometric Synthetic Aperture Radar (InSAR). (InSAR) measures ground displacement above the reservoir due to either injection or production processes.

Further, more than 25 million tons of carbon dioxide is captured and stored annually in deep sedimentary reservoirs by 15 large-scale Carbon dioxide Capture and Storage (CCS) projects. (See White DJ, Burrowes G, Davis T et al (2004) "Greenhouse gas sequestration in abandoned oil reservoirs: the International Energy Agency Weyburn pilot project". Geol Soc Am 14(7):4-11; Rutqvist J, Vasco D W, Myer L (2010) "Coupled reservoir geo-mechanical analysis of $CO_2$ injection and ground deformations at In Salah, Algeria". Int J Greenhouse Gas Control 4:225-230; Jin C, Liu L, Li Y, Zeng R (2017) "Capacity assessment of $CO_2$ storage in deep saline aquifers by mineral trapping and the implications for Songliao Basin", Northeast China. Energy Sci Eng 5(2):81-89; and Mahmoud M, Elkatatny S M (2017) "Dual benefit of $CO_2$ sequestration: storage and enhanced oil recovery". Pet Petrochem Eng J 1(2):1-10, each incorporated herein by reference in their entirety). The CCS process can be viewed as a sink process, as it removes the greenhouse gases from the environment. (See Torvanger AK, Rypdal S (2005) "Geological CO$_2$ storage as a climate change mitigation option". Mitig Adapt Strateg Glob Chang 10(4):693-715, incorporated herein by reference in its entirety).

Several reported studies have addressed the pore pressure buildup during carbon dioxide injection and its effect on reservoir deformation, as well as the reservoir's stability. In the case of In-Salah project in Algeria, about 0.5-1 million tons of carbon dioxide was injected into a water-filled sandstone reservoir. The carbon dioxide injection was continued for five years, which caused huge pressure buildup in the reservoir and provoked a measurable ground uplift of 5 millimeters per year. This excessive pressure buildup may cause horizontal stresses to decrease and can cause failure of the reservoir structure, including the caprock. Both ground uplift during carbon dioxide injection and ground subsidence during the oil and gas productions may affect the infrastructure in the vicinity of the injection reservoir. (See Jtirgen E S, Siggins F A, Brian J E (2005) "Predicting and monitoring geo-mechanical effects of CO$_2$ injection". Carbon dioxide capture for storage in deep geologic formations 2:751-766; Moeck I, Kwiatek G, Zimmermann G (2009) "Slip tendency analysis, fault reactivation potential and induced seismicity in a deep geothermal reservoir". Journal of Structural Geology 10:1174-1182; Rutqvist J, Vasco D W, Myer L (2010) "Coupled reservoir geo-mechanical analysis of CO$_2$ injection and ground deformations at In Salah, Algeria". International Journal of Greenhouse Gas Control 4:225-230; Rutqvist J, Rinaldi AP, Cappa F, Moridis G J (2013) "Modeling of fault reactivation and induced seismicity during hydraulic fracturing of shale-gas reservoirs". Journal of Petroleum Science and Engineering, 107:31-44; and Zhang H, Liu J, Elsworth D (2008) "How sorption-induced matrix deformation affects gas flow in Coal seams: a new FE model". International Journal of Rock Mechanics and Mining Sciences 45(8):1226-1236, each incorporated herein by reference in their entirety).

If the injected carbon dioxide can flow across the boundaries of the reservoir, then the open boundary conditions are normally used during a modeling procedure. For a reservoir with open boundary conditions, the pressure build-up will spread along the reservoir if the permeability of the reservoir is low and the carbon dioxide is injected at a high injection rate. However, for reservoirs with closed boundary conditions, the injection of carbon dioxide results causes significant pressure buildup and subsequent reduction in carbon dioxide storage capacity, thus posing great risk for geo-mechanical failure of the reservoir. (See Eshiet K, Sheng Y (2014) "Investigation of geo-mechanical responses of reservoirs induced by CO$_2$ storage". Environmental Earth Sciences 71:3999-4020; Khan S, Khulief Y A, Al-Shuhail AA (2017) "Numerical modeling of the Geomechanical behavior of Biyadh reservoir undergoing CO$_2$ Injection". International Journal of Geomechanics 17(8), 10.1061/(ASCE) GM.1943-5622.0000893, 1-12; and Qu H Y, Liu J S, Pan Z J, Connell L (2010) "Impact of thermal processes on CO$_2$ injectivity into a coal seam". In IOP Conference Series: Materials Science and Engineering, 10.1088/1757-899X/10/1/012090, 1-10, each incorporated herein by reference in their entirety).

The change in permeability is highly dependent on the change in the effective stresses and matrix swelling, which are also dependent on the type of boundary conditions of the reservoir. Although the previous cited documents provide an insight into the changes in the local properties of the reservoir, such as permeability and porosity for different types of boundary conditions, a need remains to explore overall effects, e.g. ground uplift due to different types of boundary conditions. (See Kiyama T et al (2011) "Coal swelling strain and permeability change with injecting liquid/supercritical CO$_2$ and N$_2$ at stress-constrained conditions". International Journal of Coal Geology 85(1):56-64; Khan S, Al-Shuhail A A, Khulief Y A (2016). "Numerical modeling of the geo-mechanical Behavior of Ghawar Arab-D carbonate petroleum reservoir undergoing CO$_2$ injection". Environmental Earth Sciences Journal 75(1), 10.1007/s12665-016-6122-3, 1-15; and Zhang et al. 2008, each incorporated herein by reference in their entirety).

The Ghawar oil field in Saudi Arabia shown in FIG. 1 may be a good candidate for CO$_2$ sequestration once it is depleted as it has stable layers. Additionally, The Ghawar oil field has been extensively logged and the velocities, pore pressures, depths and lithography have already been determined. Ghawar is a large north-trending anticlinal structure, some 250 kilometers long and 30 kilometers wide. It is a drape fold over a basement horst, which grew initially during the Carboniferous Hercynian deformation and was reactivated episodically, particularly during the Late Cretaceous. In detail, the deep structure consists of several en echelon horst blocks that probably formed in response to right-lateral transpression. The bounding faults have throws exceeding 3000 feet at the Silurian level but terminate within the Triassic section. The episodic structural growth influenced sedimentation of the Permo-Carboniferous sandstone reservoirs, which on lap the structure and the Jurassic and Permian carbonate reservoirs, which accumulated in shoals above structural culminations. The excellent reservoir quality is due to the preservation of the primary porosity, the enhancement of permeability, and the presence of fractures in the deeper and tighter parts. Oil has been sourced exclusively from Jurassic organic-rich mudstones and is effectively sealed beneath massive anhydrite. The general absence of faults at the Arab-D level has maintained seal integrity. (See Afifi, A., "Ghawar: The Anatomy of the World's Largest Oil Field", Jan. 25, 2005. Search and Discovery Article #20026. http://www.searchanddiscovery.com/documents/2004/afifi01/, incorporated herein by reference in its entirety.

Carbon dioxide nay also be stored in aquifers. An aquifer in a targeted underground deep reservoir may contain saline water. When carbon dioxide is injected into the aquifer, water in the rock matrix is replaced by the injected carbon dioxide. To increase the storage capacity of carbon dioxide, the CO$_2$ is injected into a reservoir in its supercritical form. Carbon dioxide changes to its supercritical form when it is exposed to a temperature of 304.25 K and to a pressure of 7.39 MPa. In general, underground reservoirs at greater depths are less vulnerable to leakage of carbon dioxide into the environment. (See Jennifer S C, Azra N T (2015) "Coupled geomechanics and fluid flow model for production optimization in naturally fractured shale reservoirs". SEG technical program expanded abstracts 2015. https://doi.org/10.1190/segam2015-5928833.1. Accessed 09 September 2017; Gibbins J, Chalmers H (2008) "Carbon capture and storage". Energ Policy 36:4317-4322; Sung S P et al (2016) "Numerical modeling of the tensile fracture reactivation under the effects of rock geo-mechanical properties and heterogeneity during CO$_2$ storage". Environ Earth Sci 75:298-303; and Zhangshuan H et al (2012) "Evaluating the impact of caprock and reservoir properties on potential risk of CO$_2$ leakage after injection". Environ Earth Sci 66:2403-2415, each incorporated herein by reference in their entirety).

The injection of carbon dioxide may affect the stability of the reservoir if the injected quantity is greater than the storage capacity of the reservoir. (See Sandrine V G, Nauroy J F, Brosse E (2009) "3D geo-mechanical modeling for $CO_2$ geologic storage in the Dogger carbonates of the Paris basin". Int J Greenhouse Gas Control 3:288-299, incorporated herein by reference in its entirety). A key injection parameter is the carbon dioxide injection pressure. An increase in injection pressure increases the storage capacity of a reservoir. (See Bustin R M, Clarkson C R (1998) "Geological controls on coal bed methane reservoir capacity and gas content". Int J Coal Geol 38:3-26, incorporated herein by reference in its entirety). However, an excessive increase in the injection pressure and the subsequent change in the horizontal stresses may result in failure of the reservoir structure and the caprock, which is a geological layer normally of low permeability that caps the reservoir. (See Engelder T, Fischer M P (1994) "Influence of poroelastic behavior on the magnitude of minimum horizontal stress, $S_h$, in over pressured parts of sedimentary basins". Geology 22:949-952, incorporated herein by reference in its entirety). Accordingly, safe injection parameters must be evaluated by performing coupled geo-mechanical modeling of the reservoir. Geomechanical modeling during carbon dioxide injection into a reservoir helps to evaluate the behavior of the reservoir as the pressure and deformation fields change due to the injection of carbon dioxide. (See Rutqvist J, Wu Y S, Tsang C F, Bodvarsson G (2002) "A modeling approach for analysis of coupled multiphase fluid flow, heat transfer, and deformation in fractured porous rock". Int J Rock Mech Min Sci 39:429-442, incorporated herein by reference in its entirety). Carbon dioxide injection in an Enhanced Oil Recovery (EOR) is a process in which carbon dioxide or other fluid is injected into a low-pressure oil containing reservoir to increase reservoir pressure and enhance oil production. (See Holloway S (1997) "An overview of the underground disposal of carbon dioxide". Energy Conyers Manag 38: 193-198; Gibbins J, Haszeldine S, Holloway S et al (2006) "Scope for future $CO_2$ emission reductions from electricity generation through the deployment of carbon capture and storage technologies". Cambridge University Press, United Kingdom; Gibbins J, Chalmers H (2007) "Preparing for global rollout: a "developed country first" demonstration program for rapid CCS deployment". Energy Policy, https://doi.org/10.1016/j.enol.2007.10.021; Gibbins and Chalmers (2008); and Wojtacki K, Lewandowska J, Gouze P, Lipkowski A (2015) "Numerical computations of rock dissolution and geo-mechanical effects for $CO_2$ geological storage". Int J Numer Anal Methods Geomech 39:482-506, each incorporated herein by reference in their entirety).

Apart from coal beds and oil and gas reservoirs, carbon dioxide has been injected into saline aquifers, thus avoiding some of the organizational difficulties associated with Enhanced Oil and the Enhanced Coal Bed Methane (ECBM) recovery processes in which carbon dioxide is injected into coal. The injected carbon dioxide is adsorbed onto the coal matrix and thus releases the methane from the rock matrix. The released methane can be produced using a production well. (See Stevens S H, Kuuskraa V A, Gale J, Beecy D (2001) "$CO_2$ injection and sequestration in depleted oil and gas fields and deep coal seams: worldwide potential and costs". Environ Geosci 8(3):200-209; Bachu S, Adams J J (2003) "Sequestration of $CO_2$ in geological media in response to climate change: capacity of deep saline aquifers to sequester $CO_2$ in solution". Energy Conyers Manag 44(20):3151-3175; Damen K, Faaij A B, van Bergen F, Gale J, Lysen E (2005) "Identification of early opportunities for $CO_2$ sequestration—worldwide screening for $CO_2$ EOR and $CO_2$-ECBM projects". Energy 30(10): 1931-1952; and White C M, Smith D H, Jones K L, Goodman A L, Jikich S A, LaCount R B, DuBose S B, Ozdemir E, Morsi B I, Schroeder K T (2005) "Sequestration of carbon dioxide in coal with enhanced coal bed methane recovery a review". Energy Fuel 19(3):659-724, each incorporated herein by reference in their entirety).

Carbon dioxide injection has been considered as a viable technique for enhanced oil recovery. Saudi Arabia has proposed utilizing $CO_2$ injection in the Ghawar reservoir. The Ghawar oil field is primary composed of carbonate rock, which is a naturally fractured structure formed as a result of the precipitation of calcium carbonate. In Saudi Arabia, almost 60% of the oil is found in the carbonate rocks. The injected carbon dioxide can flow both in the matrix pores and fractures in the carbonate reservoir. Technical feasibility studies for carbon dioxide sequestration in some of the depleted oil reservoirs have been performed. In a depleted oil or gas reservoir, the magnitude of the pore pressure is low due to the excessive production of oil and gas. (See Pollastro R M (2003) "Total petroleum systems of the Paleozoic and Jurassic, Greater Ghawar uplift and adjoining provinces of central Saudi Arabia and northern Arabian-Persian Gulf". US Department of the Interior, US Geological Survey. https://pubs.er.usgs.gov/publication/b2202H. Accessed 9 Sep. 2017; Khalid A, Hussain M, Imam B et al (2004) "Lithologic characteristics and diagnosis of the Devonian Jauf sandstone at Ghawar Field, Eastern Saudi Arabia". Mar Pet Geol 21:1221-1234; Abdulkader MA (2005) "Ghawar: the anatomy of the world's largest oil field". Saudi Aramco search and discovery article#20026. http://www.searchand-discovery.com/documents/2004/afifi01/. Accessed 26 August 2017; and Swart P K, Cantrell D L, Westphal H, Handford C R, Kendall C G (2005) "Origin of dolomite in the Arab-D reservoir from the Ghawar field, Saudi Arabia: evidence from petrographic and geochemical constraints". J Sediment Res 75(3):476-491, each incorporated herein by reference in their entirety).

Apart from carbonate reservoirs, saline aquifers in particular, such as the Biyadh sandstone reservoir, can be used to store carbon dioxide for long periods of time. Sandstone rock is made of the sand-size rock grains. Sandstone rocks have enough permeability and porosity to be used for carbon dioxide sequestration. For carbon dioxide sequestration in saline aquifers, a feasibility study was performed before starting the injection process. (See Pruess K, Garcia J (2002) "Multiphase flow dynamics during $CO_2$ disposal into saline aquifers". Environ Geol 42: 282-295; Barnes D A, Bacon D H, Kelley S R (2009) "Geological sequestration of carbon dioxide in the Cambrian Mount Simon sandstone: regional storage capacity, site characterization, and large-scale injection feasibility", Michigan Basin. Environ Geosci 16(3): 163-183; Rayward WJ, Woods A W (2011) "Some implications of cold $CO_2$ injection into deep saline aquifers". Geophys Res Lett 38(6):1-6, https://doi.org/10.1029/2010GL046412; Lamert H, Geistlinger H, Werban U, SchUtze C, Peter A, Hornbruch G, Schulz A, Pohlert M, Kalia S, Beyer M, GroBmann J, Dahmke A, Dietrich P (2012) "Feasibility of geoelectrical monitoring and multiphase modeling for process understanding of gaseous $CO_2$ injection into a shallow aquifer". Environ Earth Sci 67(2):447-462; Yang D X, Zeng R S, Zhang Y, Wang Z Q, Wang S, Jin C (2012) "Numerical simulation of multiphase flows of $CO_2$ storage in saline aquifers in Daqingzijing oilfield, China". Clean Techn Environ Policy 14(4):609-618; Zhang Z, Agarwal RK (2012) "Numerical simulation and optimization of $CO_2$ sequestration in saline aquifers for vertical and horizontal well injection". Comput Geosci 16(4):891-6899; and Zhao R, Cheng J (2015) "Non-isothermal modeling of $CO_2$ injection into saline aquifers at a low temperature". Environ Earth Sci 73(9):5307-5316, each incorporated herein by reference in their entirety).

During coupled geo-mechanical modeling, fluid flow in the reservoir as well as deformation of the reservoir due to the fluid flow are parameters of note. Shale is fine-grained low-permeability rock that normally caps the oil and gas reservoirs. In the case of carbon dioxide injection and sequestration, the shale rock cap will prevent the leakage of the stored carbon dioxide. The Biyadh sandstone reservoir is located between the Shale Hith Anhydrite and the Shuaiba layers. It is composed of highly impermeable layers, which can trap carbon dioxide for a long duration. The masking of Biyadh reservoir by the low permeability Shuaiba, Wasia, and Aruma sedimentary rocks ensures that the stored carbon dioxide will not leak to the surface or to the potable water layer of Um Ar Radhuma, which is located above the Biyadh reservoir. Attempts to model the two-phase flow in the Biyadh sandstone reservoir and its corresponding deformation have been reported. (See Tran D, Nghiem L, Buchanan L (2005) "An overview of iterative coupling between geo-mechanical deformation and reservoir flow". Soc Pet Eng. https://doi.org/10.2118/97879-MS; Chen Z, Huan G, Ma Y (2006) "Computational methods for multiphase flows in porous media". Siam, Germany; and Kvamme B, Liu S (2009) "Reactive transport of $CO_2$ in saline aquifers with implicit geo-mechanical analysis". Energy Procedia 1(1): 3267-3274, each incorporated herein by reference in their entirety). The depth of Biyadh reservoir at over 1000 meters has been determined to be sufficient for storing carbon dioxide in its supercritical form, which serves to increase the storage capacity. In addition, the high permeability of Biyadh reservoir enhances the rapid carbon dioxide transport within the reservoir. (See Kalbus E, Oswald S, Wang Wet al (2011) "Large-scale modeling of the groundwater resources on the Arabian platform". Int J Water Resour Arid Environ 1(1):38-47; Hakimi M H, Shalaby M R, Abdullah W H (2012) "Diagenetic characteristics and reservoir quality of the lower cretaceous Biyadh sandstones at Kharir oilfield in the western central Masila basin", Yemen. J Asian Earth Sci 51:109-120; and Al-Shuhail A A, Alshuhail A A, Khulief Y A (2014) "$CO_2$ leakage detection using geophysical methods under arid near-surface conditions: progress report of KACST TIC-CCS project number TIC-CCS-1, Saudi Arabia", each incorporated herein by reference in their entirety).

The size of the reservoir used during the geo-mechanical modeling is a representative sample and not the actual size of the reservoir. The selection of the reservoir size is also dependent on the mass of the injected $CO_2$ per year. The geological sequestration of $CO_2$ was started in 1996 by the Sleipner project in the North Sea, followed by the Fenn Big Valley and Weyburn projects in Canada. (See Gunter W D, Mayor M J, Robinson J R (2004) "$CO_2$ storage and enhanced methane production: field testing at Fenn-Big Valley, Alberta, Canada, with application". Proceedings of the 7th International Conference on Greenhouse Gas Control Technologies (GHGT-7), Alberta, Canada, 413-422; and White D (2009) "Monitoring $CO_2$ storage during EOR at the Weyburn-Midale field". Leading Edge 28:838-842, each incorporated herein by reference in their entirety). Following these early carbon dioxide projects, the injection of $CO_2$ was continued at the In-Salah project in Algeria, Frio project in USA, and Qinshui Basin project in China. The above mentioned carbon dioxide injection projects ranged from a pilot scale to large-scale commercial projects, however, the effect of the selected reservoir size and boundary conditions on the pressure and deformation responses of the reservoir was not addressed in those studies. (See Kharaka Y K et al (2006) "Gas-water-rock interactions in sedimentary basins: $CO_2$ sequestration in the Frio Formation, Texas, USA". Journal of Geochemical Exploration 89:183-186; Metz B, Davidson O, de Coninck H, Loos M, Meyer L (2007) "A report on the Mitigation of Climate Change". Cambridge University Press; and Zhou F, Hou W, Allinson G, Wu J, Wang J, Cinar Y (2013) "A feasibility study of ECBM recovery and $CO_2$ storage for a producing CBM field in Southeast Qinshui Basin, China". International Journal of Greenhouse Gas Control 10.1016/j.ijggc.2013.08.011, 26-40, each incorporated herein by reference in their entirety).

Although studies have been carried out to investigate the effects of reservoir size and boundary conditions on pore pressure buildup during carbon dioxide injection, extensive research is needed to evaluate the effects of reservoir size and boundary conditions on the ground uplift, fault reactivation, and stability of the reservoir, to avoid caprock failure and the subsequent leakage of carbon dioxide to the overburden layers. (See Han W S, Kim K Y (2018) "Evaluation of $CO_2$ plume migration and storage under dip and sinusoidal structures in geologic formation". Journal of Petroleum Science and Engineering 169(1):760-771; Teletzke G F , Lu P (2013) "Guidelines for reservoir modeling of geologic $CO_2$ storage". Energy Procedia 37:3936-3944; and Zhang L, Dilmore R M, Bromhal G S (2016) "Effect of outer boundary condition, reservoir size, and $CO_2$ effective permeability on pressure and $CO_2$ saturation predictions under carbon sequestration conditions". Greenhouse Gases: Science and Technology 6(4):546-560, each incorporated herein by reference in their entirety).

None of the references cited above describes the combination of determining pore pressure, horizontal stresses, and the vertical ground displacement caused by carbon dioxide injection, determining the effect of varying the injection well arrangement on the storage capacity and stability of the reservoir, and determining the relationship between reservoir size and boundary conditions on the ground uplift, fault reactivation, and stability of the reservoir, to avoid caprock failure and the subsequent leakage of carbon dioxide to the overburden layers.

Accordingly it is one objective of the present disclosure to provide a description of a process for monitoring carbon dioxide injection and long-time sequestration in reservoirs in order to avoid leakage of carbon dioxide through the caprock. In some aspects geo-mechanical modeling is used to estimate the safe injection parameters and take into account the increase in the pore pressure, horizontal stresses, and vertical ground displacement caused by carbon dioxide injection.

It is another objective of the present disclosure to provide a method for reducing pore pressure build-up and maximizing reservoir storage capacity by varying the number of carbon dioxide injection wells along with their placement arrangement in a naturally fractured reservoir.

It is another objective of the present disclosure to provide a method for relating reservoir boundary conditions to caprock uplift, pore pressure buildup, fault reactivation and long term stability of $CO_2$ sequestration.

SUMMARY

In an exemplary embodiment, a method for carbon dioxide sequestration in a geologic reservoir having a caprock and a plurality of subsurface layers between the reservoir and the caprock is described comprising constructing a reservoir model, varying injection pressures of CO2, the number of injection wells, the locations of the injection wells and an array formation of the injection wells, the sizes of the model and the boundaries of the model to determine changes in changes in the porosity, the horizontal stresses, the pore pressures, the permeabilities, the pressure wave velocities and the shear wave velocities which affect fracturing, fracture reactivation and caprock uplift.

In another exemplary embodiment, an alarming system for leakage in a geologic reservoir sequestering carbon dioxide, the geologic reservoir having a caprock and a plurality of subsurface layers between the reservoir and the caprock includes a satellite surface imaging database including topology images of the geologic reservoir taken over a period of time, a memory storing the satellite imaging database, a reservoir database and program instructions, a computer comprising a processor with circuitry configured to cause the one or more processor to perform the program instructions to construct a reservoir model which includes reservoir boundary conditions, a three dimensional size of the reservoir, faults in the reservoir, lithography, rock densities, porosities ($\emptyset$), and depths of the caprock and the plurality of subsurface layers, initial values of horizontal stresses ($\sigma$), volumetric strain ($\varepsilon v$), pore pressures, permeabilities (k0), pressure wave velocities and shear wave velocities of the reservoir, the caprock and the subsurface layers. The reservoir model further comprises a plurality of injection wells located in an array formation in the reservoir, each injection well supplying carbon dioxide at a plurality of supercritical injection pressures and predicting, by the computer, changes in the porosity, the horizontal stresses, the pore pressures, the permeabilities, the pressure wave velocities and the shear wave velocities of the reservoir, the caprock and the subsurface layers, based on each supercritical injection pressure and predicting, by the computer, an amount of caprock uplift and a location of the caprock uplift at each injection pressure based on the changes. The alarming system further includes comparing, by the computer, the topology images over discrete time periods to determine if the caprock uplift is greater than a threshold, if the caprock uplift is greater than the threshold, comparing at least one location of caprock uplift to the locations of injection wells from the reservoir model to determine at least one injection well near the caprock uplift, and displaying an alarm on a display of the computer which shows the locations of caprock uplift and the at least one injection well near the caprock uplift.

In another exemplary embodiment, a non-transitory computer readable medium having instructions stored therein that, when executed by one or more processor, cause the one or more processors to perform a method for monitoring the sequestration of carbon dioxide in a geologic reservoir having a caprock and a plurality of subsurface layers between the reservoir and the caprock is described.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
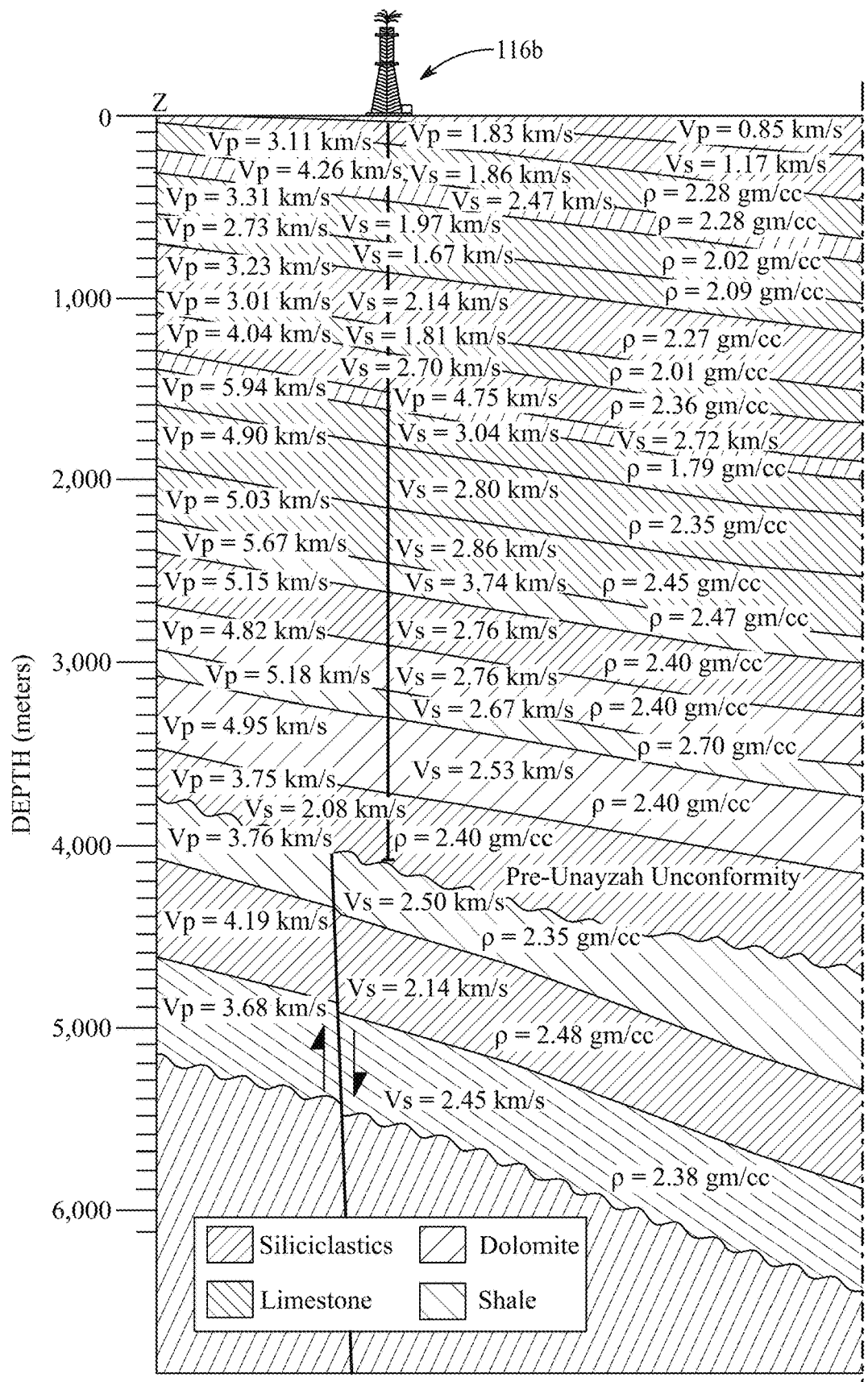
FIG. 1 illustrates a geological model showing the locations of the Biyadh and Arab Jubaila target locations for carbon dioxide injection and the geological layers above and below the Biyadh reservoir.
Figure 1:
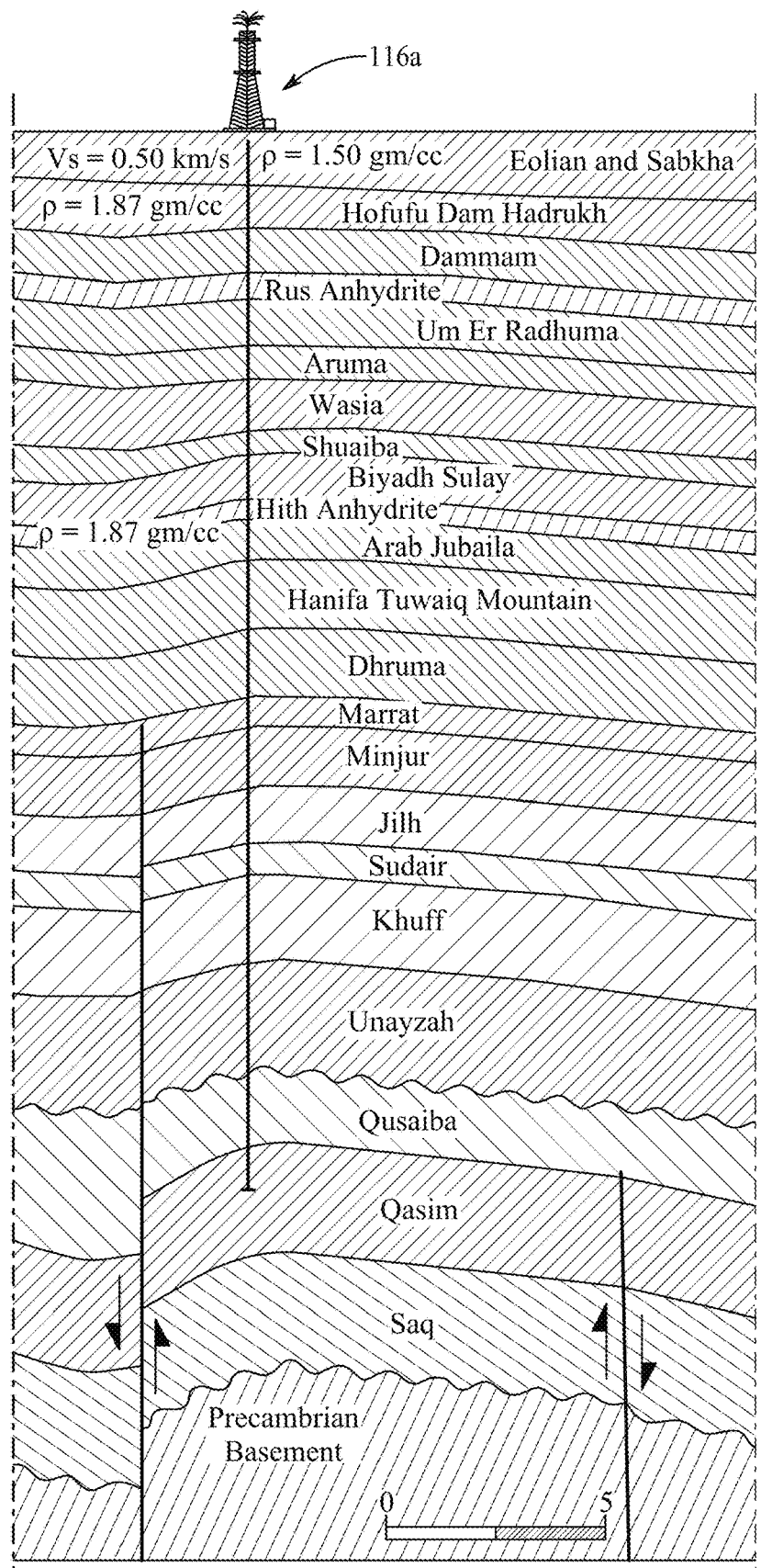
Figure 1:
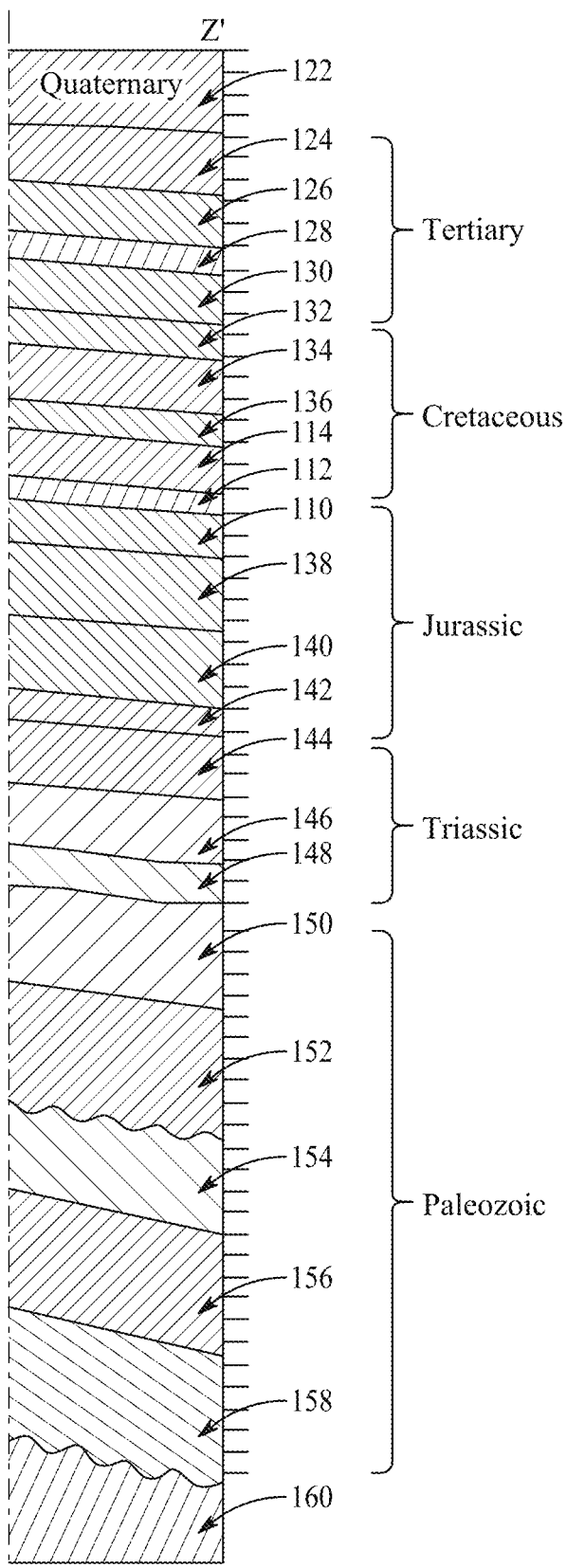

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure are directed to a method for carbon dioxide sequestration in a geologic reservoir having a caprock and a plurality of subsurface layers between the reservoir and the caprock, an alarming system for leakage in a geologic reservoir sequestering carbon dioxide, the geologic reservoir having a caprock and a plurality of subsurface layers between the reservoir and the caprock and a non-transitory computer readable medium having instructions stored therein that, when executed by one or more processors, cause the one or more processors to perform a method for monitoring the sequestration of carbon dioxide in a geologic reservoir having a caprock and a plurality of subsurface layers between the reservoir and the caprock.

Aspects of the present disclosure are described with respect to a non-limiting example of the Ghawar oil field. The Biyadh sandstone reservoir 114 (see FIG. 1) is a suitable site for the long term injection of carbon dioxide because: (a) it is capped by the low permeability Shuaiba layer 122, and (b) it is far away from the potable water Um Er Radhuma layer 124. However, the methods and systems of the present disclosure are not limited to a particular reservoir or location and may be applied to any geologic reservoir.

An oil field is particularly suited for $CO_2$ sequestration as oil field surveys before and during production have collected a preponderance of data regarding reservoir porosity, depth, lithography, vertical and horizontal stresses and such like. This accumulated data is invaluable in predicting the effects of $CO_2$ sequestration has on the internal reservoirs of the oil field. For example, $CO_2$ injection into a reservoir may cause uplift of the caprock, which could endanger buildings, trees and other ground structures. Further, if the reservoir fractures, $CO_2$ may leak into a potable ground water reservoir above the injected reservoir, causing algae growth and contamination of the water. Large fractures may endanger the stability of the oil field.

Additionally, $CO_2$ may be injected into a carbonate reservoir during production to aid in forcing remaining oil from the porous rocks. This process sequesters the $CO_2$ and may aid in supporting the depleted reservoir structure.

In an aspect of the present disclosure, a method is described for modelling a reservoir in order to predict the effects on caprock uplift, reservoir stability and fracture reactivation during $CO_2$ injection. The method determines the number of injection wells and their placement within the reservoir needed to achieve the highest amount of sequestration while minimizing pore pressures, internal stresses, reservoir stability, fracture reactivation and caprock uplift. The method further relates the reservoir boundary conditions to build up of pore pressure, caprock uplift and long term stability of the $CO_2$ sequestration.

In an aspect, a model is utilized which accounts for the two-phase flow associated with the geo-mechanical behavior of the reservoir with respect to caprock leakage. At the surface, $CO_2$ acts as a gas which is lighter than water. At a depth greater than 800 meters, the $CO_2$ enters a second phase, where it is denser and mixes with water. Injecting $CO_2$ into a saline reservoir, such as the Biyadh reservoir 114 of the Ghawar oil field shown in FIG. 1, which is at a depth greater than 1000 meters, thus mixes the $CO_2$ with the saline water. The large amount of additional $CO_2$ may swell the reservoir and cause caprock uplift or reactivate a fracture the reservoir. A fracture in the subsurface areas above the Biyadh layer may allow $CO_2$ to leak upward, becoming less dense, to enter the potable ground water of the Um Ar Radhuma reservoir.

In another aspect, the method incorporates rock permeability in the prediction of caprock uplift or leakage. The permeability of a rock is its ability to pass fluids. The reservoirs in which carbon dioxide is injected should have sufficient permeability to allow the spread of the injected carbon dioxide along the reservoir. The caprock is considered to be a dual permeability medium when modeling the carbon dioxide leakage through the caprock. Dual-permeability models assume that the porous medium consists of two interacting regions, one associated with the inter-aggregate, macropore, or fracture system, and one comprising micropores (or intra-aggregate pores) inside soil aggregates or the rock matrix.

In order to evaluate the permeability, the method incorporates the Barton-Bandis model to relate the changes in the effective stresses due to $CO_2$ injection to the caprock fracture permeability. According to the Barton-Bandis Model, the fracture permeability is a function of the effective stresses on the fracture model. If the effective stresses are decreased, the fracture permeability will increase. The Barton-Bandis model is applied only to specific grid blocks of the model that represent fractures in the caprock. Changes in the effective stresses within a fracture in the caprock because of injection and the resulting leakage of the stored carbon dioxide are incorporated in the model. The ensuing ground uplift caused by the leaked carbon dioxide is also included in the model, thus allowing the determination of the exact location and dimension of the fracture in the caprock in terms of the calculated location and magnitude of the ground uplift. (See "Barton-Bandis Criterion Synopsis", published by Researchgate, 2017, incorporated herein by reference in its entirety).

The Mohr-Coulomb criterion for shear failure is incorporated in the model in order to predict the stability of the reservoir. The Mohr-Coulomb failure criterion is a mathematical model describing the failure of materials such as rocks due to shear stresses as well as normal stresses. The Mohr-Coulomb failure criterion represents the linear envelope that is obtained from a plot of the shear strength of a material versus the applied normal stress.

The injection of carbon dioxide into a reservoir causes both the pore pressure and stress fields to change. In the non-limiting example of the Biyadh sandstone reservoir, the reservoir is filled with water, thus the injected carbon dioxide is stored mainly by displacing the water and partially by dissolving in water. The increase in the pore pressure primarily affects reservoir stability if the caprock is not fractured. However, if the caprock is fractured, then the increase in the pore pressure tends to activate the already existing fractures in the caprock, thus causing leakage of carbon dioxide into the overburden layers. Therefore, the methods of the present disclosure monitor the pore pressure and ground uplift during carbon dioxide injection. Any leakage of carbon dioxide because of excessive pore pressure buildup or any damage to infrastructure because of excessive ground uplift may violate climate mitigation policies.

Aspects of the present disclosure relate the rate of injection of $CO_2$ into a reservoir layer to pore pressure and effective stresses in fractured and non-fractured layers. The pore pressure and effective stresses are used to predict subsequent uplift of the caprock, leakage into the subsurface layers and long term stability of the reservoir.

In an additional aspect of the present disclosure, a method is described for reducing pore pressure build-up and effective stresses and for maximizing the reservoir storage capacity by varying the number of carbon dioxide injection wells along with their placement arrangement (distance from a reservoir center) in a naturally fractured carbonate reservoir. An optimum arrangement is determined at which the pore pressure attains the lowest value at the same injection pressure and for the same injection period for a particular reservoir.

In an aspect of the present disclosure, the modelling predicts the effect of using multiple injection wells. The pore pressure variations for various arrangements of injection wells may be determined. The resulting ground surface vertical uplift, reservoir stability and maximum occupancy for various arrangements of injection wells may be predicted.

In a further aspect of the present disclosure, the effect of the reservoir size and boundary conditions selection are incorporated using geo-mechanical modeling of the reservoir undergoing carbon dioxide injection. Relationships between reservoir size and boundary conditions selection to reservoir pore pressure buildup, ground uplift, fault reactivation and reservoir stability are determined.

Another aspect of the present disclosure, fault reactivation modeling is performed to evaluate the effects of reservoir size and boundary conditions on fault reactivation in the reservoir.

In an aspect of the present disclosure, hydro-mechanical coupled geo-mechanical modeling was performed for carbon dioxide injection into small and large models of a sandstone reservoir.

In an aspect of the present disclosure, the reservoir model may be used to identify the location of a fracture post injection, the amount of leakage, the location of a fracture or predict the amount of caprock uplift due to the leakage.

Finally, the method predicts the estimated safe values of the injection parameters to furnish benchmark data for $CO_2$ injection and long term sequestration in the reservoir. An alarm may be generated when caprock uplift is detected.

In order to model a sandstone reservoir containing water, multiphase flow, as well as corresponding deformation of the reservoir, must be considered. Coupled geo-mechanical and stability analyses are performed.

The Arab Jubaila reservoir 110 is a carbonate reservoir of the Ghawar oil field. This reservoir is used as a non-limiting example in some aspects of the present disclosure. The carbonate reservoir may have rock structures comprising at least one of grainstone, packstone, wackestone, mudstone, bafflestone, bindstone, framestone, floatstone, rudstone and shale.

The first embodiment is drawn to a method for carbon dioxide sequestration in a geologic reservoir (112 or 114, FIG. 1) having a caprock 122 and a plurality of subsurface layers (124, 126, 128, 130, 132, 134, 136) between the reservoir and the caprock as shown in FIG. 1, comprising constructing a reservoir model (see FIG. 2A, 2B, 18A-18D, 31A-33B), by a computer (5000, FIG. 50) having program instructions (in CPU 5001), a display 5010 and a reservoir database (in memory 5002) stored therein that, when executed by one or more processors, causes the one or more processors to construct the reservoir model which includes reservoir boundary conditions, a three dimensional size of the reservoir, faults in the reservoir, lithography, rock densities, porosities (Ø), and depths of the caprock and the plurality of subsurface layers; initial values of the horizontal stresses (σ), the volumetric strain ($\varepsilon_v$), the pore pressures, the permeabilities ($k_0$), the pressure wave velocities and the shear wave velocities of the reservoir, the caprock and the subsurface layers sourced from the database memory; a plurality of injection wells located in an array formation (see FIG. 18A-18D), in the reservoir (see, for example, two injection wells 116a and 116b, FIG. 1), each injection well supplying carbon dioxide at a plurality of injection pressures. The injection pressures vary depending on the type of reservoir, either saline 114 or carbonate 110 (in the non-limiting example of the Ghawar oil field of FIG. 1), and its depth (1000-1700 m in the non-limiting example of the Ghawar oil field of FIG. 1). The injection pressure in a carbonate well may be in the range of 1800-5000 pounds per square inch gauge (psig). In a carbonate well, the injection pressure may be selected from the range of 2000-500 psig.

The method continues by determining, by the computer, changes in the porosity, the horizontal stresses, the pore pressures, the permeabilities, the pressure wave velocities and the shear wave velocities of the reservoir, the caprock and the subsurface layers, based on each injection pressure and determining, by the computer, an amount of caprock uplift and the location of the caprock uplift at each rate of injection based on the changes; determining, by the computer, each volume of carbon dioxide sequestered in the reservoir at each injection pressure after a period of time and correlating, by the computer, the injection pressure at each injection well after the period of time to the amount of caprock uplift and the amount of carbon dioxide sequestered.

The method further comprises minimizing the caprock uplift and maximizing the volume of carbon dioxide sequestered by adjusting the number of injection wells, the array formation and the injection pressure at each injection well, and providing, on the display, a representation of the reservoir displaying the number of injection wells, the array formation, the locations of caprock uplift and the injection pressures at each injection well for the minimized caprock uplift and the maximized volume of carbon dioxide sequestered.

The reservoir may be a carbonate reservoir including at least one of grainstone, packstone, wackestone, mudstone, bafflestone, bindstone, framestone, floatstone, rudstone and shale.

The reservoir may be a sandstone reservoir including saline water and wherein the injected carbon dioxide dissolves in the saline water.

In the method, determining changes in the porosity is based on $Ø^*=Ø(1-\varepsilon_v)$ where $\varepsilon^*$ is the changed porosity.

The program instructions include a Mohr-Coulomb failure criterion; and calculating, by the computer, the Mohr-Coulomb failure criterion representing a stability of the reservoir based on the changes in pore pressures, horizontal stresses and volumetric strains and predicting safe values of the injection pressures based on the Mohr-Coulomb failure criterion.

The program instructions also include a Barton-Bandis model which determines changes in the permeability of the caprock based on the Barton-Bandis model and wherein the computer identifies a fracture in the caprock based on a rise in the permeability of the caprock.

The program instructions include a Warren and Root fracture model. The method includes determining, by the computer, changes in the permeability of the fault based on the Warren and Root fracture model; and identifying a reactivation of the fault.

The method further comprises calculating carbon dioxide saturation in the subsurface layers based on the changes in the permeability of the fault, determining the fault location and the fault dimensions and predicting the amount of caprock uplift.

The reservoir boundary conditions are at least one of an open boundary and a closed boundary, and the method includes adjusting the number of injection wells based on the reservoir boundary conditions or adjusting the number of injection wells based on the three dimensional size of the reservoir.

The program instructions further include geo-mechanical modelling instructions wherein the geo-mechanical modelling incorporates the initial values of reservoir density, pressure wave velocity and shear wave velocity to calculate changes in the modulus of elasticity, the shear modulus, a modulus of rigidity and a bulk modulus due to the injection pressures.

The method additionally includes performing post injection monitoring of the pore pressure in the subsurface layers; identifying carbon dioxide leakage from the reservoir based on decreased levels of the pore pressures and providing a leakage alarm.

Figure 50:
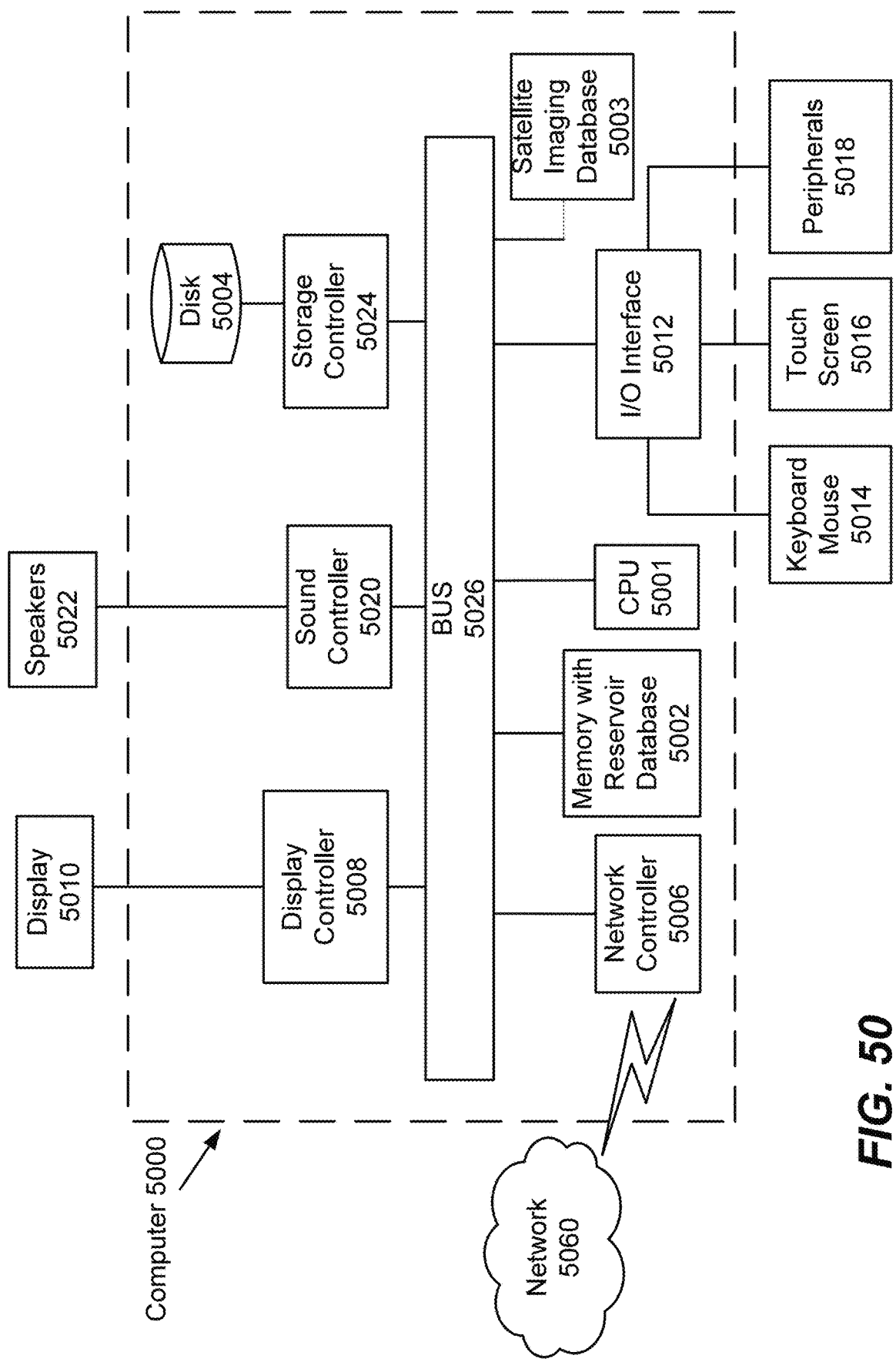
FIG. 50 is an illustration of a non-limiting example of details of computing hardware used in the computing system, according to certain embodiments.

The method further comprises performing post injection monitoring of the caprock uplift; identifying carbon dioxide leakage from the reservoir based on caprock uplift; and generating, by the computer, a leakage alarm (see sound controller 5020 and speakers 5022, FIG. 50).

The second embodiment is drawn to an alarming system for leakage in a geologic reservoir (110 or 114, FIG. 1) sequestering carbon dioxide, the geologic reservoir having a caprock 122 and a plurality of subsurface layers (124, 126, 128, 130, 132, 134, 136) between the reservoir and the caprock, comprising a satellite surface imaging database 5003 (see FIG. 50) including topology images of the geologic reservoir taken over a period of time; a memory storing the satellite imaging database, a reservoir database and program instructions; constructing a reservoir model (see FIG. 2A, 2B, 18A-18D, 31A-33B), by a computer (5000, FIG. 50) having program instructions, a display 5010 and a reservoir database (in memory 5002) stored therein that, when executed by one or more processors, causes the one or more processors to construct the reservoir model which includes the reservoir boundary conditions, the three dimensional size of the reservoir, faults in the reservoir, lithography, rock densities, porosities (Ø), and depths of the caprock and the plurality of subsurface layers; initial values of the horizontal stresses ($\sigma$), the volumetric strain ($\varepsilon_v$), the pore pressures, the permeabilities ($k_0$), the pressure wave velocities and the shear wave velocities of the reservoir, the caprock and the subsurface layers. The reservoir model further includes a plurality of injection wells (see, for example, two injection wells 116a and 116b, FIG. 1), located in an array formation in the reservoir (see FIG. 18A-18D), each injection well supplying carbon dioxide at a plurality of injection pressures.

The alarming system further includes determining, by the computer, changes in the porosity, the horizontal stresses, the pore pressures, the permeabilities, the pressure wave velocities and the shear wave velocities of the reservoir, the caprock and the subsurface layers, based on each injection pressure, determining an amount of caprock uplift and the location of the caprock uplift at each rate of injection based on the changes, determining each volume of carbon dioxide sequestered in the reservoir at each injection pressure after a period of time and correlating the injection pressure at each injection well after the period of time to the amount of caprock uplift and the amount of carbon dioxide sequestered, comparing the caprock uplift after the period of time to a threshold and generating an alarm when the caprock uplift is greater than the threshold. The threshold is selected from the group consisting of 25 mm or less than 25 mm, preferably 20 mm, even more preferably 15 mm, even more preferably 10 mm or less than 10 mm, even more preferably 5 mm or less than 5 mm.

The period of time is selected from the range of one to one hundred years, preferably one to fifty years, even more preferably one to twenty five years and even more preferably one to ten years.

The alarming system further comprises responding to the alarm by adjusting the number of injection wells, the array formation and the injection pressure at each injection well to minimize the caprock uplift and volume of carbon dioxide sequestered; and providing, on the display, a representation of the reservoir displaying the number of injection wells, the array formation, the locations of caprock uplift and the injection pressures at each injection well for the minimized caprock uplift and the maximized volume of carbon dioxide sequestered.

The third embodiment is drawn to a non-transitory computer readable medium having instructions stored therein that, when executed by one or more processors, cause the one or more processors to perform a method for monitoring the sequestration of carbon dioxide in a geologic reservoir (112 or 114, FIG. 1) having a caprock 122 and a plurality of subsurface layers (124, 126, 128, 130, 132, 134, 136) between the reservoir and the caprock, comprising constructing a reservoir model (see FIG. 2A, 2B, 18A-18D, 31A-33B), by a computer (5000, FIG. 50) having program instructions (in CPU 5001), a display 5010 and a reservoir database (in memory 5002) stored therein that, when executed by one or more processors, causes the one or more processors to construct the reservoir model.

The reservoir model includes reservoir boundary conditions, a three dimensional size of the reservoir, faults in the reservoir, lithography, rock densities, porosities (Ø), and depths of the caprock and the plurality of subsurface layers; the initial values of the horizontal stresses ($\sigma$), the volumetric strain ($\varepsilon_v$), the pore pressures, the permeabilities ($k_0$), the pressure wave velocities and the shear wave velocities of the reservoir, the caprock and the subsurface layers; a plurality of injection wells (see, for example, two injection wells 116a and 116b, FIG. 1) located in an array formation in the reservoir (see FIG. 18A-18D), each injection well supplying carbon dioxide at a plurality of injection pressures.

The computer readable medium method further includes determining, by the computer, changes in the porosity, the horizontal stresses, the pore pressures, the permeabilities, the pressure wave velocities and the shear wave velocities of the reservoir, the caprock and the subsurface layers, based on each injection pressure; determining, by the computer, an amount of caprock uplift and the location of the caprock uplift at each rate of injection based on the changes; determining, by the computer, each volume of carbon dioxide sequestered in the reservoir at each injection pressure after a period of time; correlating, by the computer, the injection pressure at each injection well after the period of time to the amount of caprock uplift and the amount of carbon dioxide sequestered; minimizing the caprock uplift and maximizing the volume of carbon dioxide sequestered by adjusting the number of injection wells, the array formation and the injection pressure at each injection well; and providing, on the display, a representation of the reservoir displaying the number of injection wells, the array formation, the locations of caprock uplift and the injection pressures at each injection well for the minimized caprock uplift and the maximized volume of carbon dioxide sequestered.

The program instructions further include a Mohr-Coulomb failure criterion; and calculating, by the computer, a Mohr-Coulomb failure criterion representing a stability of the reservoir based on the changes in pore pressures, horizontal stresses and volumetric strains.

Two reservoirs in the Ghawar oil field are used in non-limiting examples to describe the methods of the present disclosure. As shown in FIG. 1, starting from the top, the Quaternary deposits 122 consist of Quaternary Eolian and Sabkha deposits (fine sand) with an average P-wave velocity of 850 m/s and density of 1500 kg/m3 with variable thickness. The Hofuf Dam Hadrukh 124 formation is made of marl, shale, sandstone, and chalky limestone with an average P-wave velocity of 1830 m/s, density of 1870 kg/m3 and average thickness of 150 m. The Dammam 126 formation consists of limestone, dolomite, and shale with an average P-wave velocity of 3110 m/s, density of 2280 kg/m3 and average thickness of 200 m. The Rus 128 formation is dominantly anhydrite in the subsurface with an average P-wave velocity of 4260 m/s, density of 2280 kg/m3 and average thickness of 90 m.

The Umm Er Radhuma 130 formation mainly consists of dolomitic limestone with an average P-wave velocity of 3310 m/s, density of 2020 kg/m$^3$ and average thickness of 250 m. The Aruma 132 formation consists of limestone, subordinate dolomite and shale with an average P-wave velocity of 2730 m/s, density of 2090 kg/m$^3$ and average thickness of 160 m. The Wasia 134 formation is mainly sandstone with subordinate shale and rare dolomitic lenses with an average P-wave velocity of 3230 m/s, density of 2270 kg/m$^3$ and average thickness of 230 m. The Shuaiba 136 formation is a limestone with an average P-wave velocity of 3010 m/s, density of 2030 kg/m$^3$ and average thickness of 100 m. The Biyadh 114 formation is dominantly sandstone having an average P-wave velocity of 4040 m/s, density of 2360 kg/m$^3$ and average thickness of 320 m. The Hith anhydrite 112 is an evaporite with an average P-wave velocity of 4750 m/s, density of 1870 kg/m$^3$ and average thickness of 100 m. The Arab 110 formation consists of dolomitic limestone and some anhydrite with an average P-wave velocity of 5940 m/s, density of 2400 kg/m$^3$ and average thickness of 170 m. This layer is the most prolific reservoir in the Mesozoic petroleum system.

Hanifa and Tuwaiq mountain 138 formation consists of organic-rich carbonate mudrocks with an average P-wave velocity of 4900 m/s, density of 2890 kg/m$^3$ and average thickness of 310 m. This formation has long been recognized as the source rock of the Mesozoic petroleum system. Dhruma 140 formation is a limestone with an average P-wave velocity of 5030 m/s, density of 2450 kg/m$^3$ and average thickness of 330 m. Marrat 142 formation is mainly shale with subordinate sandstone having an average P-wave velocity of 5670 m/s, density of 2470 kg/m$^3$ and average thickness of 160 m. The Minjur 144 formation consists of sandstone with minor shale having an average P-wave velocity of 5150 m/s, density of 2400 kg/m$^3$ and average thickness of 200 m. The Jilh 146 formation consists of dolomitic limestone with an average P-wave velocity of 4820 m/s, density of 2400 kg/m$^3$ and an average thickness of 300 m. The Sudair 148 formation is a red and green shale with an average P-wave velocity of 5180 m/s, density of 2700 kg/m$^3$ and average thickness of 140 m. The Khuff 150 formation is a dolomitic limestone with an average P-wave velocity of 4950 m/s, density of 2400 kg/m$^3$ and average thickness of 400 m. The Unayzah 152 formation is a sandstone layer with an average P-wave velocity of 3750 m/s, density of 2400 kg/m$^3$ and average thickness of 100 m.

The Qusaiba 154 formation is shale with an average P-wave velocity of 3760 m/s, density of 2350 kg/m$^3$ and average thickness of 300 m. This formation is believed to be the main source rock for the Paleozoic-Mesozoic petroleum system. The Qasim 156 formation is composed of mainly siliciclastic sandstone and shale with an average P-wave velocity of 4190 m/s, density of 2480 kg/m$^3$ and average thickness of 400 m. The Saq 158 formation is a sandstone layer with an average P-wave velocity of 3680 m/s, density of 2380 kg/m$^3$ and average thickness of 400 m. The Precambrian 160 basement is composed of igneous and metamorphic rocks with an average P-wave velocity of 6380 m/s and density of 2800 kg/m$^3$. This is the lowermost layer in the model and is assumed as a half space with an infinite thickness. The P-wave velocities, S-wave velocities, density and depths are summarized in Table 2.

Aspects of the present disclosure are described using the example of injection of carbon dioxide into a sandstone reservoir containing saline water. However, the techniques of the present disclosure are not limited to sandstone reservoirs, and may apply to depleted oil or gas reservoirs formed of carbonate rock or to coal reservoirs.

Details of the model used to perform the methods and embodiments of the present disclosure are presented below.

A computer system (5000, FIG. 50), as detailed below with respect to FIG. 50-53, includes circuitry having program instructions (in CPU 5001), a display 5010 and a reservoir database (in memory 5002) stored therein that, when executed by one or more processors, causes the one or more processors to construct the reservoir model which includes reservoir boundary conditions, a three dimensional size of the reservoir, faults in the reservoir, lithography, rock densities, porosities (Ø), and depths of the caprock and the plurality of subsurface layers; initial values of the horizontal stresses (σ), the volumetric strain ($\varepsilon_v$), the pore pressures, the permeabilities ($k_0$), the pressure wave velocities and the shear wave velocities of the reservoir, the caprock and the subsurface layers sourced from the database memory; a plurality of injection wells located in an array formation (see FIG. 18A-18D), in the reservoir (see, for example, two injection wells 116a and 116b, FIG. 1), each injection well supplying carbon dioxide at a plurality of injection pressures. The database holds values for the reservoir boundary conditions, a three dimensional size of the reservoir, faults in the reservoir, lithography, rock densities, porosities (Ø), and depths of the caprock and the plurality of subsurface layers; initial values of the horizontal stresses (σ), the volumetric strain ($\varepsilon_v$), the pore pressures, the permeabilities ($k_0$), the pressure wave velocities and the shear wave velocities of the reservoir. The processors of the computer system are configured to determine changes in the porosity, the horizontal stresses, the pore pressures, the permeabilities, the pressure wave velocities and the shear wave velocities of the reservoir, the caprock and the subsurface layers, based on each injection pressure and determining, by the computer, an amount of caprock uplift and the location of the caprock uplift at each rate of injection based on the changes; determining, by the computer, each volume of carbon dioxide sequestered in the reservoir at each injection pressure after a period of time and correlating, by the computer, the injection pressure at each injection well after the period of time to the amount of caprock uplift and the amount of carbon dioxide sequestered.

An iterative coupling method is used in the to perform the coupled multiphase flow and the reservoir deformation analyses. During iterative coupling, the geo-mechanical calculations are not performed at the same time as the reservoir flow calculations but are calculated one step behind. Equation-based modelling in COMSOL multi-physics finite element software is utilized for the numerical modelling of various carbon dioxide injection scenarios. In this context, the effects of varying the number of injection wells together with their distances from the reservoir's center on the pattern of stress build-up and stability of the reservoir are investigated numerically. The simulation results show that the storage capacity of the reservoir is highly affected by changing the number and arrangement of injection wells, while showing different stability margins for different injection well arrangements. Moreover, the results suggest the existence of an optimum arrangement at which the pore pressure attains the lowest value at the same injection pressure and for the same injection period. In the iterative coupling method, the flow variable, e.g., pressure, is first calculated in the parent CMG flow simulator and then sent to the GEM module to calculate the deformation variables, such as displacements, stresses, and strains. In the coupled geo-mechanical modeling by CMG-GEM, the displacement values in each time step are used to calculate the change in the matrix porosity. Using the change in porosity, a new value of the porosity at each grid point is calculated and used for the next time step by the flow simulator. (See Kazemi et al. 1978; Barton C A, Zoback M D, Moos D (1995) "Fluid flow along potentially active faults in crystalline rock". Geology 23(8):683-686; Anjani and Varun 1998; Tran D, Buchanan W L, Nghiem L X (2010) "Improved gridding technique for coupling geomechanics to reservoir flow". SPE J 15(1):64-75; Sahimi M (2011) "Flow and transport in porous media and fractured rock: from classical methods to modern approaches". John Wiley & Sons, Germany; and "GEM Advanced Compositional Reservoir Simulator, Version (2012) User guide". Calgary. https://www.cmgl.ca/gem. Accessed 9 Sep. 2017; "Numerical modeling of fracture permeability change in naturally fractured reservoirs using a fully coupled displacement discontinuity method". Dissertation. Texas A&M University, each incorporated herein by reference in their entirety).

Equations for the multiphase flow, the deformation of the reservoir, and the Barton-Bandis model of carbon dioxide leakage through the caprock are described below.

The fully coupled carbon dioxide flow and reservoir deformation models are generated in the COMSOL multiphysics software, wherein the MATLAB code has been utilized to generate the input properties of the rock at each node of the reservoir's model.

The multiphase flow of carbon dioxide through the reservoir is simulated by a compositional simulator. In a non-limiting example, the GEM flow simulator is used. The composition of the phase is permitted to change due to the variations in pressure and quantity of the injected fluid. A compositional reservoir simulator calculates the Pressure-Volume-Temperature (PVT) properties of oil and gas phases once they have been fitted to an equation of state (EOS), as a mixture of components. An Equation of State (EOS) is a simplified mathematical model that calculates the phase behavior of the reservoir. In the case of carbon dioxide injection into the reservoir, the conservation of mass is defined as follows:

$$\frac{\partial}{\partial t}(\rho_L \emptyset (1-\varepsilon_V) S_L) - \nabla \cdot (\rho_L v_L) = Q_L \qquad (1)$$

where L refers to the phase (either water or carbon dioxide), $\rho_L$ is the density of corresponding phase, $\emptyset$ is the true porosity of the reservoir, $\varepsilon_v$ is the volumetric strain in the reservoir caused by the injected carbon dioxide, $S_L$ is the saturation, $v_L$ represents Darcy's velocities, and $Q_L$ represents the flow rate. (See Tore B, Eyvind A, Elin S (2009) "Safe storage parameters during $CO_2$ injection using coupled reservoir geo-mechanical analysis". Excerpt from the Proceedings of the COMSOL Conference Milan; "GEM Advanced Compositional Reservoir Simulator 2012"; and Amirlatifi A (2013) "Coupled geo-mechanical reservoir simulation". Dissertation. Missouri University of Science and Technology, each incorporated herein by reference in their entirety). Equation (1) relates the deformation and porosity to the injection of carbon dioxide at a specific flow rate into the reservoir. In this coupled model solution, new values of the porosity and volumetric strain are determined at each iteration step, in order to cope with the deformation of the reservoir. In this analysis, the reservoir's porosity ($\emptyset^*$) is a function of both the true porosity ($\emptyset$) and the volumetric strain, which is defined as follows:

$$\emptyset^* = \emptyset(1-\varepsilon_v) \qquad (2)$$

where $\varepsilon_v$ is the volumetric strain. The new values of porosity, as calculated by Eq. (2), are utilized by the modeling scheme to find the new values of the pore pressure at each node. The values of the pore pressure are used in the deformation equations to find the new values of the effective stresses. Knowing that the current value of porosity at any time step is dependent on the volumetric strain, Eq. (2) is used to write the equation of the conservation of mass in the reservoir as follows:

$$\frac{\partial}{\partial t}(\rho_L \emptyset^* S_L) - \nabla \cdot (\rho_L v_L) = Q_L \qquad (3)$$

Utilizing the current values of porosity, the method proceeds by calculating new values of the pore pressure based on the saturation and capillary pressure of each phase in the reservoir. The relations showing the saturations and capillary pressure of carbon dioxide and water in the reservoir can be stated as follows:

$$S_{water} + S_{carbon\ dioxide} = 1 \qquad (4)$$

$$P_c(S_{water}) = P_{carbon\ dioxide} - P_{water} \qquad (5)$$

where $S_{water}$ is the saturation of water and $S_{carbon\ dioxide}$ is the saturation of carbon dioxide. As shown by Eq. (5), the capillary pressure $P_c$ ($S_{water}$) is equal to the difference between the pore pressures of carbon dioxide and water phases, respectively.

Darcy's law states that the velocity at which the injected fluid will flow in a reservoir is dependent on the pressure difference in the direction of flow. Utilizing Darcy's law, the Darcy velocities for phase L are given by the following:

$$vL = \left(\frac{kL}{\mu L}\right)(\nabla p - \rho L g) \qquad (6)$$

where $k_L$ is the reservoir's permeability, $\mu_L$ is the viscosity, and p is the pore pressure. The permeability is updated at each time step, throughout the injection process. The new values of the reservoir's permeability are calculated from the current values of the porosity using the Kozeny-Carman model as follows:

$$\frac{k}{k_o} = \left(\frac{\emptyset}{\emptyset_o}\right)^3 \left(\frac{1-\emptyset_o}{1-\emptyset}\right)^2 \qquad (7)$$

where k is the current value of permeability, $k_o$ is the initial reservoir permeability, $\emptyset$ is the current value of the porosity, and $\emptyset_o$ is the initial porosity of the reservoir. The Kozeny-Carman model determines the value of the reservoir current permeability based on the value of the current porosity.

The deformation of the reservoir due to $CO_2$ injection is described below.

The pressure-induced deformation of the reservoir due to $CO_2$ injection causes the displacement field to change. The new values of the strain tensor may be calculated at each time step using the strain—displacement relationship as follows:

$$\varepsilon^{ij} = \tfrac{1}{2}(u_{i,j} + u_{j,i}) \qquad (8)$$

where $u_{i,j}$ and $\varepsilon_{ij}$ are the displacement and strain tensors, respectively. (See Mase G E (1970) "Theory and problems of continuum mechanics". Schaum's outline series, United States of America, incorporated herein by reference in its entirety). Using the constitutive relation of Eq. (9) below, the stresses in the reservoir can be calculated from the already calculated strains using Eq. (8). This can be expressed as follows:

$$\sigma_{ij} = 2G\varepsilon_{ij} + \left(K - \frac{2G}{3}\right)\varepsilon_{kk}\delta_{ij} + \alpha p \delta_{ij} \qquad (9)$$

where $\sigma_{ij}$ is the stress tensor, G is the shear modulus, K is the bulk modulus, $\delta_{ij}$ is the Kronecker delta, and $\alpha$ is the Biot's coefficient. (See Mase (1970); Chen W F, Saleeb A F (1982) "Constitutive equations for engineering materials". Wiley, N.Y., incorporated herein by reference in their entirety).

Once the new values of pore pressure and the total stresses are determined, the effective stresses in the reservoir can be easily calculated. The effective stresses in the reservoir are defined as follows:

$$\sigma_{ij}' = \sigma_{ij} - \alpha p \delta_{ij} \qquad (10)$$

where $\alpha_{ij}'$ represents the effective stresses. The effective stresses calculated from Eq. (10) are then used to perform stability analysis of the reservoir.

In the present disclosure, the carbon dioxide flow and the deformation equations presented above are coupled to give the changes in pore pressure, effective stresses, and deformations. The change in the effective stresses is utilized by the Barton-Bandis model to monitor carbon dioxide leakage during the injection process by calculating the value of fracture permeability from the normal fracture effective stress. The Barton-Bandis model accurately represents the change in the fracture permeability by considering its initial value at the equilibrium condition before carbon dioxide injection. As the effective stresses start to decrease during carbon dioxide injection, the fracture permeability increases. When the effective stresses decrease past a critical value, the fracture permeability becomes very high, thus causing the fracture to open completely and leak the injected carbon dioxide into the overburden layers. In comparison to other models used for calculating the fracture permeability, the Barton-Bandis model can be applied to specific grid blocks in order to simulate the change in the permeability of a single fracture. (See Warren J E, Root P J (1963) "The behavior of naturally fractured reservoirs". Soc Pet Eng 3:245-255; Ameen M S, Smart B G D, Somerville J M, Hammilton S, Naji N A (2009) "Predicting rock mechanical properties of carbonates from wireline logs (a case study: Arab-D reservoir, Ghawar field, Saudi Arabia)". Mar Pet Geol 26:430-444; and Wu Y, Liu J, Elsworth D (2010) "Dual poroelastic response of a coal seam to $CO_2$ injection". Int J Greenhouse Gas Control 4:668-678, each incorporated herein by reference in their entirety).

The fracture permeability $k_f$ is calculated as follows:

$$k_f = \bar{k}(e/e_o)^4 \qquad (11)$$

where $\bar{k}$ is the fracture closure permeability. The following equations are defined:

$$e = e_o - V_j \qquad (12)$$

$$V_j = \frac{\sigma_{n'}}{\xi + \sigma_{n'}/V_m} \qquad (13)$$

$$V_m = e_o\left[1 - \left(\frac{\lambda}{\bar{k}}\right)^{1/4}\right] \qquad (14)$$

where $e_o$ is the initial fracture aperture and e is the current fracture aperture, $V_j$ is the stress to fracture stiffness ratio, $\sigma'$ is the normal fracture effective stress, $\xi$ is the initial normal fracture stiffness, $\lambda$ is the initial fracture permeability, and $V_m$ is the minimum fracture aperture.

The model description and input parameters are described below.

In a non-limiting example, CMG-GEM software has been employed for modeling the coupled multi-phase flow and deformation for the non-limiting example of the Biyadh sandstone reservoir.

The model incorporates coupled geo-mechanical modelling and simulation to analyze stability. In a non-limiting example, the coupled geo-mechanical modelling and simulation are performed using both the CMG-GEM (Computer Modeling Group Ltd.-Geomechanical Modeling Software) and COMSOL (cross-platform finite element solver and multiphysics simulation software) have been utilized. COMSOL allows conventional physics-based user interfaces and coupled systems of partial differential equations. COMSOL and CMG-GEM are multiphysics software which may be used to model the flow of a fluid in the reservoir and the accompanying deformation of the reservoir. GEM is an efficient, multidimensional, Equation-Of-State (EOS) simulator that provides the flexibility to use custom script files for performing multiphysics operations. An Equation of State (EOS) is a simplified mathematical model that calculates the phase behavior of the reservoir.

GEM was developed by the Computer Modeling Group (CMG) for the geo-mechanical modeling of single-porosity and naturally fractured reservoirs. GEM can perform efficient dual permeability modeling by considering fluid flow, not only between the matrix elements, but also between the matrix and fractures. One of the advantages of this software is its capability for simultaneous modeling of the production and injection processes. It can also model the reservoir's post-production and post-injection responses. COMSOL multiphysics software can also be used to perform equation-based modeling in which a recent set of equations can be used for the gas flow and reservoir deformation. (See Kazemi H, Vestal C R, Shank D G (1978) "An efficient multi component numerical simulator". Soc Pet Eng J 18(5): 355-368; and Anjani K, Varun P (1998) "The role of coupled geo-mechanical modeling in reservoir simulation Calgary, Alberta". https://www.cmgl.ca/events/webinar-coupled-geomechanics. Accessed 8 Jun. 2017, each incorporated herein by reference in their entirety).

The method focuses on determining the changes in the pore pressure and ground uplift caused by carbon dioxide injection into the reservoir. The Biyadh sandstone reservoir 114 is located above the Arab Jubaila carbonate reservoir 110 as shown in FIG. 1. The geological locations and details of different geological layers, which are stacked above and below the Biyadh reservoir are shown. Two injection wells (116a, 116b) are shown drilled through the rock layers. Tables 1 and 2 list the parameters used to model the reservoir.

Figure 2A:
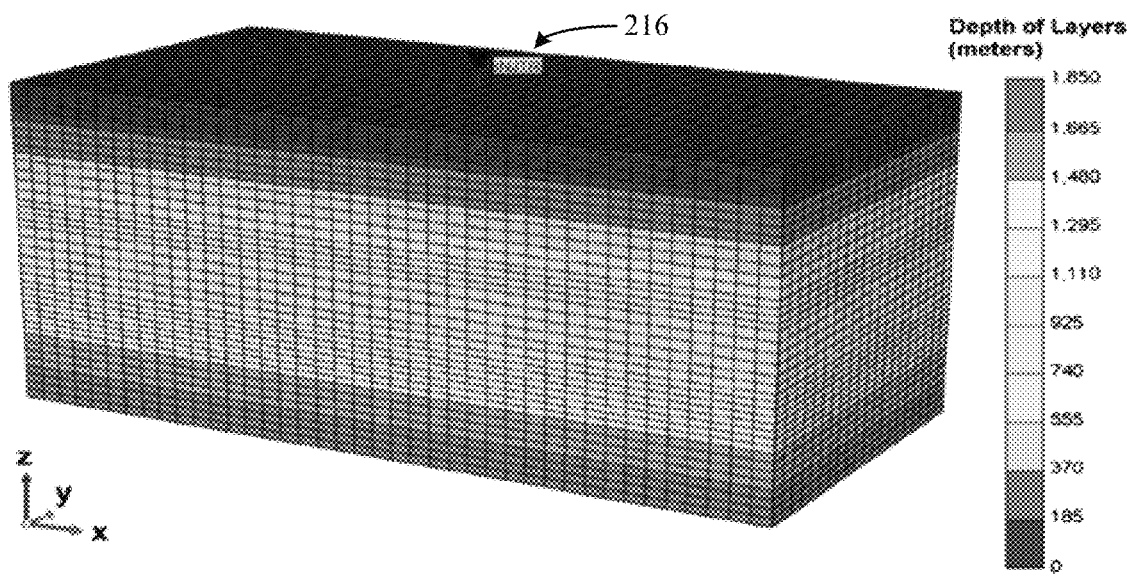
FIGS. 2A and 2B illustrate the simulation model for Biyadh reservoir with the injection well at center of the reservoir using A. a CMG-GEM and model B. a COMSOL model.
Figure 2B:
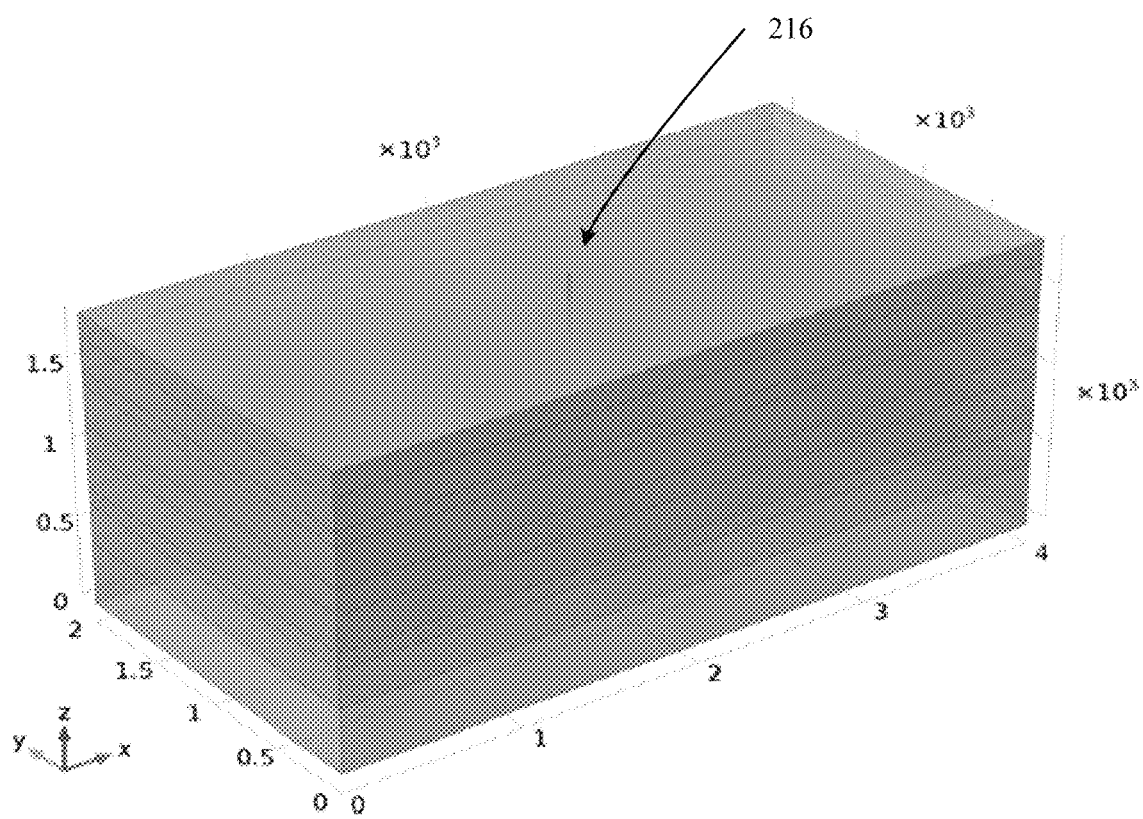

As shown in FIG. 2A, 2B, simulation models were constructed for Biyadh sandstone reservoir in both the CMG-GEM (FIG. 2A) and COMSOL (FIG. 2B) software, wherein the injection well is located at the center of the reservoir. The three-dimensional-layered models of FIG. 2A, 2B represent one under burden layer, a caprock above the Biyadh layer, and six overburden layers.

In this coupled geo-mechanical modeling procedure, the Biyadh reservoir 114 was treated as a single-porosity structure, while the caprock 122 was modeled as a fractured structure. The dual permeability modeling in CMG-GEM was performed with the fracture grid blocks activated only in the caprock structure. The number of grid blocks of the caprock was refined to accurately simulate the fluid flow through the fractures. A total of 19,200 grid blocks were used to construct the model with the Cartesian grid type. In the caprock, the Barton-Bandis model was used to calculate the changes in the fracture permeability. An injection pressure of 23 MPa was used to inject carbon dioxide for a period of ten years. All sides of the model were assigned roller boundary conditions, except for the top side which is permitted to move in the upward direction.

Appropriate initial stresses were applied to the reservoir before the onset of carbon dioxide injection. Initial stresses were assigned to the model both in the horizontal and vertical directions. The stresses change with an increase in the depth below the ground level, based on the depth and density of different layers in the overburden side of the reservoir. As the Biyadh formation is under compressional stress regime, the relationship between the magnitudes of the three principal stresses is such that, $\sigma_1 > \sigma_2 > \sigma_3$, where $\sigma_1$ is the maximum horizontal stress ($\sigma_H$), $\sigma_2$ is the minimum horizontal stress ($\sigma_h$), and $\sigma_3$ is the vertical stress ($\sigma_v$) caused by the weight of the overburden layers. The vertical stress is also known as lithostatic pressure and it is due to the weight of the overburden layers (124, 126, 128, 130, 132, 134, 136). The carbon dioxide injection pressure should always be less than the lithostatic pressure to avoid the failure of the reservoir structure. (See Buchmann T, Connolly P (2007) "Contemporary kinematics of the Upper Rhine graben: a 3D finite element approach". Glob Planet Chang 58:287-309; Eckert A, Connolly A (2007) "Stress and fluid-flow interaction for the geothermal field derived from 3D numerical models". Geotherm Resour Counc Trans 31:385-390; and Hergert T, Heidbach O 2011) "Geomechanical model of the Marmara sea region-II, 3-D contemporary background stress field". Int J Geophys 185:1090-1120, each incorporated herein by reference in their entirety). The initial stresses were applied in all the three directions to all the layers of the model along the depth. The relationship between the horizontal and vertical stresses used is given by:

$$\sigma_{Horizontal\ stress} = 1.25 \sigma_{vertical\ stress} \quad (15)$$

The 3D-layered model constructed in COMSOL to represent the Biyadh reservoir is shown in FIG. 2B. Knowing the average thickness of each geological layer, the model was constructed layer by layer in COMSOL using a total of 60,685 grid blocks with the associated tetrahedral elements. One injection well with a specific diameter has been used to inject carbon dioxide at the center of the reservoir. The injection pressure and flow rate were defined at the bottom hole side of the injection well. As the injection of carbon dioxide was continued, the pore pressure increased in the reservoir, which caused vertical ground uplift. The input parameters used during the modeling are listed in Table 1. (See Ameen et al. (2009); Hakimi et al. (2012); Al-Shuhail et al. (2014); Eshiet K, Sheng Y (2014) "Investigation of geo-mechanical responses of reservoirs induced by $CO_2$ storage". Environ Earth Sci 71:3999-4020; Robert H, Mark Z (2014) "Adsorption of methane and carbon dioxide on gas shale and pure mineral samples". J Unconv Oil Gas Resour 8:14-24; Tan X, Heinz K (2014) "Numerical study of variation in Biot's coefficient with respect to microstructure of rocks". Tectonophysics 61:159-171; and Gameil M, Abdelbaset S (2015) "Gastropods from the Campanian Maastrichtian Aruma formation", Central Saudi Arabia. J Afr Earth Sci 103:128-139, each incorporated herein by reference in their entirety).

The method used for the calculation of the rock mass properties is based on the rock density, pressure wave velocity, Poisson's ratio, and shear wave velocity as shown for the reservoir layers in the columns of Table 1. Calculations of the rock properties, such as modulus of elasticity, modulus of rigidity, and bulk modulus, the initial values of rock porosity and permeability were determined based on mathematical relations given by Ameen et al. (2009), Hakimi et al. (2012), Al-Shuhail et al. (2014), Eshiet and Sheng (2014), Robert and Mark (2014), Tan and Heinz (2014), and Gameil and Abdelbaset (2015).

TABLE 1

Input parameters for coupled geo-mechanical modeling of Biyadh reservoir

| Property | Hofuf Dam Hadrukh | Dammam | Rus Anhydrite | Um Er Radhuma | Aruma | Wasia | Shuaiba | Biyadh Sulay | Hith Anhydrite |
|---|---|---|---|---|---|---|---|---|---|
| Layer thickness (m) | 150 | 200 | 90 | 250 | 160 | 230 | 100 | 320 | 100 |
| Grid top (m) | 0 | 150 | 350 | 440 | 690 | 850 | 1080 | 1180 | 1500 |
| Rock density $\rho$ (kg/m$^3$) | 1877 | 2289 | 2280 | 2020 | 2090 | 2270 | 2030 | 2360 | 2960 |
| Young's modulus, E (GPa) | 7 | 21.43 | 37.25 | 21 | 15.6 | 27.84 | 18.1 | 44.7 | 42.67 |
| Bulk modulus, K (GPa) | 2.83 | 11.47 | 22.8 | 11.67 | 7.8 | 9.82 | 9.13 | 25.7 | 38.2 |

TABLE 1-continued

Input parameters for coupled geo-mechanical modeling of Biyadh reservoir

| Property | Hofuf Dam Hadrukh | Dammam | Rus Anhydrite | Um Er Radhuma | Aruma | Wasia | Shuaiba | Biyadh Sulay | Hith Anhydrite |
|---|---|---|---|---|---|---|---|---|---|
| Shear modulus, G (GPa) | 2.6 | 8.004 | 13.91 | 7.83 | 5.828 | 10.4 | 6.65 | 17.2 | 15.932 |
| Initial porosity, $\varnothing_n$ | 0.2 | 0.2 | 0.28 | 0.24 | 0.17 | 0.29 | 0.09 | 0.12 | 0.01 |
| Initial permeability, $k_m$ ($10^{-15}$ m$^2$) | 0.2 | 0.02 | 0.25 | 0.01 | 0.15 | 0.2 | 0.025 | 0.7 | 0.00001 |
| Pressure wave velocity, $V_p$ (m/s) | 1835 | 3110 | 4260 | 3310 | 2730 | 3230 | 3010 | 4040 | 4480 |
| Shear wave velocity, $V_s$ (m/s) | 1180 | 1870 | 2470 | 1970 | 1670 | 2140 | 1810 | 2700 | 2320 |

TABLE 2

Velocities and Pore Pressures of Layers of the Ghawar Oil Field

| LAYER | Vp (km/s) | Vs (km/s) | ρ (gm/cc) | Avg. Depth (m) |
|---|---|---|---|---|
| Eolian And Sabkha | 0.85 | 0.5 | 1.5 | Variable |
| Hofufu Dam Hadrukh | 1.83 | 1.17 | 1.87 | 150 |
| Damman | 3.11 | 1.86 | 2.28 | 200 |
| Rus Anhydrite | 4.26 | 2.47 | 2.28 | 90 |
| Um Er Radhuma | 3.31 | 1.97 | 2.02 | 250 |
| Aruma | 2.73 | 1.67 | 2.09 | 160 |
| Wasia | 3.23 | 2.14 | 2.27 | 230 |
| Shuaiba | 3.01 | 1.51 | 2.03 | 100 |
| Biyadh Sulay | 4.04 | 2.7 | 2.36 | 320 |
| Hith Anhydrite | 4.75 | 2.72 | 1.87 | 100 |
| Arab Jubaila | 5.94 | 3.04 | 2.74 | 170 |
| Hanifa Tuwaiq Mountain | 4.9 | 2.8 | 2.45 | 310 |
| Druma | 5.03 | 2.86 | 2.45 | 330 |
| Marrat | 5.67 | 3.74 | 2.47 | 160 |
| Minjur | 5.15 | 2.76 | 2.4 | 200 |
| Jilh | 4.82 | 2.76 | 2.4 | 300 |
| Sudair | 5.18 | 2.67 | 2.7 | 140 |
| Khuff | 4.95 | 2.53 | 2.4 | 400 |
| Unayzah | 3.75 | 2.08 | 2.4 | 100 |
| Qusaiba | 3.76 | 2.5 | 2.35 | 300 |
| Qasim | 4.19 | 2.14 | 2.48 | 400 |
| Saq | 3.68 | 2.45 | 2.38 | 400 |
| Precambrian Basement | 6.38 | 2.45 | 2.8 | Infinite |

The values listed in Tables 1 and 2 may be obtained by various types of well logging. For example, rock density and strata velocities can be measured by seismic logging and ultrasonic logging, porosity can be measured by compensated neutron logging data, and the Young's, bulk and shear moduli can be calculated from the velocity, porosity and density measurements. (See Boonyasatphan, P. "Reservoir Characterization For Unconventional Resource Potential, Pitsanulok Basin, Onshore Thailand", 2017, https://mountainscholar.org/bitstream/handle/11124/171012/Boonyasatphan_mines-0052N_11268.pdf?sequence=1, incorporated herein by reference in its entirety).

Figure 3:
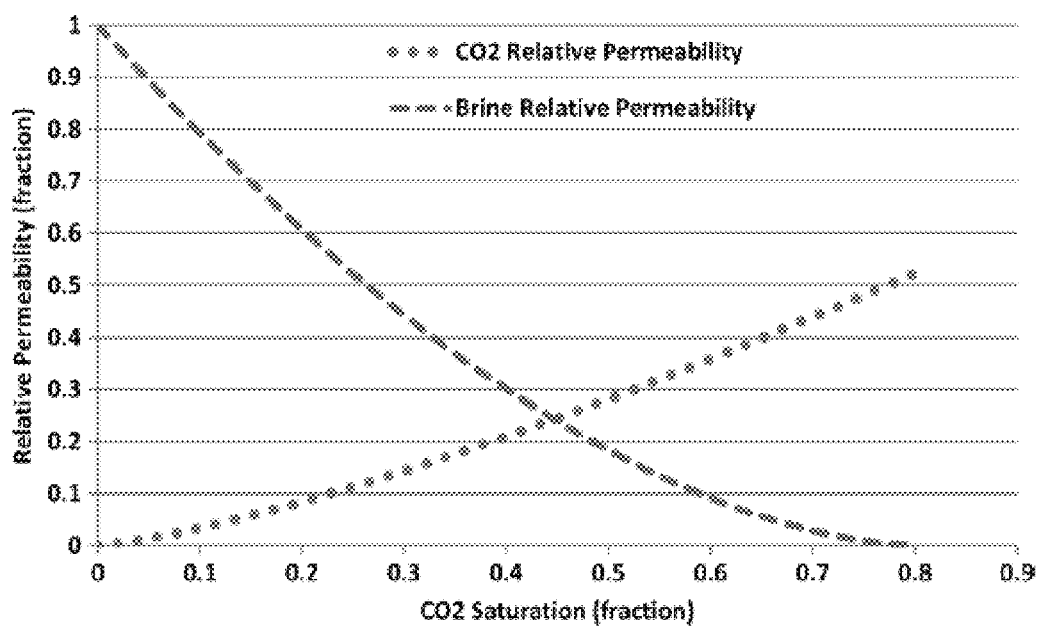
FIG. 3 is a graph illustrating the relative permeability curves for $CO_2$ injection into Biyadh reservoir.
Figure 4:
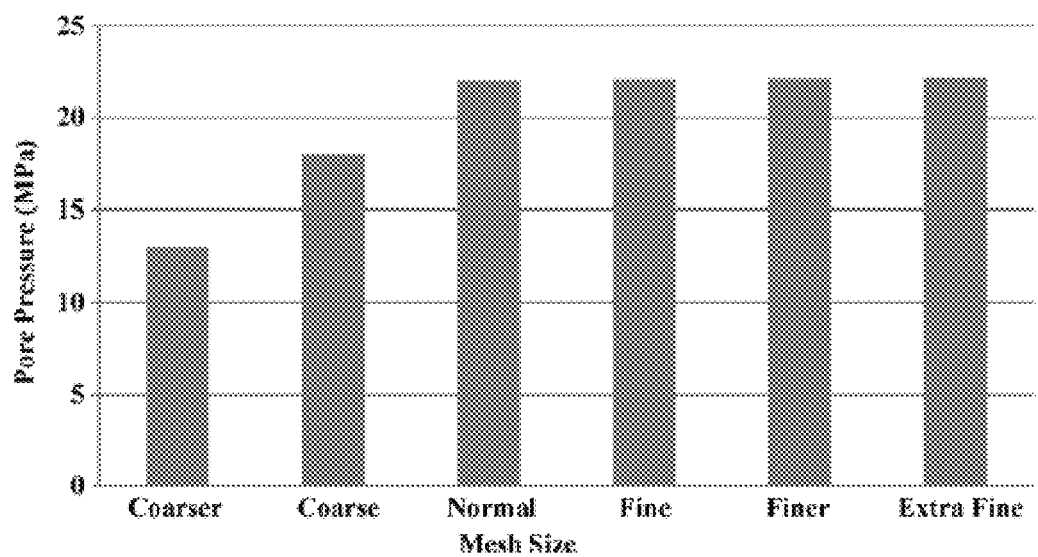
FIG. 4 is a graph illustrating the mesh size dependence of pore pressure buildup during carbon dioxide injection.

$CO_2$ is injected into a water-filled medium in the Biyadh reservoir. As carbon dioxide is injected into the reservoir, it displaces the water in the pores and increases the gas saturation in the vicinity of the injection port. The relative permeability curves take into account the reservoir's pressure, temperature, and brine salinity. During the flow of a wetting and non-wetting phase in a reservoir rock, the path followed by each phase is different. The two phases are distributed based on their wetting characteristics which results in wetting and non-wetting phase-relative permeability curves. (See Bennion B, Bachu S (2005) "Relative permeability characteristics for supercritical $CO_2$ displacing water in a variety of potential sequestration zones". In SPE Annual Technical Conference and Exhibition. Society of Petroleum Engineers; and Bennion B, Bachu S (2006) "Dependence on temperature, pressure, and salinity of the IFT and relative permeability displacement characteristics of $CO_2$ injected in deep saline aquifers". In SPE Annual Technical Conference and Exhibition, each incorporated herein by reference in their entirety). These curves are shown in FIG. 3. The mesh dependency is shown in FIG. 4. The solution was shown to converge to constant value as the grid density was increased beyond the normal grid size, which was consequently adopted in the numerical modeling.

The model incorporates the variation in reservoir pore pressure variation with $CO_2$ injection as shown below.

Figure 5A:
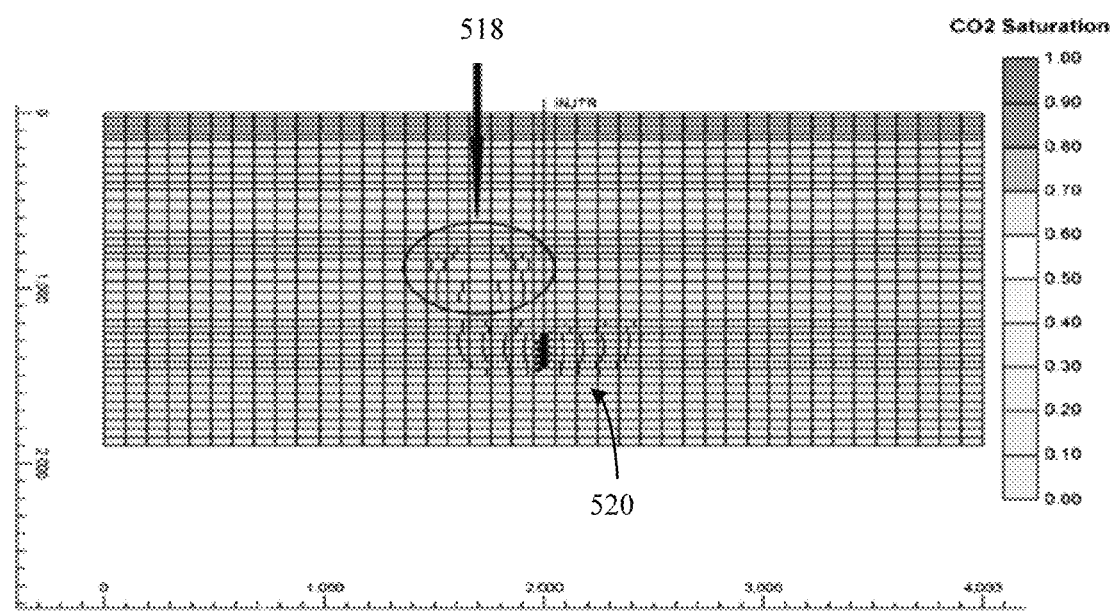
FIGS. 5A and 5B illustrate the carbon dioxide saturation in A. fractured caprock and B. non-fractured caprock.
Figure 5B:
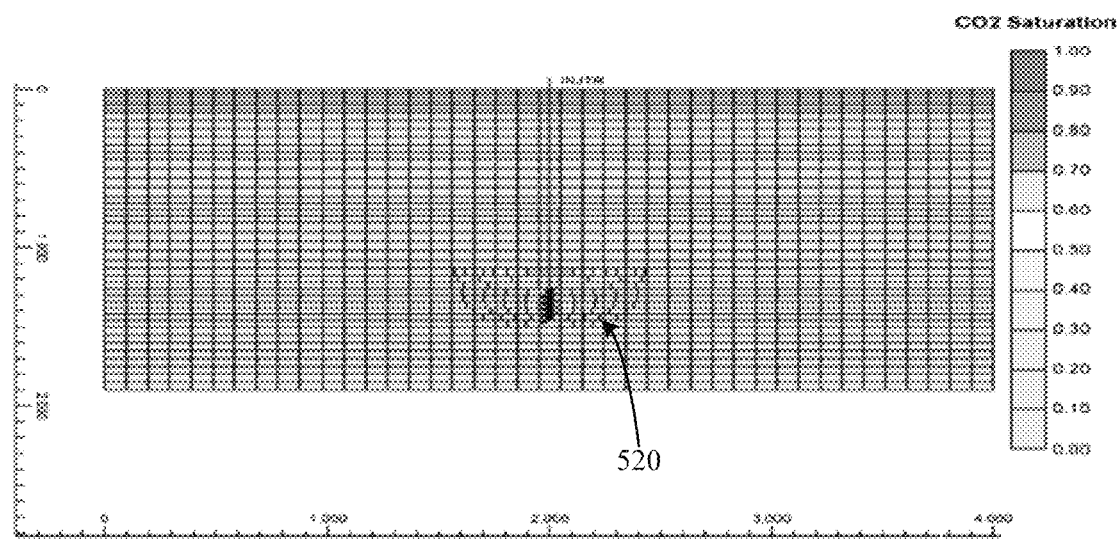

In order to investigate the effect of fracture on the pressure response in the reservoir, a fractured zone was created in the caprock, by assigning a large value of permeability to the grid blocks at a distance of 200 m from the injection well. The transport of carbon dioxide to the overburden layers is restricted by the impermeable caprock. The simulation results of carbon dioxide saturation are shown for the cases of fractured (FIG. 5A) and non-fractured caprock (FIG. 5B). For the case of non-fractured caprock, carbon dioxide was shown to have been restricted by the caprock to spread only within the reservoir, whereas for the case of fractured caprock, the carbon dioxide leaked into the overburden layers. As shown in FIG. 5A, the injection of carbon dioxide into the reservoir at 520 tends to increase the pore pressure in the reservoir, thus opening the already existing fractures in the caprock. When the fractures in the caprock open up, carbon dioxide leaks to the overburden layers 518. In the case of non-fractured caprock shown in FIG. 5B, the injection of carbon dioxide tends to increase the pore pressure in the reservoir but spreads only within the reservoir.

Figure 6A:
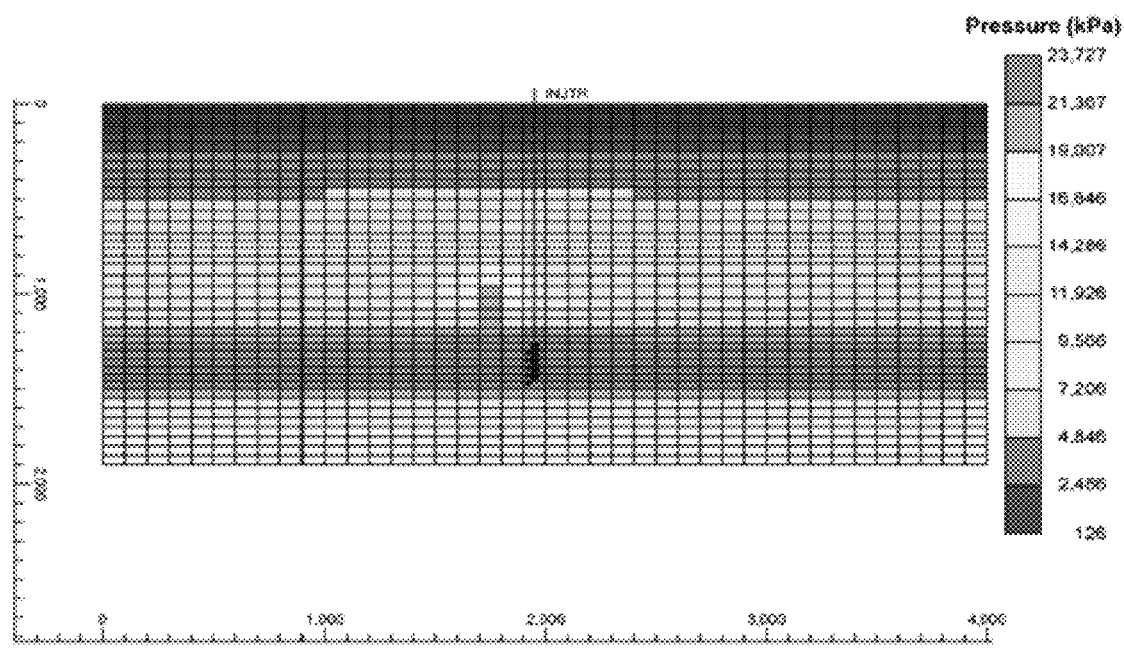
FIGS. 6A and 6B illustrate the reservoir pressure response during $CO_2$ injection for A. fractured caprock and B. non-fractured caprock.

The effect of carbon dioxide leakage can be seen in the pressure response of the reservoir. The pressure response of the reservoir is shown for the fractured (FIG. 6A) and non-fractured (FIG. 6B) caprocks. The injection increases the pore pressure in the reservoir, which reaches values above that in the other geological layers. It can be seen in FIG. 6A that the injection of carbon dioxide for 10 years has opened a fracture in the caprock and leaked pressurized carbon dioxide into the overburden layers. The pore pressure attained higher values at the point of leakage in the overburden layers, and therefore, influences the pore pressure buildup. In the case of non-fractured caprock shown in FIG. 6B, the injection increased the pore pressure mainly in the injection reservoir. It can be seen that the pressure buildup is relatively lower in the fractured caprock, because of the leakage of the pressurized carbon dioxide into the overburden layers. This leakage results in an increase of the local pore pressure.

Figure 7A:
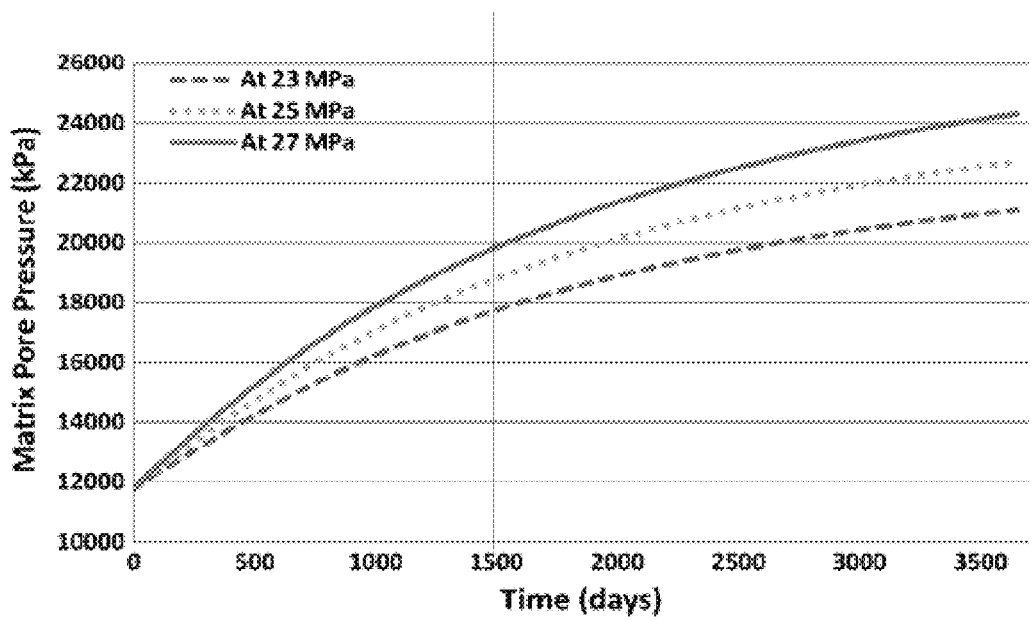
FIGS. 7A and 7B are graphs illustrating the pore pressure variation for 10-year of $CO_2$ injection period at various injection pressures for A. fractured caprock and B. non-fractured caprock.
Figure 7B:
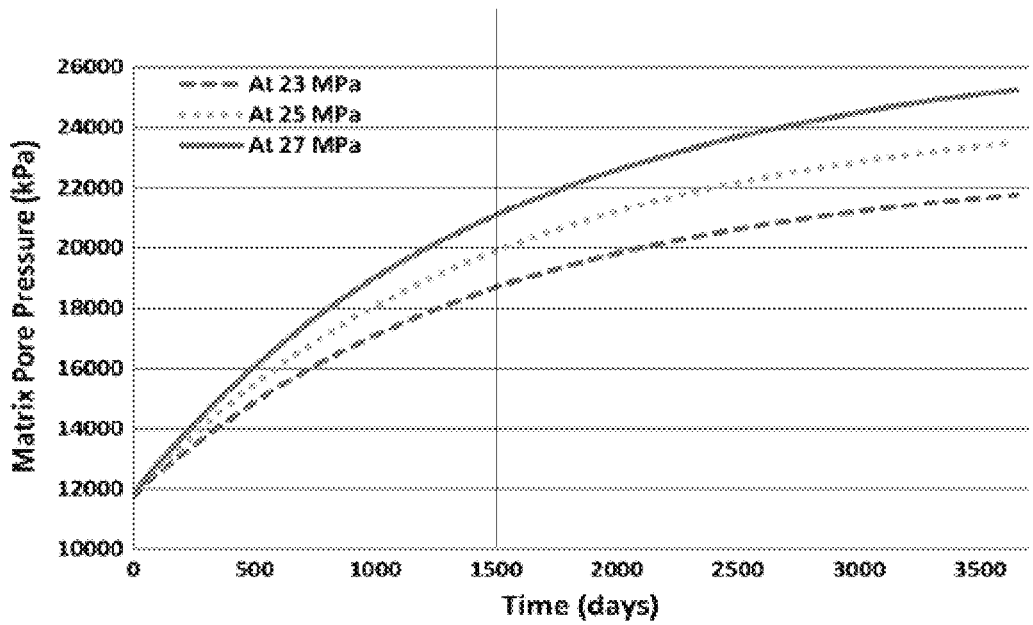

The pore pressure increase due to injection for the 10-year period is shown in FIG. 7A, 7B. The injection pressure was varied in the range of 23-27 MPa for both fractured (FIG. 7A) and non-fractured cases (FIG. 7B). As shown in FIG. 7A, 7B, the carbon dioxide injection pressure has a considerable effect on the pore pressure buildup in the reservoir. For example, at 1500 days, the pore pressure in the fractured well of FIG. 7A is about 20K kPa. For the same term, the pore pressure in the non-fractured well of FIG. 7B is about 21K kPa, as the $CO_2$ has not leaked. The magnitude of pore pressure increases with an increase in the value of the injection pressure. The spread of carbon dioxide in the reservoir is dependent on the pressure difference between the injected carbon dioxide and reservoir pressure. It is therefore recommended to first calculate the maximum possible safe value for the injection pressure for the reservoir before starting injection.

Figure 8:
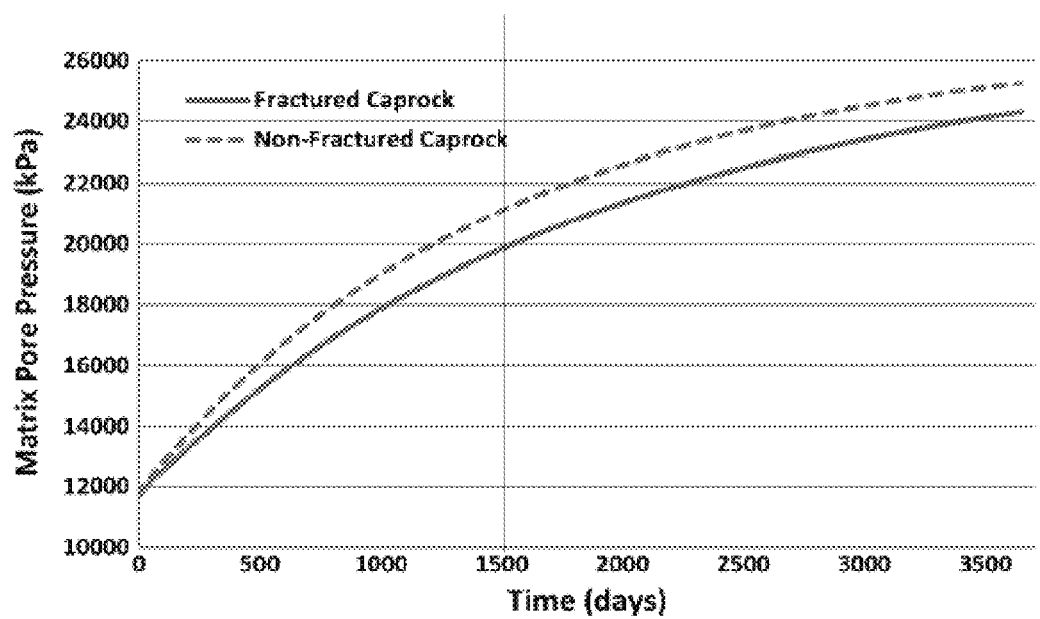
FIG. 8 is a graph illustrating the pore pressure variation for the 10-year $CO_2$ injection period at an injection pressure of 27 MPa for fractured and non-fractured caprocks.

The pore pressure buildup in the reservoir at an injection pressure of 27 MPa is shown in FIG. 8 for both fractured (solid line) and non-fractured caprocks (dotted line). The pore pressure build up is about 1000 kPa higher for the non-fractured caprock than for the fractured caprock, indication that the non-fractured caprock is not leaking $CO_2$.

Figure 9A:
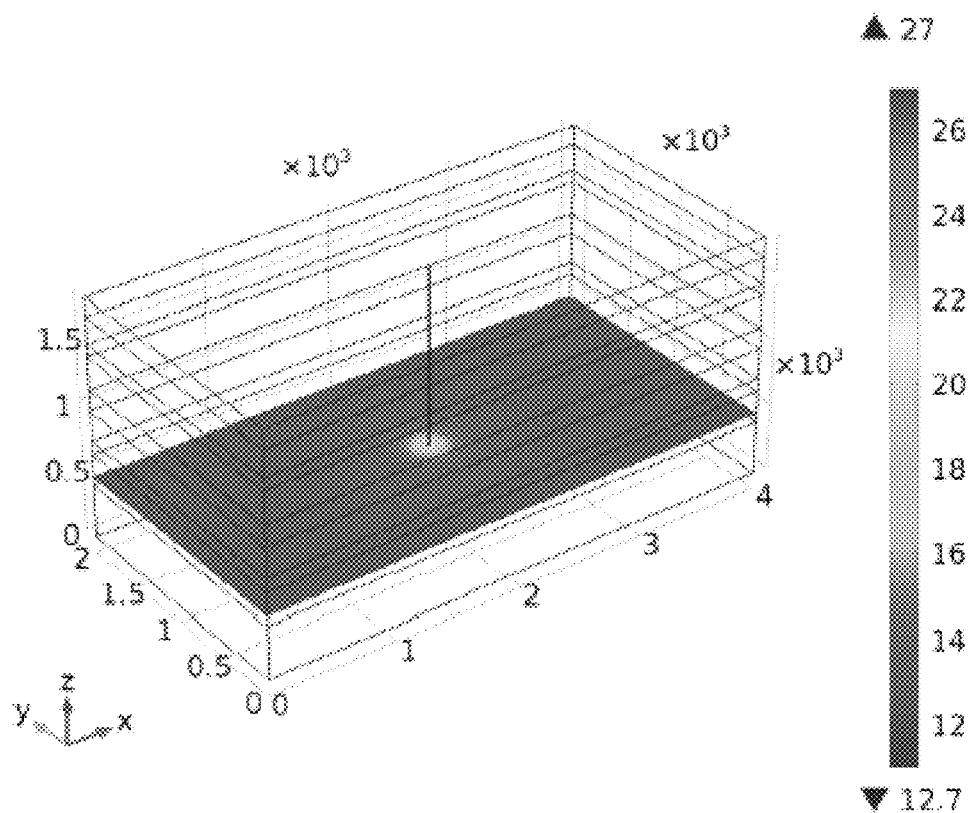
FIGS. 9A-9C illustrate the reservoir pressure response during $CO_2$ injection for A. after 2 years, B. after 6 years, and C. after 10 years.
Figure 9B:
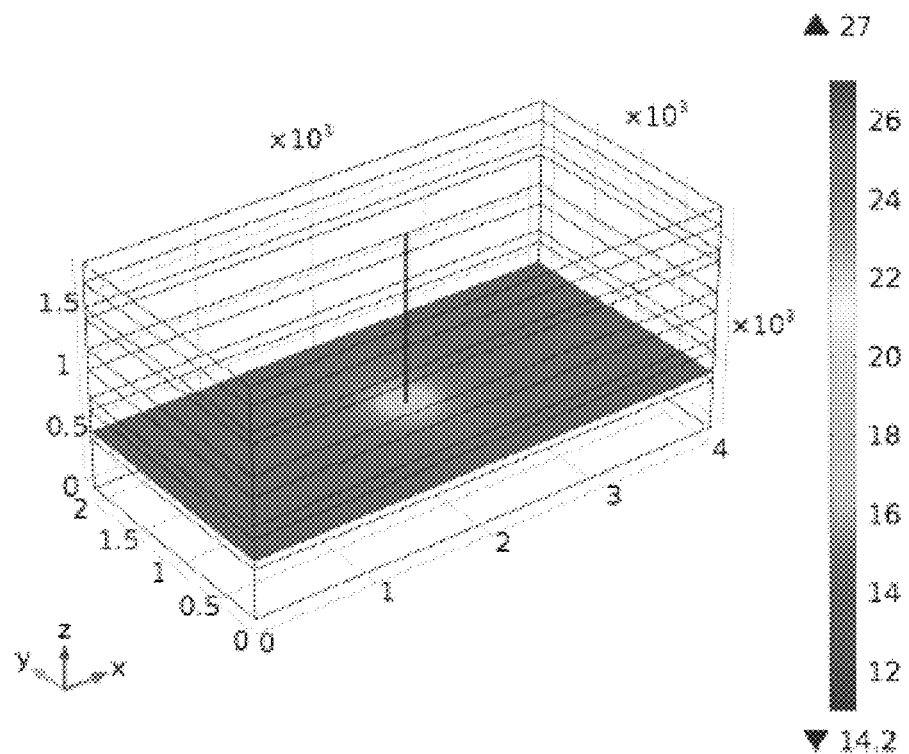
Figure 9C:
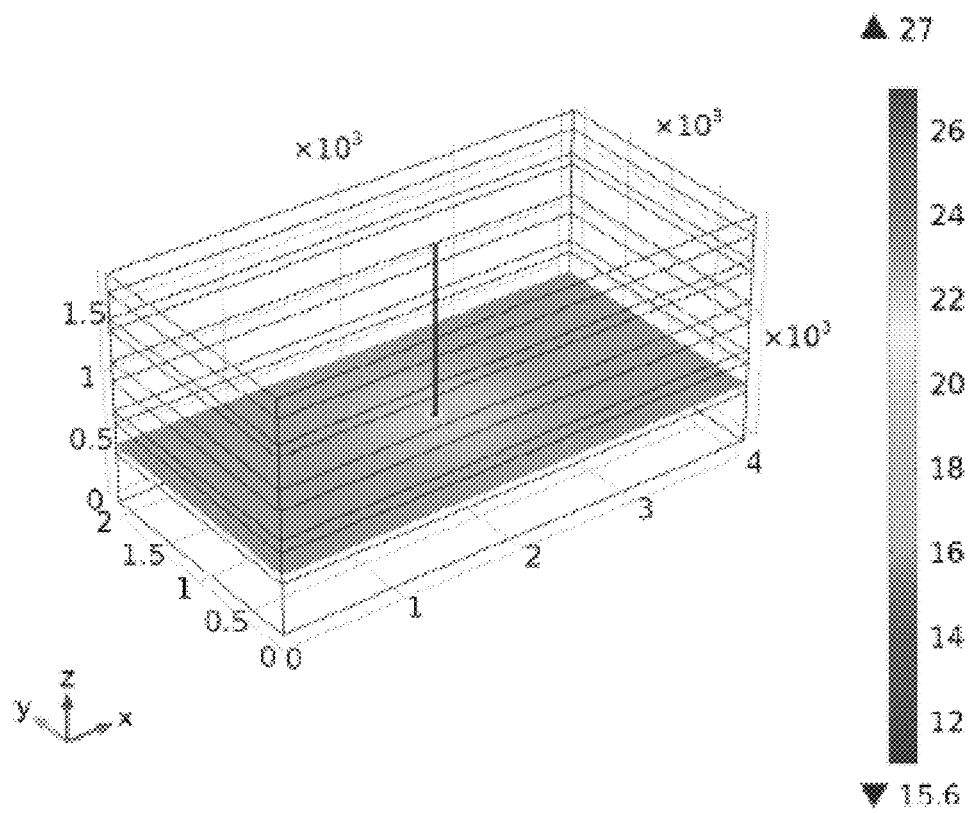
Figure 10:
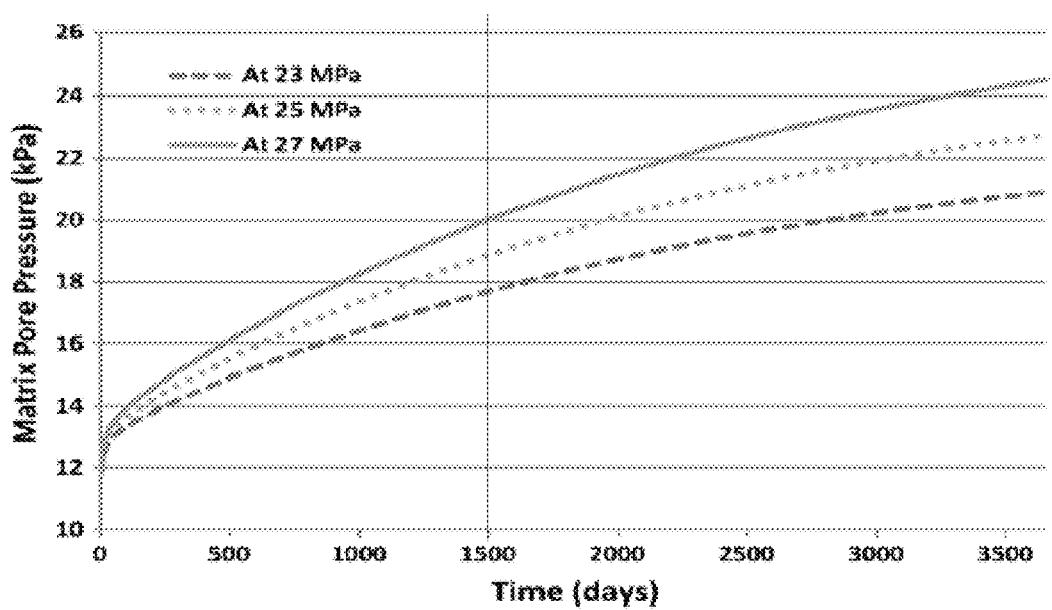
FIG. 10 illustrates the reservoir pressure response at various injection pressures during $CO_2$ injection.

For non-fractured caprock, the pressure response of the reservoir is shown in FIGS. 9A-C and FIG. 10. FIG. 9A illustrates the reservoir pressure response from $CO_2$ injection after 2 years. FIG. 9B shows the reservoir pressure response from $CO_2$ injection after 6 years and FIG. 9C illustrates the reservoir pressure response from $CO_2$ injection after 10 years. FIG. 10 is a graph showing the reservoir pressure response at various injection pressures during $CO_2$ injection. The pressure response obtained using the COMSOL multiphysics software was in good agreement with the results of the CMG-GEM software, for the same injection and reservoir parameters.

Figure 11A:
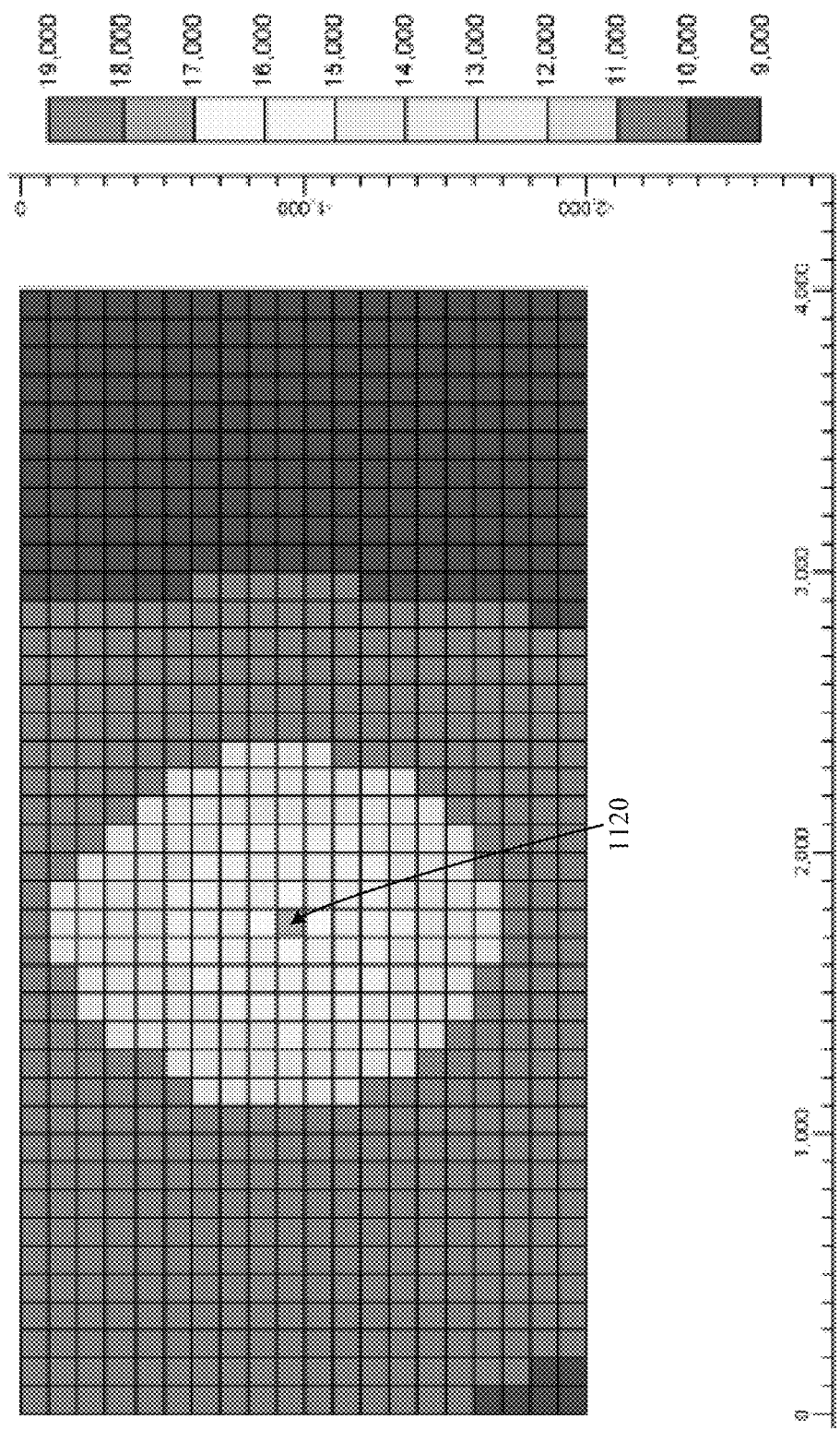
FIGS. 11A-11C illustrate the pore pressure in Wasia overburden layer for a fractured zone spaced from the injection well A. at 200 m, B. at 400 m, and C. at 600 m.
Figure 11B:
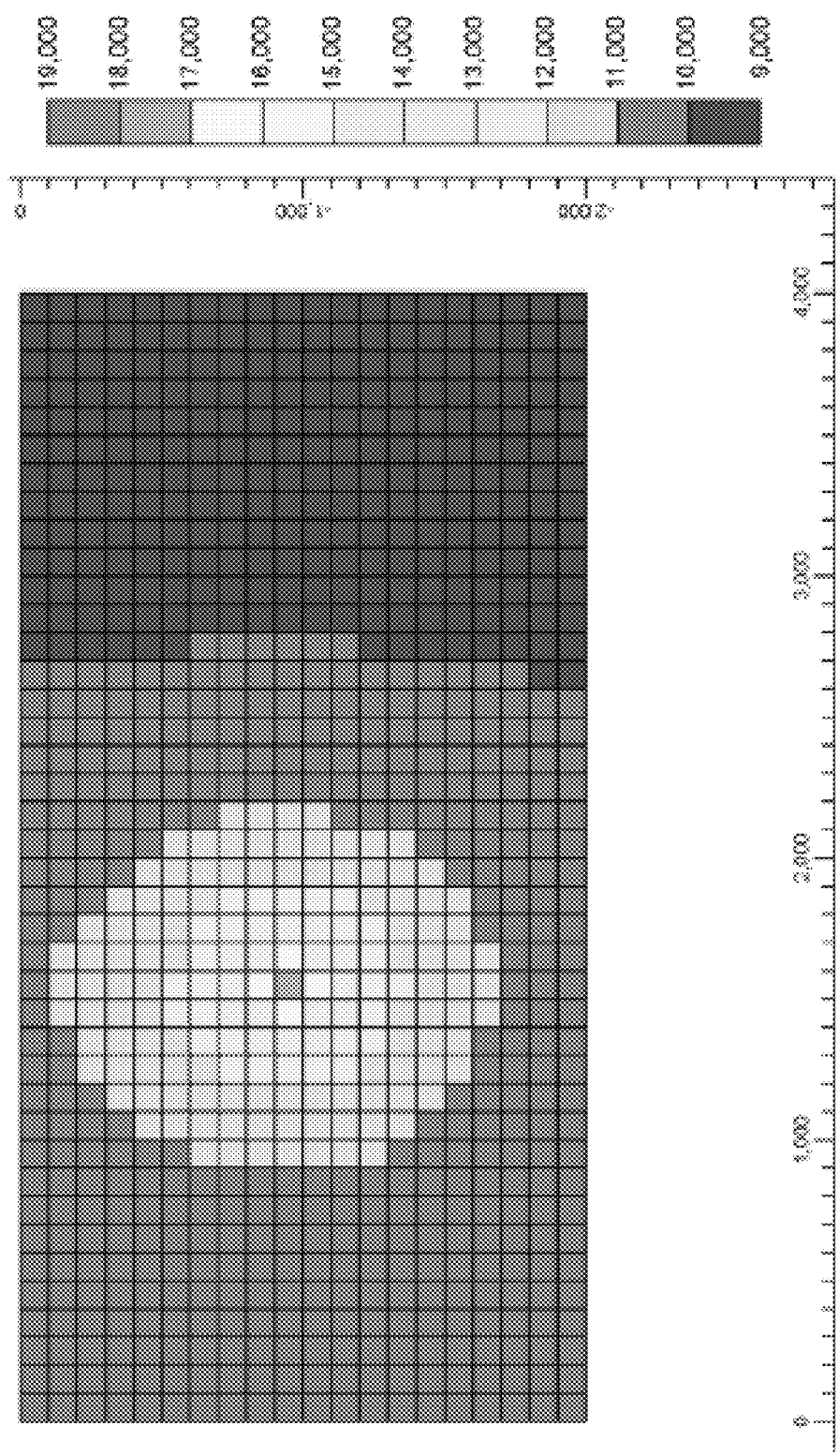
Figure 11C:
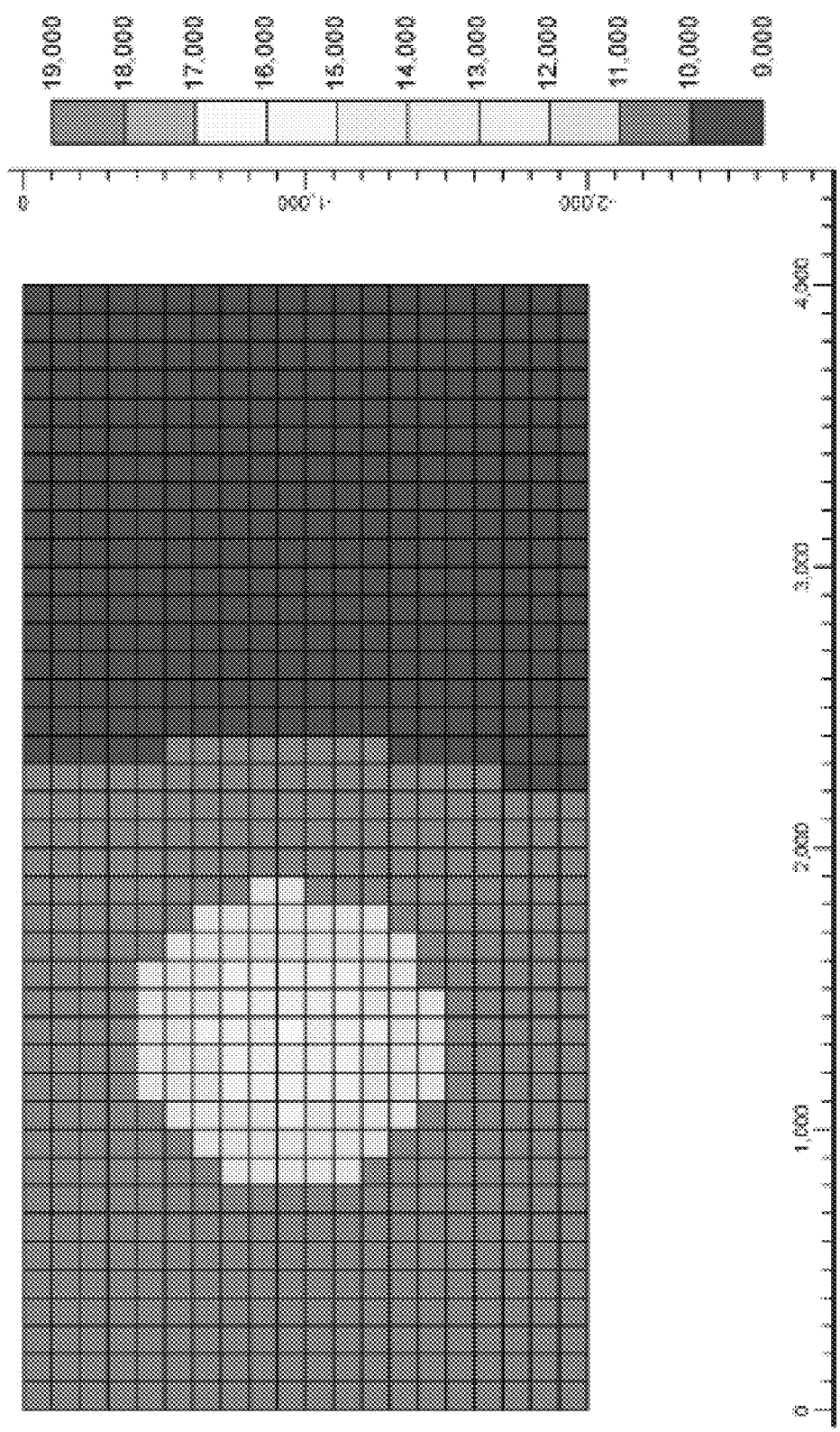

The effect of the location of the fracture zone in the caprock on the pore pressure in the overburden layers was determined. The magnitude of the pore pressure in the Wasia overburden layer above the caprock is shown in FIG. 11A, B, C for a fractured zone at the distances of 200 (FIG. 11A), 400 (FIG. 11B), and 600 m (FIG. 11C) from the injection well. As the carbon dioxide starts spreading in the reservoir, the reservoir pore pressure starts to increase, with its distribution having a maximum value near the injection point 1120. The highly pressurized carbon dioxide will leak first into fractures that are closer to the injection point. The leaked highly pressurized carbon dioxide results in pore pressure buildup in the overburden layers. It can be observed that the magnitude of the pore pressure reaches relatively higher values as the fractured zone gets closer to the injection well.

The methods of the present disclosure predict ground uplift during $CO_2$ injection as described below.

Figure 12A:
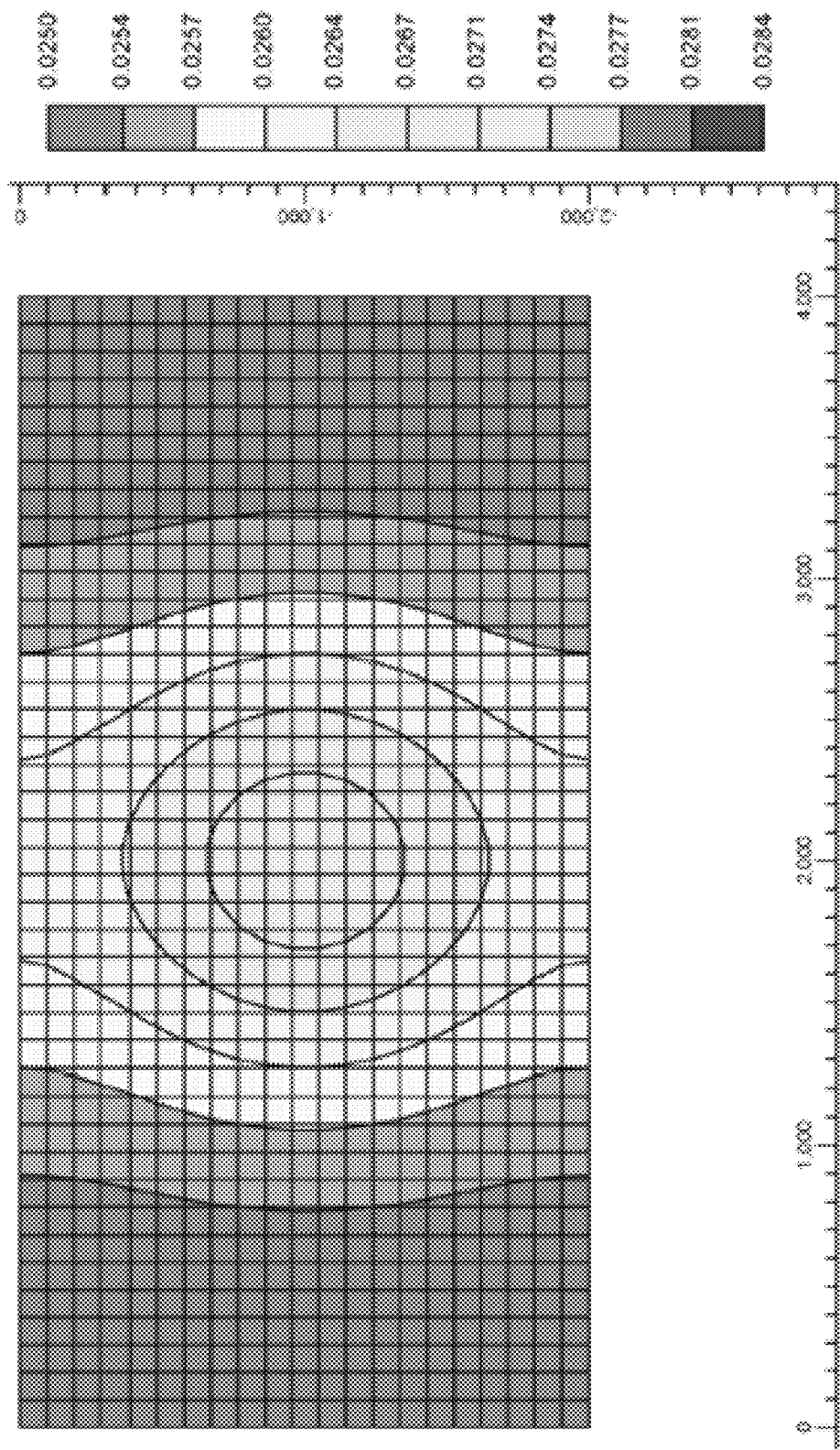
FIGS. 12A and 12B illustrate the ground uplift for A. non-fractured caprock and B. fracture at 200 m from the injection well.
Figure 12B:
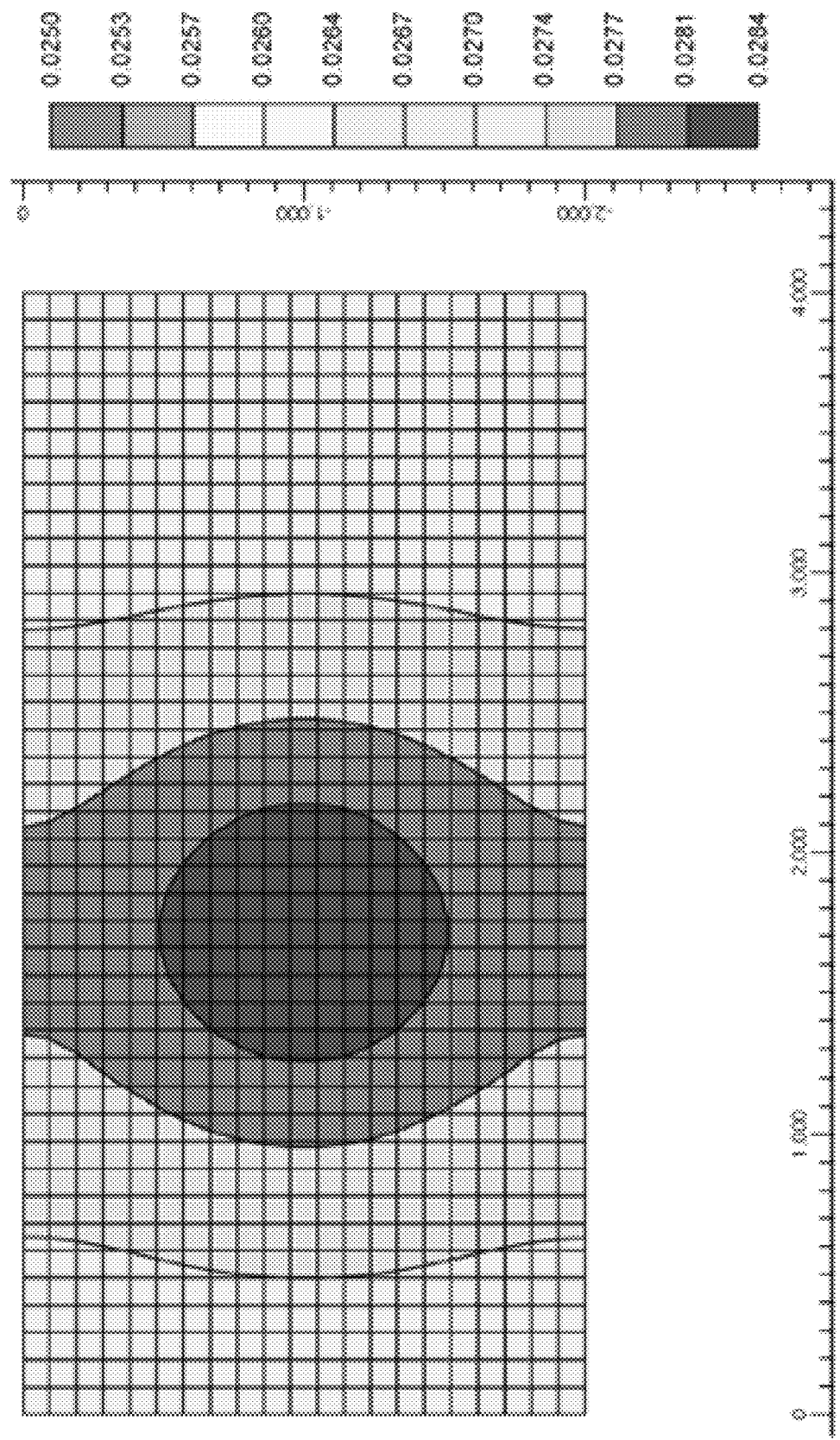
Figure 13A:
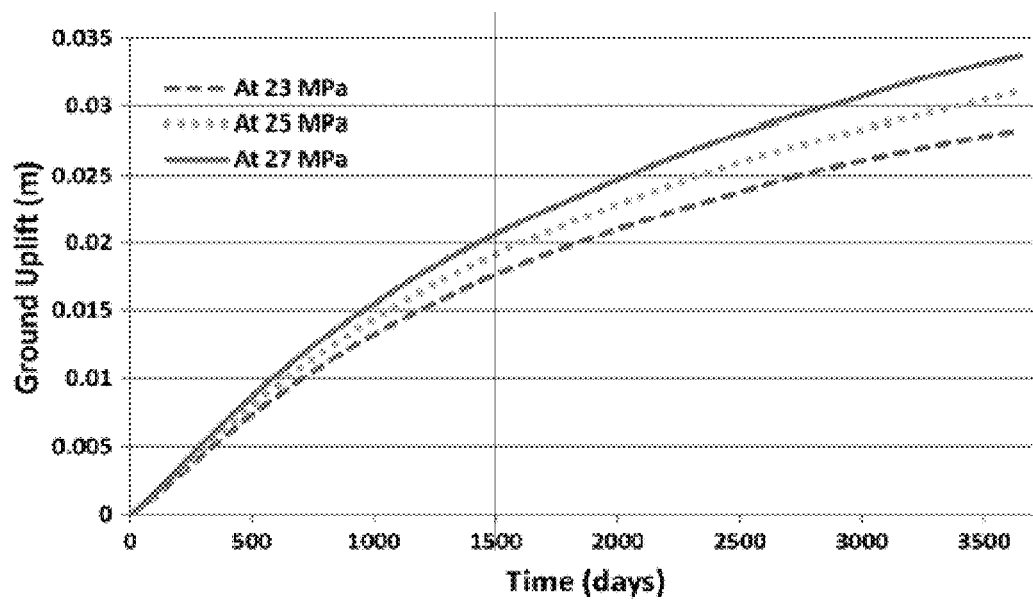
FIGS. 13A and 13B illustrate the ground vertical displacement during $CO_2$ injection for the 10-year injection period at different injection pressures for A. fractured caprock and B. non-fractured caprock.
Figure 13B:
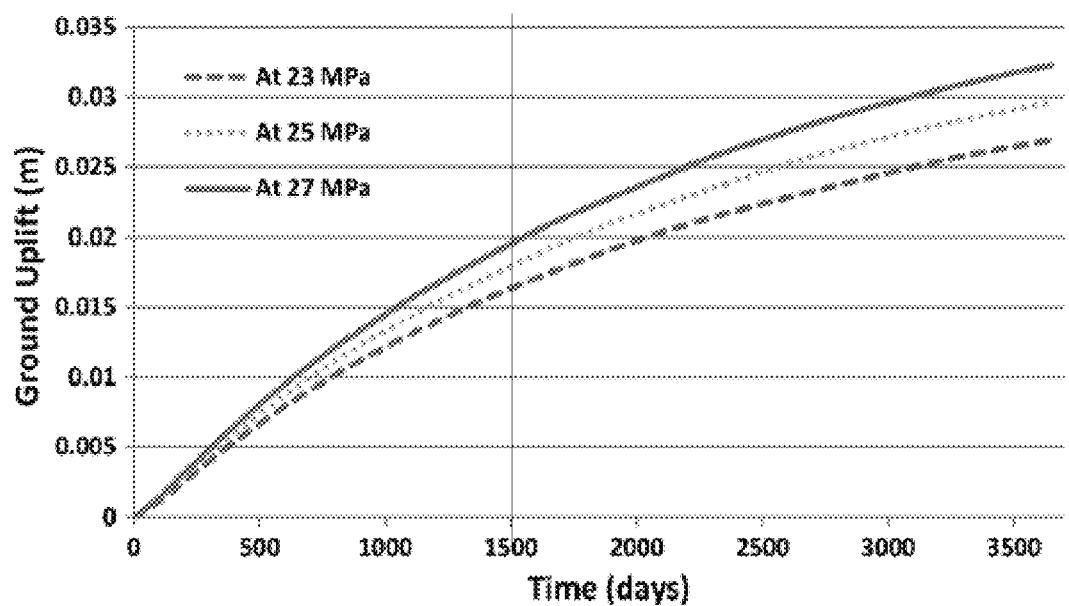

The increase in the pore pressure results in the deformation of the reservoir, thus causing vertical ground uplift. The vertical ground displacement can be calculated from the geo-mechanical module in the CMG-GEM. For both cases of the fractured and non-fractured caprocks, the vertical ground displacement was calculated for the 10-year injection period at different injection pressures. In FIG. 12A, it can be seen that for the case of the non-fractured caprock, the ground vertical displacement attains higher values just above the injection point at the center of the reservoir. However, it is interesting to note that, for the case of fractured caprock, shown in FIG. 12B, the ground vertical displacement is centered above the fractured zone. In the case of the fractured caprock, as the pressurized carbon dioxide is leaked into the overburden layers, their volumetric expansion becomes higher at the point of leakage, which causes the ground vertical displacement to be higher above this point. It is important to state that the increase in the ground vertical displacement just above the fractured zone helps in identifying the location of the fractured zone in the caprock. The increase in the pore pressure gives rise to higher values of the ground uplift, as depicted in FIG. 13A, 13B. FIG. 13A illustrates ground vertical displacement during CO2 injection for the 10-year injection period at different injection pressures in fractured caprock and FIG. 13B illustrates ground vertical displacement during CO2 injection for the 10-year injection period at different injection pressures in non-fractured caprock. The excessive ground uplift can cause damage to the surrounding infrastructure, and any carbon dioxide leakage may affect environmental air quality.

Figure 14A:
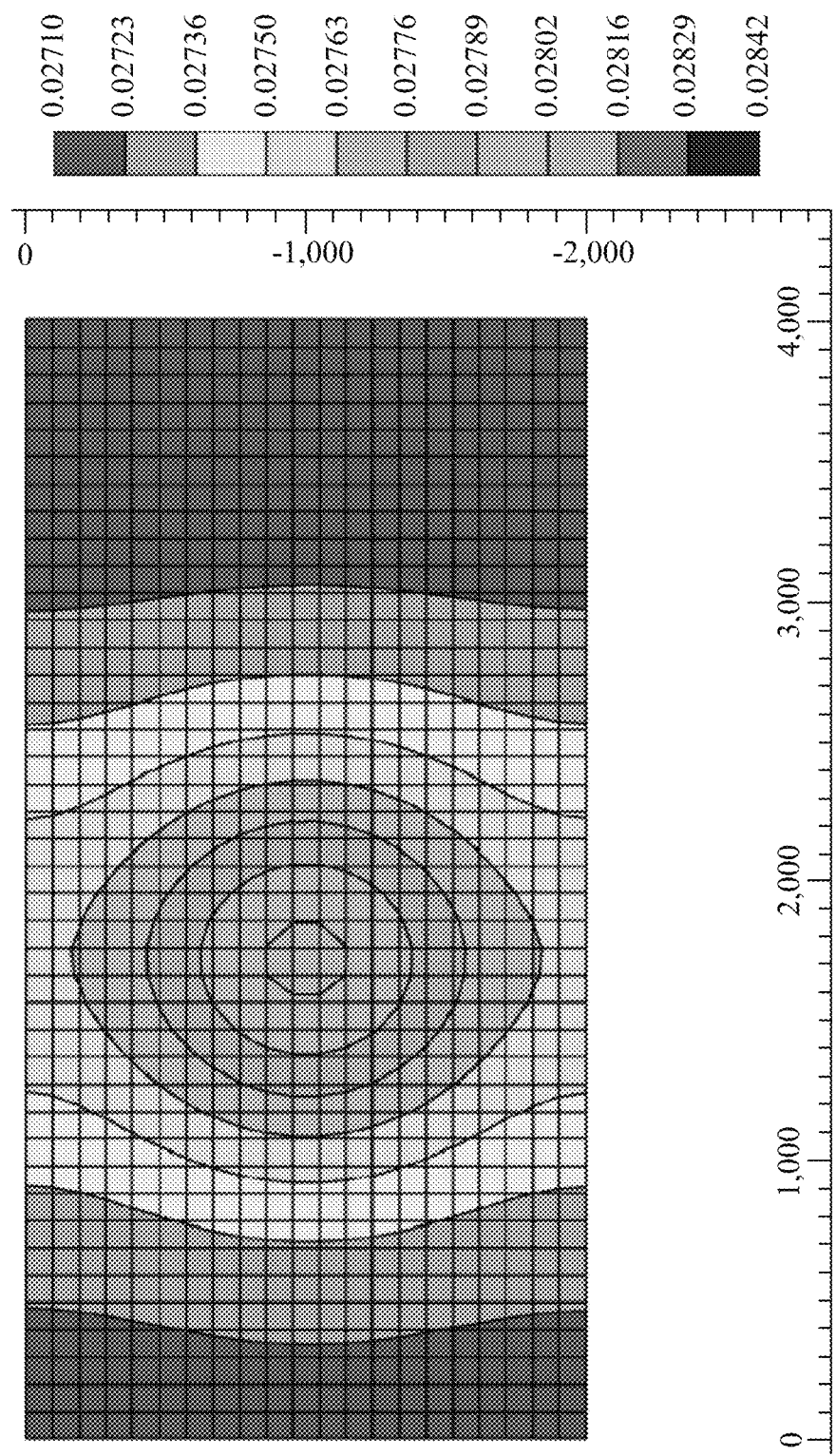
FIGS. 14A-14D illustrate the influence of fractured zone permeability on vertical ground uplift for A. 1 mDarcy, B. 25 mDarcy, C. 50 mDarcy, and D. 100 mDarcy.
Figure 14B:
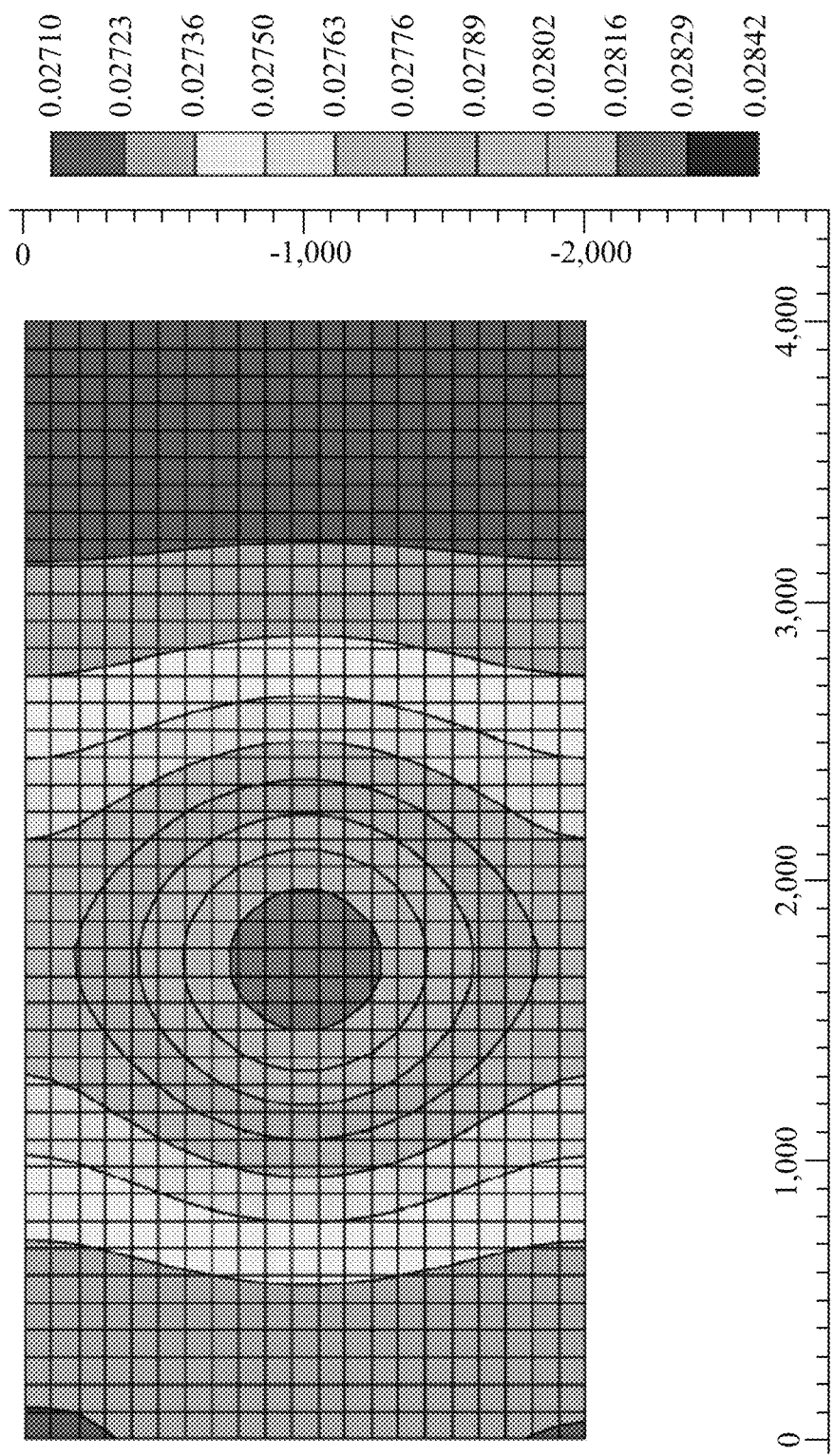
Figure 14C:
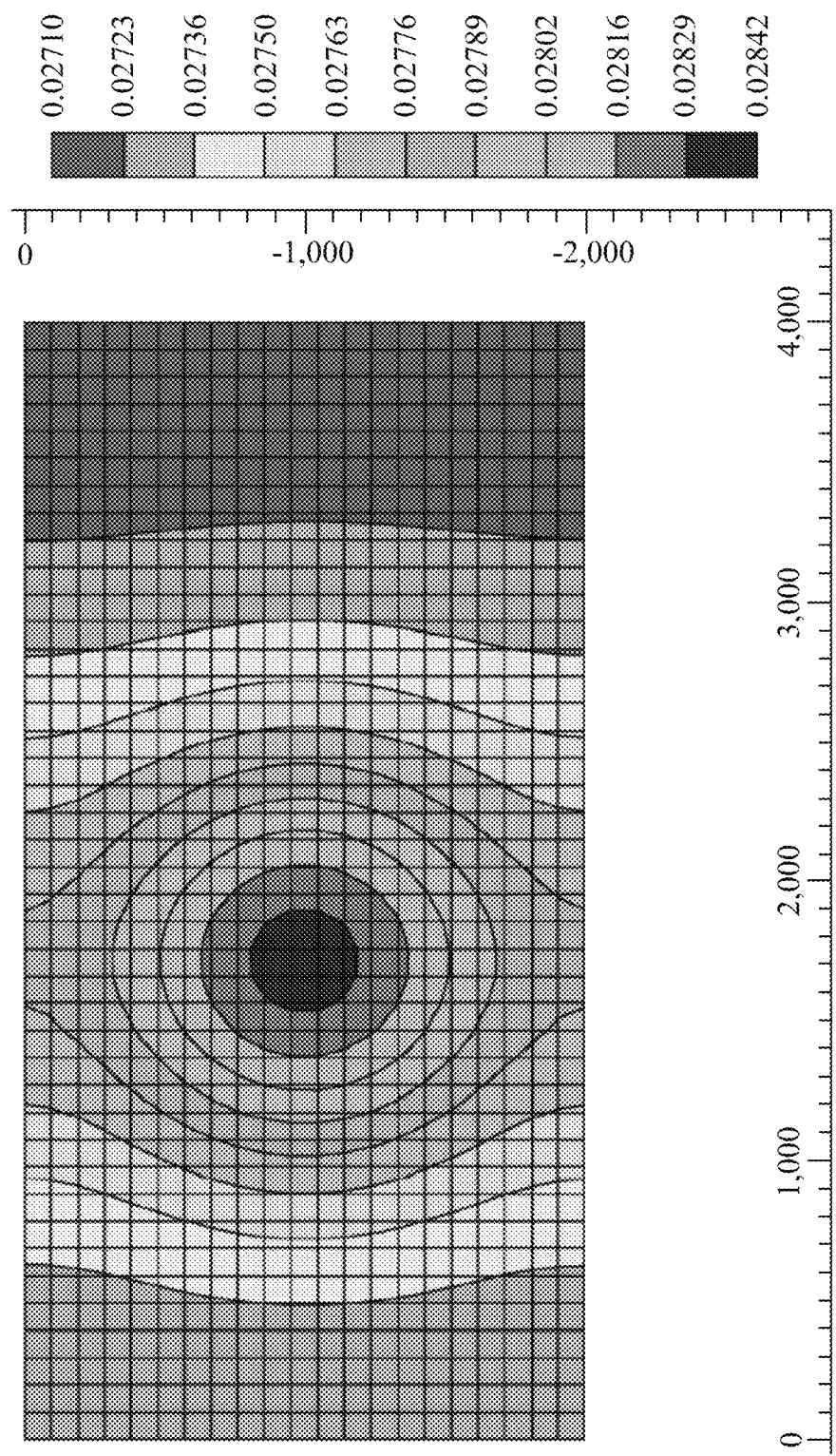
Figure 14D:
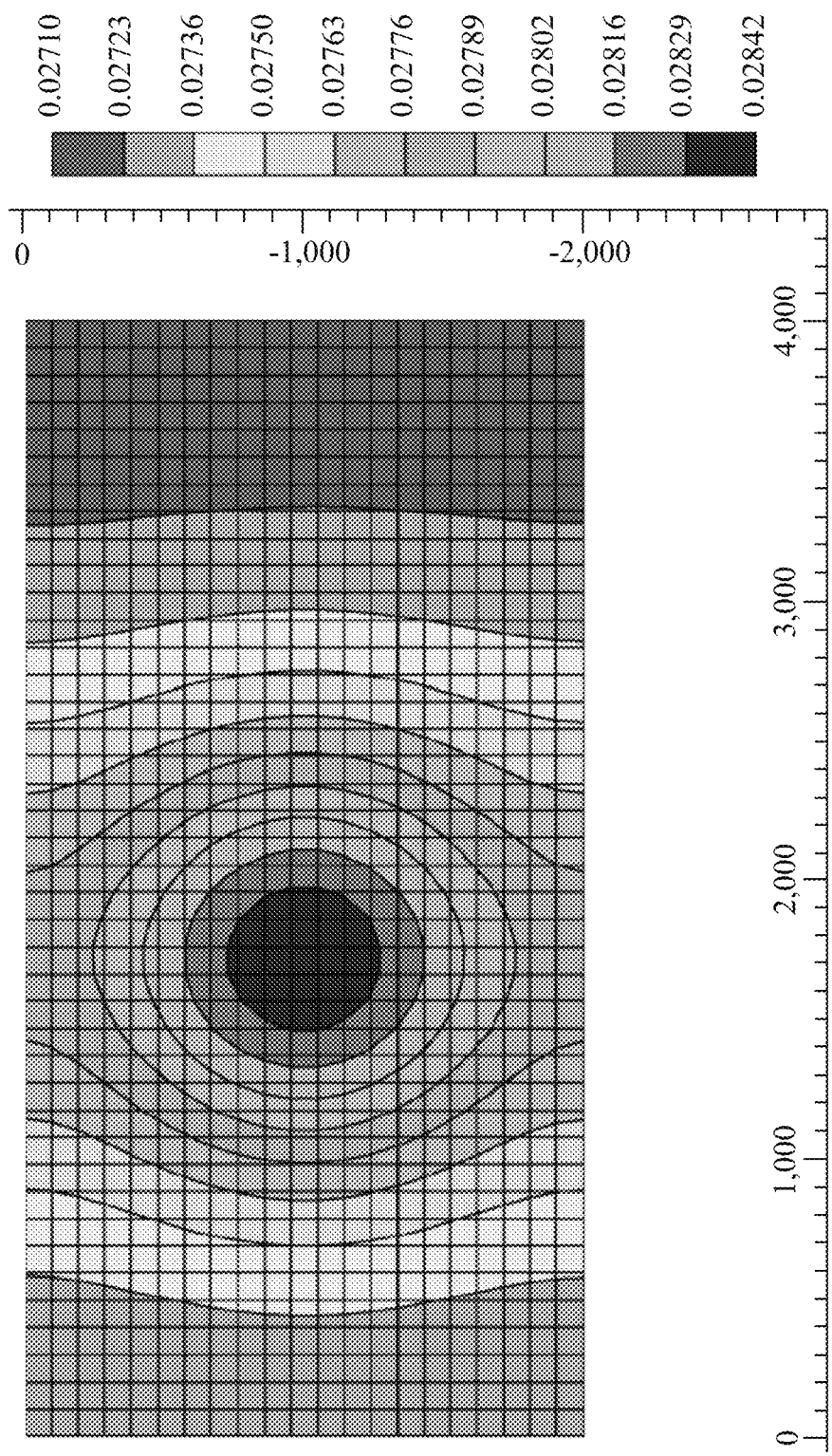

Permeability measures the ability of fluids to flow through rock (or other porous media). A Darcy is a permeability unit which is widely used in petroleum engineering and geology and has dimensional units of length. A medium with a permeability of 1 Darcy permits a flow of 1 $cm^3/s$ of a fluid with viscosity 1 cP (1 mPa·s) under a pressure gradient of 1 atm/cm acting across an area of 1 $cm^2$. Typical values of permeability range as high as 100,000 Darcys for gravel, to less than 0.01 microDarcy for granite. Sand has a permeability of approximately 1 Darcy. The Darcy is defined using Darcy's law, which can be written as:

$$Q = \frac{Ak\Delta P}{\mu \Delta x} \quad (16)$$

where:
Q is the volumetric fluid flow rough the medium:
A is the area of the medium
k is the permeability of the medium
μ is the: dynamic viscosity of the fluid
ΔP is the applied pressure difference
Δx is the thickness of the medium There is a relationship between fractured zone permeability and the amount of carbon dioxide leakage to the overburden layers and consequently on the vertical ground uplift. To evaluate the effect of fracture permeability on the vertical ground displacement, a fracture zone in the caprock at 200 m was considered. The influence of fractured zone permeability on the vertical ground uplift is shown in FIG. 14A-14D, in which the vertical ground displacement above the fractured zone decreases as the permeability of the fractured zone is decreased. This is shown in FIG. 14A for 1 milliDarcy, in FIG. 14B for 25 milliDarcy, in FIG. 14C for 50 milliDarcy, and in FIG. 14D for 100 milliDarcy.

Figure 15A:
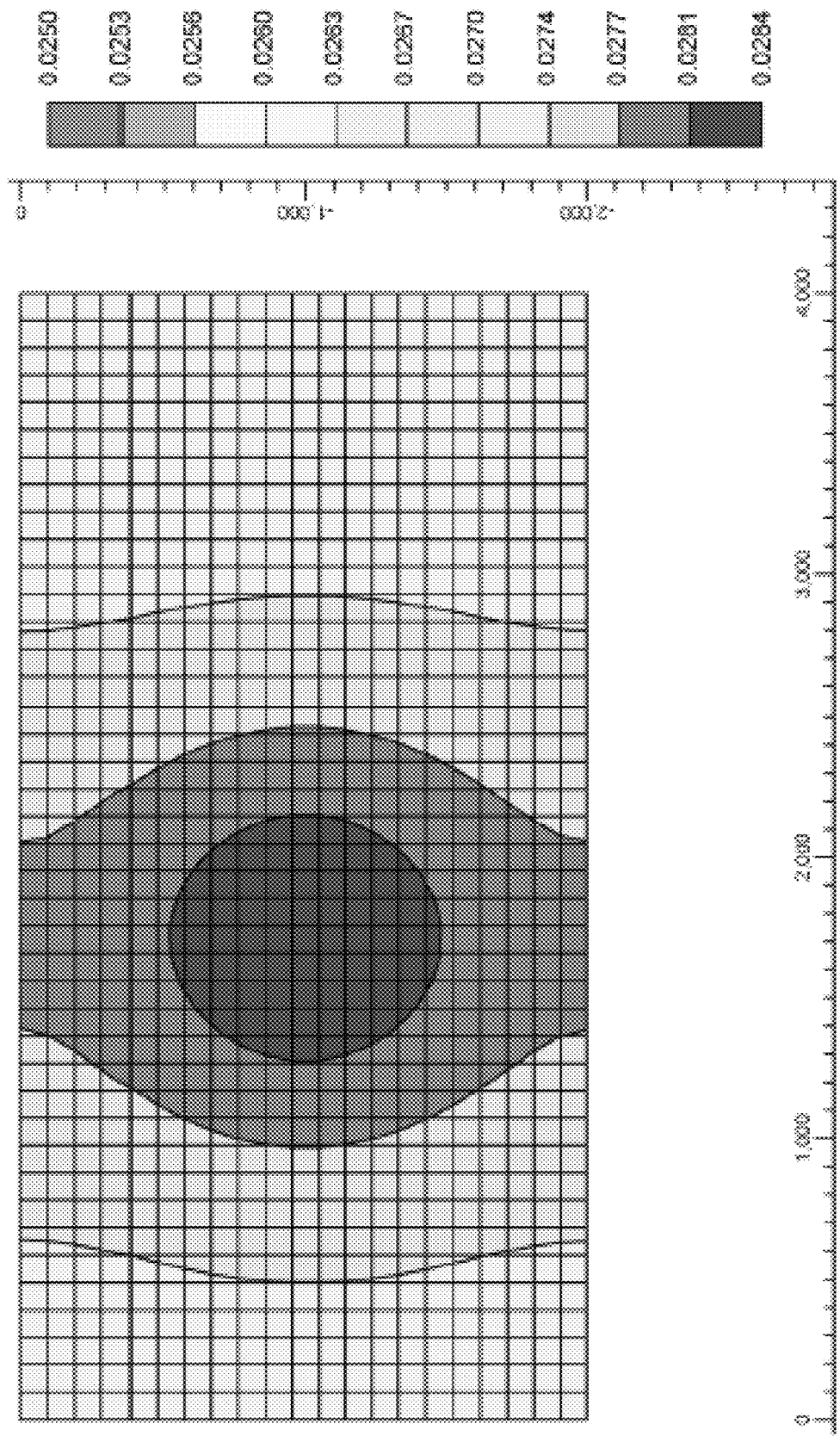
FIGS. 15A-15C illustrate the ground uplift for a fractured zone spaced from the injection well A. at 200 m, B. at 400 m, and C. Aa 600 m.
Figure 15B:
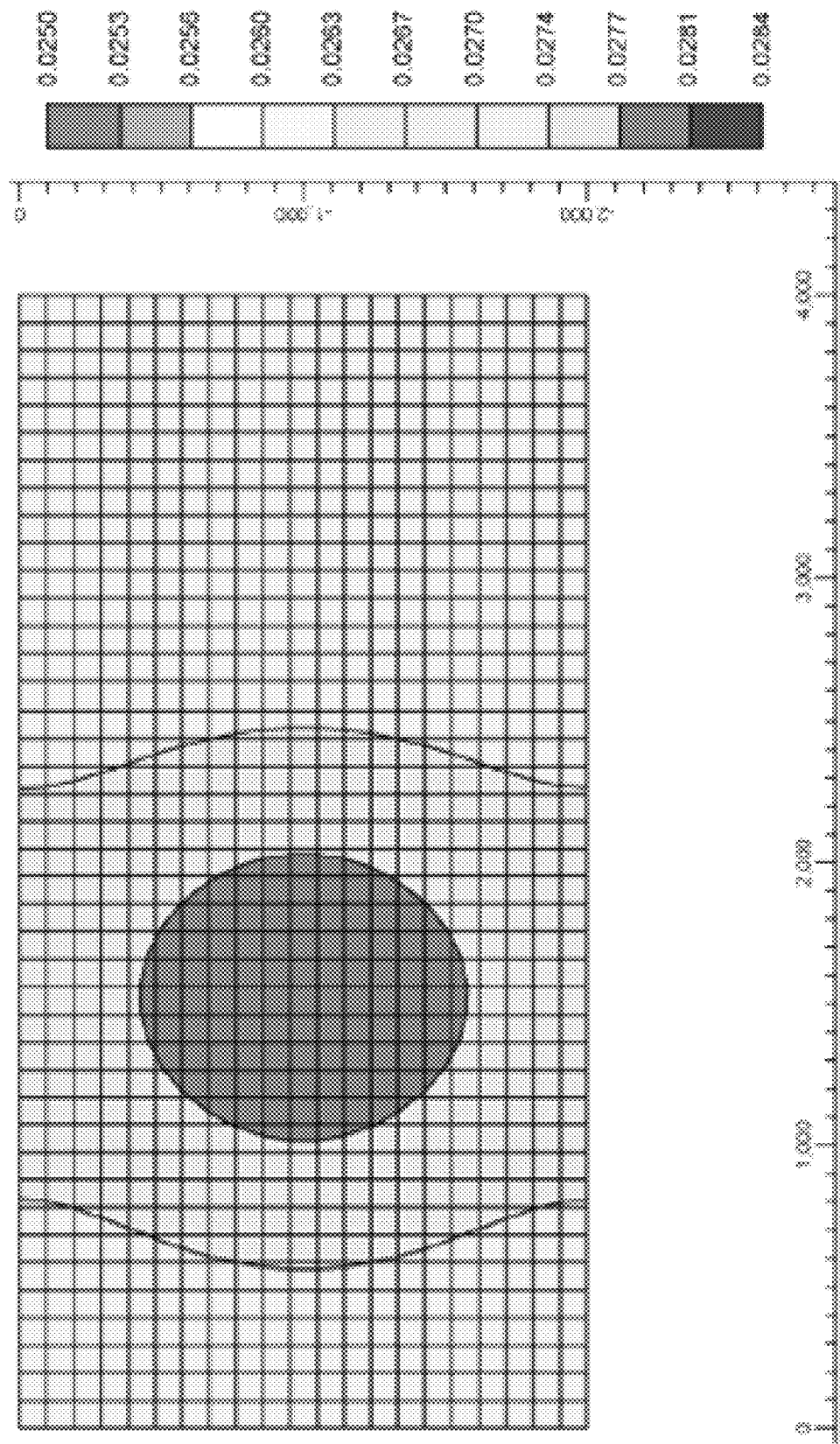
Figure 15C:
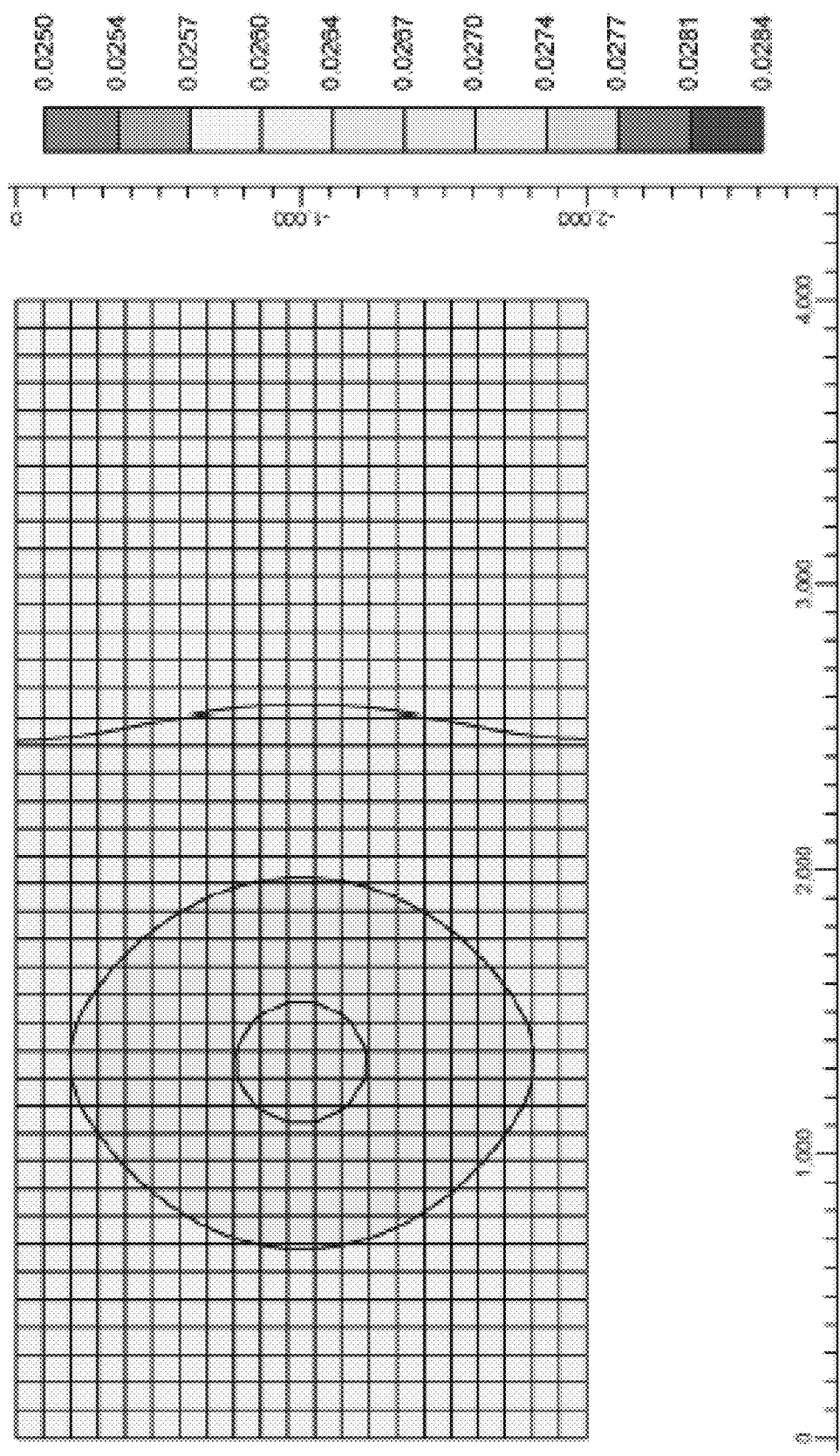
Figure 16:
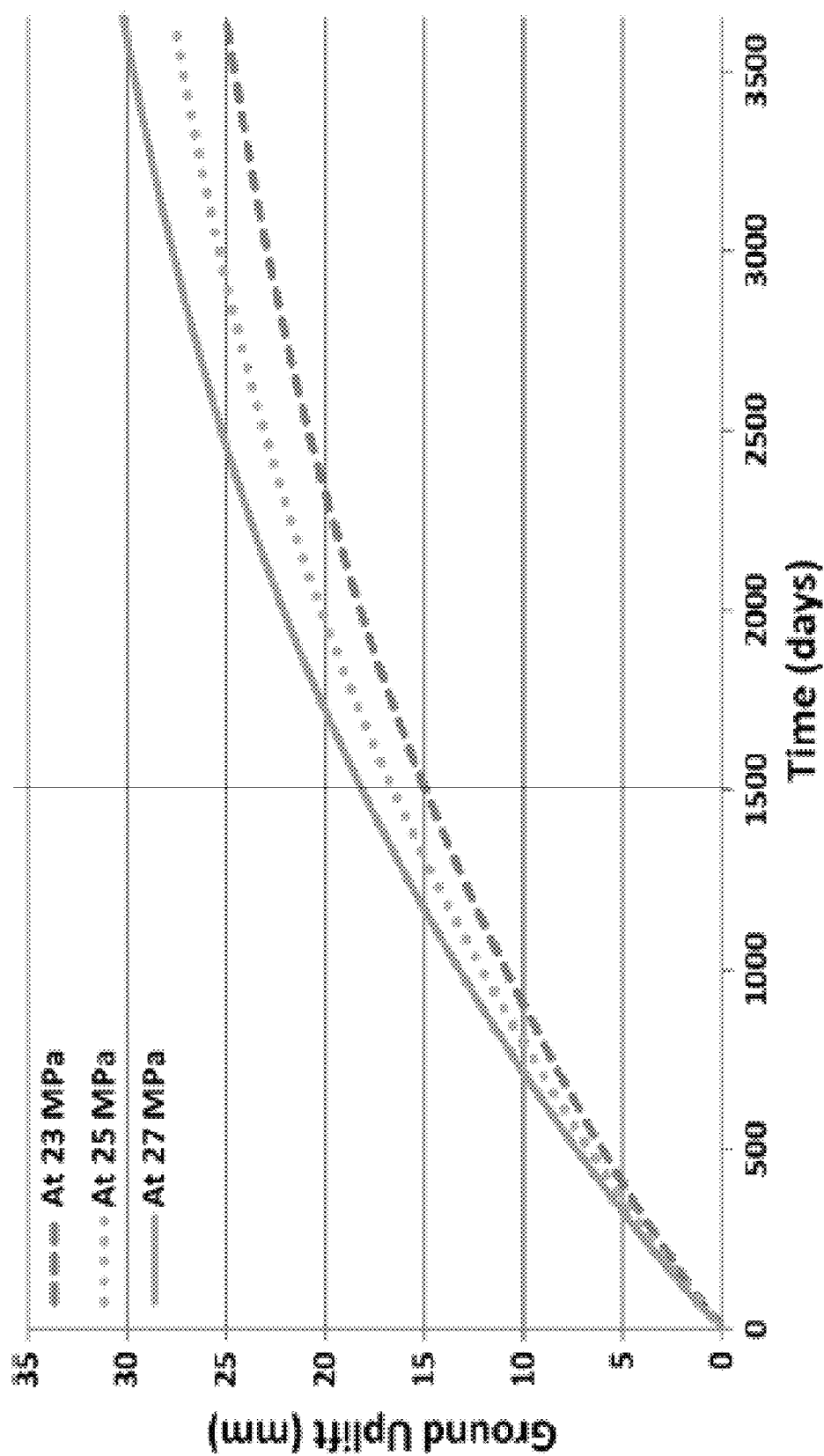
FIG. 16 is a graph illustrating the ground uplift during $CO_2$ injection for the 10-year injection period at different injection pressures.

At lower values of the permeability, less carbon dioxide leaks to the overburden layers and subsequently less pore pressure in the overburden layers. The lower pore pressure buildup corresponds to a smaller magnitude of ground uplift above the leakage point. Accordingly, the permeability of the reservoir and the initial permeability of the fracture zone should be considered before carbon dioxide is injected. If the permeability of the fractured zone is high, it is recommended to select another suitable location for injection, either with no fractured zone or with a fractured zone of low permeability. Furthermore, one must examine the effect of the fracture zone location in the caprock on the vertical ground displacement. FIG. 15A-15C display the vertical ground displacement for a fractured zone located at 200 m (FIG. 15A), 400 m (FIG. 15B), and 600 m (FIG. 15C), sequentially from the injection well. It can be noted that the fracture zone spread is greater for a fracture zone at 200 m from the injection well as shown in FIG. 15A, than it is in either FIG. 15B or FIG. 15C. Additionally, the fracture zone spread is greater for the fracture at 400 m than it is at 600 m as shown by comparing FIG. 15B and FIG. 15C respectively. This result verifies that the magnitude of the pore pressure is higher when the fractured zone is closer to the injection well. Therefore, when injecting carbon dioxide into a fractured reservoir, it should be ascertained that the increase in the pore pressure and the decrease in the effective stresses do not open the fracture and cause carbon dioxide to leak through the overburden layers to the atmosphere, in order to prevent the stored carbon dioxide from entering potable water layers. For the case of non-fractured caprock, the ground uplift is shown in FIG. 16 at different injection pressures over a 10-year period. It is clear from the graph that the ground uplift after 1500 days is about 15 mm at 23 MPa injection pressure, (dashed line), about 16.5 mm at 25 MPa injection pressure (dotted line) and about 18 mm at 27 MPa injection pressure (solid line). The ground uplift obtained using COMSOL was found to be in good agreement with the ground uplift calculated by the CMG-GEM software for the same injection and reservoir parameters.

Figure 6B:
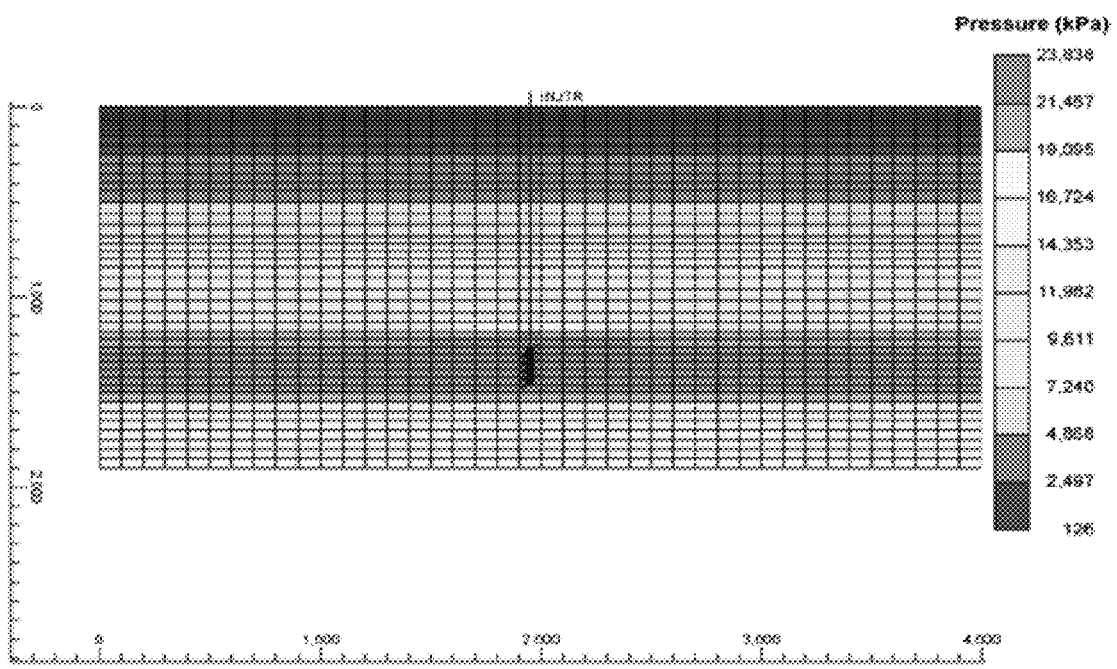

The model further incorporates a coupled stability analysis of the reservoir. In order to model the carbon dioxide injection into the Biyadh reservoir, the two-phase flow and geo-mechanical analyses are used to calculate the corresponding deformation of the reservoir. As shown in FIG. 6B, the pore pressure buildup assumes higher values in the case of the non-fractured caprock. The increase in the pore pressure is known to decreasethe effective stresses, which may lead to the failure of the reservoir structure if the pore pressure reaches a critical value. (See Streit J E, Hillis R R (2004) "Estimating fault stability and sustainable fluid pressures for underground storage of $CO_2$ in porous rock". Energy 29:1445-1456; Jtirgen ES, Siggins F A, Brian J E (2005) "Predicting and monitoring geo-mechanical effects of $CO_2$ injection. Carbon dioxide capture for storage in deep geologic formations". 2:751-766; Papanastasiou P, Thiercelin M (2011) "Modeling borehole perforation collapse with the capability of predicting the scale effect". Int J Geomech: 286-293. https://doi.org/10.1061/(ASCE)GM.1943-5622.0000013; and Poon-Hwei C (1992) "Stability analysis in geomechanics by linear programming. I: Formulation". Int J Geotech Geo Environ Eng. https://doi.org/10.1061/(ASCE)0733-9410(1992)118:11(1696), each incorporated herein by reference in their entirety). However, in the case of fractured caprock, the pressurized carbon dioxide leaks into the overburden layers, thus decreasing the pore pressure.

Figure 17A:
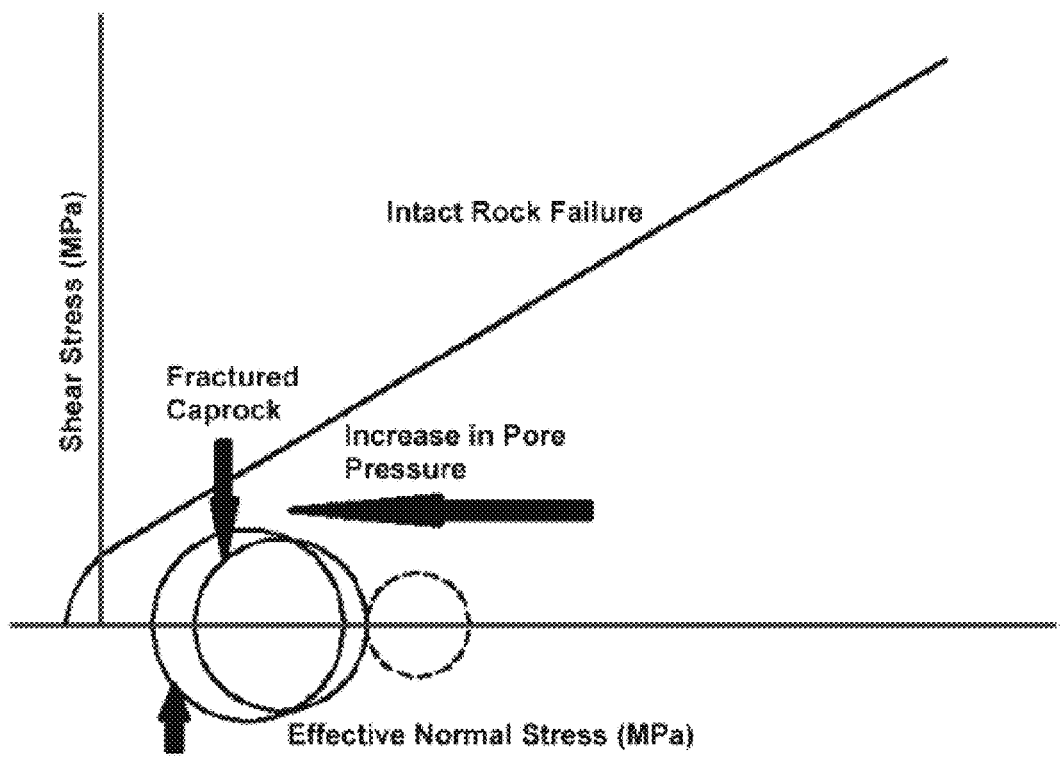
FIGS. 17A and 17B illustrate the stability of Biyadh reservoir during carbon dioxide injection. A. numerical modeling in CMG-GEM. B. numerical modeling in COMSOL Multiphysics.
Figure 17B:
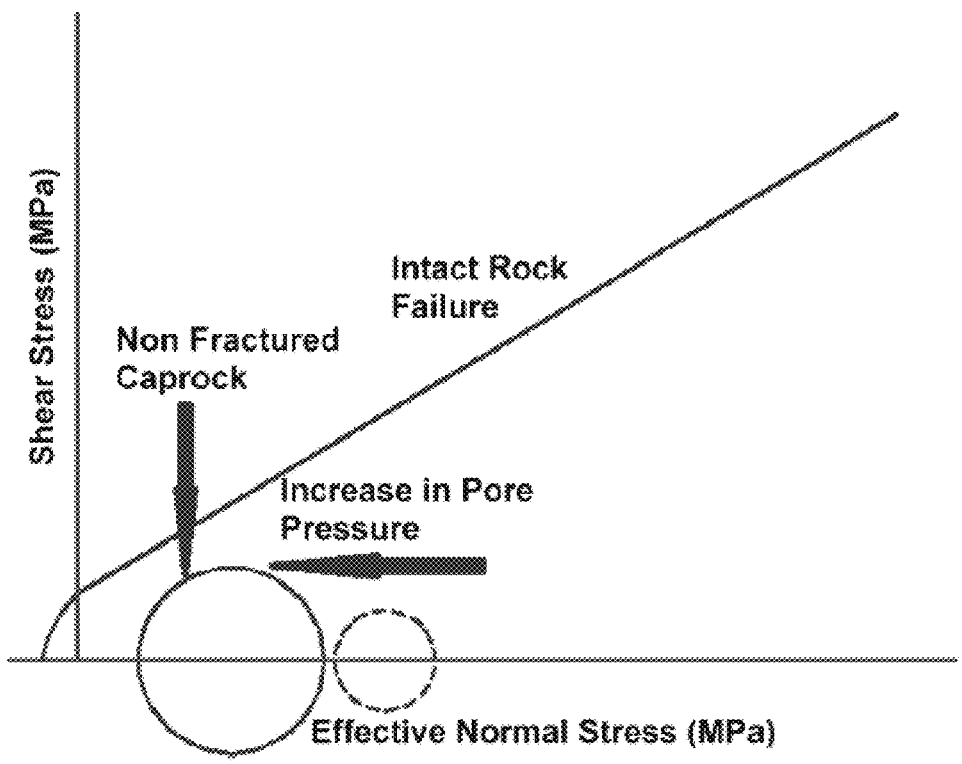

The Mohr-Coulomb failure criterion has been utilized to perform the coupled stability analysis of the reservoir during injection. As shown in FIG. 7A, 7B, the maximum pressure buildup in the reservoir was recorded at the injection pressure of 27 MPa. The stability analysis was performed using both CMG-GEM and COMSOL multiphysics software. The failure envelope of Biyadh reservoir is shown in FIG. 17A fractured caprock and in FIG. 17B for non-fractured caprock structures. The dotted circle in FIG. 17A, 17B shows the initial stressed conditions based on the following: the initial pore pressure of 11.9 MPa, the minimum principle stress of 29.63 MPa, and the maximum principle stress of 37.04 MPa. After 10 years of injection, the final stressed condition shown in FIG. 17A, 17B indicates that the pressure buildup in the case of fractured caprock is not high enough to cause failure of the reservoir. This is attributed to carbon dioxide leakage into the overburden layers, which limits the pressure buildup. Even for high values of pressure buildup in the case of non-fractured caprock, the reservoir is still safe for the 10-year injection period. As shown in FIG. 17A, 17B, the stability analyses performed using the CMG-GEM and COMSOL are in good agreement. Any further injection of carbon dioxide may cause excessive pore pressure buildup and may cause the failure of the reservoir.

In an aspect of the present disclosure, a numerical modeling scheme was developed to simulate carbon dioxide injection into the Biyadh sandstone reservoir. The coupled geo-mechanical analysis was performed using both the CMG-GEM and COMSOL software to evaluate the feasibility of using the Biyadh reservoir for carbon dioxide sequestration. Caprock lifting for the Biyadh reservoir is analyzed and compared for the cases of having no fractures and having fractures.

Large-scale injection of carbon dioxide is a highly sensitive process that needs a continuous monitoring of the stored gas. If only a small amount of carbon dioxide is leaked from the reservoir, it can have adverse effects on the environment and may jeopardize the safety of residents in the vicinity of the sequestration site. It is therefore highly recommended to model the possible leakage of carbon dioxide from the reservoir in order to estimate the safe values of the injection parameters and safe storage capacity for the injection reservoir.

$CO_2$ sequestration in a naturally fractured carbonate reservoir was modelled numerically. In this context, the COMSOL multi-physics software was employed with equation-based modelling using the Warren and Root fracture model for the fractured medium. (See Warren, J. E. and Root, P. J. (1963) "The behavior of naturally fractured reservoirs", Soc. Pet. Eng. J., Vol. 3, No. 3, pp. 245-255, incorporated herein by reference in its entirety).

The governing equations of the finite element model are described below, including the sorption effects. Additionally, the method for modelling multiple injection wells is described.

The governing equations consider the fracture system as pathways between matrix elements. Carbon dioxide flows through the fractures and is then adsorbed in the matrix. The coupled field equation of the carbon dioxide flow and the reservoir deformations is:

$$Gu_{i,kk} + \frac{G}{1-2v}u_{k,ki} - \alpha p_{m,i} - \beta p_{f,i} - K\frac{\varepsilon_{LPL}}{(p_m+p_L)^2}p_{m,i} + f_i = 0 \quad (17)$$

where G is the shear modulus, u represents the displacement vector, v is the Poisson's ratio, α and β are the Biot coefficients for matrix and fractures respectively. $P_m$ and $P_f$ are the pressures in the matrix and fractures of the reservoir. K is the bulk modulus for the reservoir, $\varepsilon_L$ is the Langmuir volumetric strain constant, $P_L$ is the Langmuir pressure constant, $f_i$ represents the body force.

The displacement field of the reservoir is dependent on $CO_2$ injection-induced pore pressure changes in the matrix and fractures. Accordingly, the flow of carbon dioxide along the naturally fractured medium can be represented by:

$$\left[\phi_m + \rho_{ga}\rho_c \frac{v_L p_L}{(pm+pL)^2} + \frac{(\alpha-\phi_m)pm}{(1+S)K_s} - \frac{(\alpha-\phi_m)p_L pm\varepsilon_L}{(1+S)(pm+pL)^2}\right]\frac{\partial p_m}{\partial t} + \quad (18)$$

$$\nabla\cdot\left(-\frac{k_m}{\mu}p_m\nabla\cdot p_m\right) = \omega(p_f-p_m) - \frac{(\alpha-\phi_m)pm}{(1+S)}\frac{\partial e_v}{\partial t}$$

$$\phi_f\left(1+\frac{pf\beta}{K_n}\right)\frac{\partial p_f}{\partial t} - \phi_f\left(\frac{pf\alpha}{K_s} + \frac{p_L pm\varepsilon_L}{(pm+pL)^2}\right)\frac{\partial p_m}{\partial t} + \quad (19)$$

$$\nabla\cdot\left(-\frac{k_f}{\mu}p_f\cdot\nabla\cdot p_f\right) = -\omega(p_f-p_m) - p_f\phi_f\left(\frac{1}{K_n}-\frac{1}{K_s}\right)\frac{\partial\left(\frac{\sigma_{kk}}{3}\right)}{\partial t}$$

where $\emptyset_m$ is the porosity of the matrix, $\emptyset_f$ is the porosity of the fractures, $V_L$ is the Langmuir volume constant, ω is a coefficient that takes into account the flow between fractures and matrix, $\rho_c$ is the density of the reservoir rock, $\rho_{ga}$ is the density of carbon dioxide at standard conditions, and S is defined as $$S = \varepsilon_v + \frac{p_m}{K_s} - \varepsilon_s \quad (20)$$

where $\varepsilon_v$ and $\varepsilon_s$ are volumetric and sorption induced strains, respectively. $K_s$ is the grain elastic modulus, $K_n$ is the normal stiffness of the fractures, $k_m$ and $k_f$ are the matrix and fractures permeability respectively, and μ is the viscosity of the carbon dioxide. It is important to note that the change in the pore pressure causes a change in the value of volumetric strain that will eventually result in vertical ground uplift with the passage of time as carbon dioxide is injected.

COMSOL multiphysics software was used to model the reservoir and the overburden layers between the ground surface and the reservoir. The step-by-step process of the model construction including various constraints, in addition to initial and boundary conditions are discussed below.

Figure 18A:
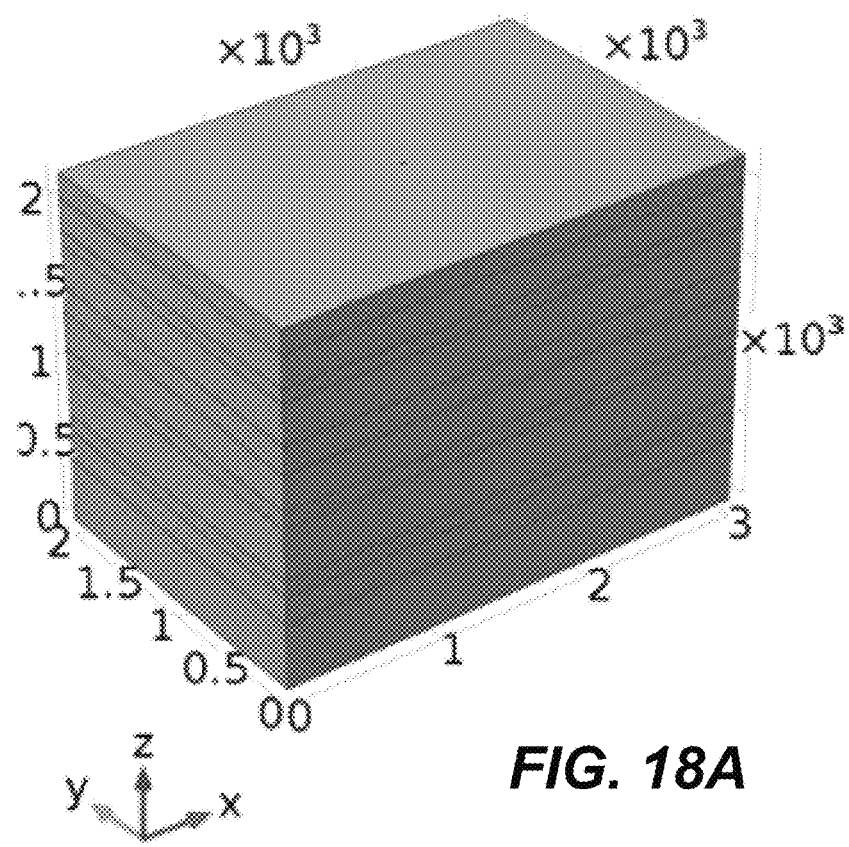
FIGS. 18A-18D illustrate the simulation models for the Ghawar Arab-D carbonate petroleum reservoir undergoing $CO_2$ injection, A. single well B. two wells (in line) C. three wells (triangular) D. four wells (rectangular)
Figure 18B:
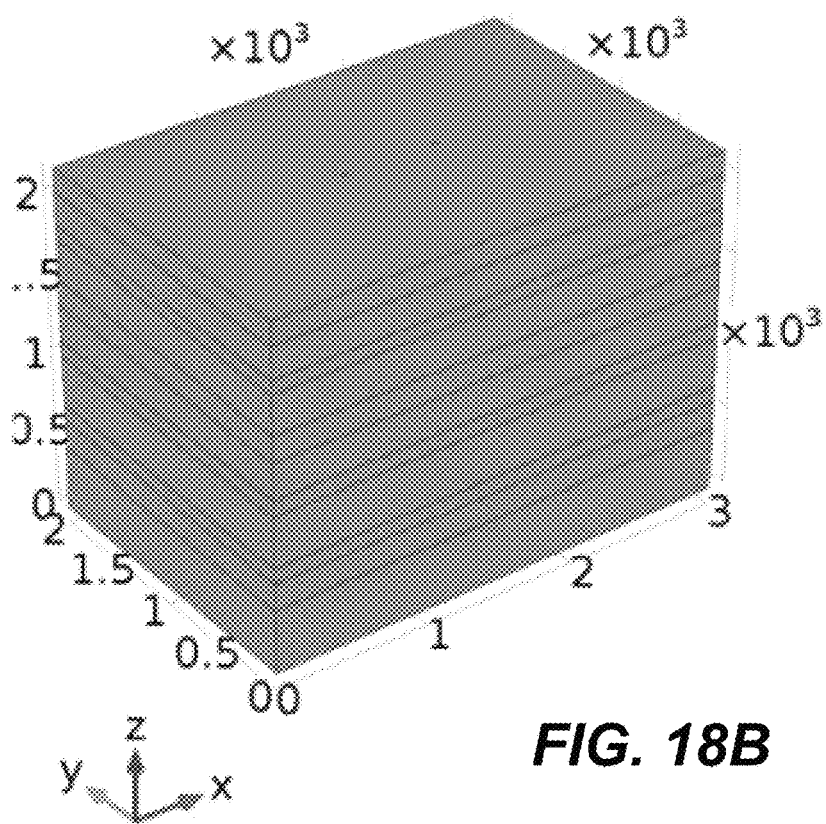
Figure 18C:
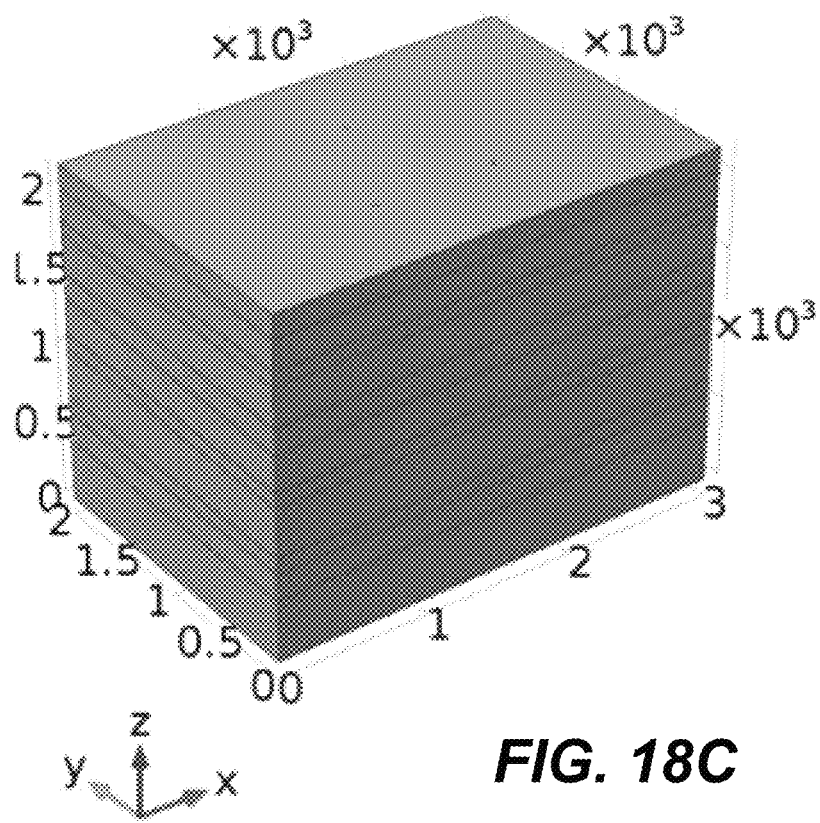
Figure 18D:
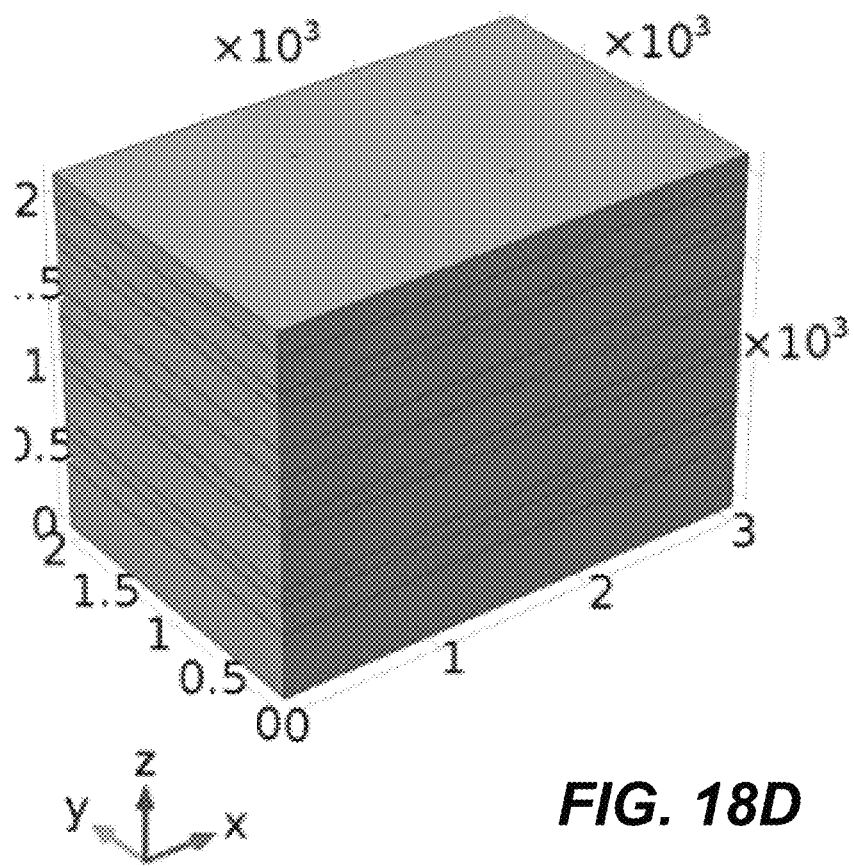
Figure 19A:
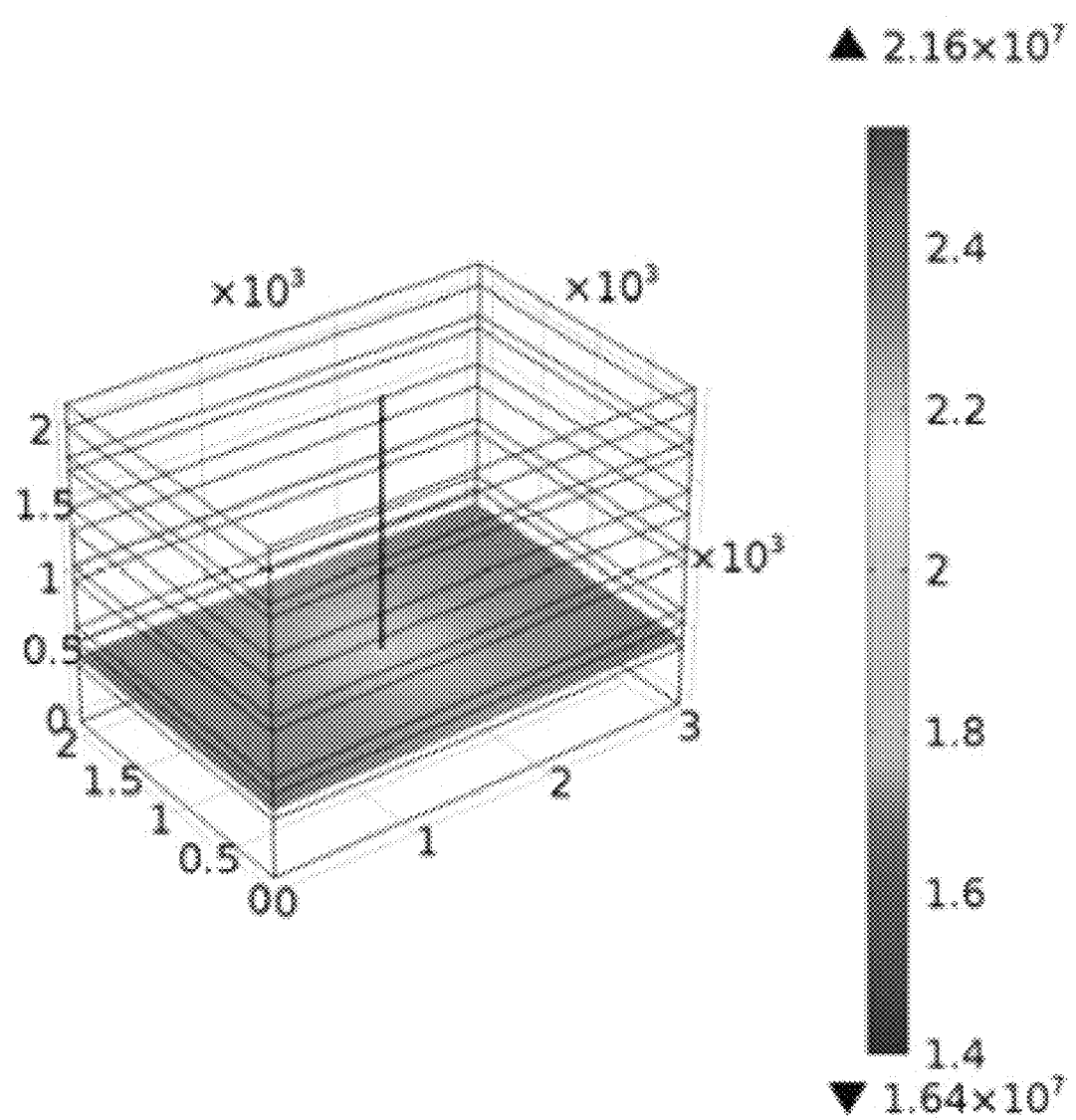
FIGS. 19A-19D illustrate the pressure variation for various periods of $CO_2$ injection.
Figure 19B:
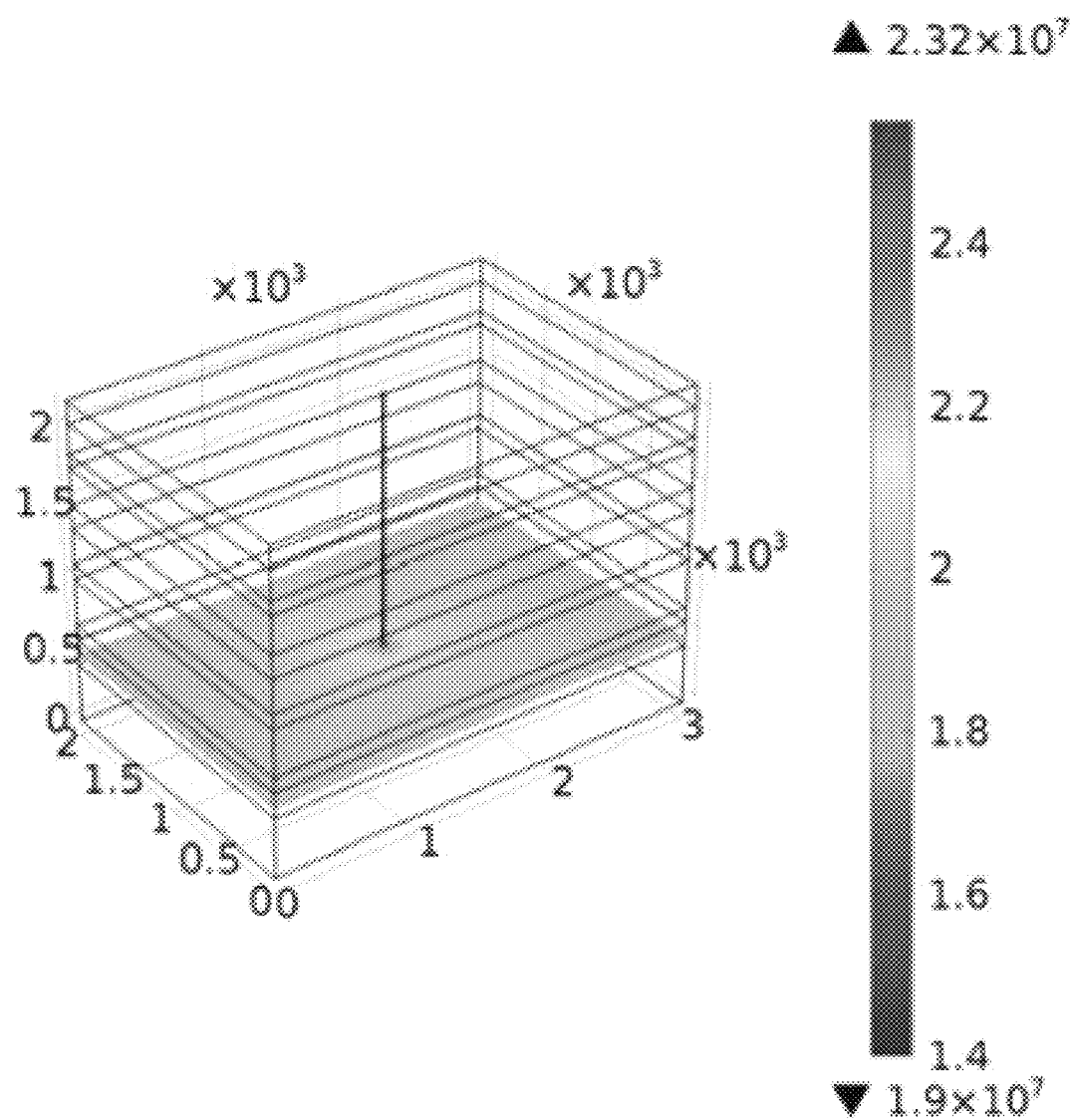
Figure 19C:
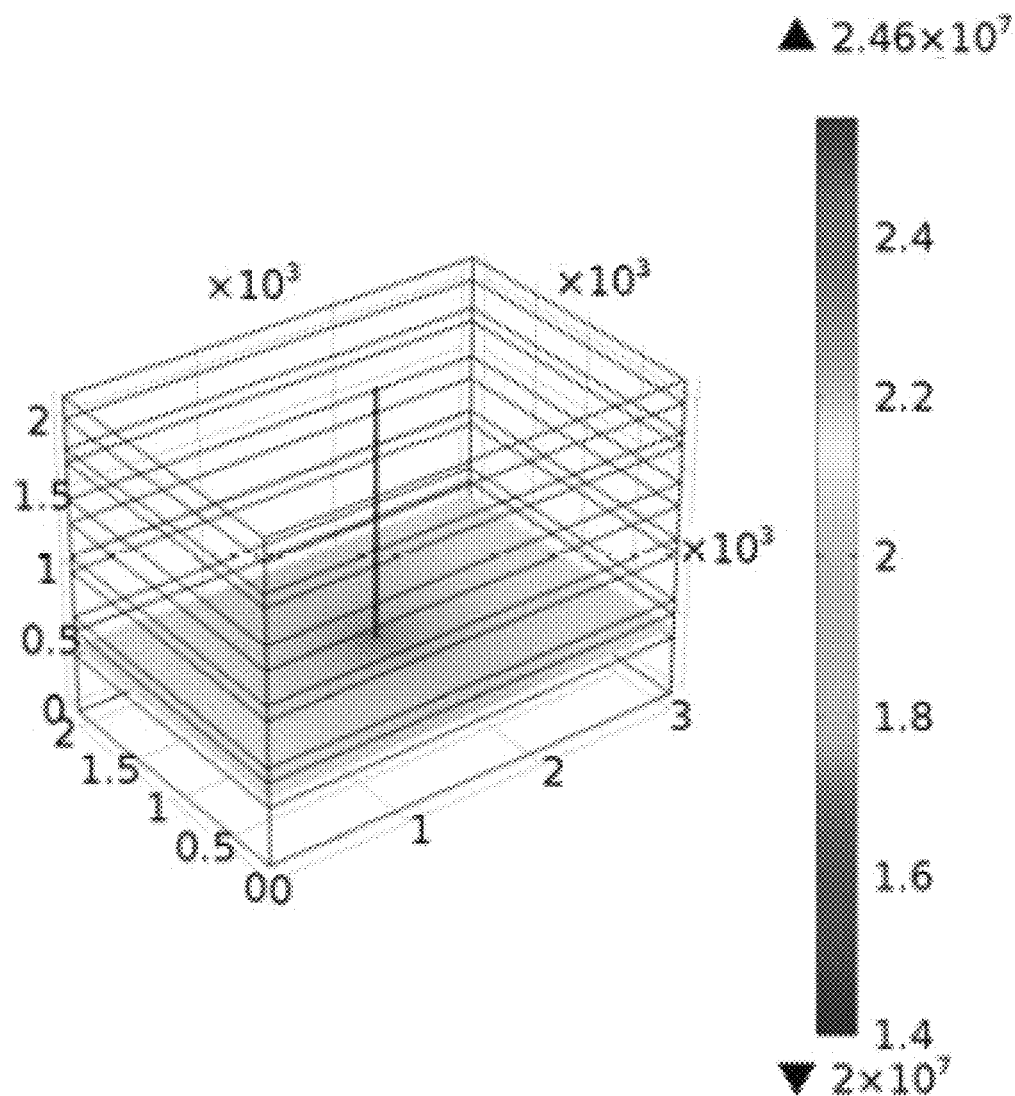
Figure 19D:
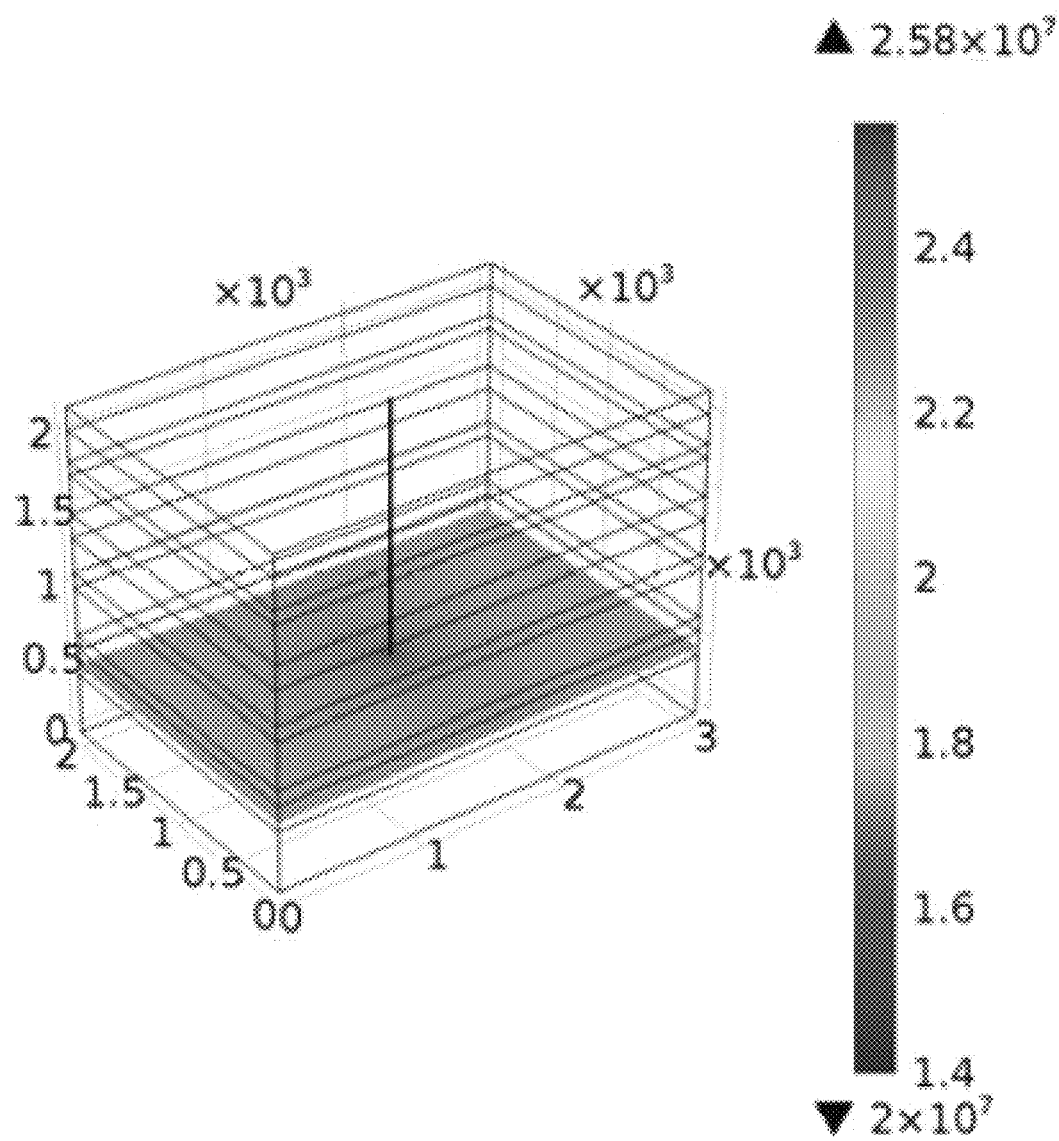

Starting with the Arab Jubaila carbonate reservoir 110 shown in FIG. 1, each geological layer was modelled in COMSOL, such that each layer has a different thickness value. Starting with a single injection well, the number of injection wells was increased up to four. A non-limiting example of the modelling of the Ghawar Arab-D carbonate reservoir with different arrangements of injection wells is shown in FIG. 18A-18D. FIG. 18A shows $CO_2$ injection in a single well, FIG. 18B shows $CO_2$ injection in two wells, FIG. 18C depicts the injection into three wells in a triangular pattern and FIG. 18D depicts the injection into four wells in a rectangular pattern.

Each of the models in FIG. 18A-18D has a total of 276,660 degrees of freedom with five independent variables at each node (two pressures and three displacement components). The two pressure variables are for the matrix pore pressure and the fracture pressure. For calculation of ground vertical uplift due to carbon dioxide injection, the bottom surface of each simulation model is constrained, the surfaces defined by normal along x and y axes are described by roller boundary conditions, and the top surfaces are left free for each of the simulation models. The formation properties and various input parameters are listed in Table 3. The overall simulation properties for $CO_2$ injection scenarios into the multi-layer 3D models for the Ghawar location is given in Table 4.

TABLE 3

Formation properties for the simulation of CO2 injection into a carbonate reservoir.

| Model parameter | For reservoir | For caprock | For under burden layer |
|---|---|---|---|
| Rock density, ρ (Kg/m³) | 2400 | 1870 | 2550 |
| Young's modulus, E (GPa) | 48.5 | 37.05 | 53.5 |
| Bulk modulus, K (GPa) | 39.24 | 23.75 | 34.5 |
| Shear modulus, G (GPa) | 18.1 | 13.8 | 19 9 |
| Initial porosity, $\emptyset_m$ | 0.13 | 0.01 | 0.10 |
| Initial permeability, $k_m$ ($10^{-15}$ m²) | 0.6 | 0.00001 | 0.2 |
| Biot coefficient, α | 0.8 | 0.2 | 0.4 |
| Dynamic viscosity, μ ($10^{-5}$ Pa · s) | 1.84 | 1.84 | 1.84 |
| Pressure wave velocity Vp (m/sec) | 5140 | 4750 | 4900 |
| Shear wave velocity, Vs (msec) | 2748 | 2770 | 7800 |

TABLE 4

Overall simulation properties for CO2 injection into the Ghawar carbonate reservoir.

| | |
|---|---|
| $CO_2$ injection rate (kTons/year) | 1,000 (31.71 kg/sec) |
| $CO_2$ injection period (years) | 5 |
| Overall model dimensions, length × width × height (m) | 3,000 × 2,000 × 2,170 |

The Ghawar oil field is undergoing a compressional stress regime according to the World Stress Map, which tends to produce compressive stresses in the reservoir structure. The World Stress Map (WSM) is a global compilation of information on the crustal present-day stress field maintained since 2009 at the Helmholtz Centre Potsdam GFZ German Research Centre for Geosciences within Section 2.6 Seismic Hazard and Stress Field. This is a collaborative project between academia and industry which aims to characterize crustal stress patterns and understand the stress sources. (See Abdulkader, M. A. (2005) "Ghawar: The Anatomy of the World's Largest Oil Field", Saudi Aramco Search and Discovery, Article#20026, Saudi Arabia; and World Stress Map (2008) [online] http://dc-app3-14.gfz potsdam.de/pub/poster/World_Stress_Map_Release_2008.pdf (accessed 20 June 2015), each incorporated herein by reference in their entirety). The pre-stresses on the sedimentary reservoirs are due to the weight of the overburden layers in the vertical direction, and due to the tectonic effects along the two horizontal directions. For the compressional stress regime, the relationship between the magnitudes of the three principal stresses is such that, $\rho_1 > \sigma_2 > \sigma_3$, where $\sigma_1$ is equal to the maximum horizontal stress ($\sigma_H$), $\sigma_2$ is the minimum horizontal stress, and $\sigma_3$ represents the vertical stress caused by the weight of the overburden layers. (See Byerlee, J. (1978) "Friction of rocks", Pure and Applied Geophysics, Vol. 116, No. 1, pp. 615-626; Hergert, T. and Heidbach, O. (2011) "Geomechanical model of the Marmara Sea region-II. 3-D contemporary background stress field", Geophysical Journal International, Vol. 3, No. 3, pp. 1090-1120; and Rutqvist, J., Birkholzer, J. T., Cappa, F. and Tsang, C. (2007) "Estimating maximum sustainable injection pressure during geological sequestration of $CO_2$ using coupled fluid flow and geomechanical fault-slip analysis", Energy Conversion and Management, Vol. 48, No. 6, pp. 1798-1807, each incorporated herein by reference in their entirety).

The reservoir stability analysis using Mohr-Coulomb criterion is presented below. The flow and transport of carbon dioxide along the reservoir is strongly dependent on the injection pressure. The more the injection pressure increases, the more the flow of carbon dioxide increases into the reservoir. For maximum storage capacity of carbon dioxide, it is desirable to increase the injection pressure. However, it is necessary to observe the estimated safe values of the injection pressure. The safe values of the injection pressure are obviously less than the critical pore pressures. The modelling of one injection well was extended to include multiple injection wells. The pore pressure variations for various arrangements of injection wells were determined. The resulting ground surface vertical uplift, reservoir stability and maximum occupancy for various arrangements of injection wells were also determined.

Figure 20:
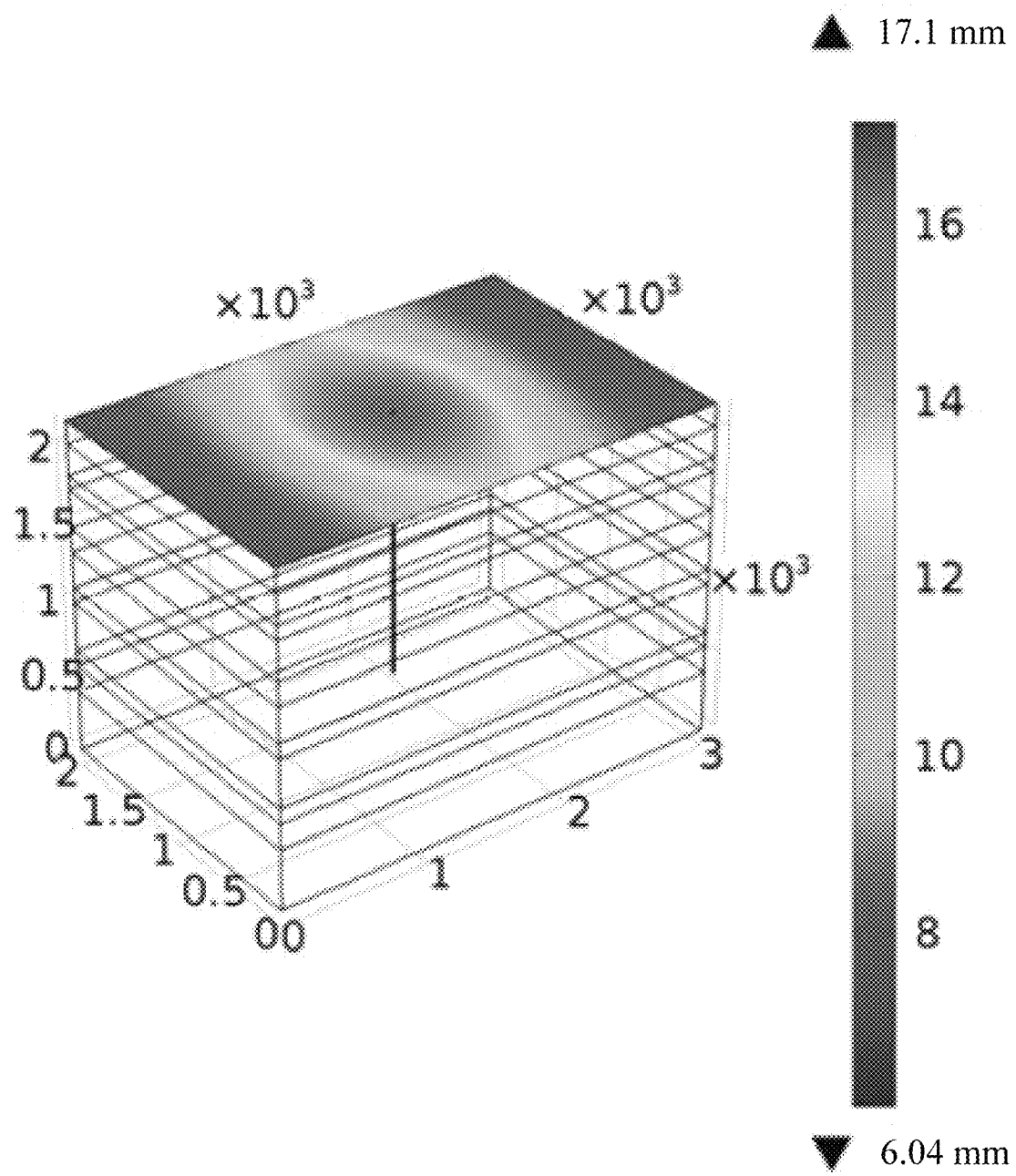
FIG. 20 illustrates the vertical ground uplift after five years of carbon dioxide injection.

A single-well injection simulation was carried out for a five-year injection period. The pressure variations for different injection periods are displayed in FIG. 19A-19D, in which the pore pressure is shown to increase with carbon dioxide injection. The region of the reservoir closer to the injection well attains higher pressure as compared to the regions far away from the well. The vertical ground uplift after a five-year injection period was found to have a maximum value of 17.1 mm as shown in FIG. 20. As shown in the contour map on the top surface of FIG. 20, the injection of carbon dioxide for a period of five years causes the vertical uplift of the ground above and around the injection well. The value of the ground vertical uplift has a maximum value above the injection well and is extended for several kilometers around the injection well.

The Mohr-Coulomb failure criterion for the compressional stress regime was used to analyze the effect of pore pressure variation on the reservoir stability. Both increases and decreases in the pore pressure can cause failure of the reservoir due to the subsequent changes in the magnitude of effective stresses in the reservoir. (See Jtirgen, E. S., Siggins, F. A. and Brian, J. E. (2005) "Predicting and monitoring geo-mechanical effects of $CO_2$ injection", Greenhouse gas control technologies: Proceedings of the 7th International Conference on Greenhouse Gas Control Technologies, Oxford, Elsevier, Vol. 1; and Streit, J. E. and Hillis, R. R. (2004) "Estimating fault stability and sustainable fluid pressures for underground storage of $CO_2$ in porous rock", Energy, Vol. 29, No. 9, pp. 1445-1456, each incorporated herein by reference in their entirety). The Mohr-Coulomb failure criterion is utilized to draw the failure envelope for the reservoir. It is assumed that the reservoir is of an intact rock type due to the fact that no major fault passes through the reservoir. As the pore pressure increases, the effective stress on the reservoir decreases and the reservoir tends to move to a new stress condition that is nearer to the failure line as compared to the initial stress condition. The stability analysis also takes into account the change in the horizontal stresses due to the pore pressure which has built up. For one injection well, the pore pressure increases to a maximum of 25.8 MPa from an initial pore pressure of 11 MPa at the reservoir. The effect of pore pressure increase in the compressional stress regime is different from other stress regimes. As the pore pressure is increases, the horizontal stresses in the reservoir increase due to the coupled poroelastic effects. With one injection well and with the carbon dioxide injection scenario given in Table 4, injection within the reservoir remains at safe levels.

For the non-limiting example of the Arab Jubaila reservoir, the initial pore volume calculated from the reservoir is $1.6926 \times 10^9$ $m^3$. For the injection parameters given in Table 4, the volume of carbon dioxide at the ground level is equal to $2.5252 \times 10^9$ $m^3$ after five years of injection. At the reservoir's depth, the carbon dioxide exists in a dense state with comparatively less volume than that at the ground level. At a reservoir depth of 1,750 meters, the formation volume factor for the reservoir is 0.00275 $m^3/m^3$, which corresponds to $6.94 \times 10^6$ $m^3$ of carbon dioxide injection volume, with occupancy of 0.41% of the available pore volume. (See Hassan, Z. H., Mehran, P. D., Elsharkawy, A. M., David, W. K. and Leonenko, Y. (2008) "Predicting PVT data for $CO_2$-brine mixtures for black-oil simulation of $CO_2$ geological storage", International Journal of Green House Gas Control, Vol. 2, No. 1, pp. 65-77, incorporated herein by reference in its entirety). The maximum occupancy value for a closed boundary reservoir is 2 to 3% of the total available volume which shows that the current injection scenario with one injection well is within the safe limit.

In the case of two injection wells, the wells are arranged in-line, i.e. the injection wells are placed along a line along the length of the reservoir which passes through the center of the reservoir. With symmetric placement of the injection wells along the center line of the wells, the various arrangements of the injection wells are given in Table 5.

TABLE 5

Different in-line two well arrangements.

| Arrangement | Central spacing (m) |
| --- | --- |
| Case 1 | 600 |
| Case 2 | 800 |
| Case 3 | 1,000 |
| Case 4 | 1,200 |

Figure 21A:
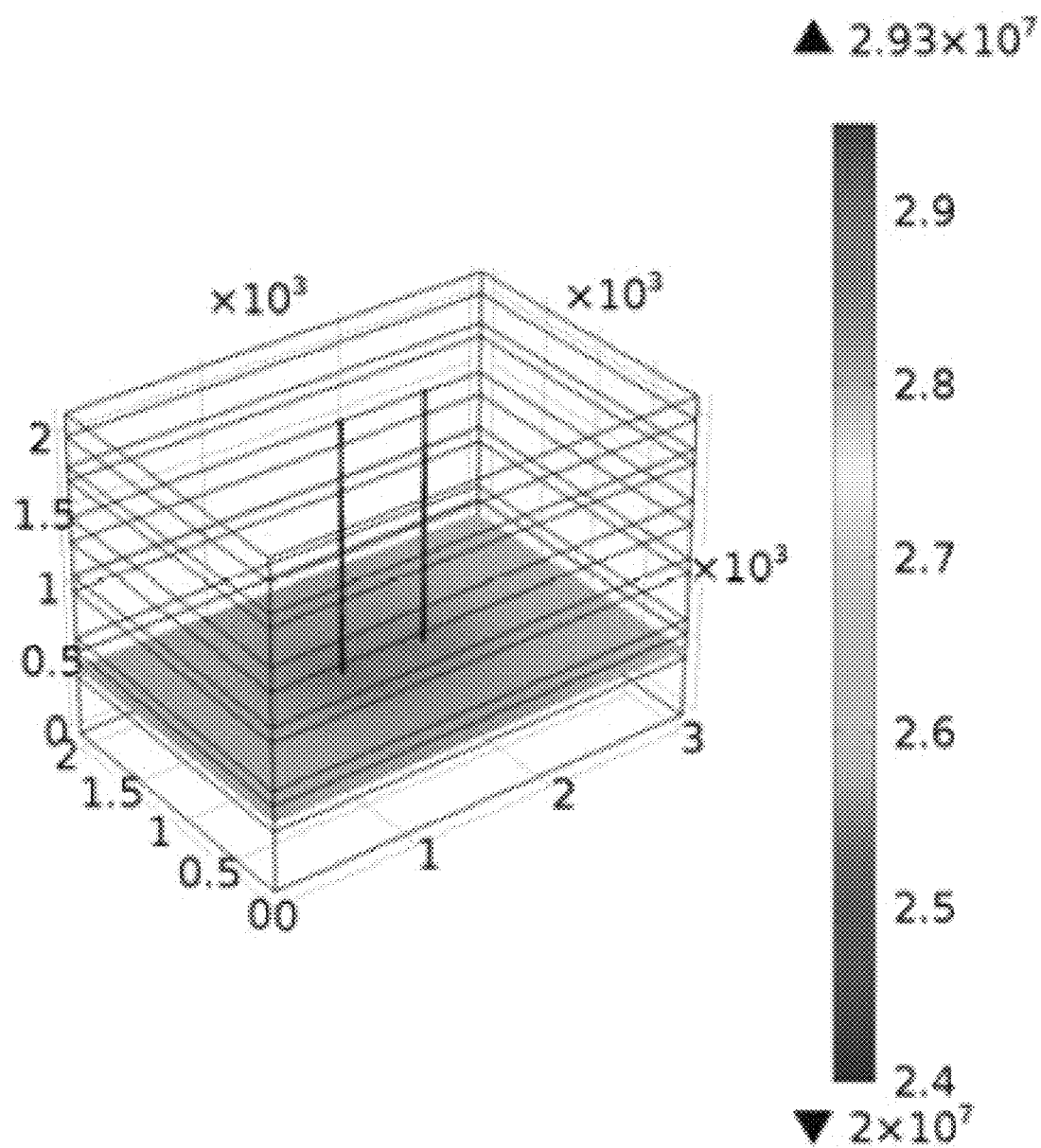
FIGS. 21A-21D illustrate the pressure variation after five years of carbon dioxide injection using two injection wells, A. at 600 meters B. at 800 meters C. at 1,000 meters D. at 1,200 meters.
Figure 21B:
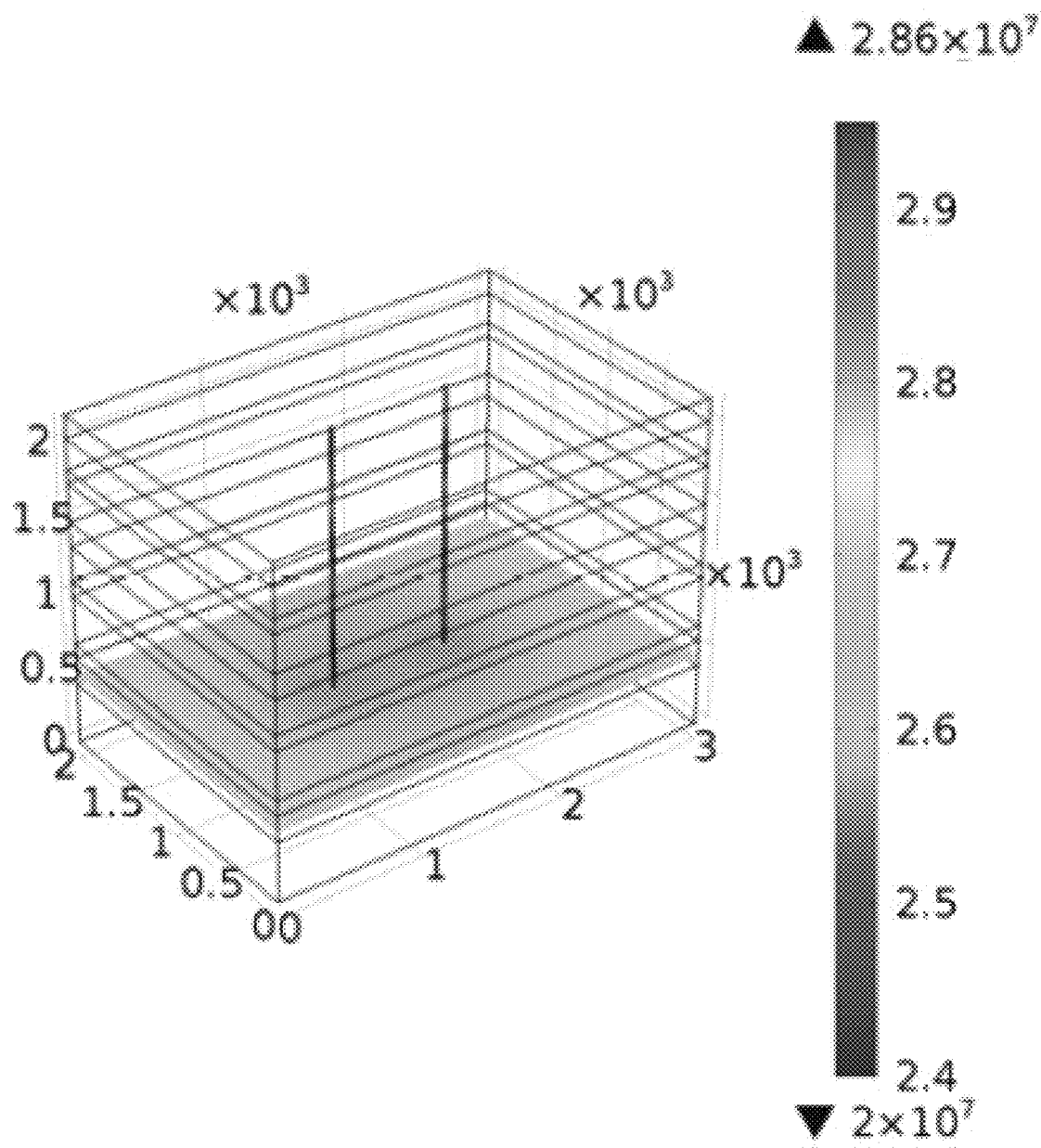
Figure 21C:
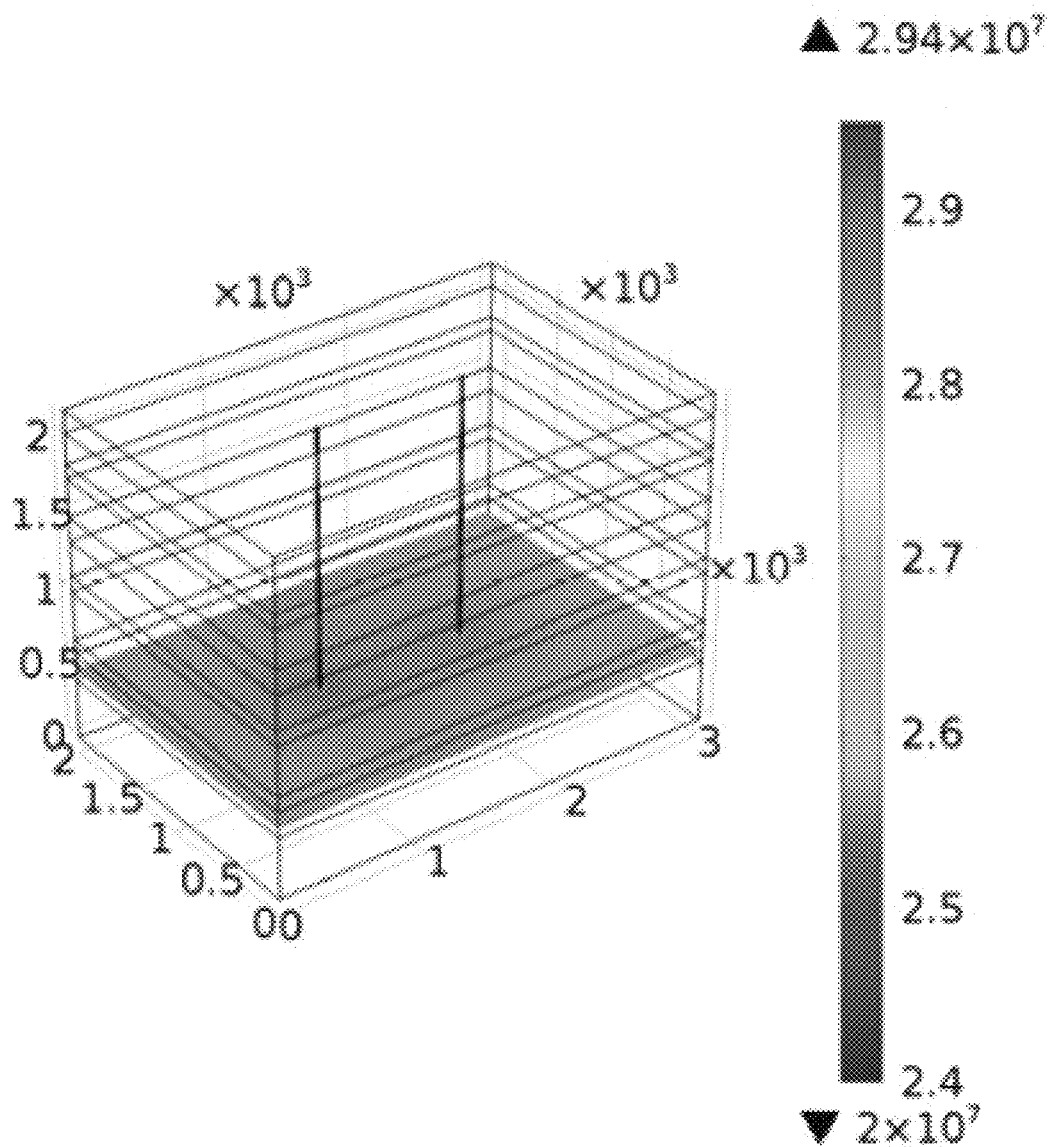
Figure 21D:
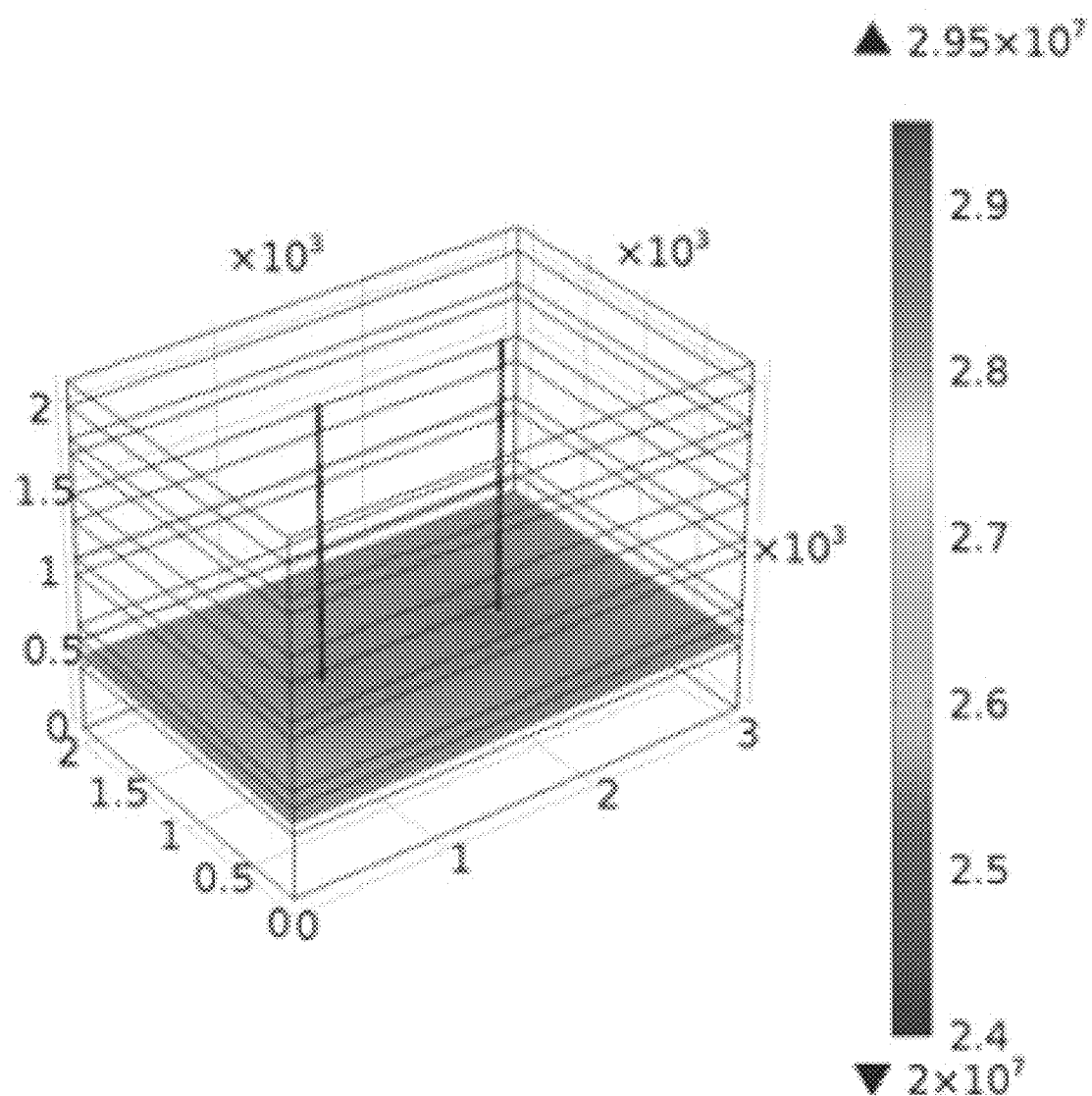

The numerical simulation results for the two injection wells spaced at 600, 800, 1,000, and 1,200 meters are depicted in FIG. 21A-21d and FIG. 22A-22D. The pressure variation after a five-year injection period is shown in FIG. 21A-21D. The injection wells spaced apart by 800 meters (FIG. 21A) have the lowest pore pressure build-up, while the injection wells spaced apart at 1,200 meters yield the maximum pressure build-up value (FIG. 21D).

Figure 22A:
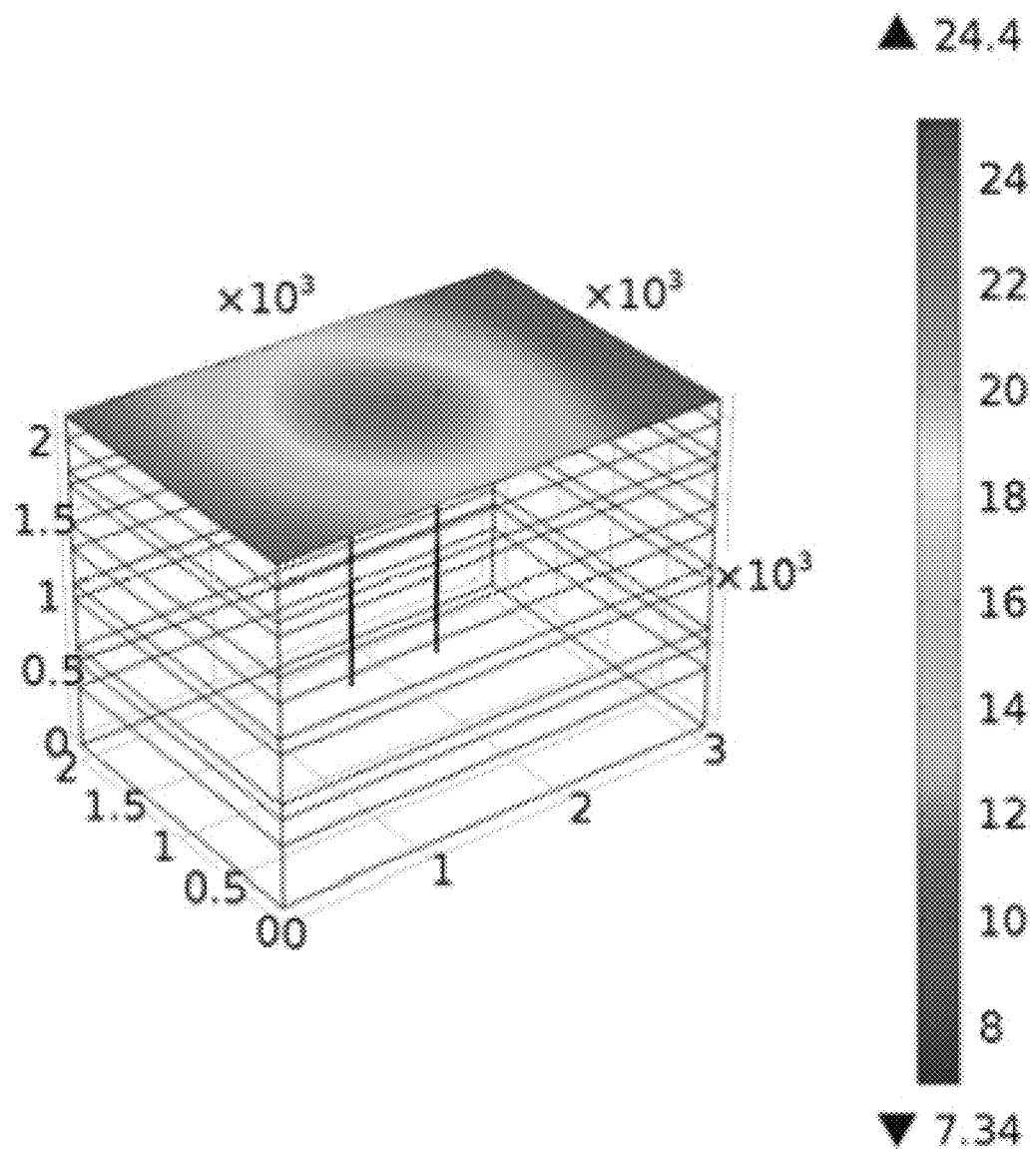
FIGS. 22A-22D illustrate the vertical ground uplift after five years of $CO_2$ injection for two injection wells, A. at 600 meters B. at 800 meters C. at 1,000 meters D. at 1,200 meters.
Figure 22B:
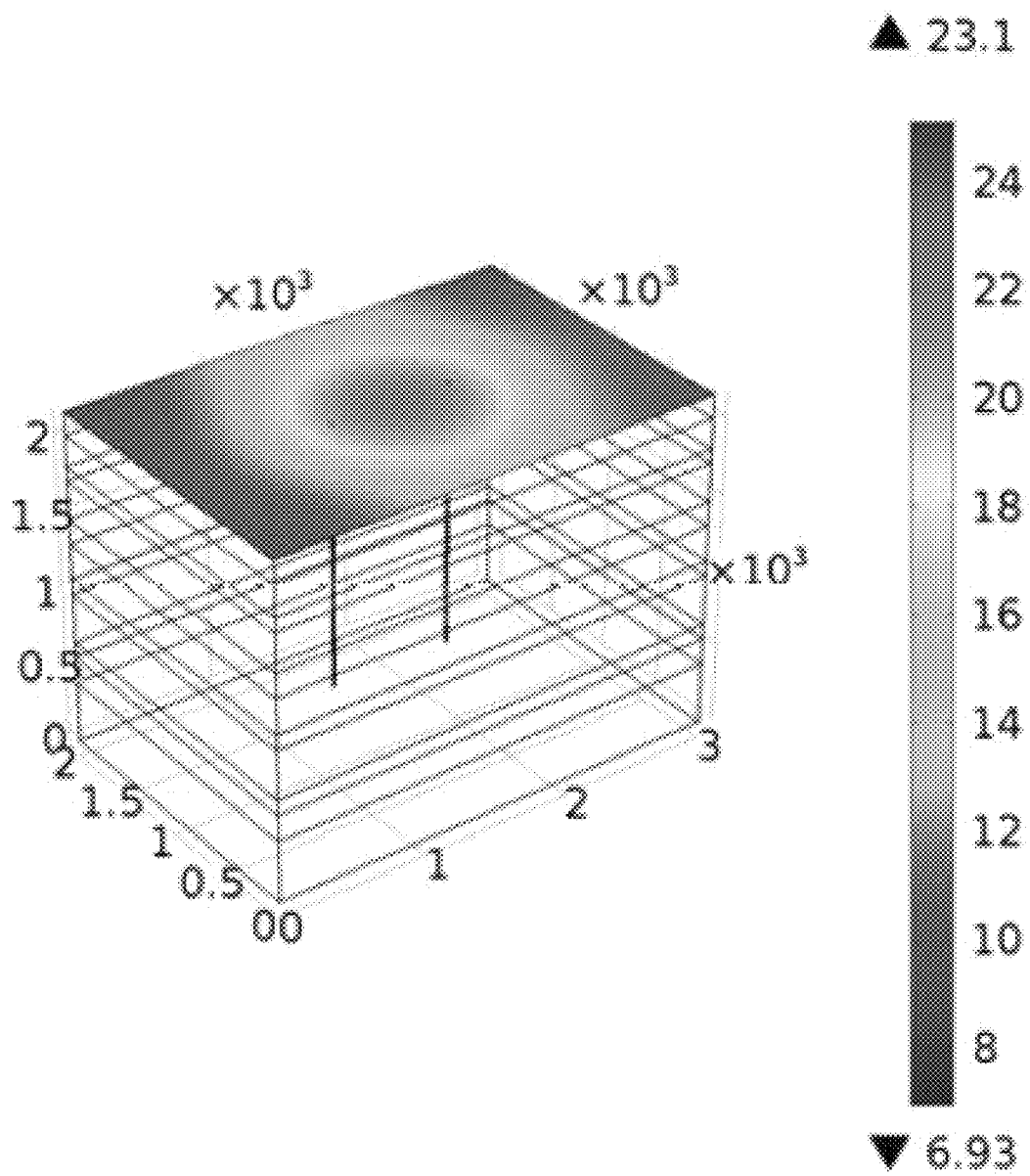
Figure 22C:
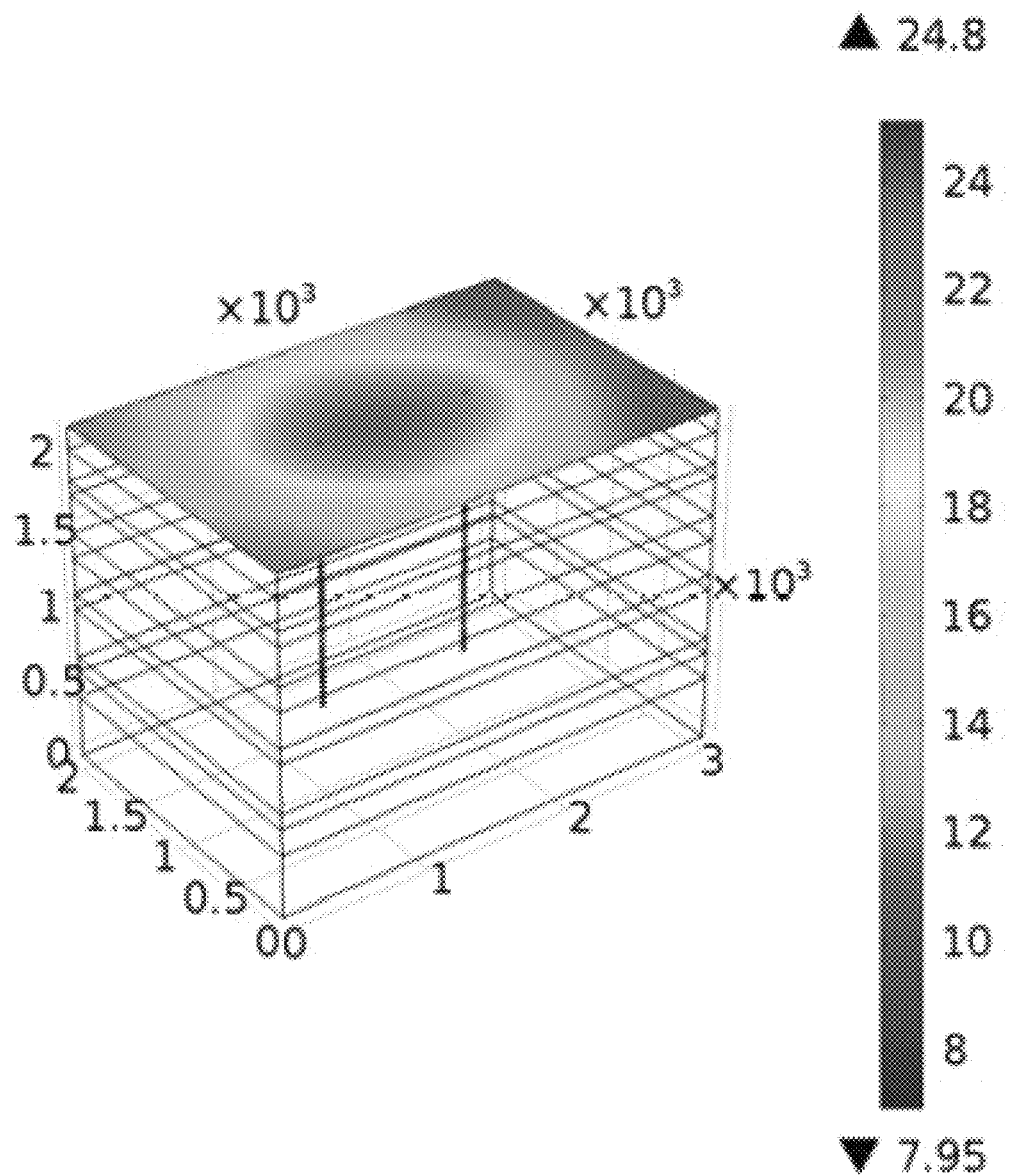
Figure 22D:
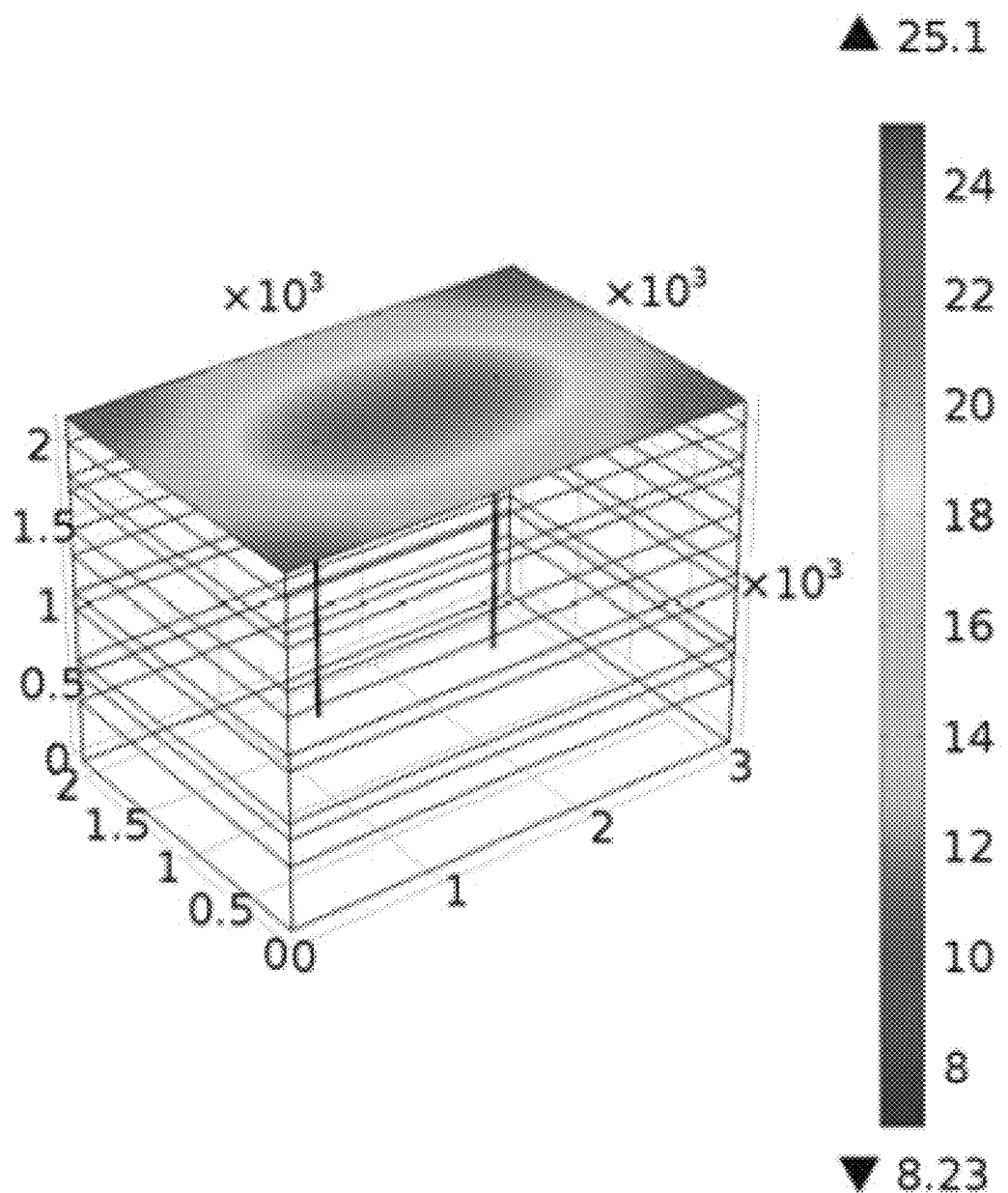

The vertical ground uplift after five years of injection period is shown in FIG. 22A-22D. Two wells at 600 meters (FIG. 22A) distance results in a maximum vertical ground uplift of 24.4 mm, two wells at 800 meters (FIG. 22B)

distance yield a maximum vertical uplift of 23.1 mm, two wells at 1,000 meters (FIG. 22C) distance result in a maximum vertical uplift of 24.8 mm, and two wells at 1,200 meters (FIG. 22C) distance yield a maximum vertical uplift of 25.1 mm. The increase in the pore pressure for the case of two-well injection, spaced centrally at 1,200 meters, is higher than that of a single-well injection. The new stressed condition of the reservoir is closer to the failure line, as compared to the case of a single-injection well. Yet, for the two-well injection scenarios considered in Table 5, the reservoir remains within a safe and stable limits.

For an initial volume of $1.6926 \times 10^9$ m$^3$ for the reservoir, the volume of carbon dioxide injected during the five-year injection period is $5.0504 \times 10^9$ m$^3$ at ground level. Due to the high pressure at the reservoir depth of 1,750 meters, the volume of the carbon dioxide will decrease with a factor of 0.00275 m$^3$. Accordingly, the volume of carbon dioxide at the reservoir level is $13.88 \times 10^6$ m$^3$, which is about 0.82% of the available pore volume. At a maximum occupancy limit of (2% to 3%) of the total available volume, the current two-well injection scenario is within the safe limits.

For three-well injection, the different patterns in which carbon dioxide injection was simulated is given in Table 6. In the case of three wells, the different well arrangements are in-line and central (equally spaced around the center of the well). The selection of an optimum well arrangement depends on the dimensions of the reservoir. After observing the pore pressure increase for various cases of three-well injection, the conclusion was drawn that, for a reservoir with minimum width and thickness as compared to its length, in-line well arrangements are more successful than the central wells arrangements. However, if the width of the reservoir has almost equal value to the length of the reservoir, then the optimum central well arrangements can keep the pore pressure value much less than the critical pore pressure for the reservoir. The maximum pore pressure for each pattern of three-well injection and its corresponding effect on reservoir stability is explained in the following sections.

TABLE 6

Different three well injection arrangements.

| Arrangement | Central spacing (m) |
|---|---|
| Case 1 | Equilateral triangular arrangement; l = 300 m |
| Case 2 | Equilateral triangular arrangement; l = 400 m |
| Case 3 | Equilateral triangular arrangement; l = 500 m |
| Case 4 | Equilateral triangular arrangement; l = 600 m |
| Case 5 | In-line arrangement; l = 500 m |
| Case 6 | In-line arrangement; l = 600 m |
| Case 7 | In-line arrangement; l = 700 m |
| Case 8 | In-line arrangement; l = 800 m |

Figure 23A:
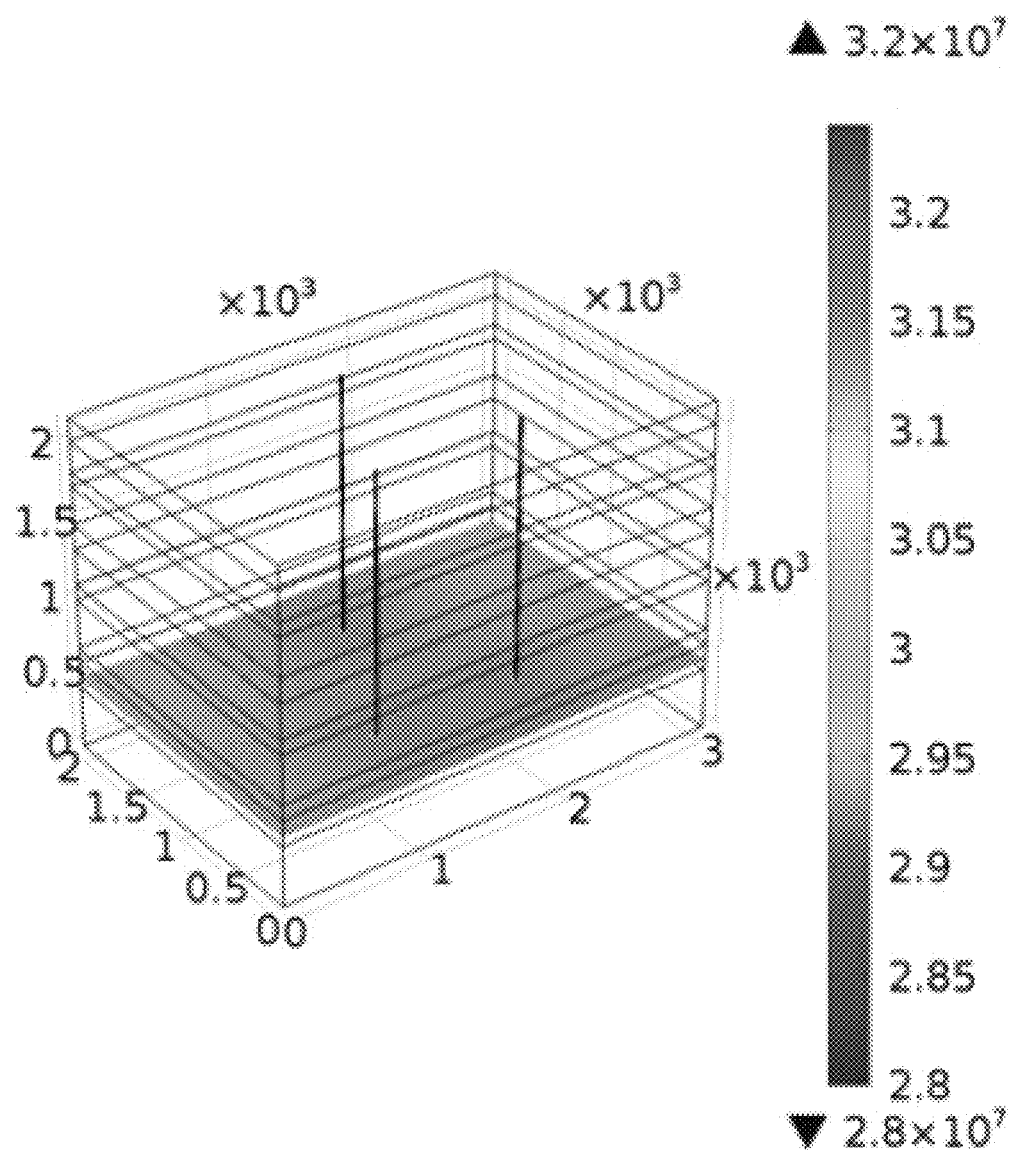
FIGS. 23A-23H illustrate the pressure variation after five years of $CO_2$ injection using three injection wells: A. at 300 m triangular B. at 400 m triangular C. at 500 m triangular D. at 600 m triangular E. at 500 m in-line F. at 600 m in-line G. at 700 m in-line H. at 800 m in-line.
Figure 23B:
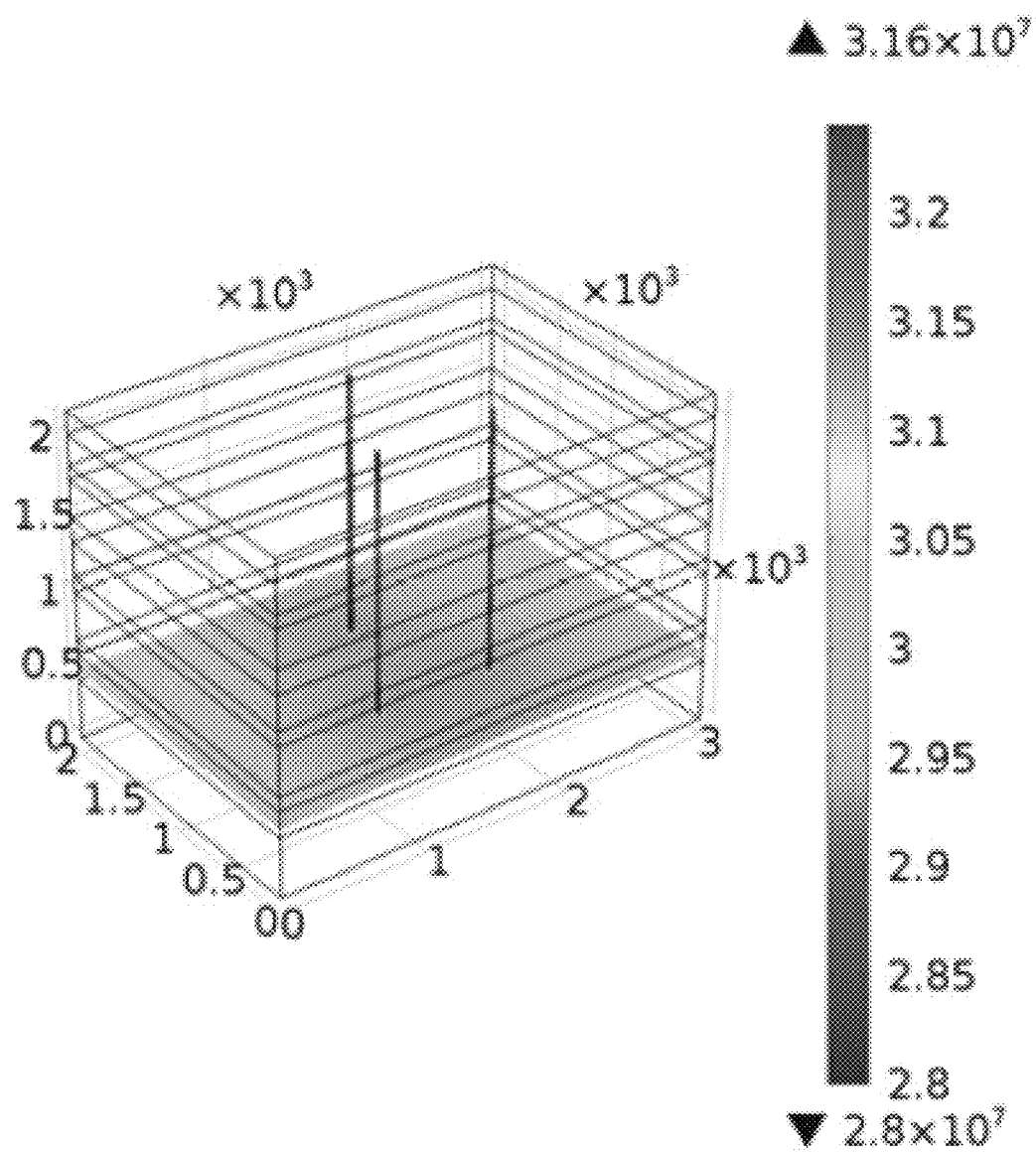
Figure 23C:
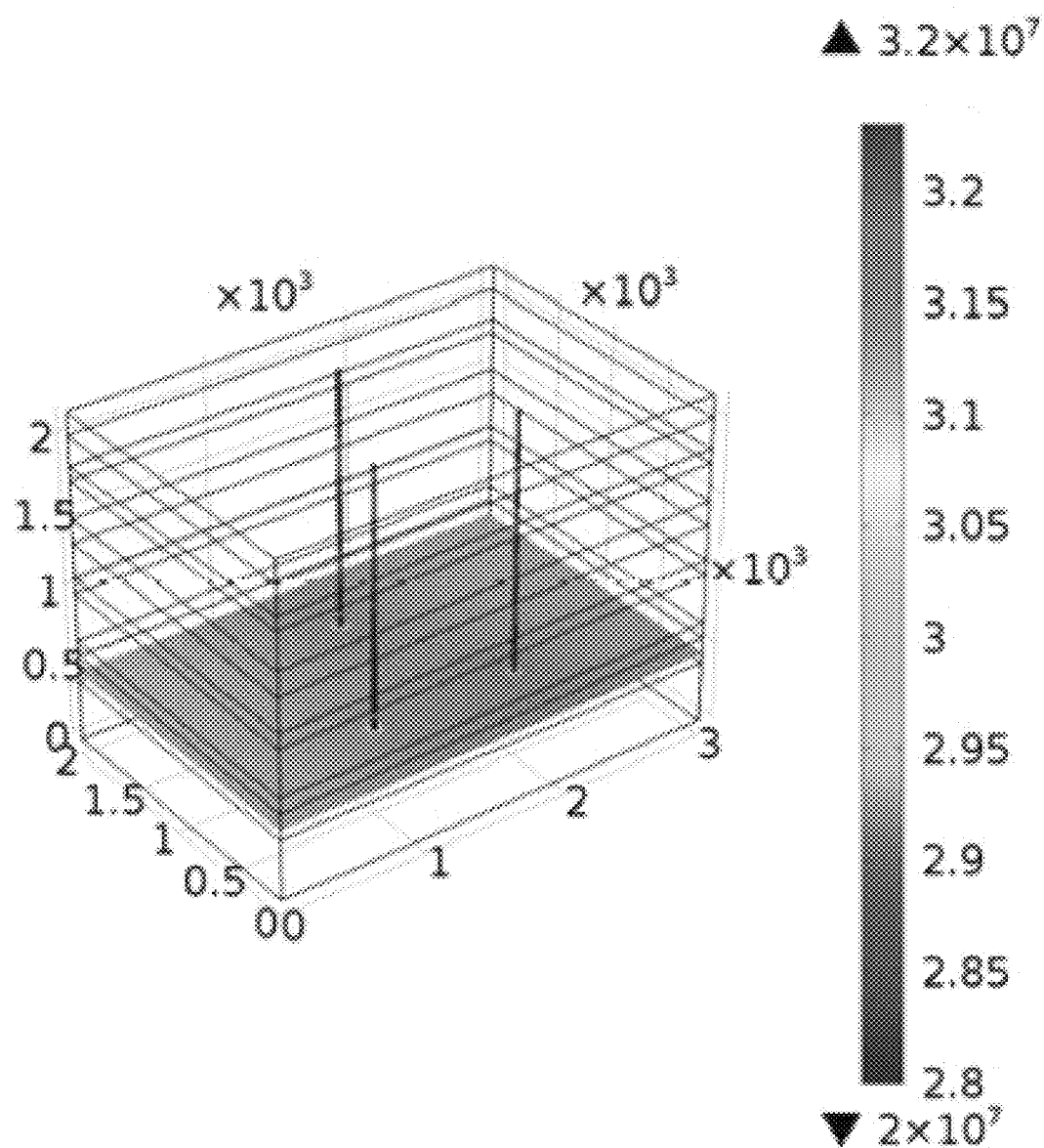
Figure 23D:
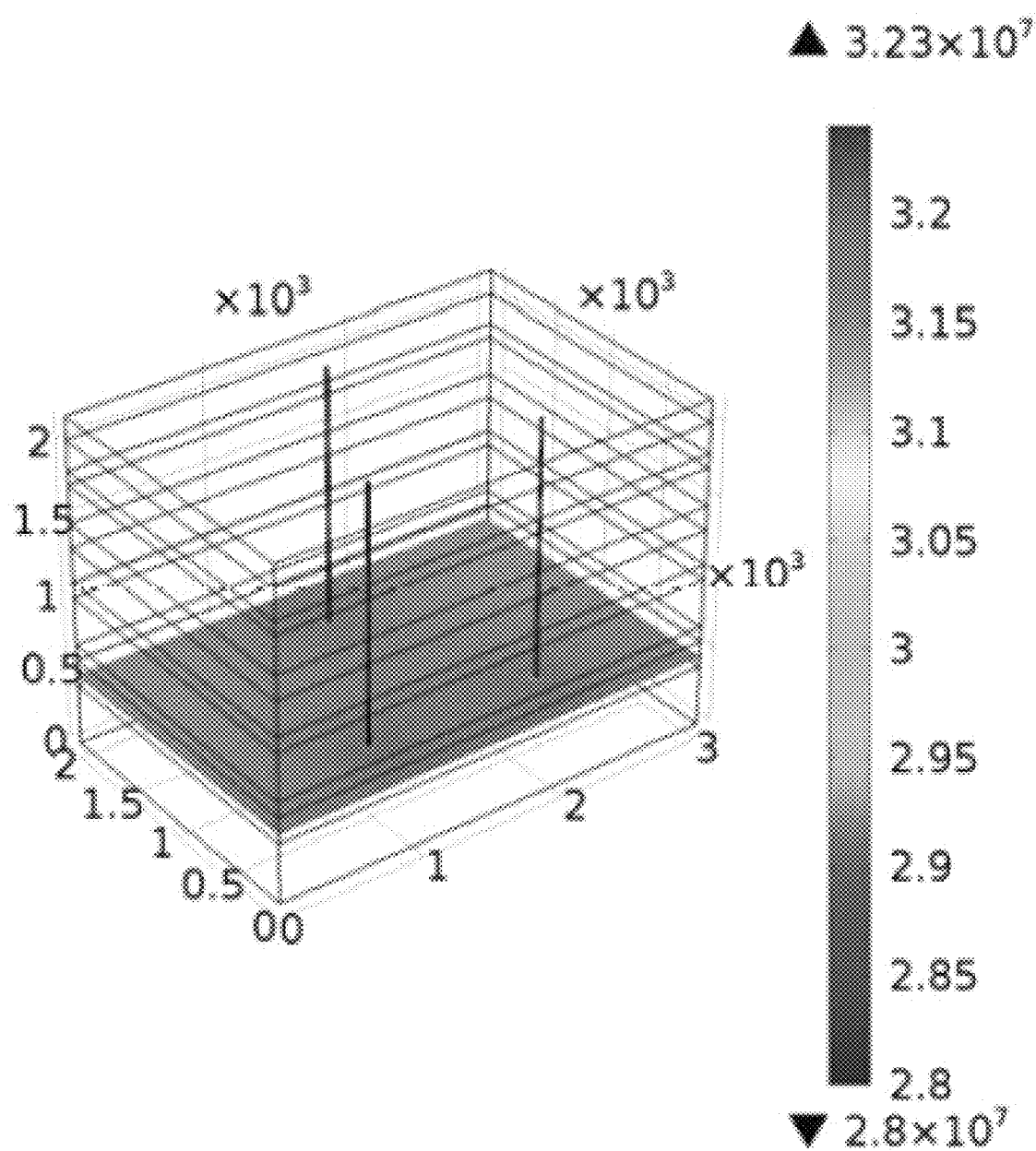
Figure 23E:
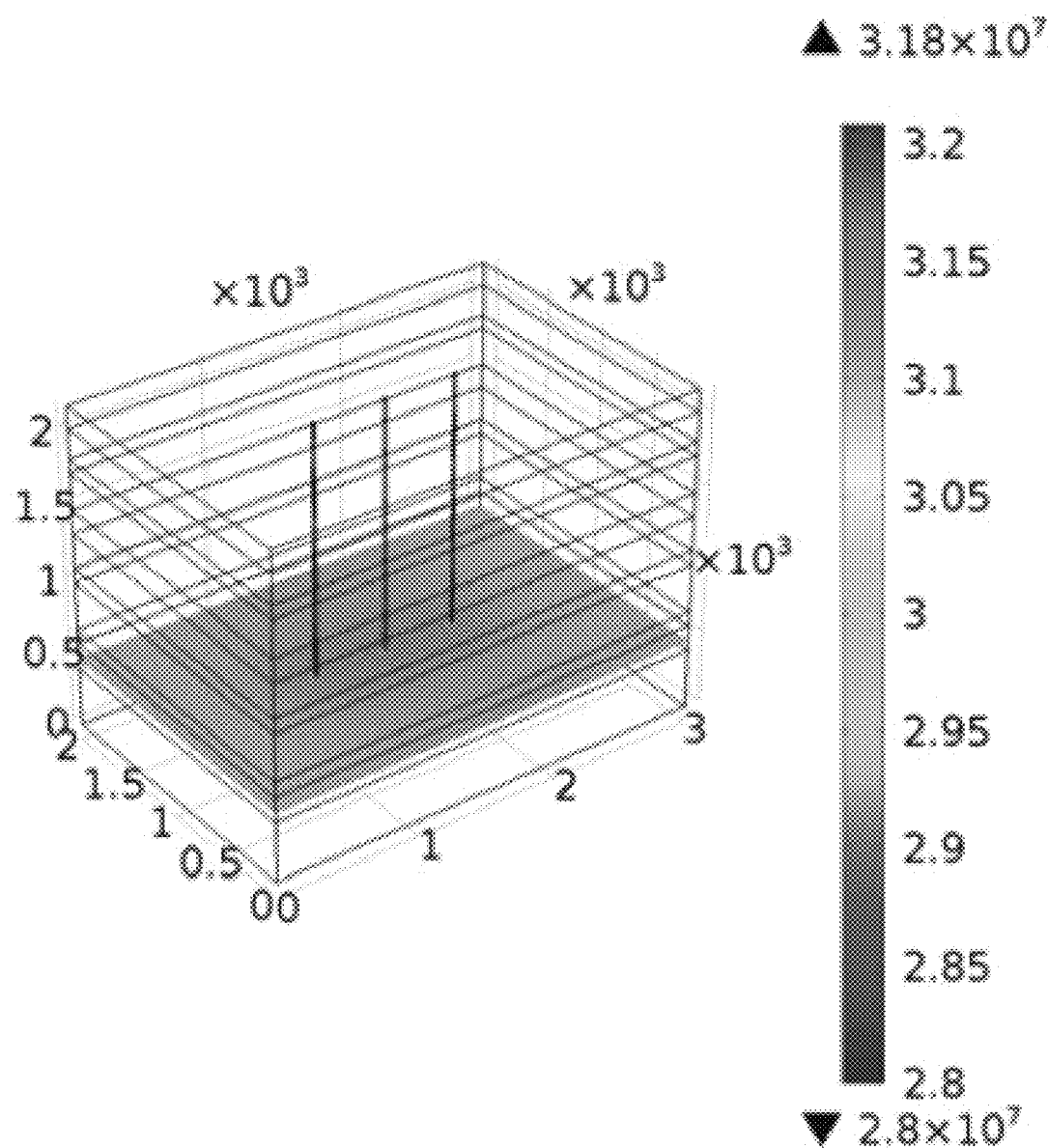
Figure 23F:
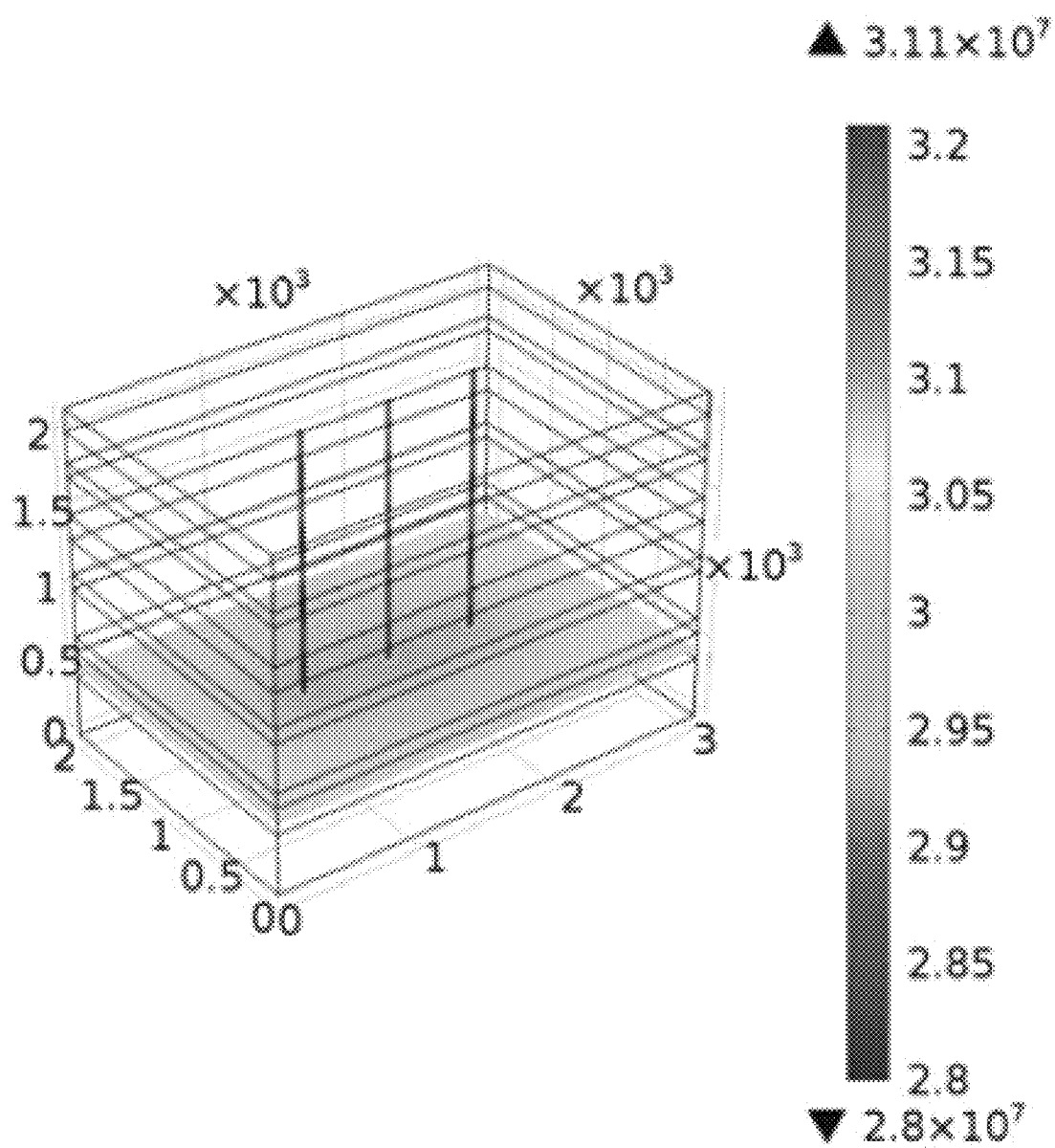
Figure 23G:
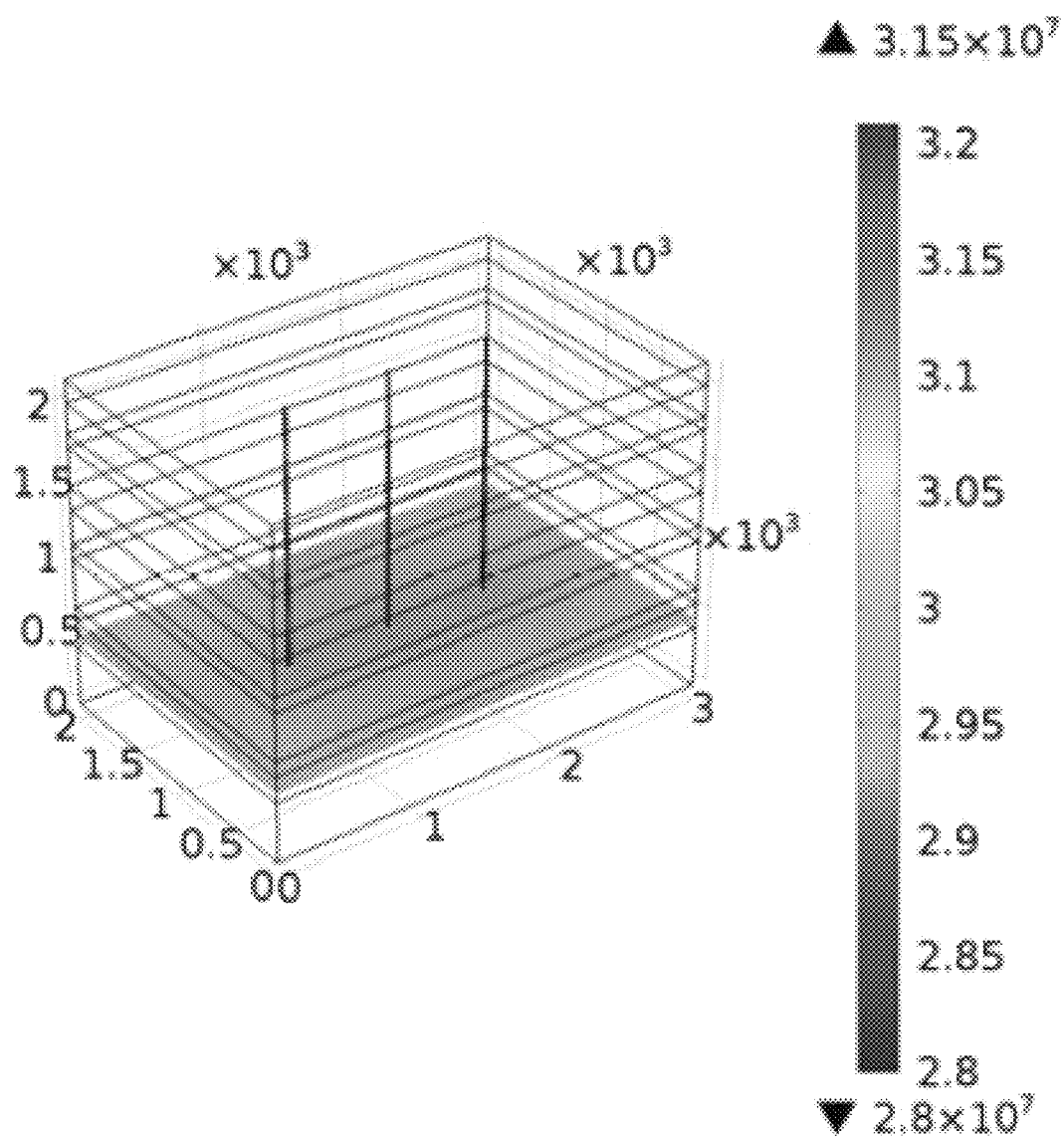
Figure 23H:
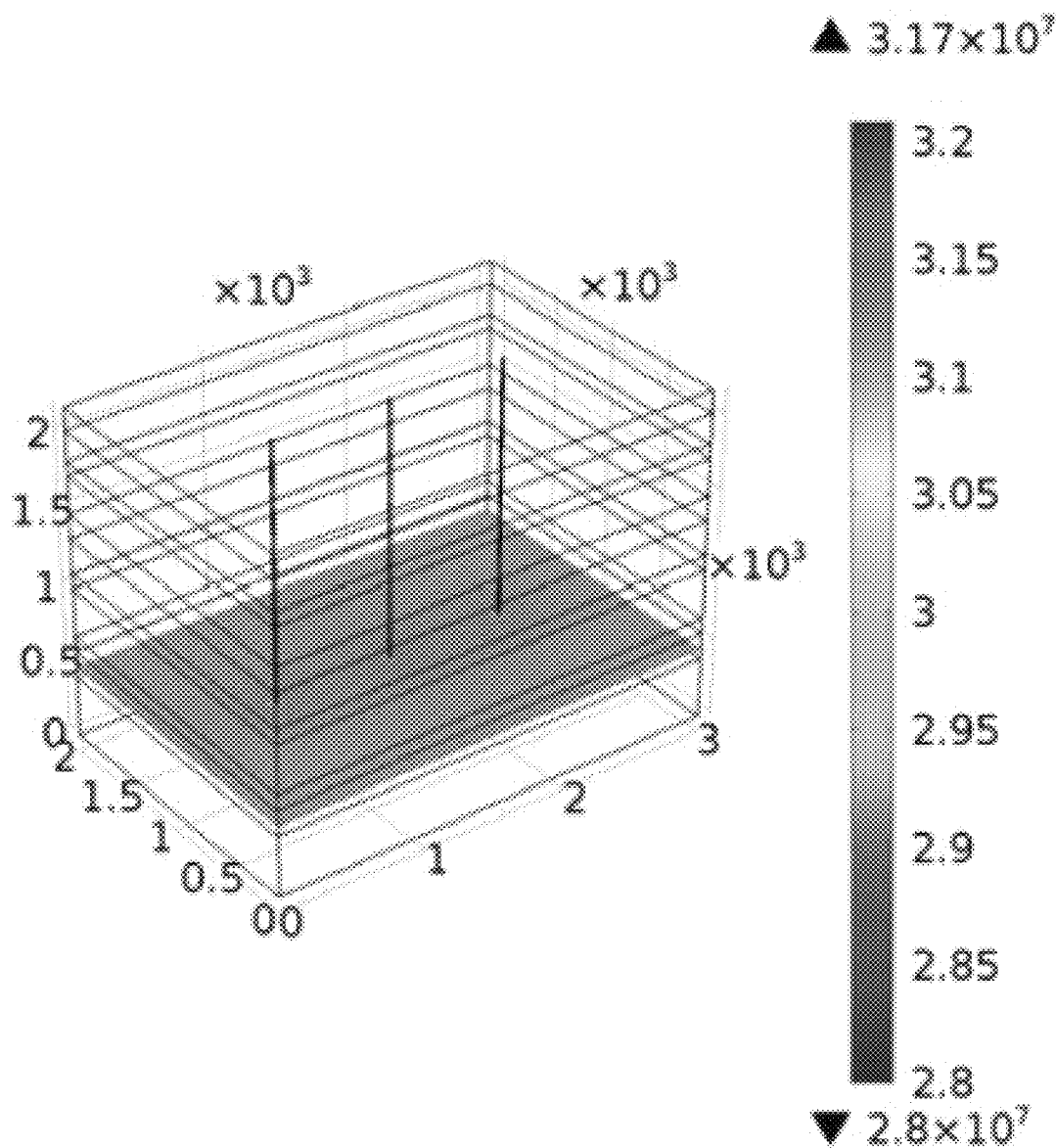

The following section summarizes the numerical simulation results for the various arrangements of three-well injection arrangements given in Table 6. After a five-year injection period, the pressure variations are shown in FIG. 23A-23H, wherein the pore pressure is shown to increase with carbon dioxide injection. FIG. 23A shows the pressure increase after five years for an equilateral triangular arrangement of injection wells spaced at 300 m apart increasing from $2.8 \times 10^7$ to $3.2 \times 10^7$ MPa. FIG. 23B depicts injection wells spaced at 400 m for an equilateral triangular arrangement of injection wells with pressure increasing to $3.16 \times 10^7$ MPa, FIG. 23C depicts injection wells spaced at 500 m in equilateral triangular arrangement with pressure increasing to $3.2 \times 10^7$ MPa, FIG. 23D depicts injection wells spaced at 600 m in equilateral triangular arrangement with pressure increasing to $3.23 \times 10^7$ MPa, FIG. 23E depicts injection wells spaced at 500 m in an in-line arrangement with pressure increasing to $3.18 \times 10^7$ MPa, FIG. 23F depicts injection wells spaced at 600 m in an in-line arrangement, with pressure increasing to $3.11 \times 10^7$ MPa, FIG. 23G depicts injection wells spaced at 700 m in an in-line arrangement with pressure increasing to $3.15 \times 10^7$ MPa and FIG. 23H depicts injection wells spaced at 800 m in an in-line arrangement with pressure increasing to $3.17 \times 10^7$ MPa.

Figure 24A:
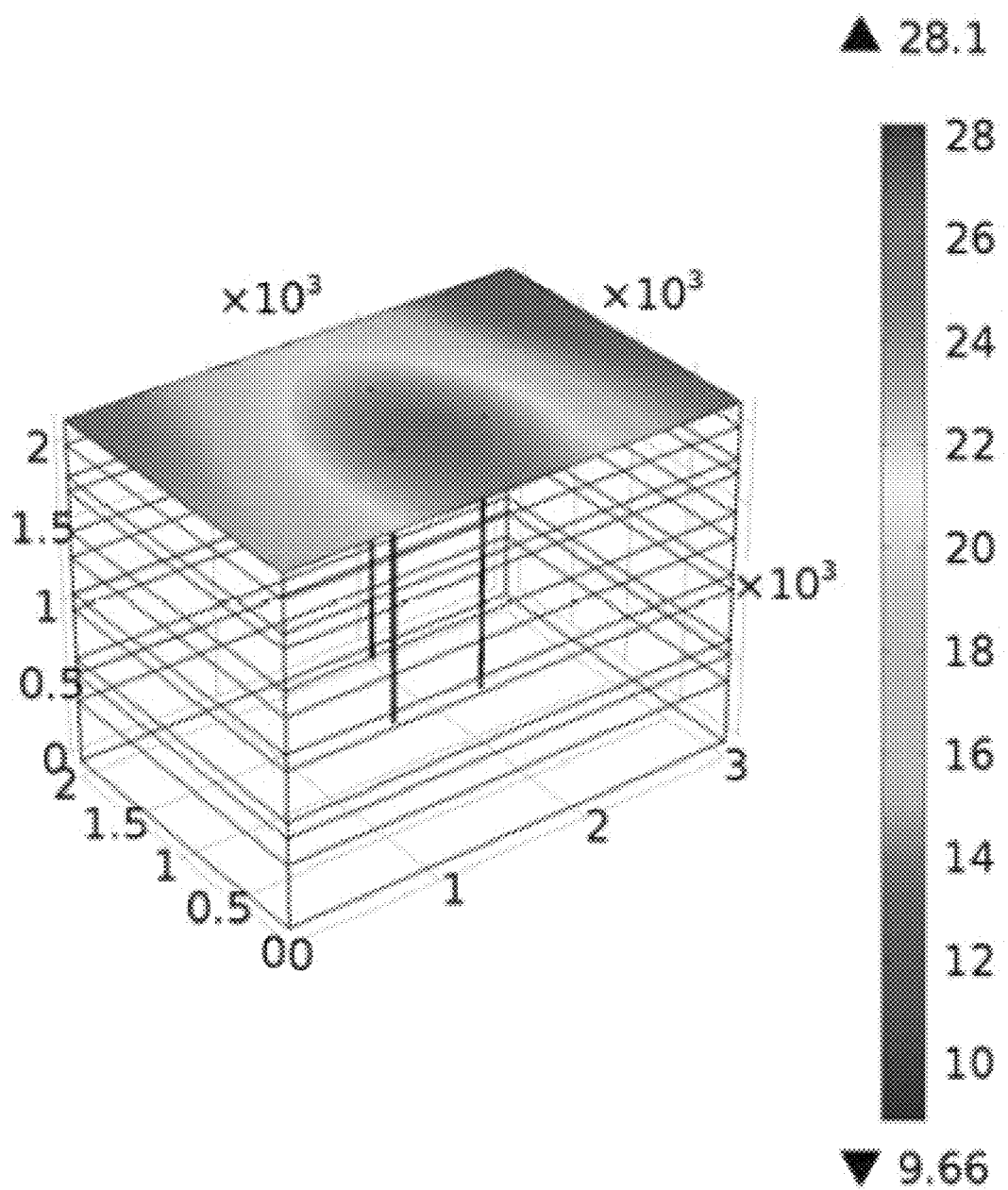
FIGS. 24A-24H illustrate the vertical ground uplift after five years of $CO_2$ injection for three injection wells, A. at 300 m triangular B. at 400 m triangular C. at 500 m triangular D. at 600 m triangular E. at 500 m in-line F. at 600 m in-line G. at 700 m in-line H. at 800 m in-line.
Figure 24B:
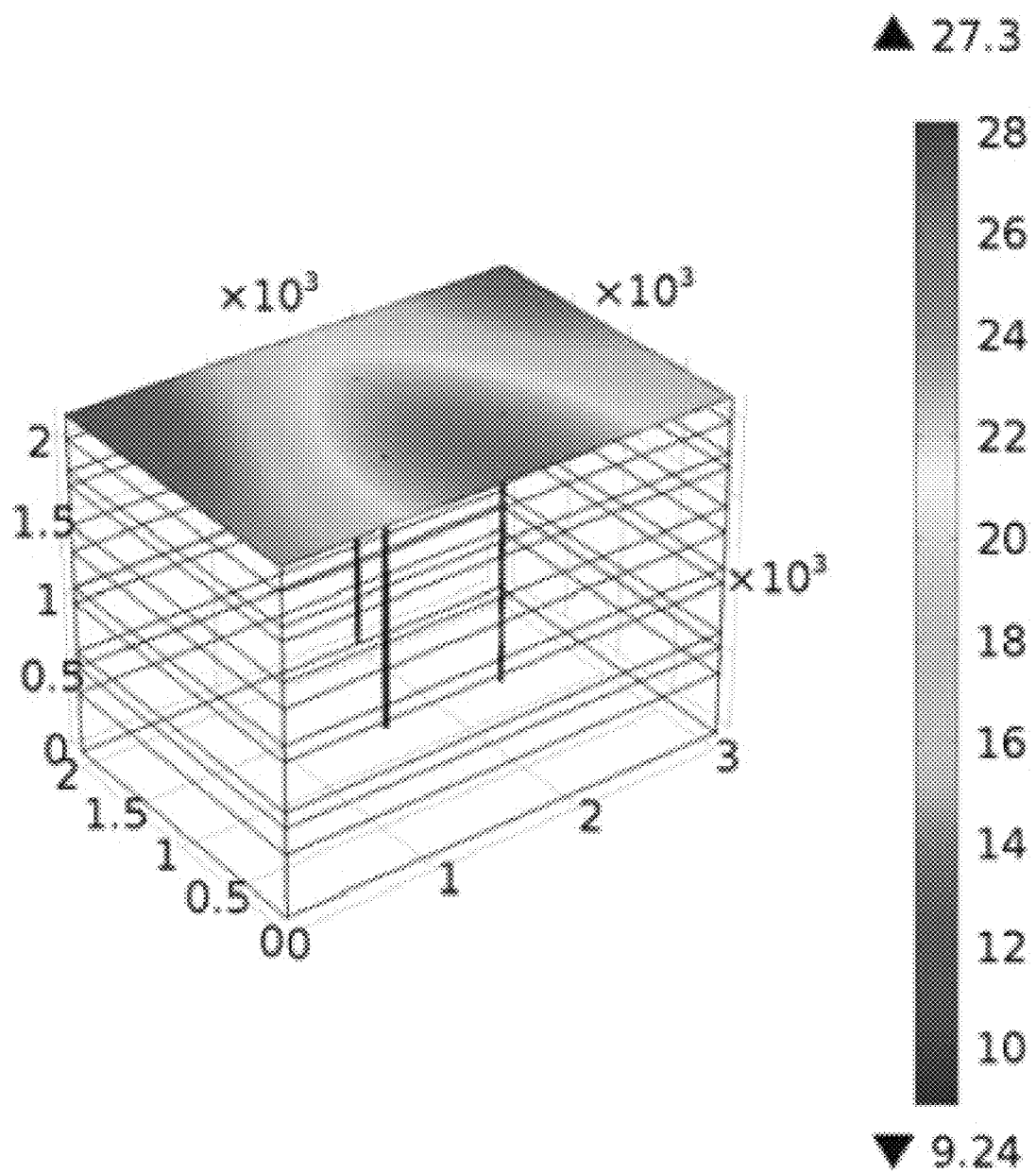
Figure 24C:
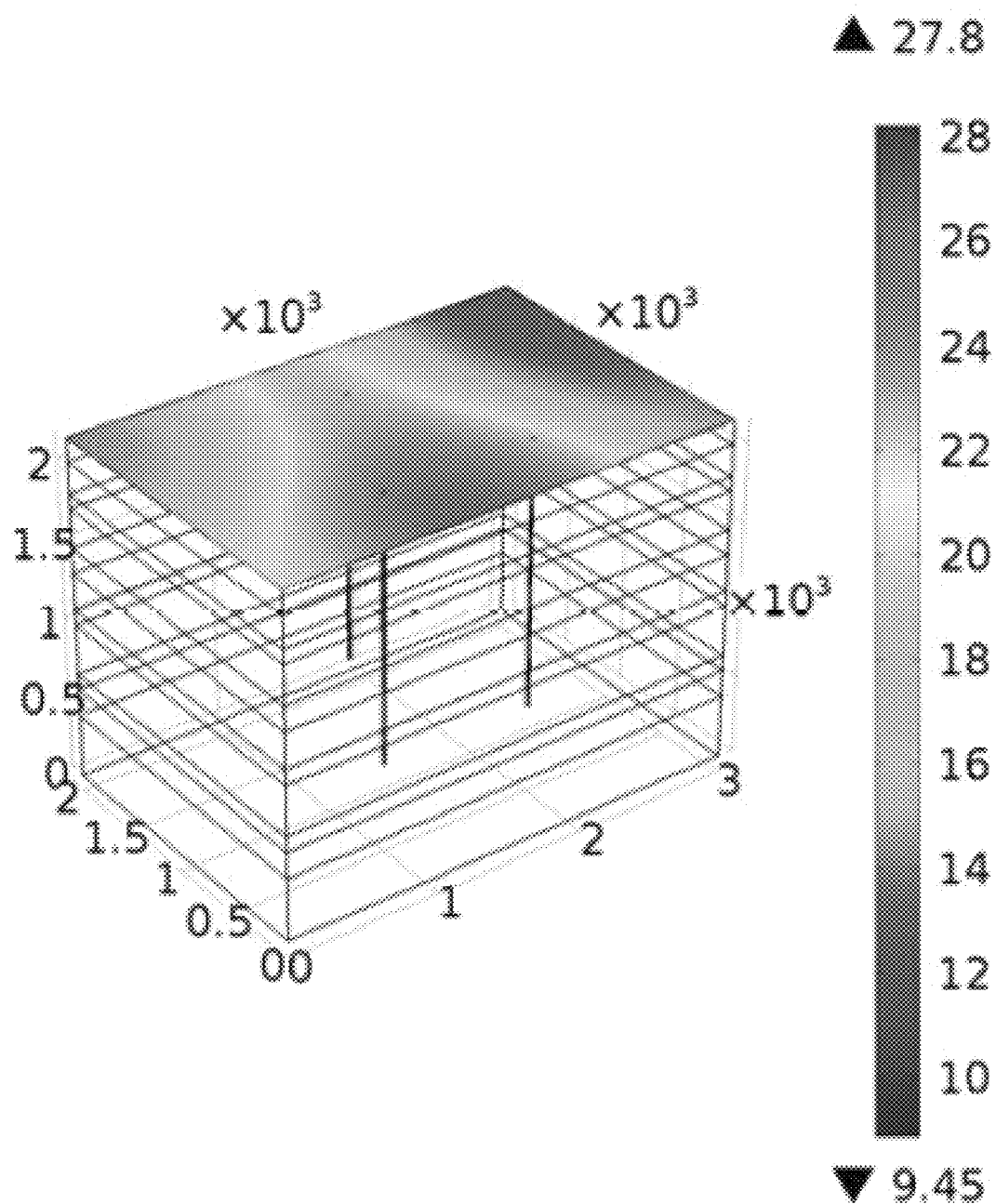
Figure 24D:
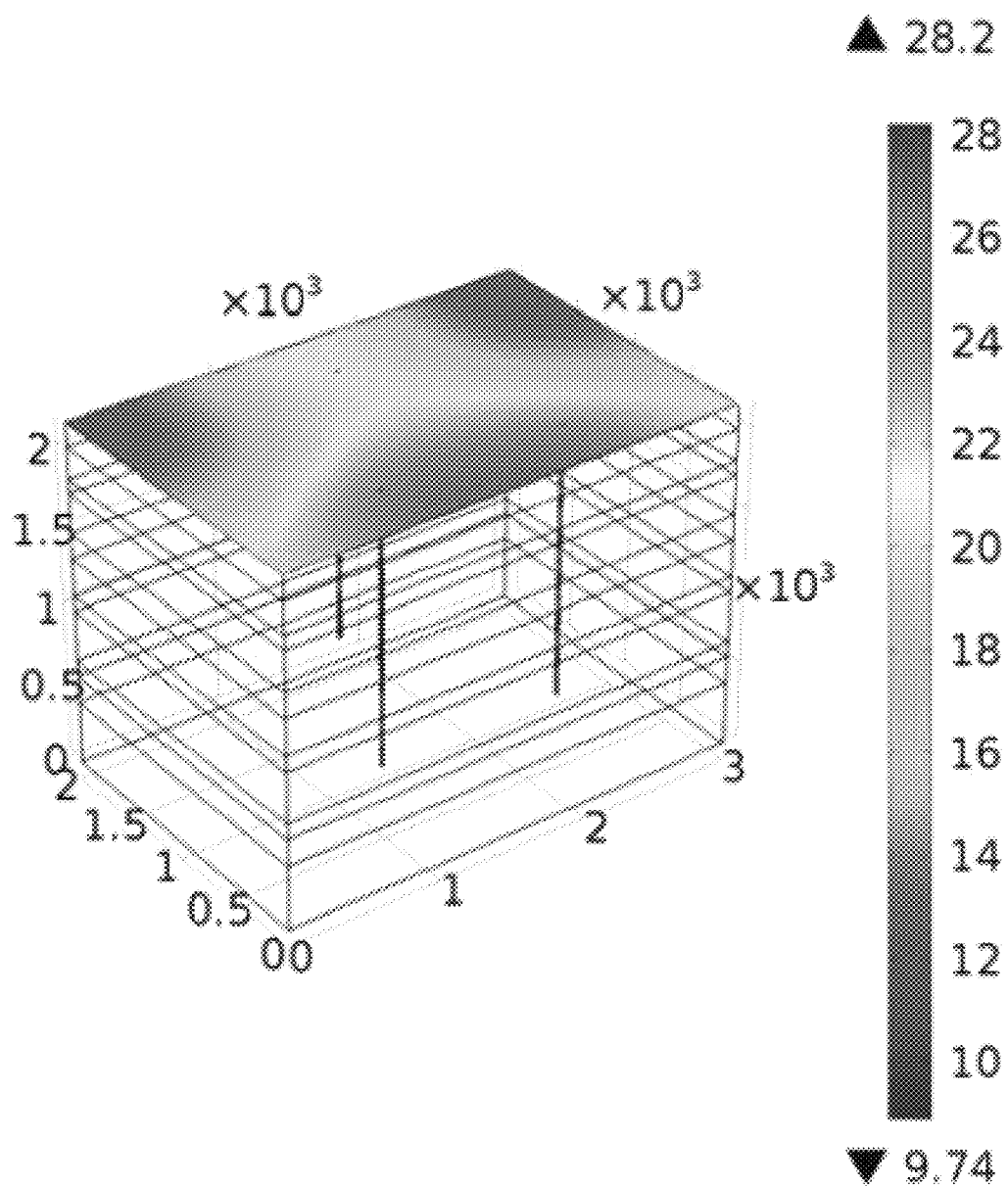
Figure 24E:
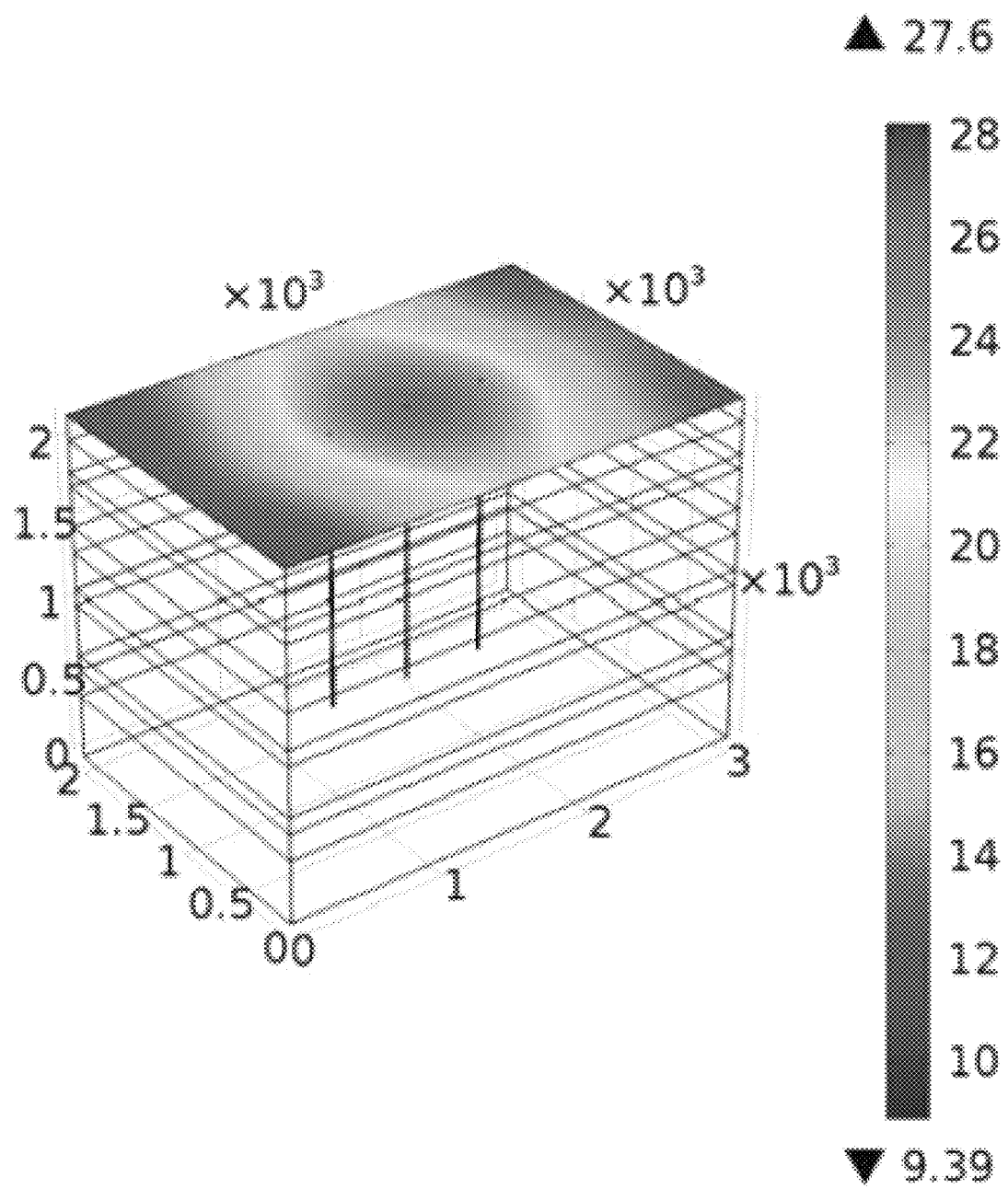
Figure 24F:
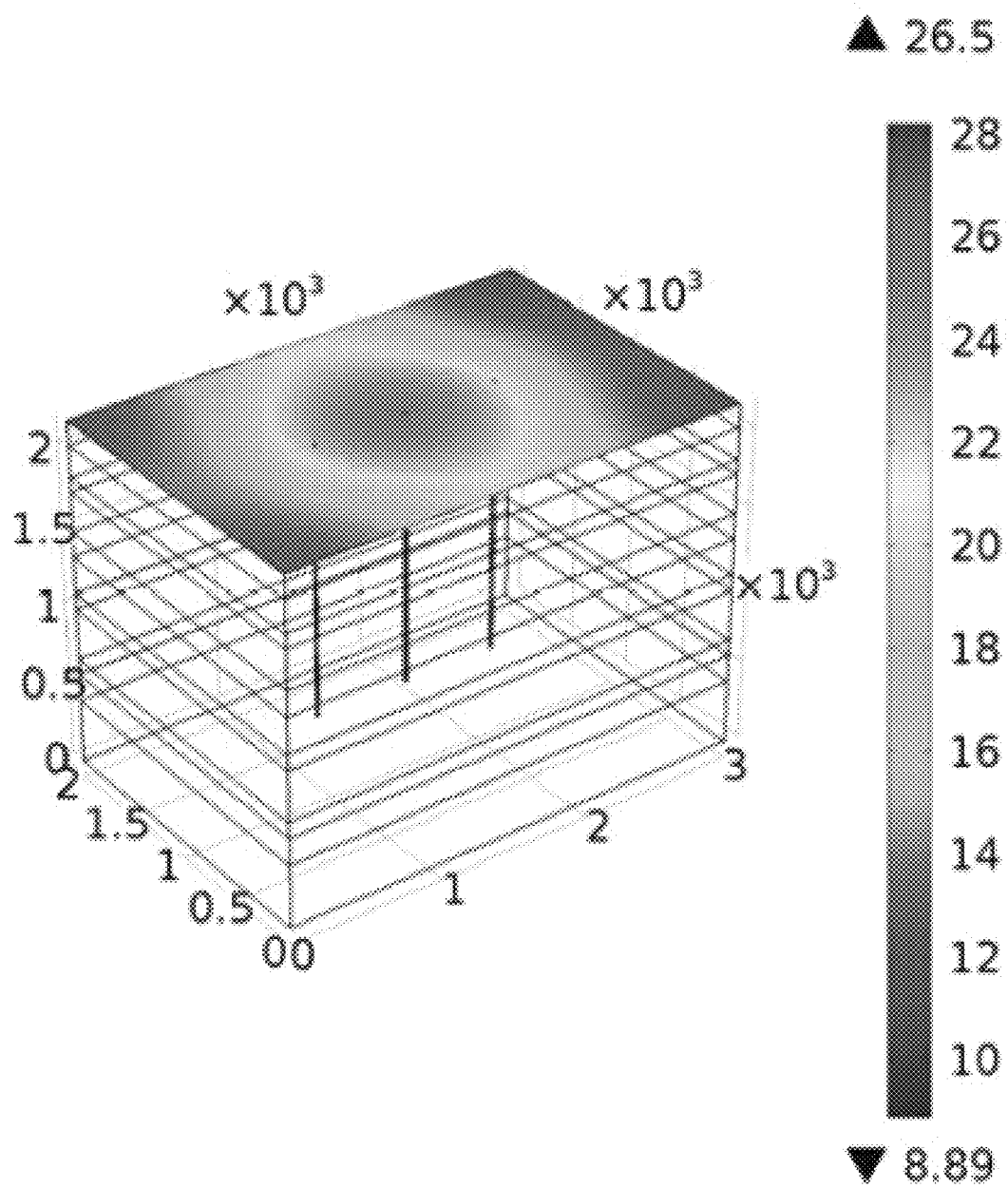
Figure 24G:
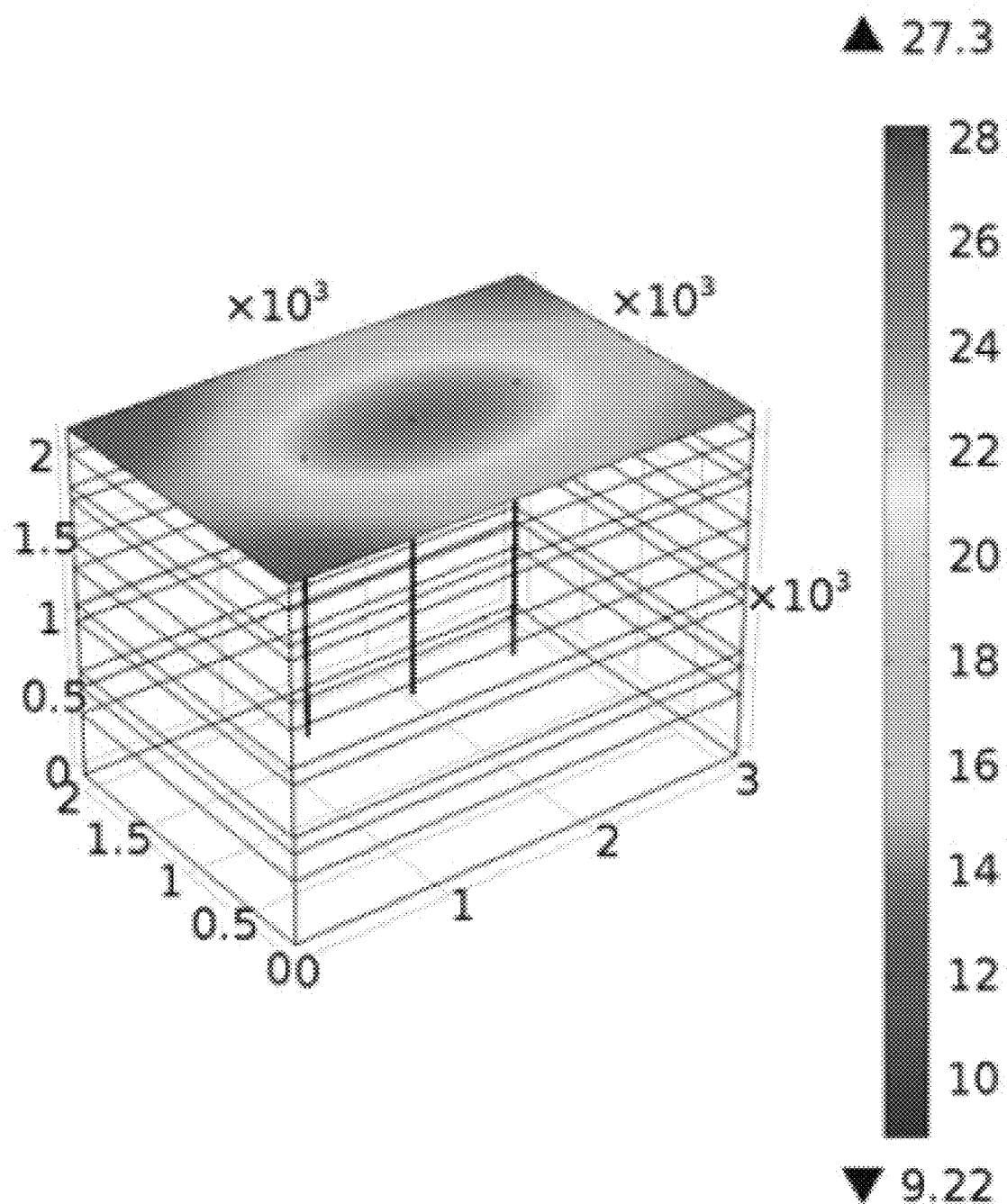
Figure 24H:
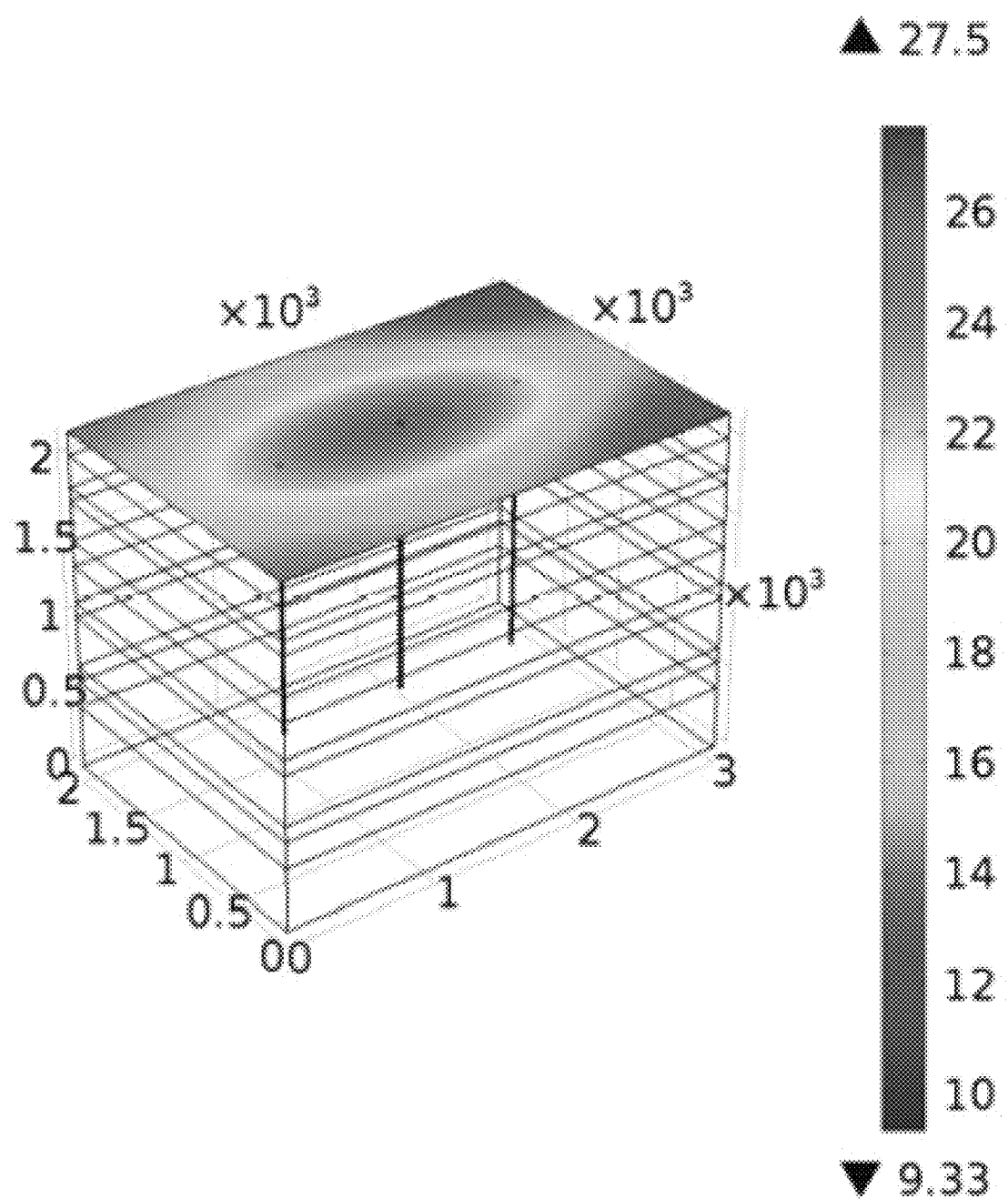
Figure 25A:
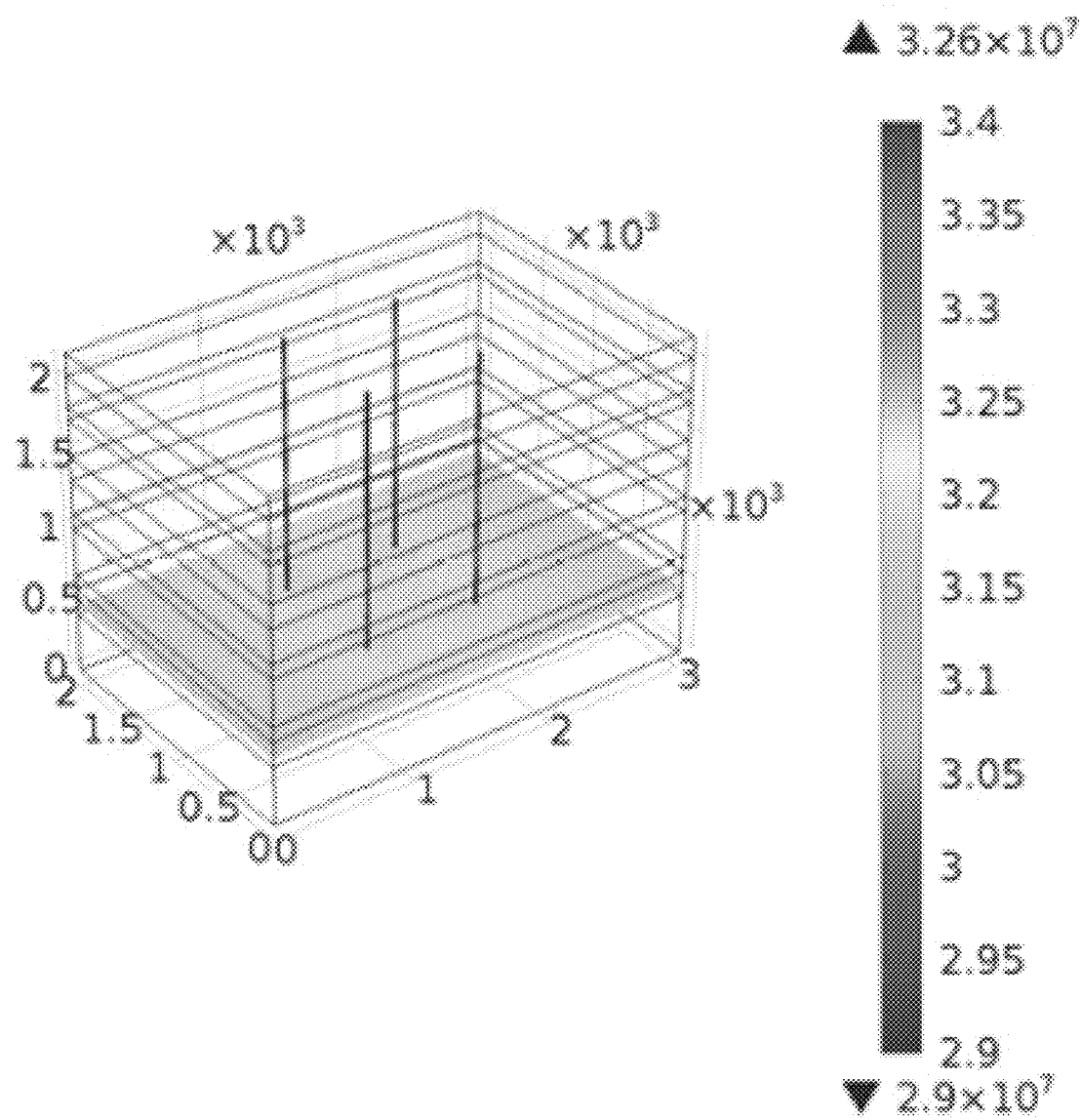
FIGS. 25A-25D illustrate the pressure variation after five years of carbon dioxide injection using four injection wells, A. at 400 meters, B. at 500 meters, C. at 600 meters and D. At 700 meters.
Figure 25B:
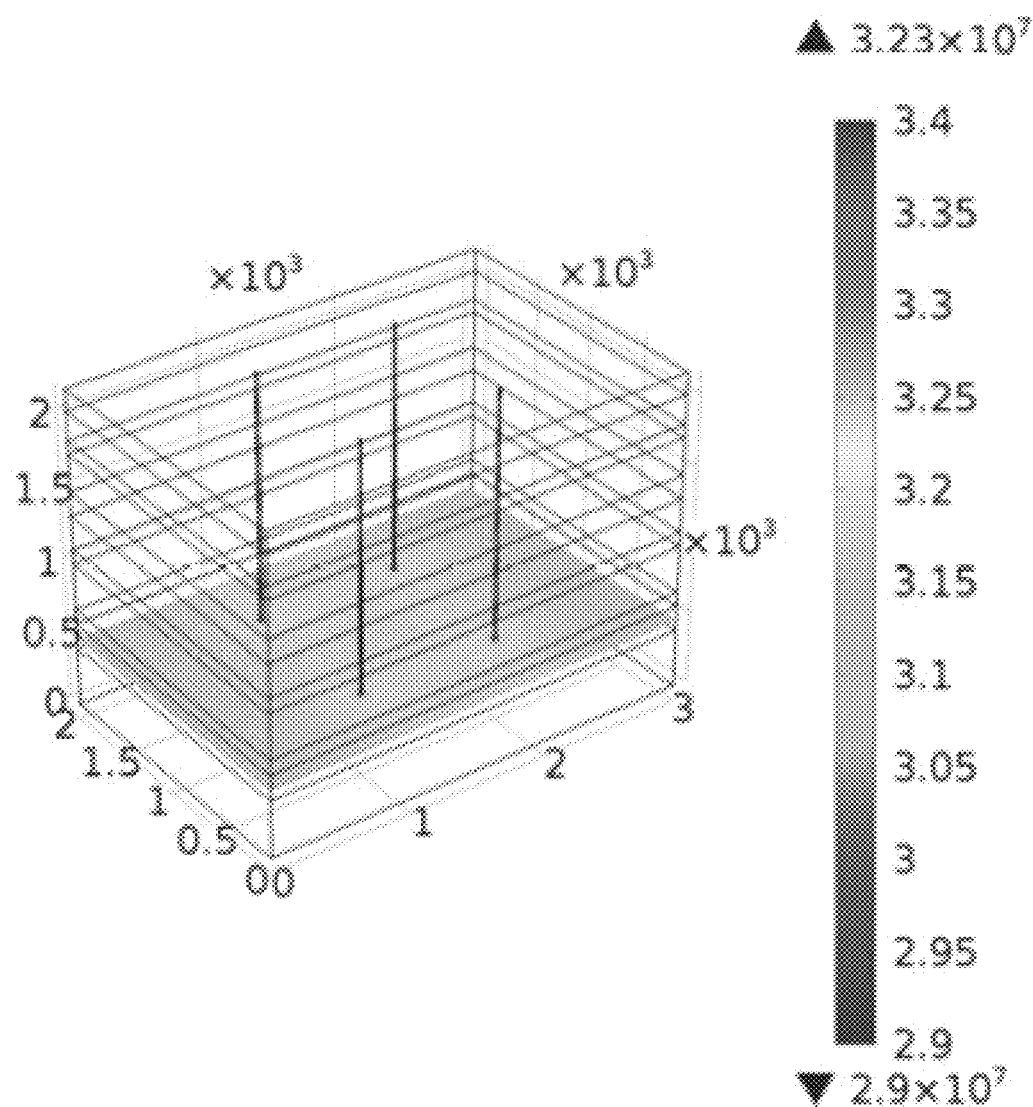
Figure 25C:
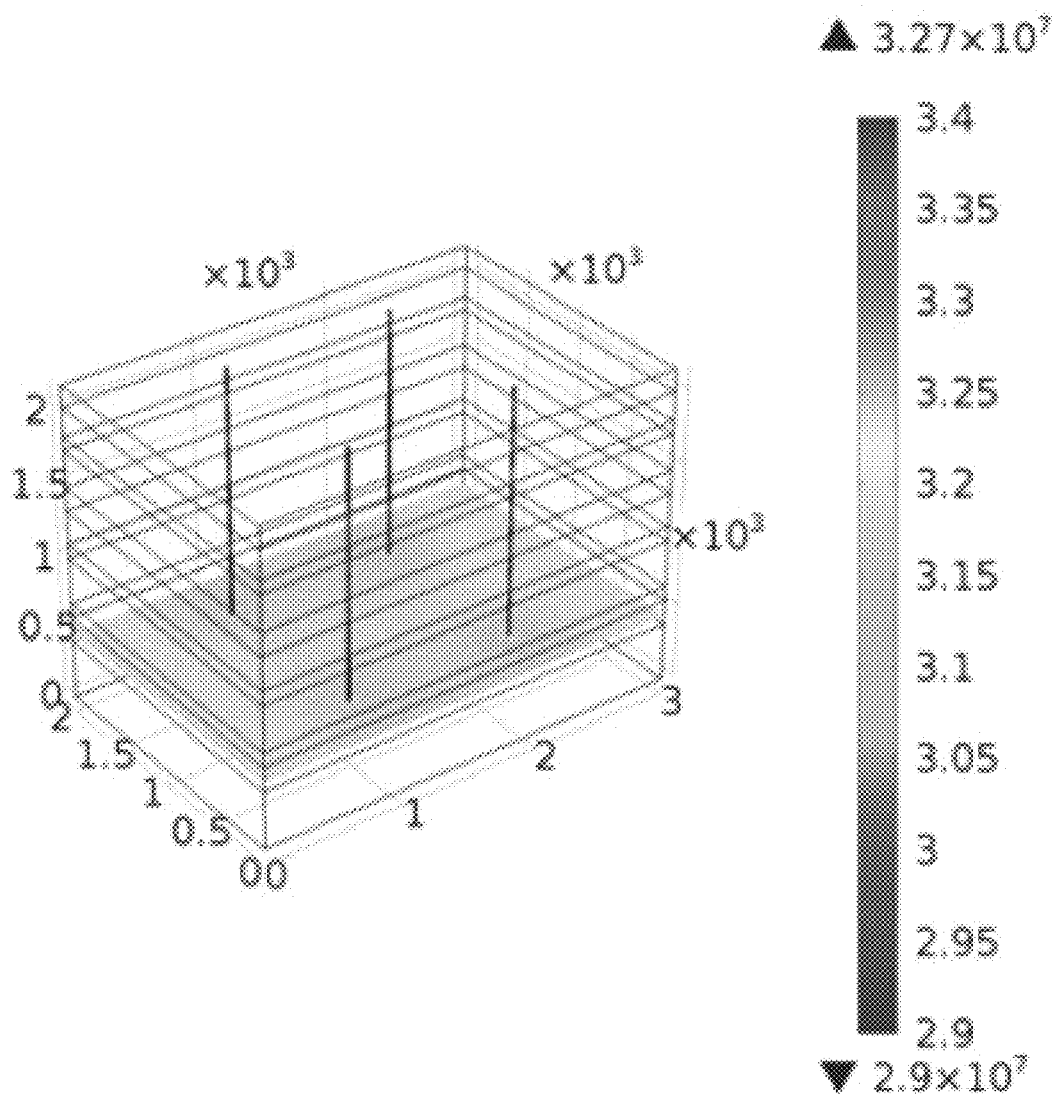
Figure 25D:
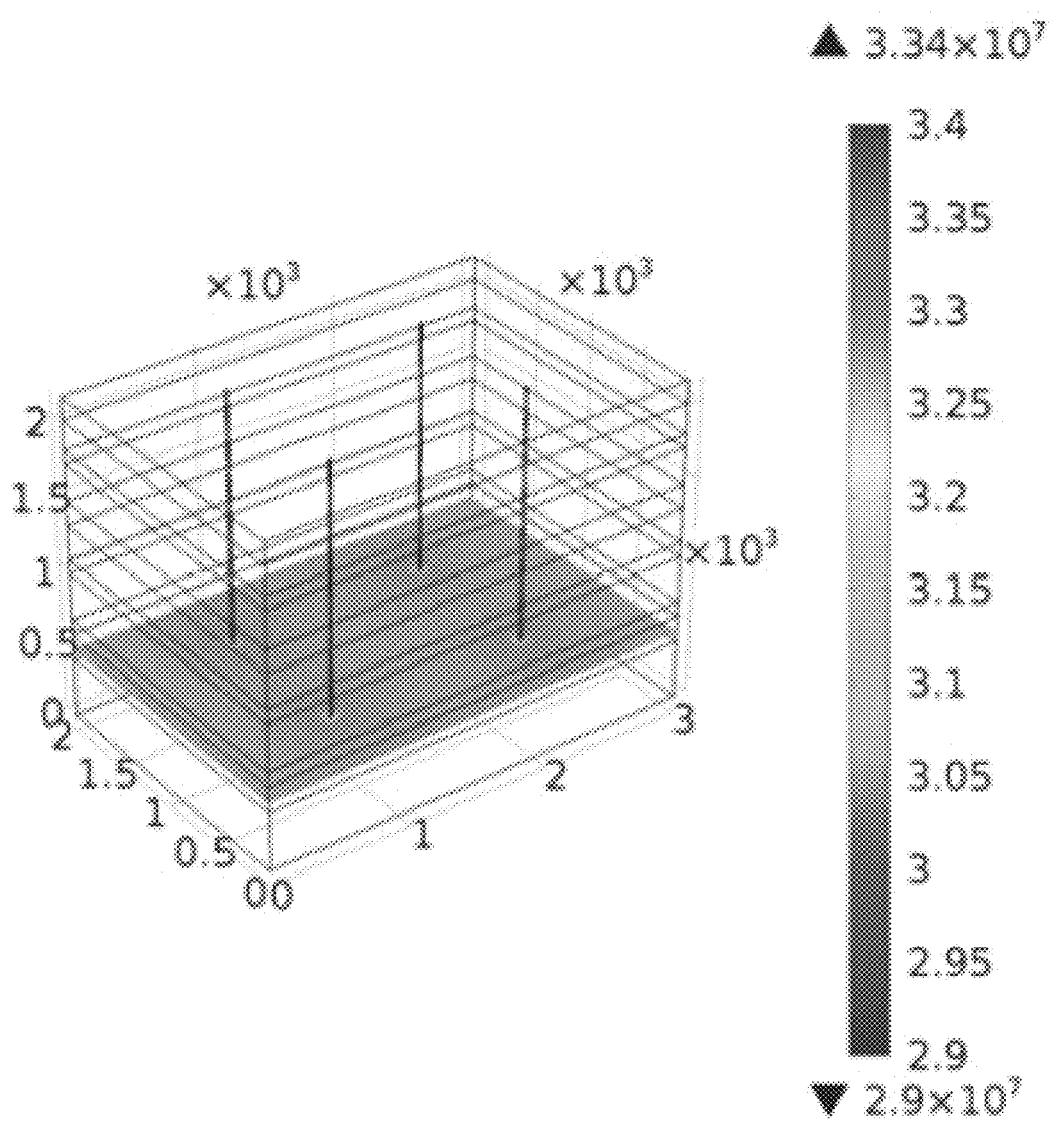
Figure 26A:
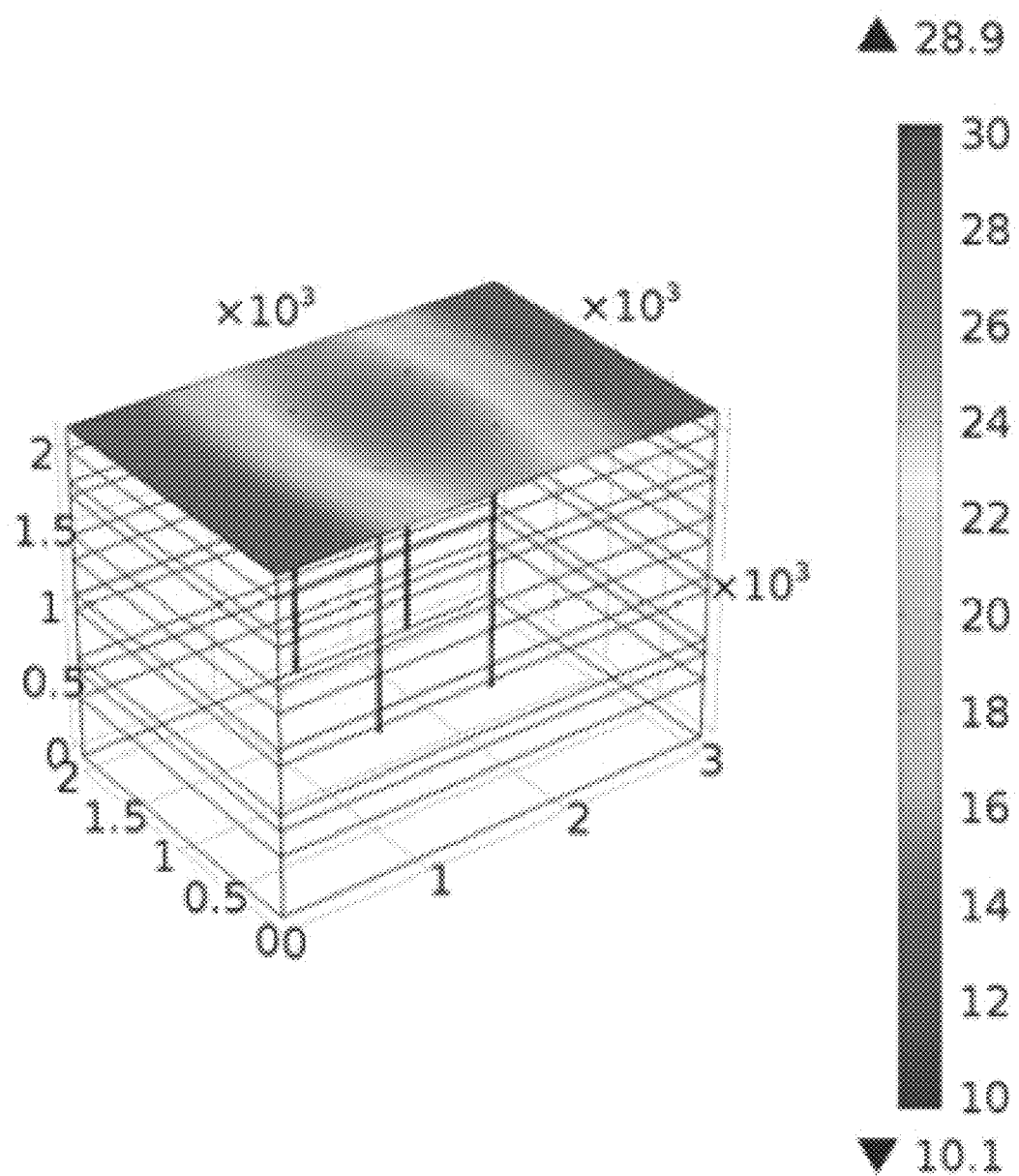
FIGS. 26A-26D illustrate the vertical ground uplift after five years of $CO_2$ injection pressure for four injection wells, A. at 400 meters B. at 500 meters C. at 600 meters D. at 700 meters.
Figure 26B:
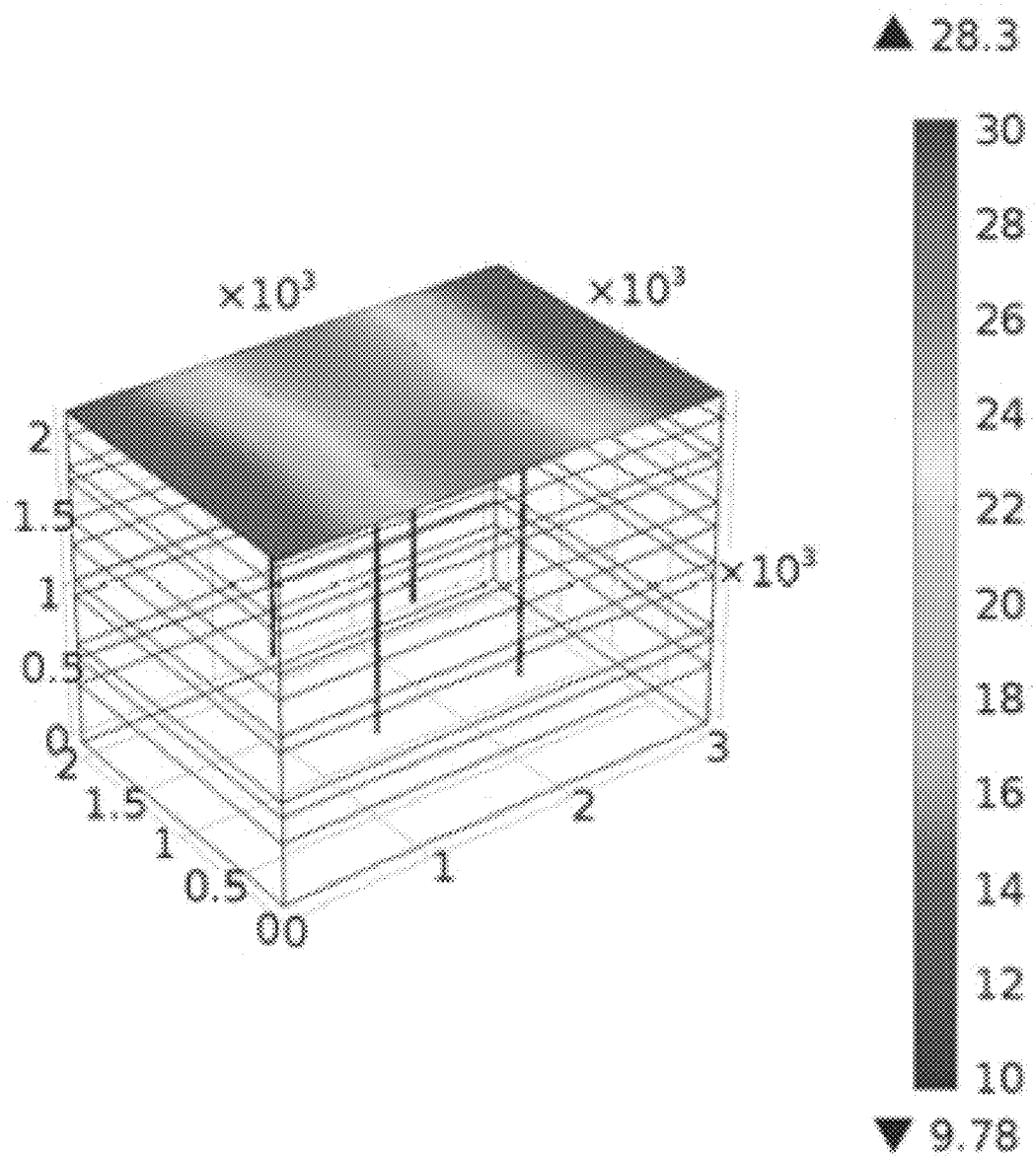
Figure 26C:
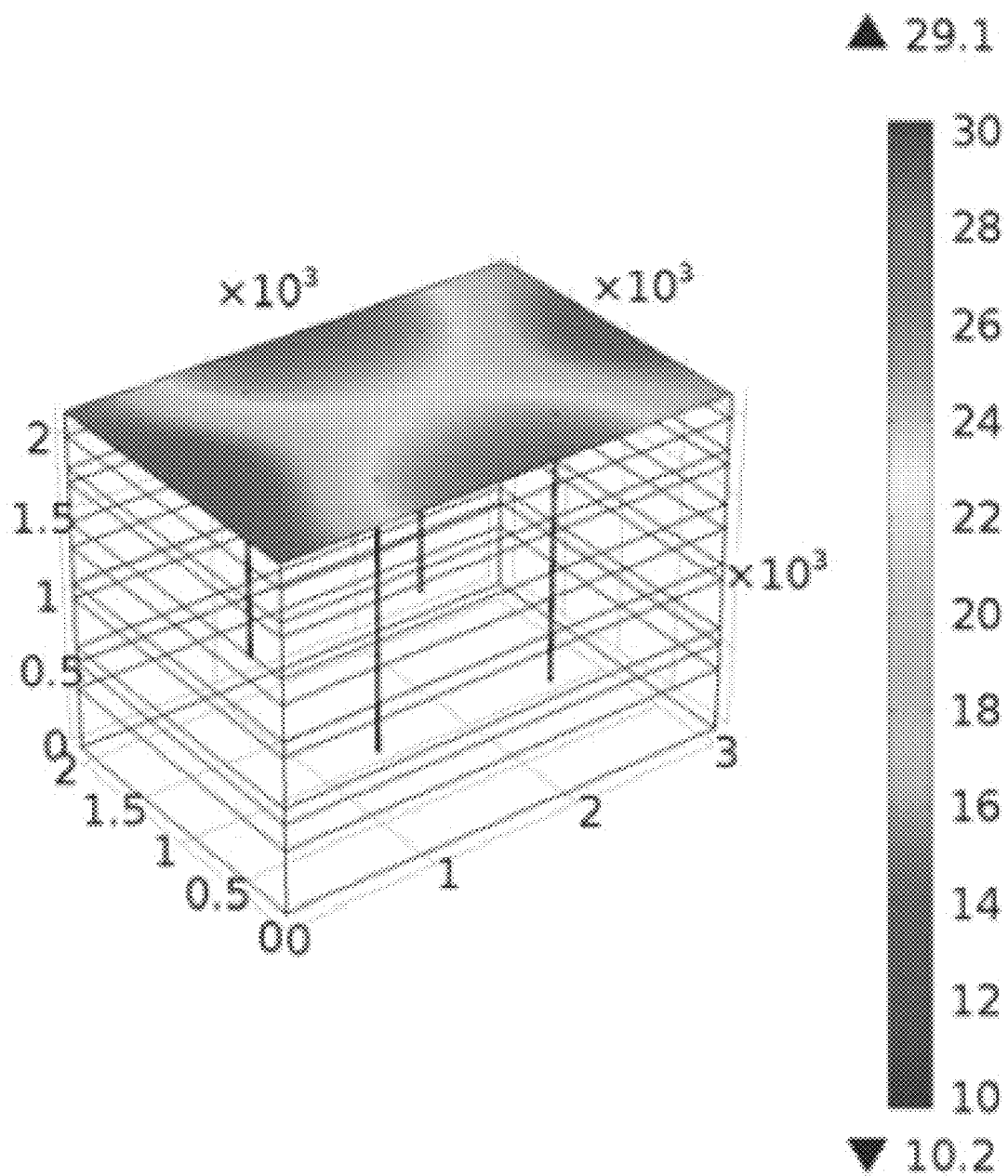
Figure 26D:
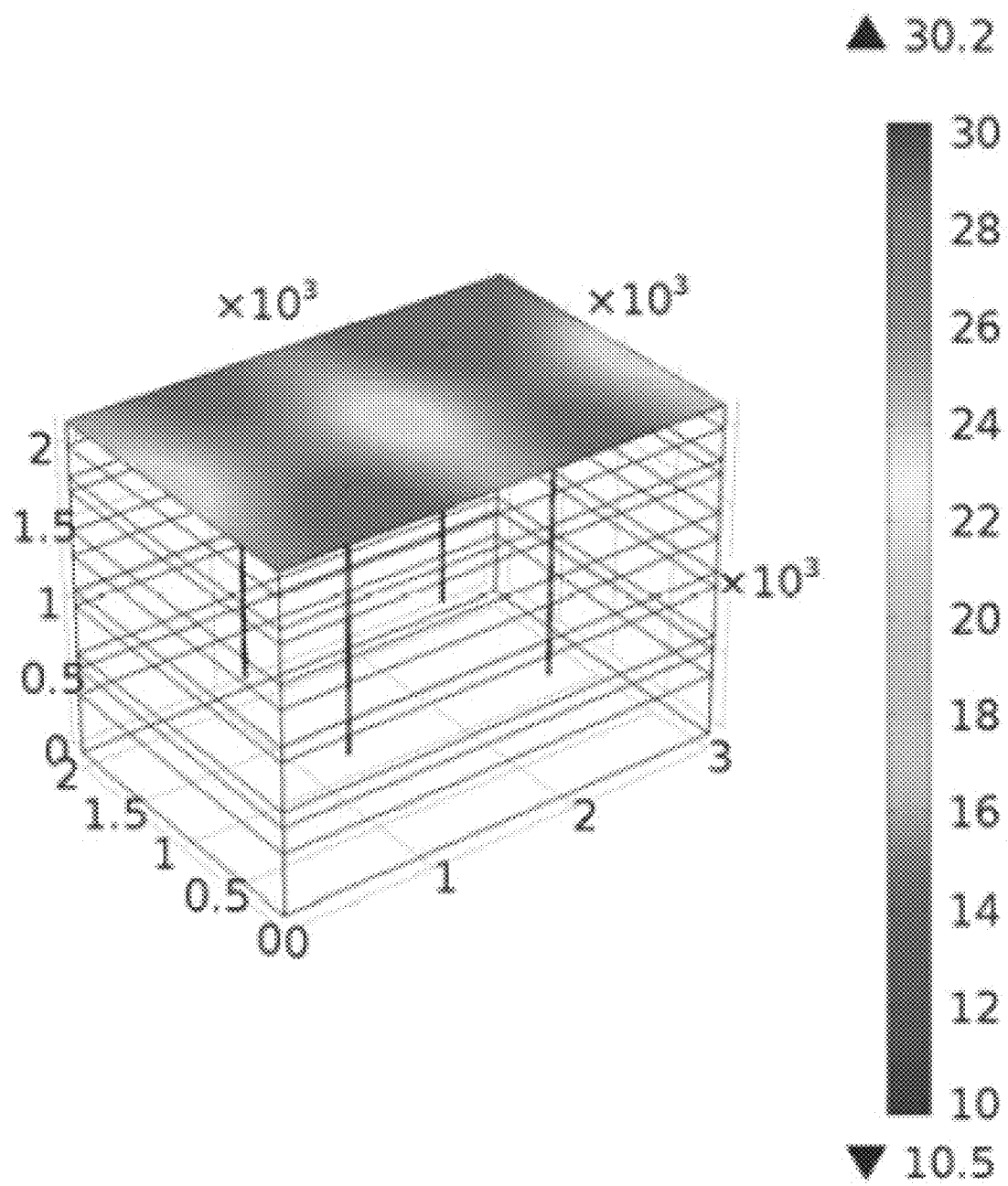

The vertical ground uplift after a five year injection period is shown in FIG. 24A-24H. Three wells at 300 meters distance from reservoir center show a maximum vertical ground uplift of 28.1 mm (FIG. 24A), three wells at 400 meters distance from reservoir center show maximum vertical ground uplift of 27.3 mm (FIG. 24B), three wells at 500 meters distance from reservoir center show maximum vertical ground uplift of 27.8 mm (FIG. 24C), and three wells at 600 meters distance from reservoir center show maximum vertical ground uplift of 28.2 mm (FIG. 24D). Similarly, three wells with in-line arrangement at a distance of 500 meters show a vertical ground uplift of 27.6 mm (FIG. 24E), three wells with inline arrangement at a distance of 600 meters show a vertical ground uplift of 26.5 mm (FIG. 24F), three wells with in-line arrangement at a distance of 700 meters show a vertical ground uplift of 27.3 mm (FIG. 24G), and three wells with in-line arrangement at a distance of 800 meters show a vertical ground uplift of 27.5 mm (FIG. 24H).

The caprock uplift may be monitored for a period of time, and compared to a threshold. An alarm may be provided when the caprock uplift is greater than the threshold. The threshold may be 35 mm, preferably 25 mm, more preferably 20 mm, even more preferably 15 mm, even more preferably 10 mm or less, even more preferably 5 mm or less.

Caprock uplift may be monitored by a comparison of satellite images of the caprock of the reservoir over a period of time.

The period of time may be selected from the range of one to one hundred years, preferably one to fifty years, even more preferably one to twenty five years and even more preferably one to ten years.

Additionally, a fracture in the subsurface layers may be identified at a location of caprock uplift. An alarming system may notify an oilfield management authority of the caprock uplift and its location. In response, the injection pressures may be adjusted or an injection well in the location of the caprock uplift may be shut down.

The pore pressure increase is more for the case of three injection wells at 600 meters distance from the reservoir center as compared to other three wells arrangements. With three injection wells at 600 meters from the reservoir center, the reservoir is more nearer to the failure envelope as compared to the cases of single and two injection wells. However, the reservoir maintains the safe stable condition. A. at 300 m triangular B. at 400 m triangular C. at 500 m triangular D. at 600 m triangular E. at 500 m in-line F. at 600 m in-line G. at 700 m in-line H. at 800 m in-line.

With three injection wells the volume of carbon dioxide injected into the reservoir at the ground level is equal to 7.5756×10⁹ m³ for five years of injection period. Due to the high pressure value of the reservoir, the volume of the injected carbon dioxide decreases to 20.83×10⁶ m³, which is 1.23% of the available pore volume of the reservoir. Still with an occupancy of 1.23%, the reservoir will be on safe side because this occupancy value is less than 2% to 3%. 2% to 3% of the available reservoir pore volume is the maximum occupancy limit.

The different patterns for the four well injection scenario are given in Table 7. In the case of four injection wells, different well arrangements that are equally spaced away from the center of the well are considered. In the first three cases tabulated in Table 7, the four wells are arranged in the form of a square, with the center of the square coincident with the reservoir's center. In the last case in Table 7, the four injection wells are arranged in the form of a rectangle, with its center being coincident with the reservoir center. The pore pressure variation for each pattern and its corresponding effect on the reservoir's stability are explained in the following sections.

TABLE 7

Four well injection arrangements

| Different cases for four-well injection | Central spacing (m) |
| --- | --- |
| Case 1 | Square arrangement with each of the four wells spaced at a distance of 400 m from the reservoir centre. |
| Case 2 | Square arrangement with each of the four wells spaced at a distance of 500 m from the reservoir centre. |
| Case 3 | Square arrangement with each of the four wells spaced at a distance of 600 m from the reservoir centre. |
| Case 4 | Rectangular arrangement with each of the four wells spaced at a distance of 700 m from the reservoir centre at a diagonal angle of 34.85° with line passing through the reservoir centre along the length of the reservoir. |

The numerical simulation results for the four injection wells at 400, 500, 600, and 700 meters distance from the reservoir center are shown in FIG. 25A to 25D and FIG. 26A to FIG. 26D. After a five year injection period, the pressure variation is shown in FIG. 25A to 25D. For a four well square arrangement spaced at 400 m (FIG. 25A), the pore pressure increased from $2.9 \times 10^7$ MPa to $3.26 \times 10^7$ MPa. For a four well square arrangement spaced at 400 m (FIG. 25A) from the reservoir center, the pore pressure increased from $2.9 \times 10^7$ MPa to $3.26 \times 10^7$ MPa. For a four well square arrangement spaced at 500 m (FIG. 25B), the pore pressure increased from $2.9 \times 10^7$ MPa to $3.23 \times 10^7$ MPa. For a four well square arrangement spaced at 600 m (FIG. 25C), the pore pressure increased from $2.9 \times 10^7$ MPa to $3.27 \times 10^7$ MPa. For a four well rectangular arrangement spaced at 700 m (FIG. 25A) at a diagonal angle of 34.85 degrees with line passing through the reservoir center, the pore pressure increased from $2.9 \times 10^7$ MPa to $3.34 \times 10^7$ MPa.

The vertical ground uplift after five years of injection is shown in FIG. 26A-FIG. 26D. The four-well arrangements at 400, 500, 600 and 700 meters from the reservoir center attained maximum values of vertical ground uplift of 28.9 mm (FIG. 26A), 28.3 mm (FIG. 26B), 29.1 mm (FIG. 26C) and 30.2 mm (FIG. 26D), respectively. For the four-well arrangement at 700 meters from the reservoir center, the pore pressure attained a higher increase relative to other four-well arrangements while remaining within safe limits.

For the four well injection arrangements, an amount of $10.1008 \times 10^9$ m³ of carbon dioxide was injected into the reservoir at ground level. At the reservoir level of 1,750 meters, the carbon dioxide is stored in a dense form at a volume of $27.77 \times 10^6$ m³, with occupancy of 1.64% of the available pore volume. The maximum occupancy value for the reservoir is 3% of the total available volume which demonstrates that the current injection scenario with four wells remains within the safe limit of 2-3%.

Figure 27A:
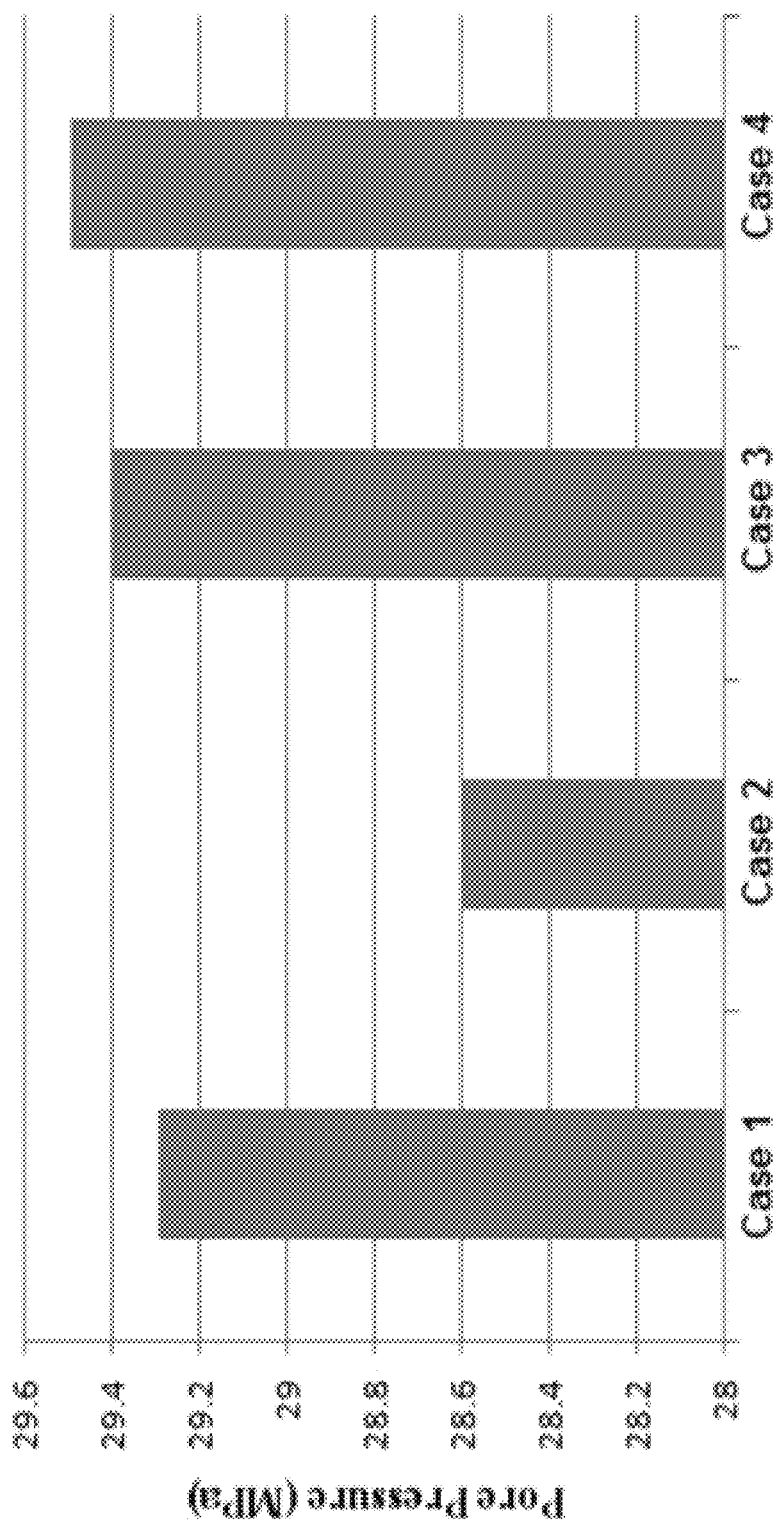
FIGS. 27A-27C illustrate the maximum pore pressure for various arrangements of injection wells, A. two injection wells B. three injection wells C. four injection wells.

The maximum pore pressure for various two-well injection arrangements of Table 5 are summarized in FIG. 27A wherein cases 1 to 4 represent two injection wells that are spaced by a central distance of 600, 800, 1,000 and 1,200 meters, respectively. The pore pressure for case 1 is higher than that for case 2 due the interaction between the pore pressure profiles that tends to increase the overall pore pressure value as the two wells become closer. However, this trend is reversed as the injection wells get closer to the boundaries of the reservoir, as shown for cases 3 and 4. In this case, the highest pressure build-up is for the case of two wells spaced by at a distance of 1,200 meters at about $2.95 \times 10^7$ MPa.

Figure 27B:
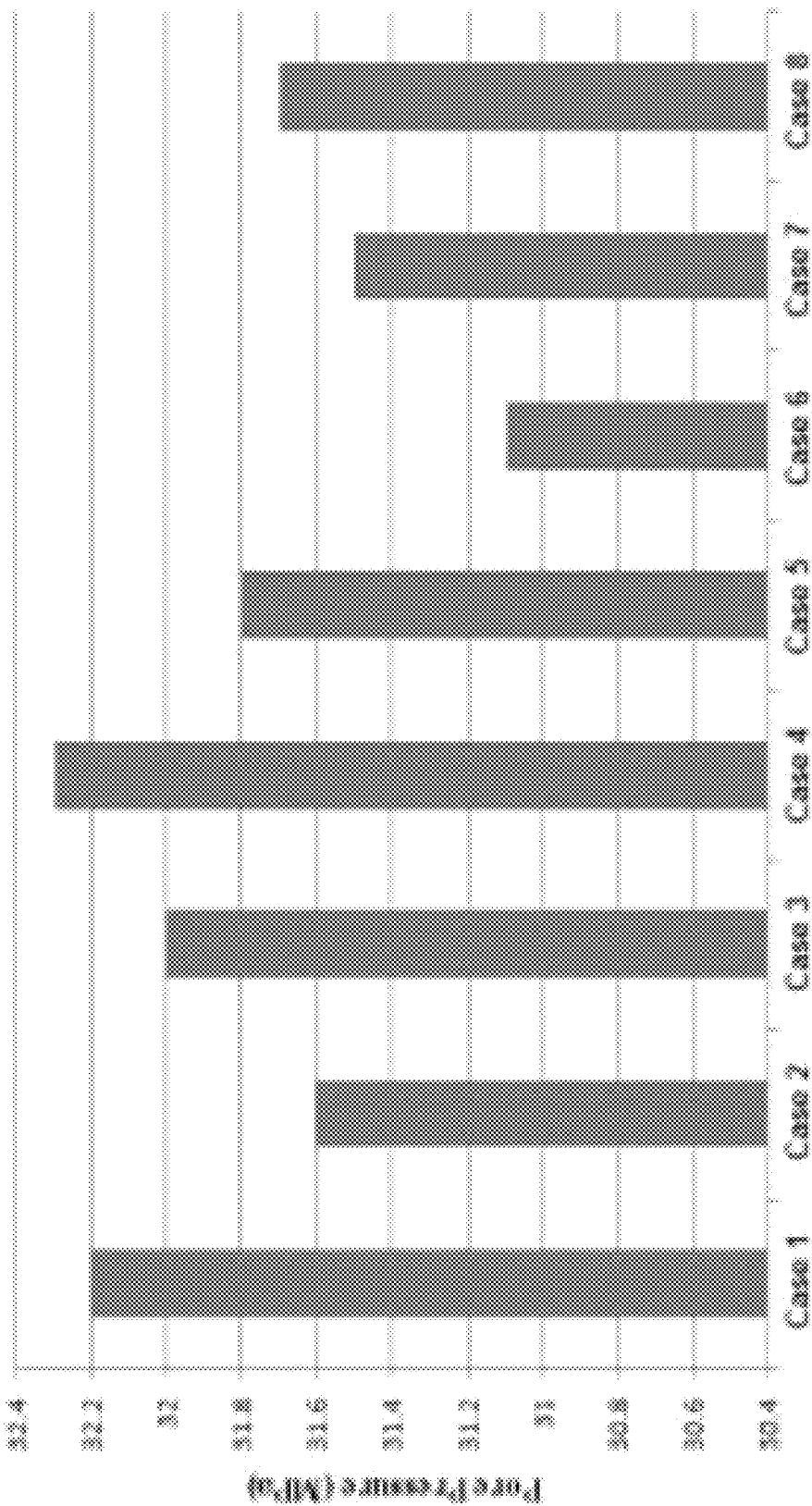

The maximum pore pressure for different three-injection well arrangements is summarized in FIG. 27B. The various cases shown in FIG. 27B were explained in Table 6. Cases 1 to 4 are equilateral triangular arrangements, and cases 5 to 8 are in-line arrangements. FIG. 27B shows that the equilateral triangular arrangements of the injection wells have higher pore pressure build-up as compared to the in-line well arrangements. One explanation for this equilateral triangular arrangements place the injection wells nearer to the reservoir boundary walls as compared to the in-line well arrangements. Among the equilateral triangular arrangements, the optimum arrangement with less pressure build-up is case 2 with three equilateral injection wells at a distance of 400 meters from the reservoir center. Among the in-line wells arrangements the optimum arrangement with less pressure build-up is case 6 with three injection wells placed in-line such that one of the well is at the reservoir center and the other two are at a distance of 600 meters from the central well.

Figure 27C:
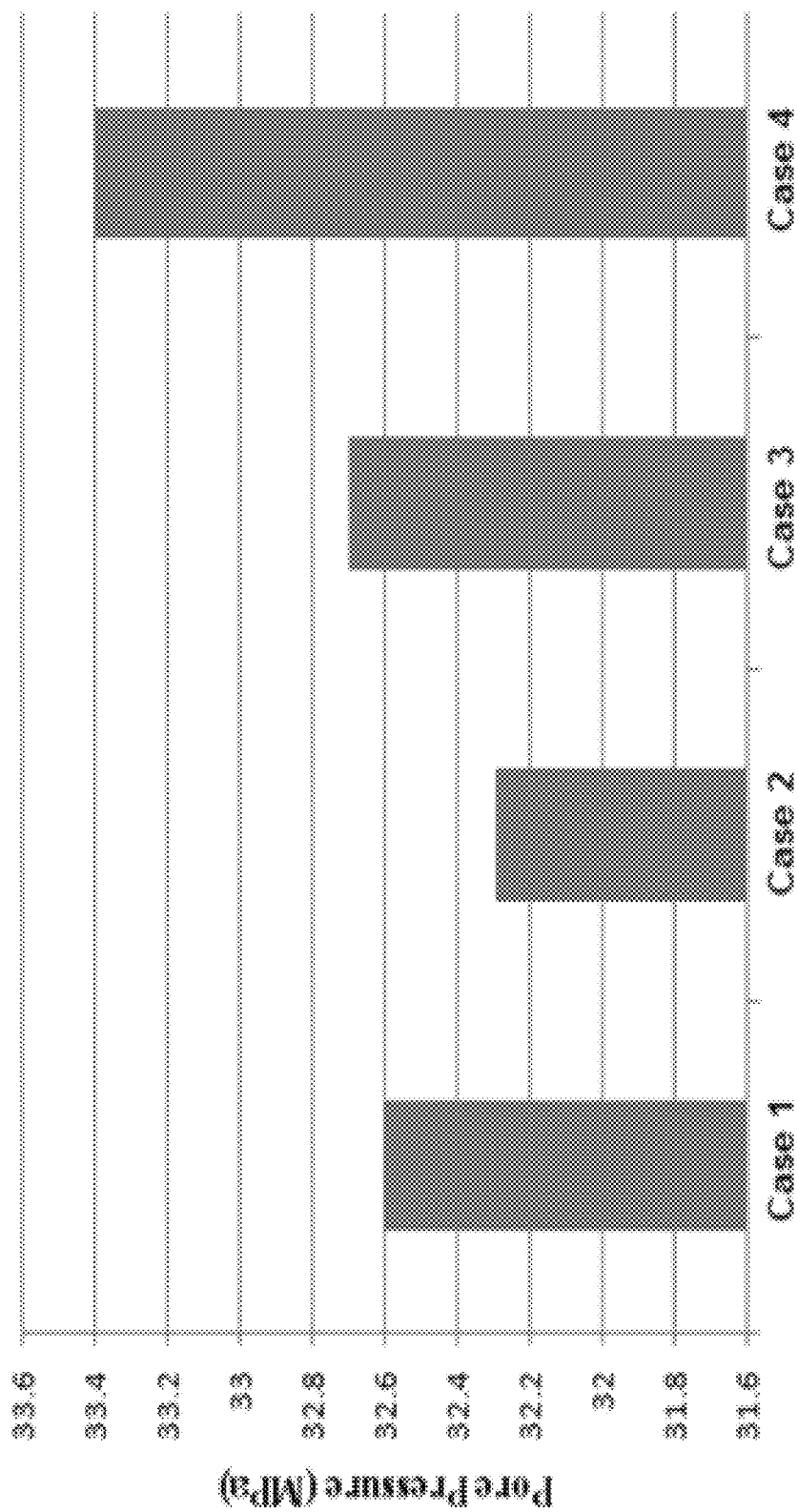

FIG. 27C shows the maximum pore pressure for different four-well injection arrangements listed in Table 7. Among the four cases, the minimum pore pressure build-up was found for case 2 at 500 meter spacing about $32.3 \times 10^7$ MPa, while the maximum pressure build-up was for case 4 at 700 meter spacing from the reservoir center was $33.4 \times 10^7$ MPa. In case 4, the value of the pore pressure after carbon dioxide injection is higher due to the reason that the injection wells are much closer to the boundary walls of the reservoir, which stop the flow of $CO_2$.

The above detailed aspects of the present disclosure, illustrated in FIG. 18A to 27C, determined the effect on reducing the pore pressure build-up and increasing the reservoir storage capacity by varying both the number and arrangement of carbon dioxide injection wells. The equation-based modelling technique in COMSOL multi-physics finite element software was utilized for the numerical modelling of different carbon dioxide injection scenarios.

The effect of the reservoir size and boundary conditions selection are investigated using geo-mechanical modeling of a reservoir undergoing carbon dioxide injection. This investigation determines relationships between reservoir size and boundary conditions selection to reservoir pore pressure buildup, ground uplift, fault reactivation and reservoir's stability. Coupled geo-mechanical modeling was performed for different sizes of reservoir models in COMSOL multiphysics software at different boundary conditions. The CMG-GEM (Computer Modeling Group Ltd-Geomechanical Modeling Software) was utilized to model fault reactivation during carbon dioxide injection into small and large size reservoirs with closed boundary condition. The geomechanical modeling for carbon dioxide injection was performed for carbon dioxide injection via single injection well at the center of the reservoir, as well as for injection via multiple injection wells. The reservoir stability analysis was performed using the Mohr-Coulomb failure criterion for both small and large models at different boundary conditions.

Hydro-mechanical coupled geo-mechanical modeling was performed for carbon dioxide injection into small and large models of a sandstone reservoir. In a non-limiting example, the sandstone reservoir is the Biyadh reservoir. During the coupled geo-mechanical modeling, the flow of carbon dioxide caused the deformation of the reservoir structure. The model is based on the following assumptions and simplifications:

(1) Conditions are isothermal.

(2) The simplified layered model incorporates initial values from known data sources and average values are used to represent the thickness of the various layers in the system.

(3) Geochemical modeling was not performed.

(4) A linear variation of the initial pore pressure and stresses along the depth is adopted.

(5) A constant value was assigned to the Biot's coefficient and a uniform porosity distribution is assumed along the reservoir.

In order to model the flow of carbon dioxide in the reservoir and the corresponding reservoir deformation due to carbon dioxide injection, two sets of governing equations were used.

The flow of carbon dioxide in the reservoir was modeled using the mass conservation and Darcy's equations, as given by equation (1) and (2) respectively $$\frac{\partial}{\partial t}(\rho_f \phi) + \nabla \cdot (\rho_f q) = Q_m \quad (21)$$

$$q = -\frac{k}{\mu}(\nabla p_f + \rho_f g \nabla D) \quad (22)$$

where:
$\rho_f$=density of carbon dioxide (kg/m$^3$),
q=Darcy's velocity vector (m/sect),
$p_f$=pore pressure (Pa),
$Q_m$=source term (kg/m$^3$),
$\phi$=matrix porosity,
D=depth in the gravity direction (m),
k=permeability (mDarcy),
$\mu$=fluid viscosity (Pa-sec).

Reservoir Deformation Equations

The deformation of the reservoir due to carbon dioxide injection was modeled using the reservoir stress equilibrium, stress-strain, and strain-displacement equations as follows:

$$-\nabla \cdot \sigma = F_v = \rho_{avg} g \quad (23)$$

$$\sigma - \sigma_0 = C:(\varepsilon - \varepsilon_0 - \in_{inel}) - \alpha p_f I \quad (24)$$

$$\varepsilon = \frac{1}{2}((\nabla u)^T + \nabla u) \quad (25)$$

where:
$\sigma$=Stress tensor (N/m$^2$),
$F_v$=Volume force vector (N/m$^3$),
$\varepsilon$=strain tensor,
C=elastic tensor,
$\alpha$=Biot's coefficient,
u=displacement components (in meters).

Equations (21-24) were solved for three displacement components along x, y, and z axes, in addition to the pore pressure. During carbon dioxide injection, Darcy flow was considered in the porous medium. During the modeling procedure, the carbon dioxide flow and reservoir deformation equations were fully coupled. As implied by equation (23), the change in the pore pressure was shown to influence the stress-strain relation and hence the displacement field in the porous medium. However, as manifested by equation (21), the spread of carbon dioxide in the reservoir was dependent on the change in the pore pressure, the permeability of the porous medium, and the viscosity of carbon dioxide.

The injection of carbon dioxide changes the magnitude of the effective stresses in the reservoir. Any pre-existing fault can be activated if the magnitude of the effective stresses acting on the fault decreases from a critical limit. The Barton-Bandis model present in CMG-GEM was utilized to model the fault reactivation during carbon dioxide injection into the reservoir. The main objective of performing the fault reactivation modeling is to evaluate the effects of reservoir size and boundary conditions on fault reactivation in the reservoir. According to Barton-Bandis model, the decrease in the effective stresses due to carbon dioxide injection will cause a significant increase in the fault permeability and thus will cause the leakage of the trapped carbon dioxide from the reservoir. In this model, a fault was inserted into the Shuaiba caprock layer 122 (See FIG. 1) which is closed before carbon dioxide injection. As compared to other models used in the past, the Barton-Bandis model is more efficient for modeling the fault permeability variations during carbon dioxide injection.

The fault permeability $k_f$ can be calculated as:

$$k_f = \overline{k}(e/e_0)^4 \quad (26)$$

where $\overline{k}$ is the fracture closure permeability, and where:

$$e = e_o - V_j \quad (27)$$

$$V_j = \frac{\sigma_n}{\xi + \sigma_{n'}/V_m} \quad (28)$$

$$V_m = e_o\left[1 - \left(\frac{\lambda}{\overline{k}}\right)^{1/4}\right] \quad (29)$$

The term $e_0$ represents the initial fracture aperture and e is the current fracture aperture, $V_j$ represents the fracture stiffness ratio, $\sigma_{n'}$ represents the normal fracture effective stress, $\xi$ represents the initial normal fracture stiffness, $\lambda$ represents the initial fracture permeability, and $V_m$ represents the minimum fracture aperture.

Using the non-limiting example of the Ghawar oil field, the geological location of Biyadh layer 114 is seen in FIG. 1. The Biyadh sandstone reservoir is a suitable site for the long term injection of carbon dioxide because: (a) it is capped by the low permeability Shuaiba layer 122, and (b) it is far away from the potable water Um Er Radhuma layer 124.

During the modeling procedure in COMSOL multiphysics, each layer in FIG. 1 is considered to have a constant thickness in the vertical direction.

Figure 28:
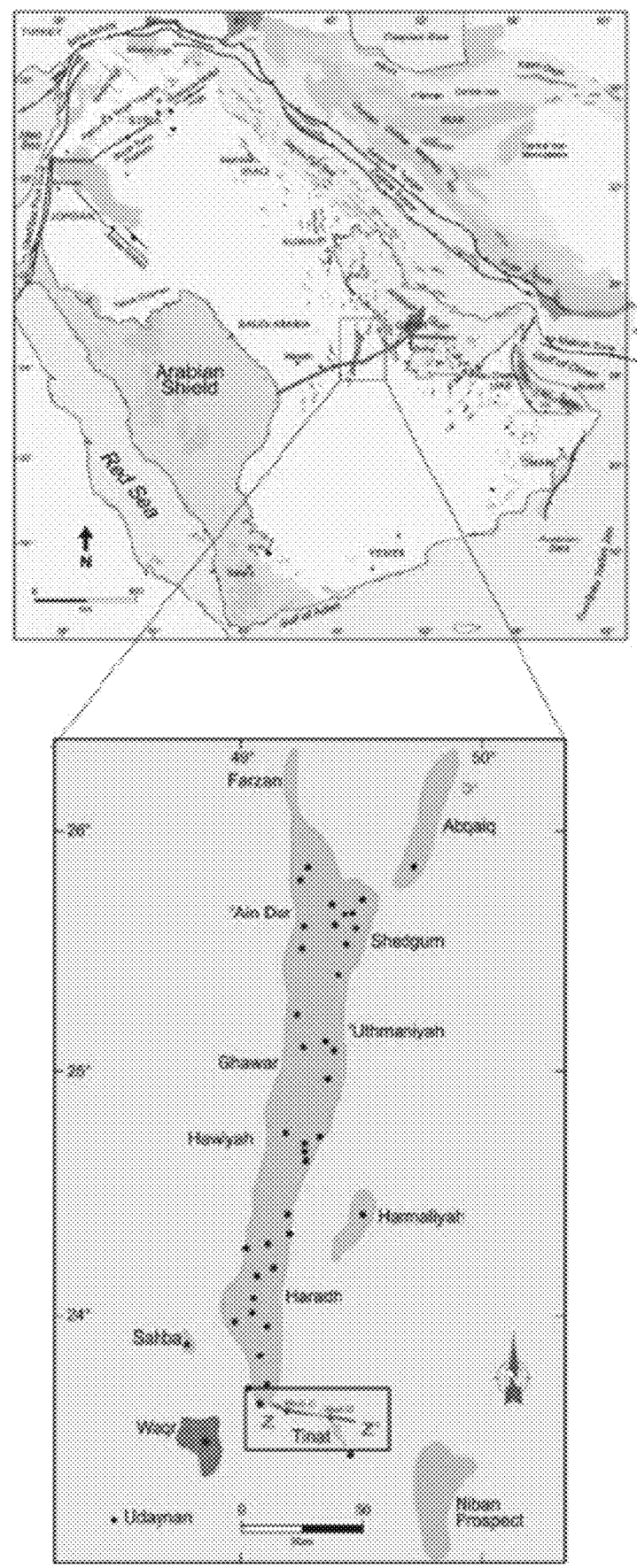
FIG. 28 illustrates a geological map with orientation and location of the Biyadh and Arab Jubaila reservoirs.
Figure 29:
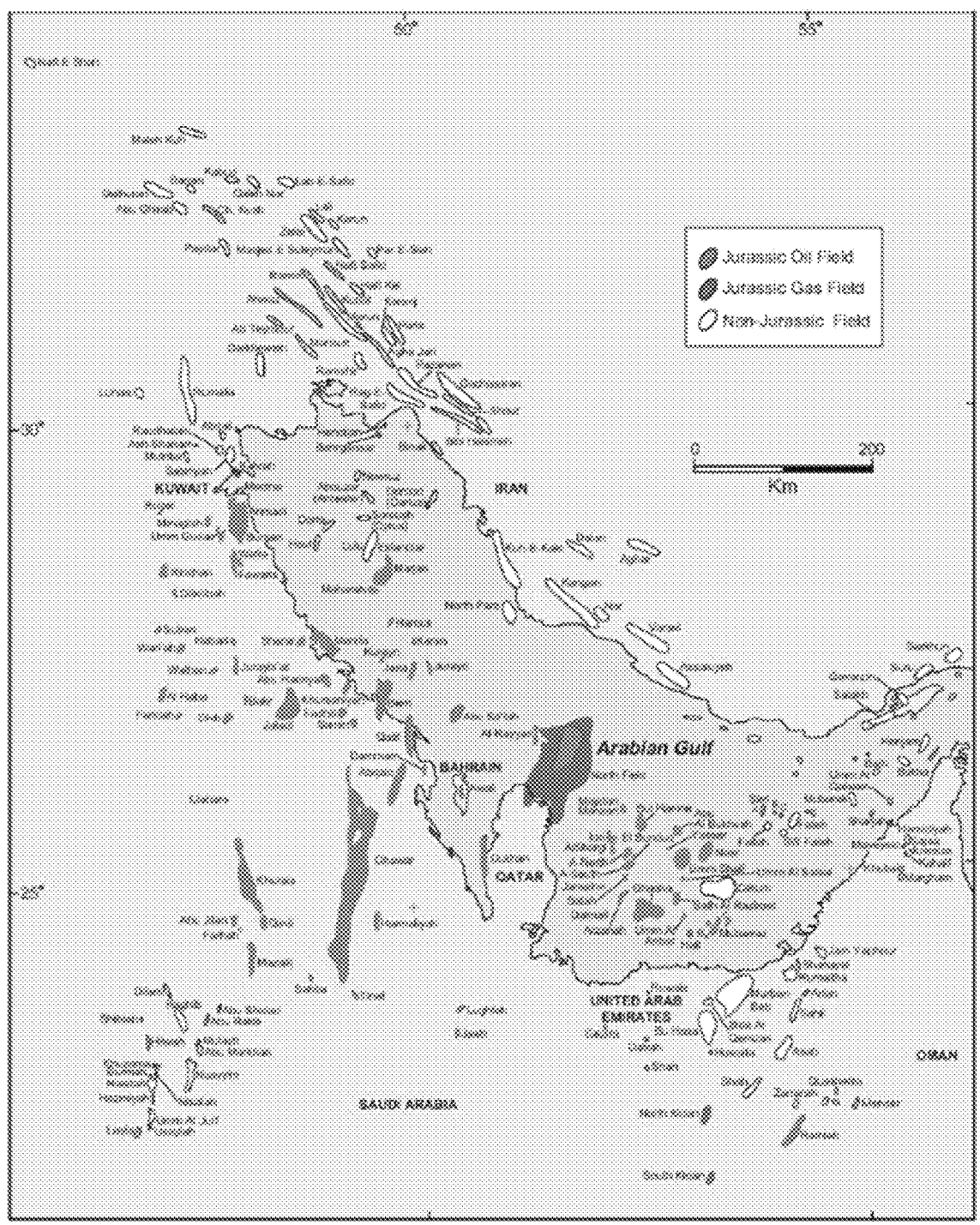
FIG. 29 illustrates a geological map showing the Ghawar oil field.
Figure 30A:
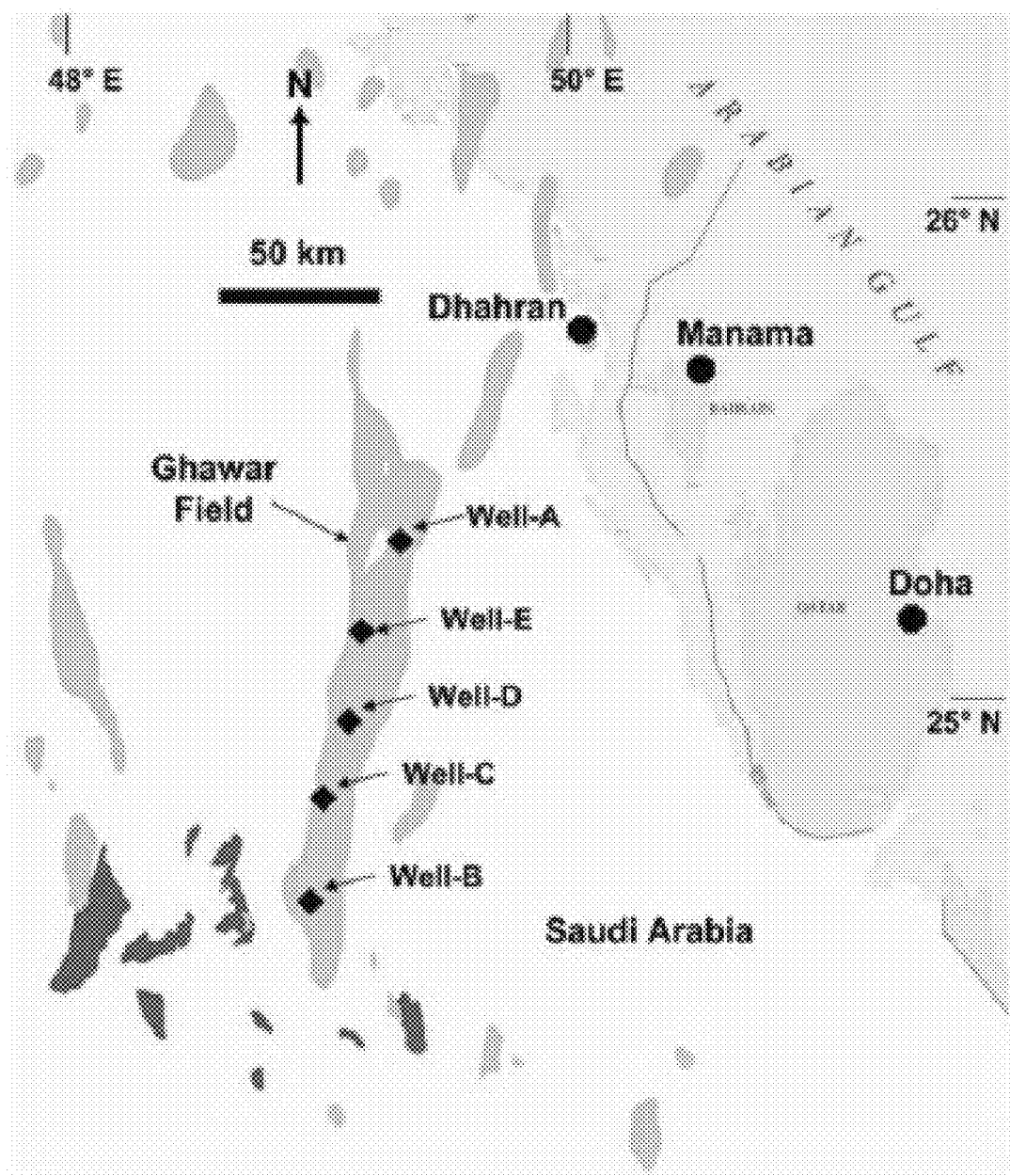
FIG. 30A-30C illustrate A. the Ghawar field with five injection wells, B. the lithology for the Arab Jubaila reservoir, and C. the porosity and flow fractions of the zones (1-4) of the Arab-D field.
Figure 30B:
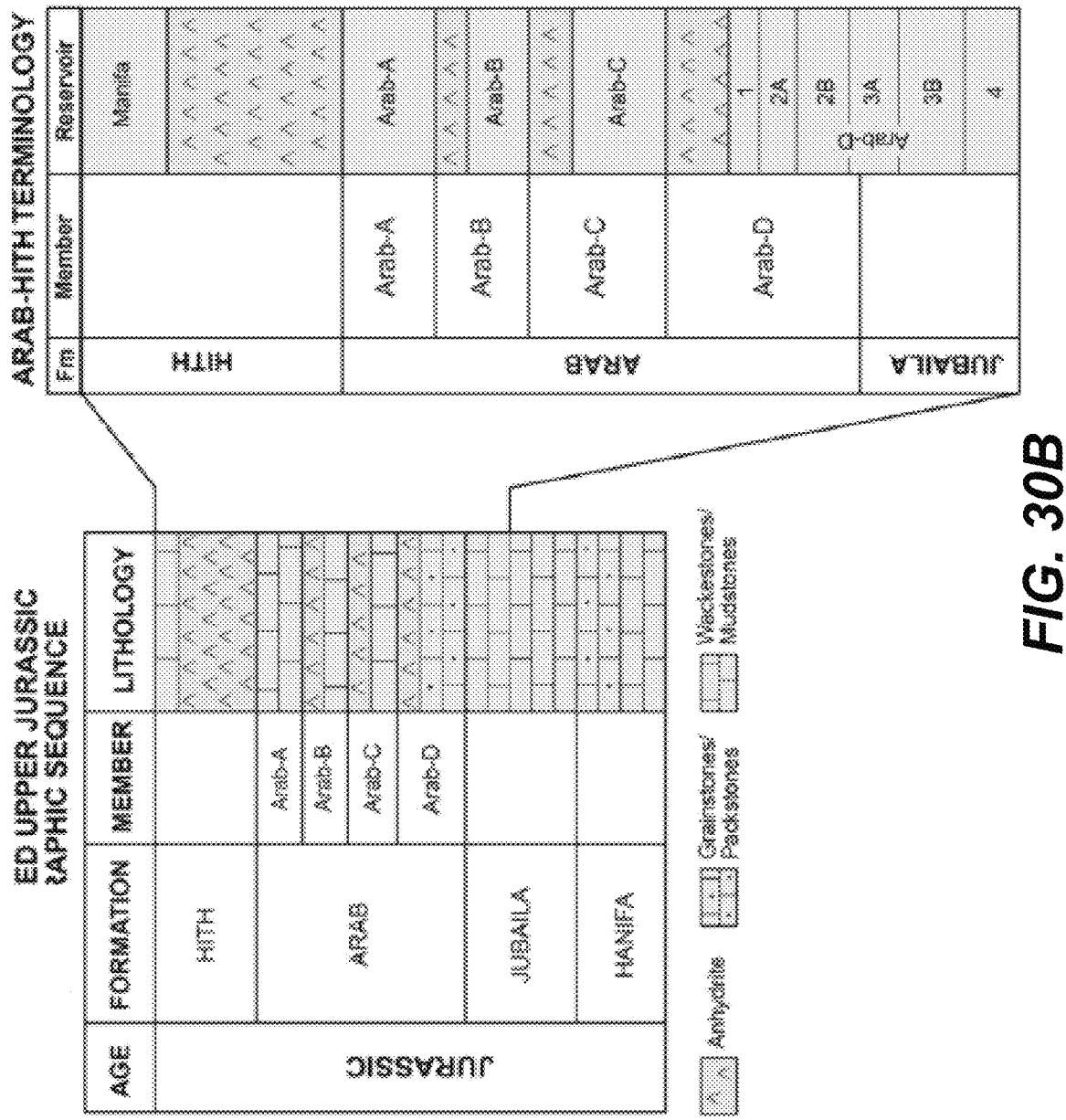
Figure 30C:
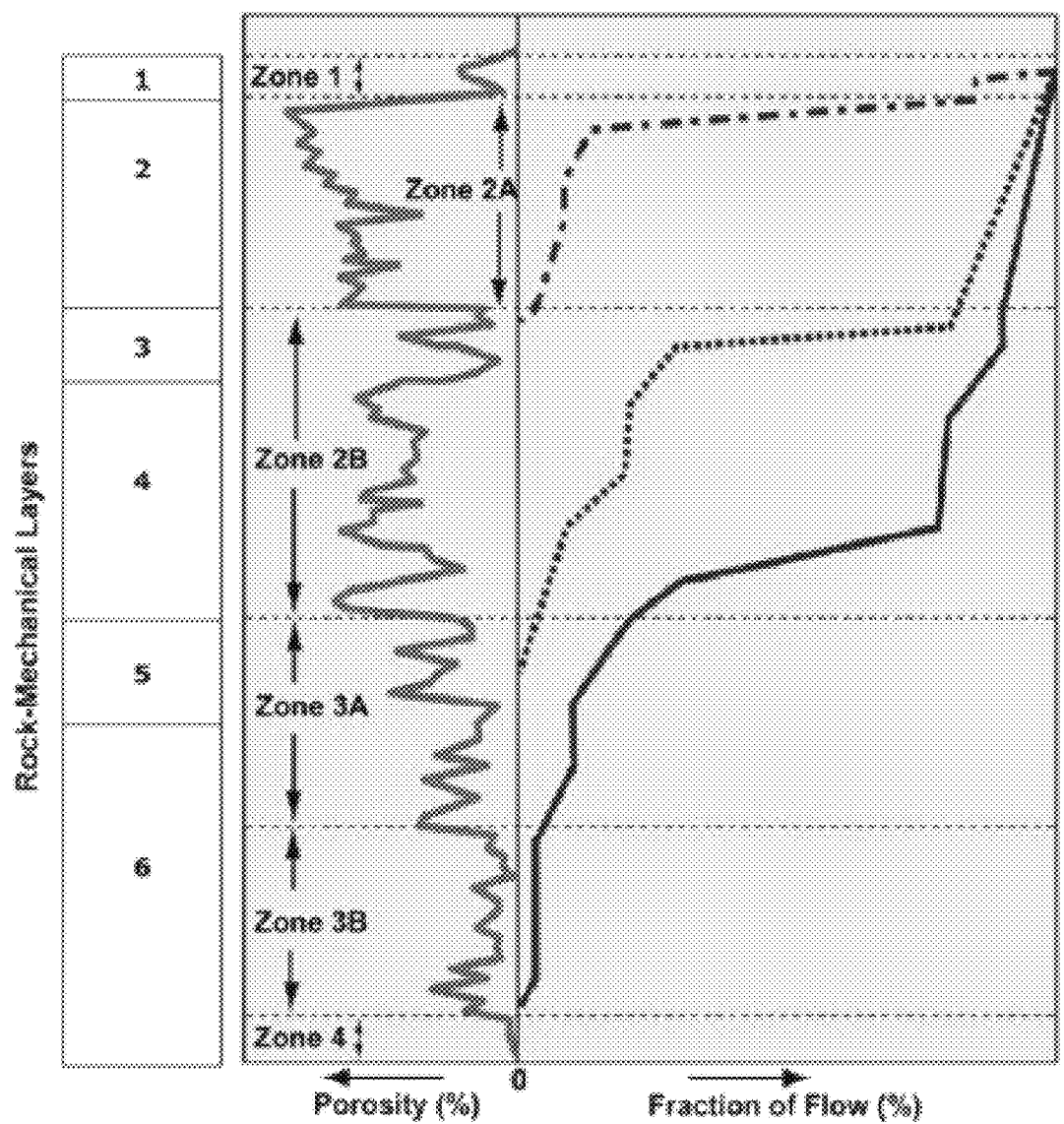
Figure 31A:
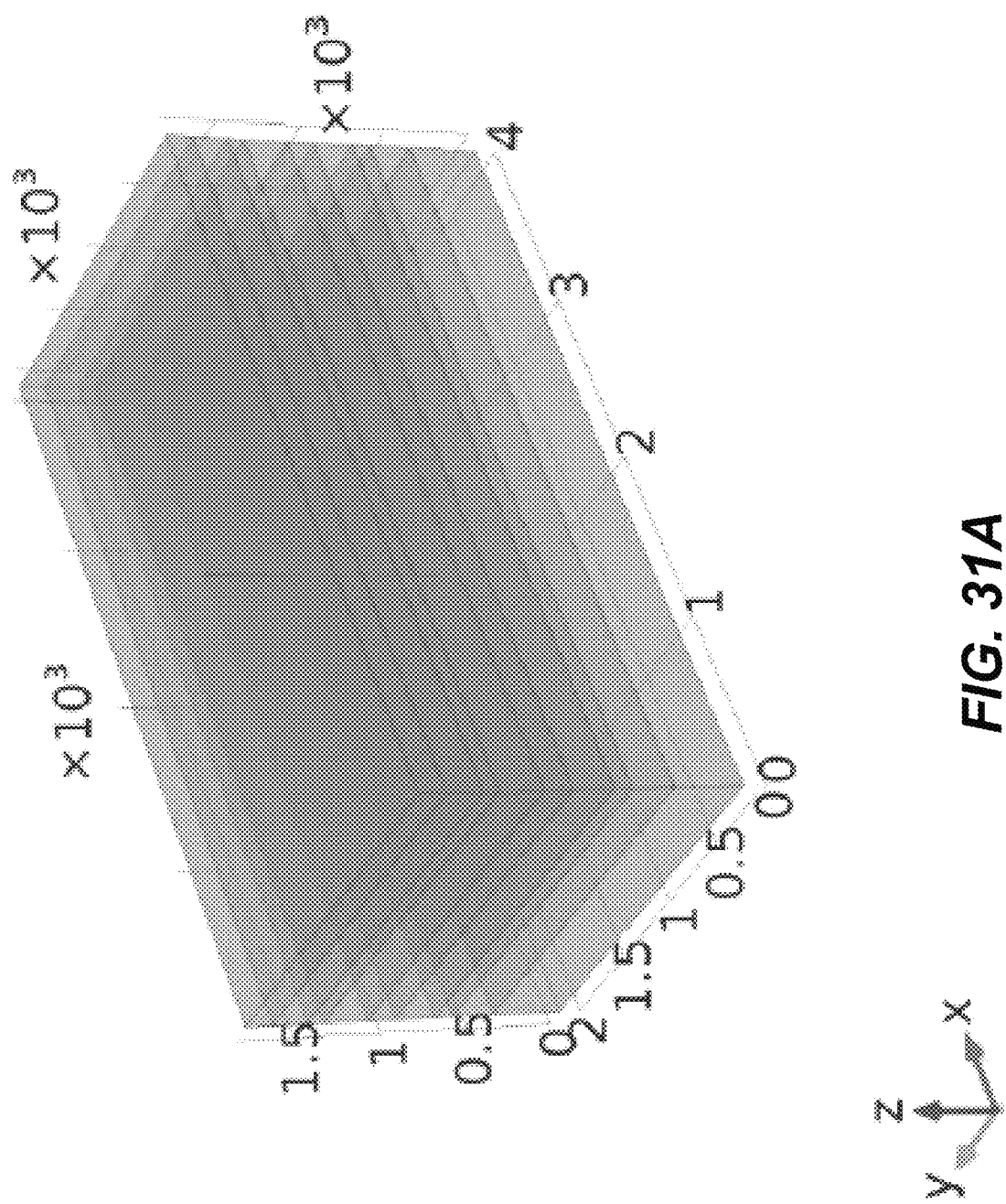
FIGS. 31A-31B illustrate the models for Biyadh reservoir A. small model (4000×2000) meters B. large model (10,000×10,000) meters.
Figure 31B:
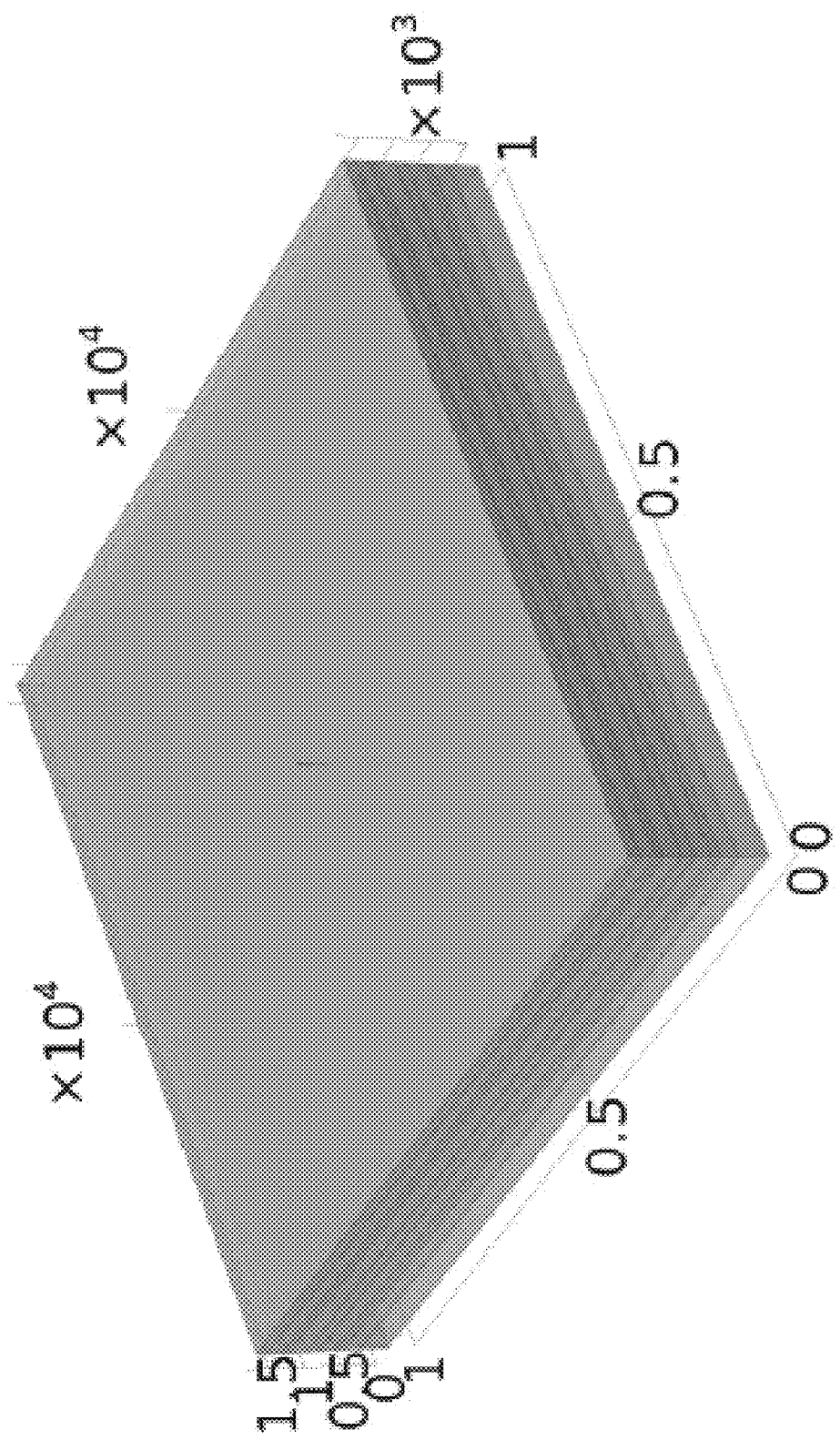

Geological maps with orientation and a scale showing the locations and ages of Biyadh and Arab Jubaila reservoirs are shown in FIGS. 28 and 29. The shape of the lithology is shown in FIG. 30A-30C. FIG. 30A shows the Ghawar field with five injection wells. FIG. 30B shows the lithology for the Arab Jubaila reservoir. FIG. 30C shows the porosity and flow fractions for the zones 1, 2A, 2B, 3A, 3B and 4 of the Arab-D/Jubaila layers. In order to see the effect of reservoir size on the pore pressure buildup and reservoir stability during carbon dioxide injection, carbon dioxide was injected into both the small and large models, and the pressure buildup and ground uplift were compared. FIG. 31A shows the small model (4000×2000) meters and FIG. 31B shows the large model (10,000×10,000) meters constructed in COMSOL multiphysics.

Figure 32A:
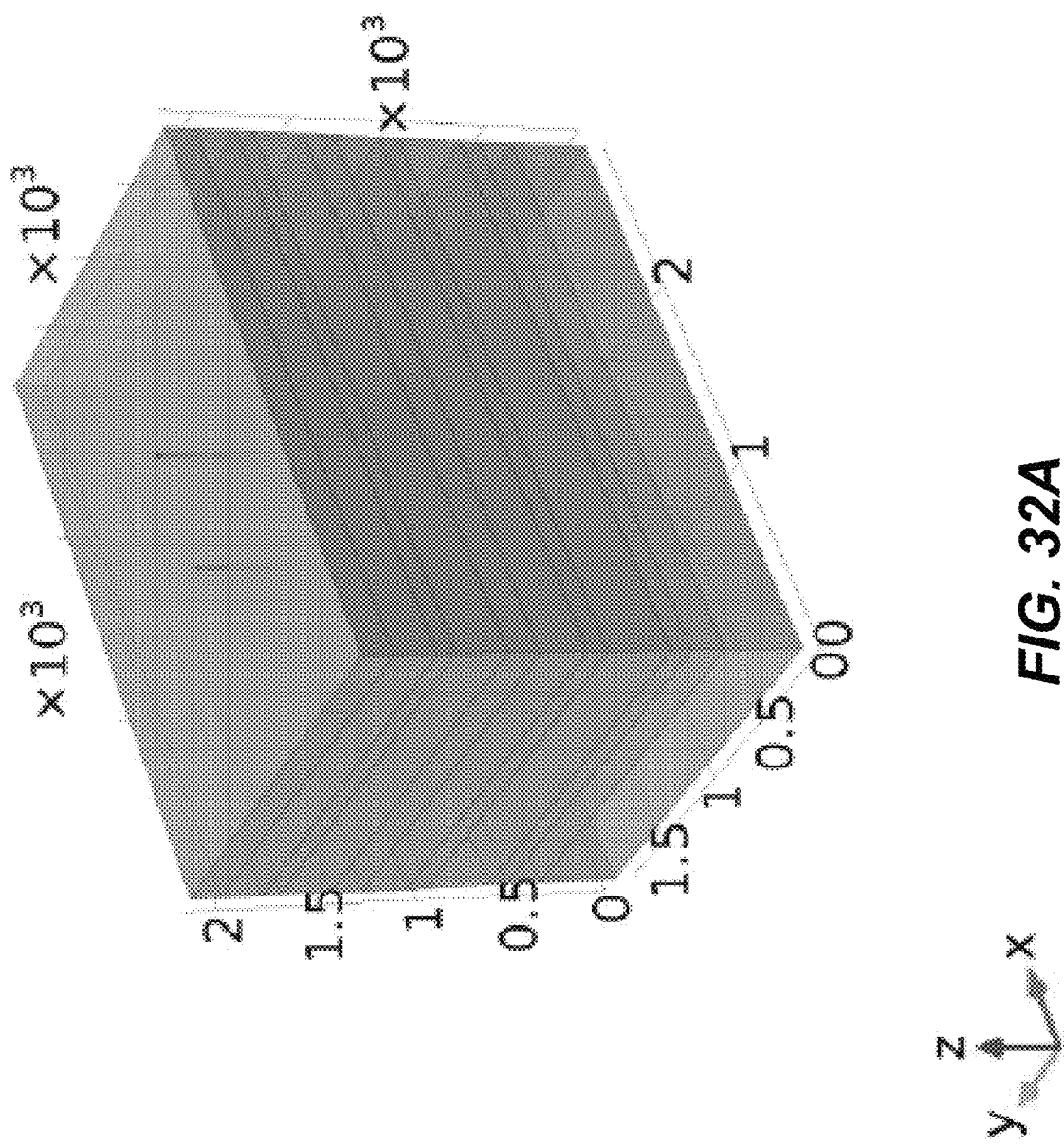
FIGS. 32A-32D illustrate the models for Arab Jubaila reservoir for multiple injection wells of size A. (2800×1800) meters B. (3000×2000) meters C. (6000×4000) meters D. (9000×6000) meters.
Figure 32B:
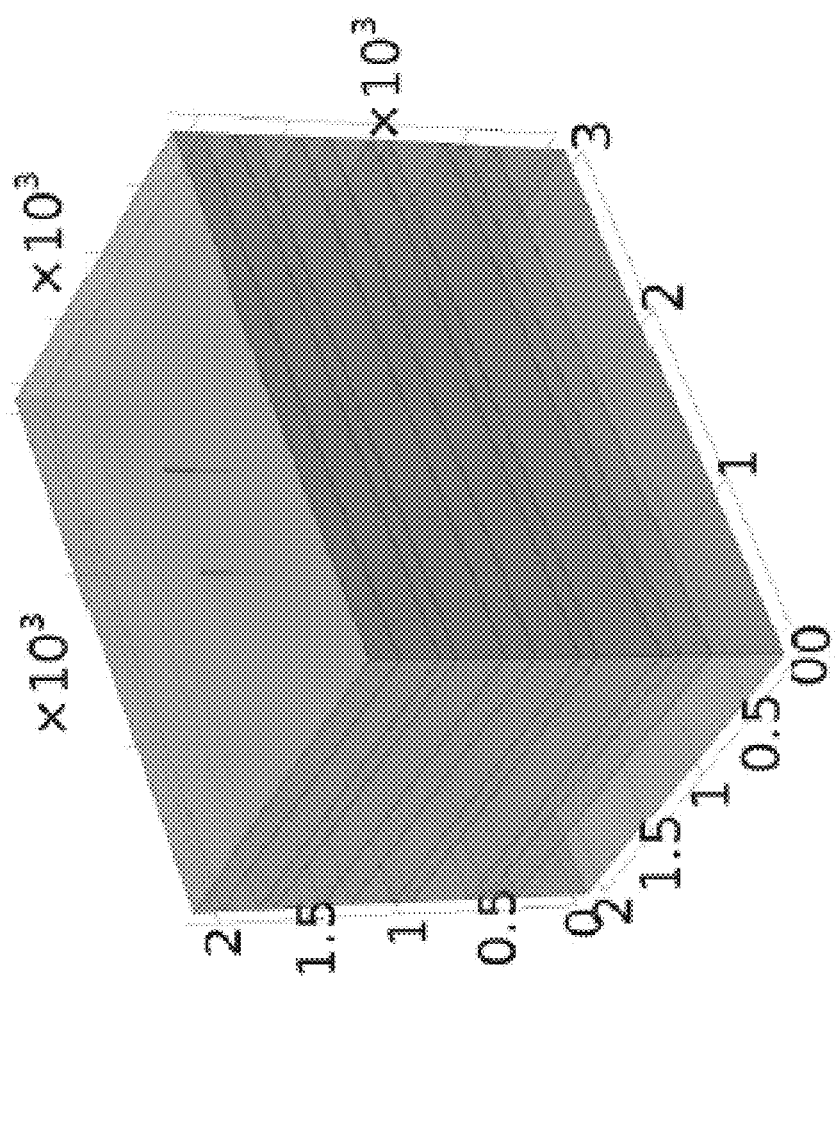
Figure 32C:
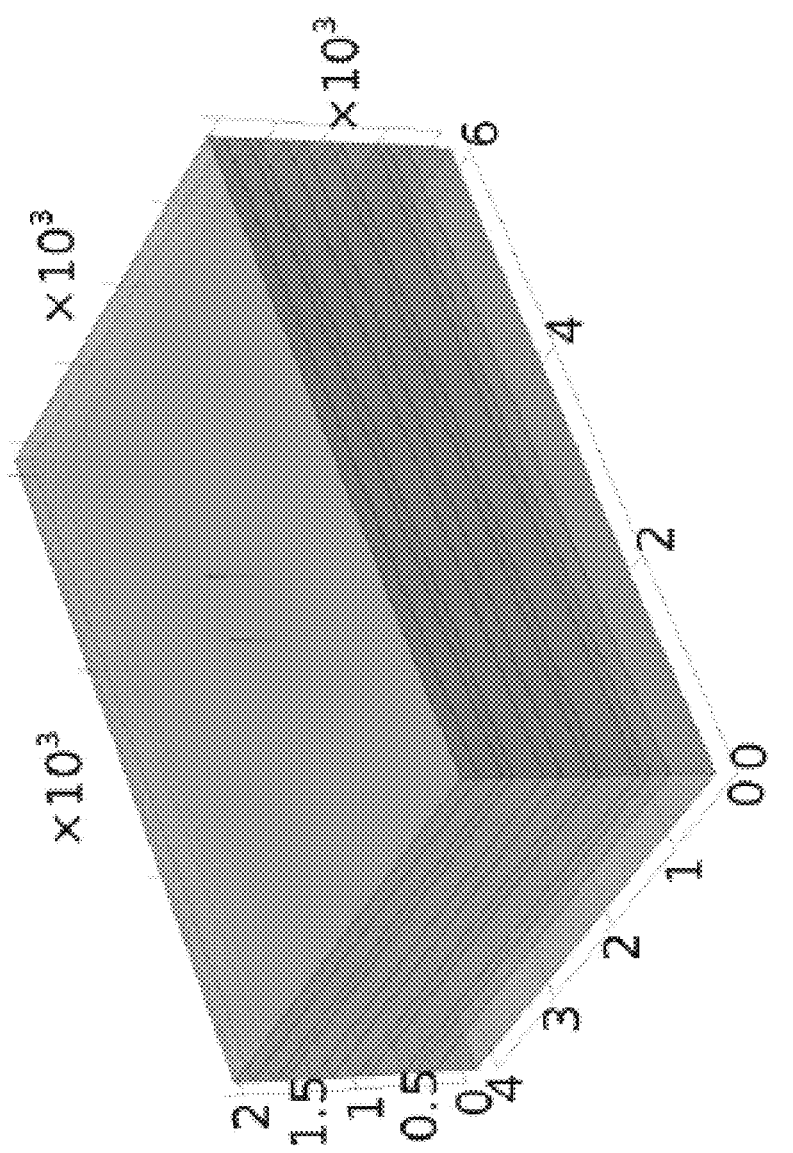
Figure 32C:
Figure 32D:
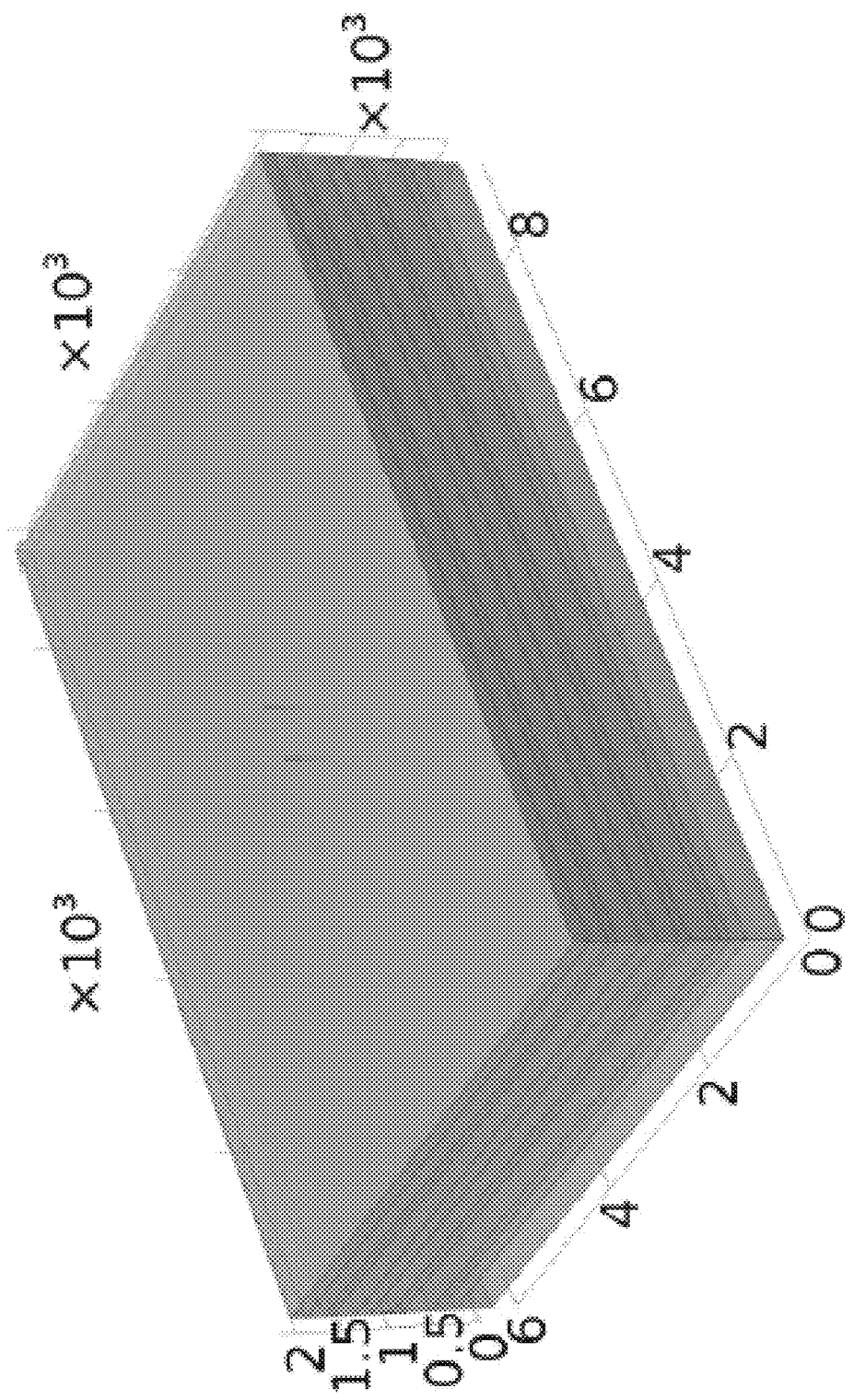
Figure 33A:
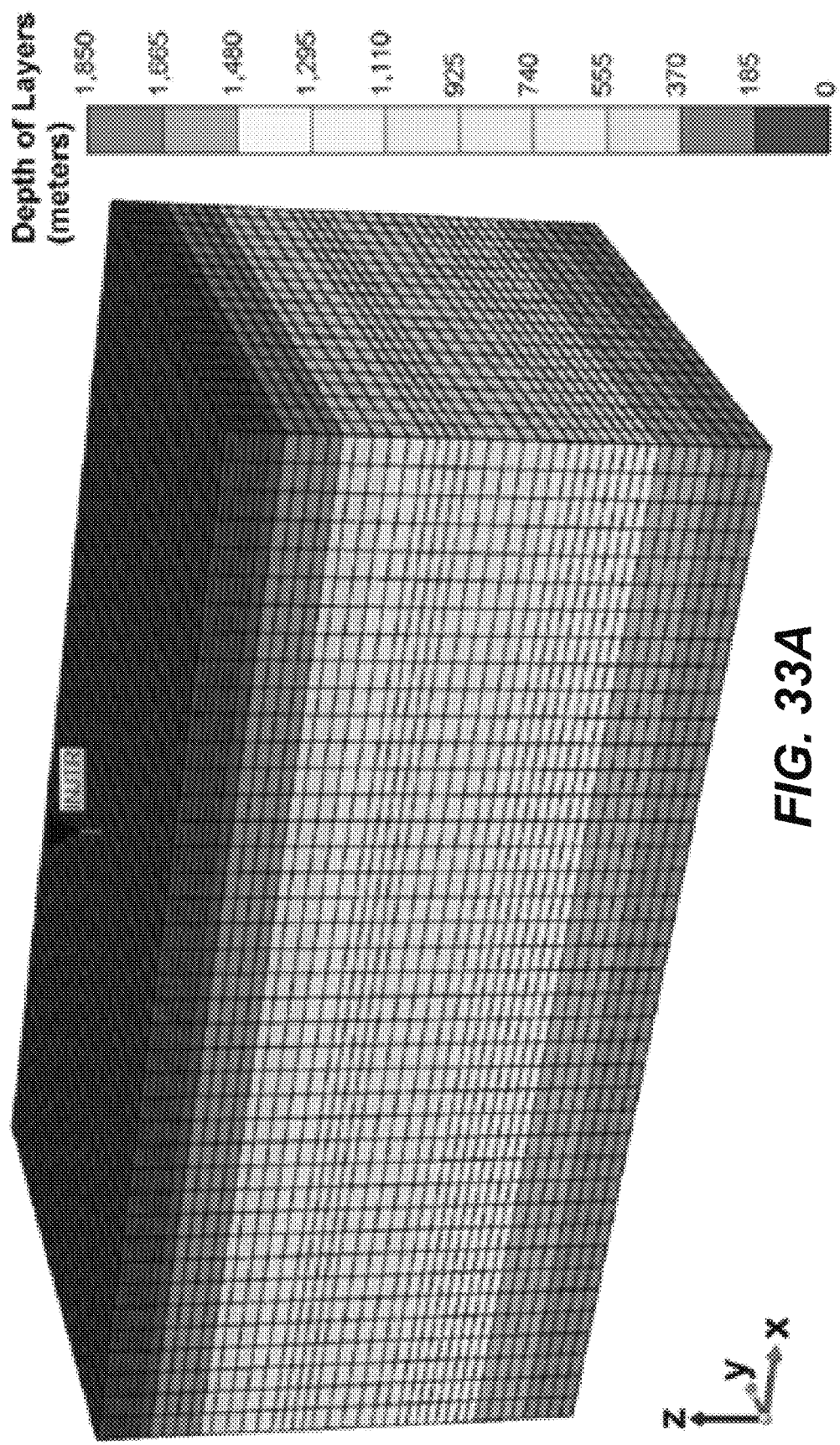
FIGS. 33A-33B illustrates the simulation models for Biyadh reservoir A. small model (4000×2000) meters, B. large model (10,000×10,000) meters.
Figure 33B:
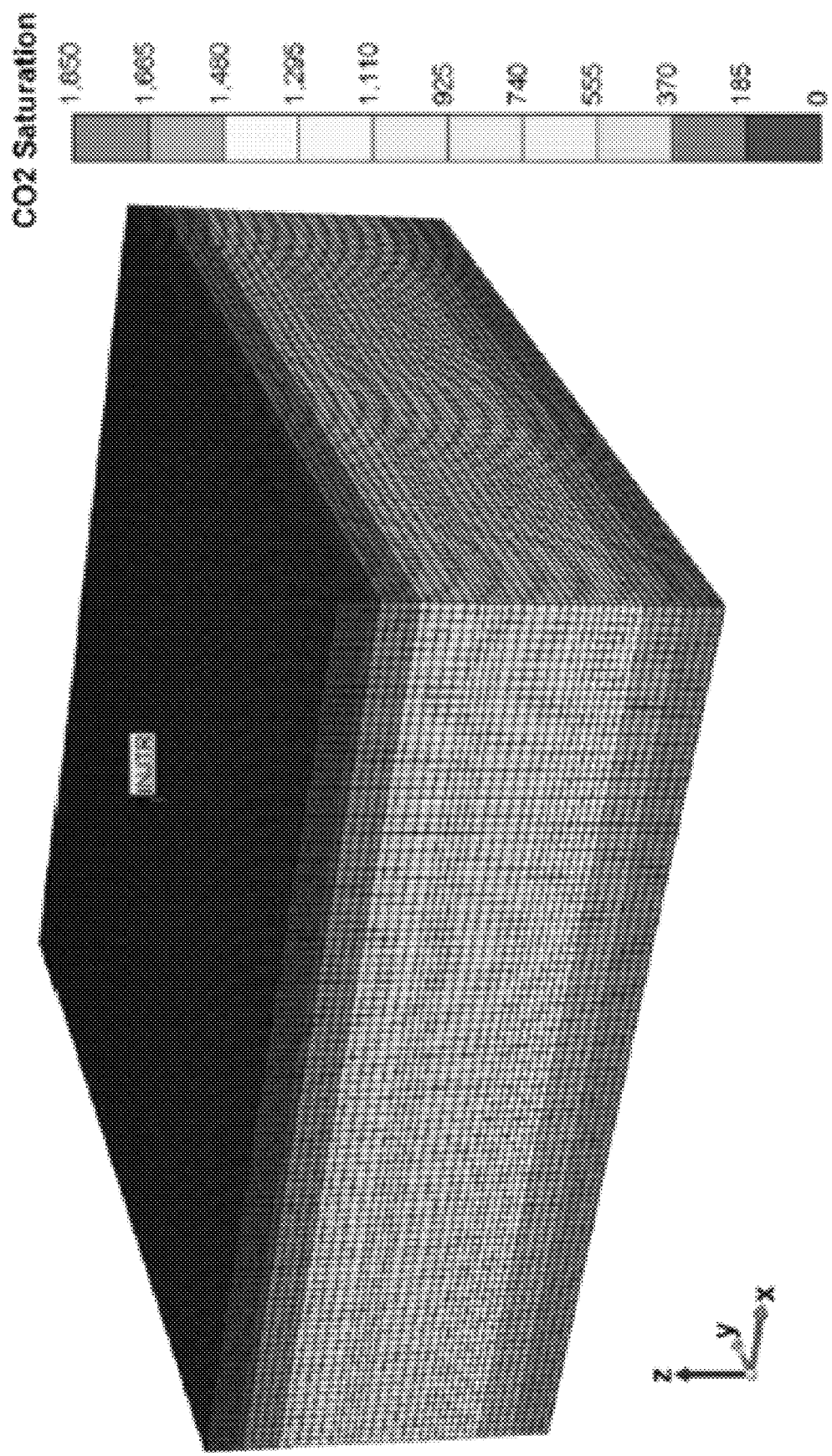

In order to see the effect of reservoir size change on pore pressure build-up during carbon dioxide injection using multiple injection wells, carbon dioxide was injected into reservoirs with different sizes using two injection wells (116a, 116b). For the multiple injection well scenarios, carbon dioxide was injected in the Arab Jubaila layer 110, as shown in FIG. 1. The different models constructed in COMSOL multiphysics for the case of multiple injection wells are shown in FIG. 32A-32D. FIG. 32A shows an injection well of size 2800×1800 meters, FIG. 32B shows an injection well of size 3000×2000 meters, FIG. 32C shows an injection well of size 6000×4000 meters and FIG. 32D shows an injection well of size 9000×6000 meters. The models constructed in CMG-GEM for evaluating the effects of reservoir size and boundary conditions on the fault reactivation are shown in FIGS. 33A and 33B. FIG. 33A depicts the small model of size 4000×2000 meters and FIG. 33B depicts the large model 10,000×10,000 meters.

The various parameters needed as input for modeling in COMSOL multiphysics and CMG-GEM are listed in Table 8.

TABLE 8

Input properties of the Biyadh and Arab Jubaila reservoirs.

| Model Parameter | For Biyadh Reservoir | For Arab Jubaila Reservoir |
|---|---|---|
| Rock Density. $\rho$ (Kg/m$^3$) | 2360 | 2400 |
| Young's Modulus, E (GPa) | 44.7 | 48.5 |
| Bulk Modulus, K (GPa) | 25.7 | 39.24 |
| Shear Modulus, G (GPa), | 17.2 | 18.1 |
| Initial porosity, $\varnothing_m$ | 0.12 | 0.13 |
| Initial permeability, kf ($10^{-15}$ m$^2$) | 0.7 | 0.9 |
| Biot Coefficient, $\alpha$ | 0.7 | 0.5 |
| Dynamic Viscosity, $\mu$($10^{-5}$ Pa · s) | 1.84 | 1.84 |
| Pressure wave velocity, Vp (m/sec) | 4040 | 2748 |
| Shear wave velocity, Vs (m/sec) | 2700 | 2748 |

During the modeling procedure, the initial values for the displacement components are taken as zero, while the initial value of the pore pressure is set equal to the reservoir's pressure before injection. Roller boundary condition was applied to all external boundaries, except the top surface in order to allow the freedom of the ground uplift. Carbon dioxide was injected at the bottom hole surface of the well at a specified gas entry pressure. Both the Biyadh and Arab Jubaila reservoirs are under compressional stress regime, wherein the principle stresses are related such that; $\sigma_1 > \sigma_2 > \sigma_3$, where $\sigma_1$ and $\sigma_2$, denote the maximum and minimum horizontal stresses, respectively, and $\sigma_3$ denotes the vertical overburden stress.

In order to avoid the error of ignoring the reservoir heterogeneity, the COMSOL multiphysics software was coupled with MATLAB software to input the rock properties at each node along the reservoir. The various input parameters shown in Table 2, Table 8 and FIG. 1 are the average values. Using the minimum and maximum values for the reservoir density, pressure wave velocity, and shear wave velocity, MATLAB functions were used to calculate the rock properties such as modulus of elasticity, shear modulus, modulus of rigidity, and bulk modulus.

The static modulus of elasticity is and dynamic moduli of elasticity are given by:

$$E_s = \sigma/\epsilon \tag{30}$$

$$E_d = 2 \times (1+v_d)\rho V_s^2 \tag{31}$$

The static shear modulus (or modulus of rigidity), $G_s$, and the dynamic shear modulus, $G_d$, are given by:

$$G_s = E_s/(2(1+V_s)) \tag{32}$$

$$G_d = \rho V_s^2 \tag{33}$$

The grain static modulus, $K_s$, and the dynamic bulk modulus, $K_d$, are given by:

$$K_s = E_s/(3(1-2v_s)) \tag{34}$$

$$K_d = \rho(V_p^2 - 4/3 V_s^2) \tag{35}$$

These calculated input parameters are applied to each node in the 3- dimensional injection reservoir. Other input properties such as the initial values of rock porosity and permeability were assumed to be uniform and were taken from the literature.

In order to examine the effect of reservoir size on the pore pressure buildup, hydro-mechanical coupled geo-mechanical modeling was performed for carbon dioxide injection into small and large models of Biyadh sandstone reservoir. Carbon dioxide was injected at a depth of 1400 meters at injection pressure in the range from 22 to 26 MPa. The maximum injection pressure of 26 MPa used in this study is less than the lithostatic pressure for maximum reservoir stability.

Figure 34:
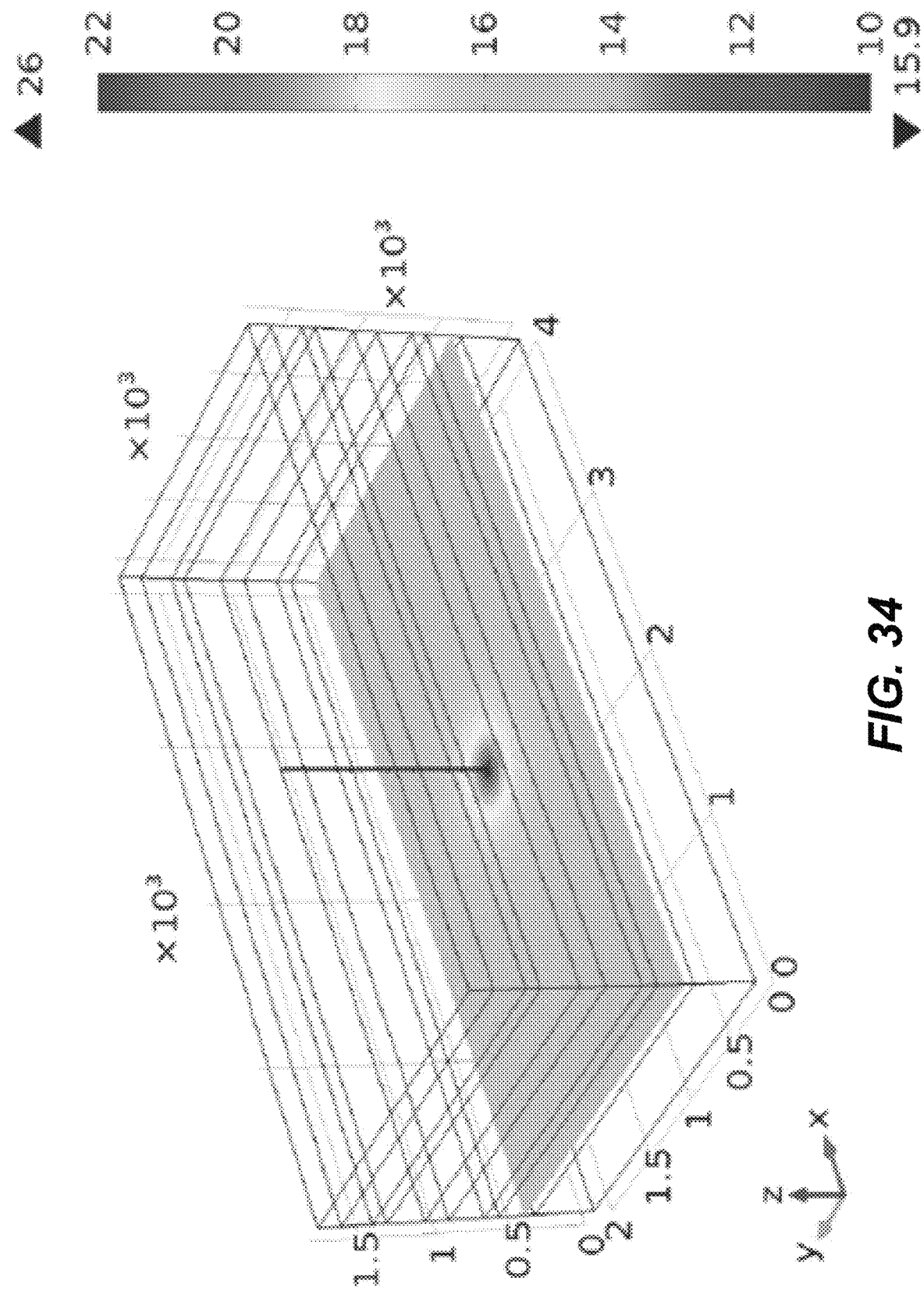
FIG. 34 illustrates the pore pressure buildup (in MPa) after ten years of carbon dioxide injection for the small reservoir model.
Figure 35:
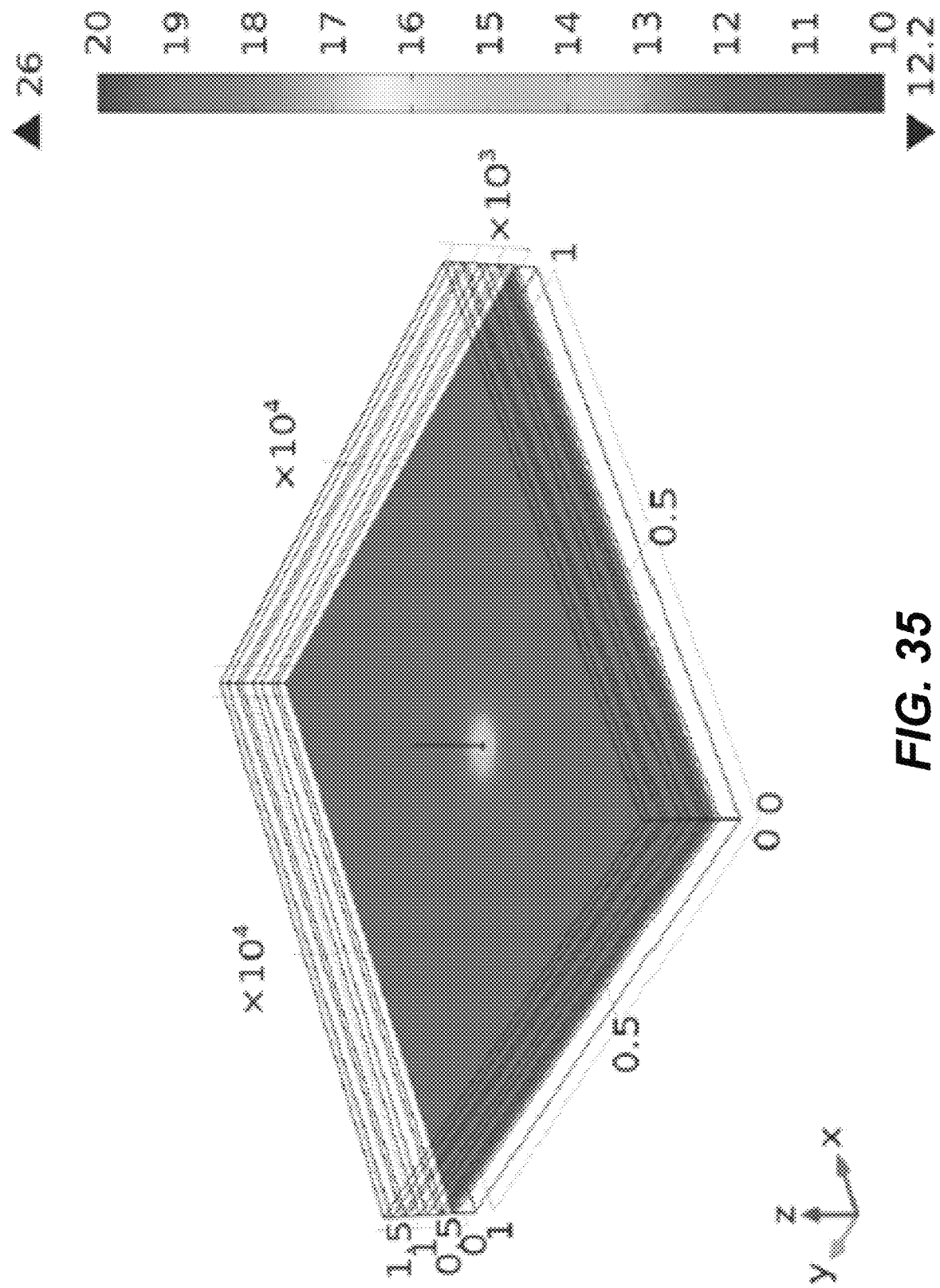
FIG. 35 illustrates the pore pressure buildup (in MPa) after ten years of carbon dioxide injection for the large reservoir model.

With the injection of carbon dioxide into a single well reservoir, the pore pressure inside the reservoir started to increase. The pore pressure buildup during carbon dioxide injection for ten years is shown in FIG. 34 (small reservoir model) and FIG. 35 (large reservoir model). As anticipated, the pore pressure increases continuously with carbon dioxide injection, reaching maximum pore pressure buildup in the case when the small simulation model was utilized. This is due to the fact that the reservoir's boundaries in the small model are comparatively closer to the injection port and therefore the dissipation of the injection pressure along the reservoir is lower, thus leading to a relatively higher pore pressure buildup.

Figure 36:
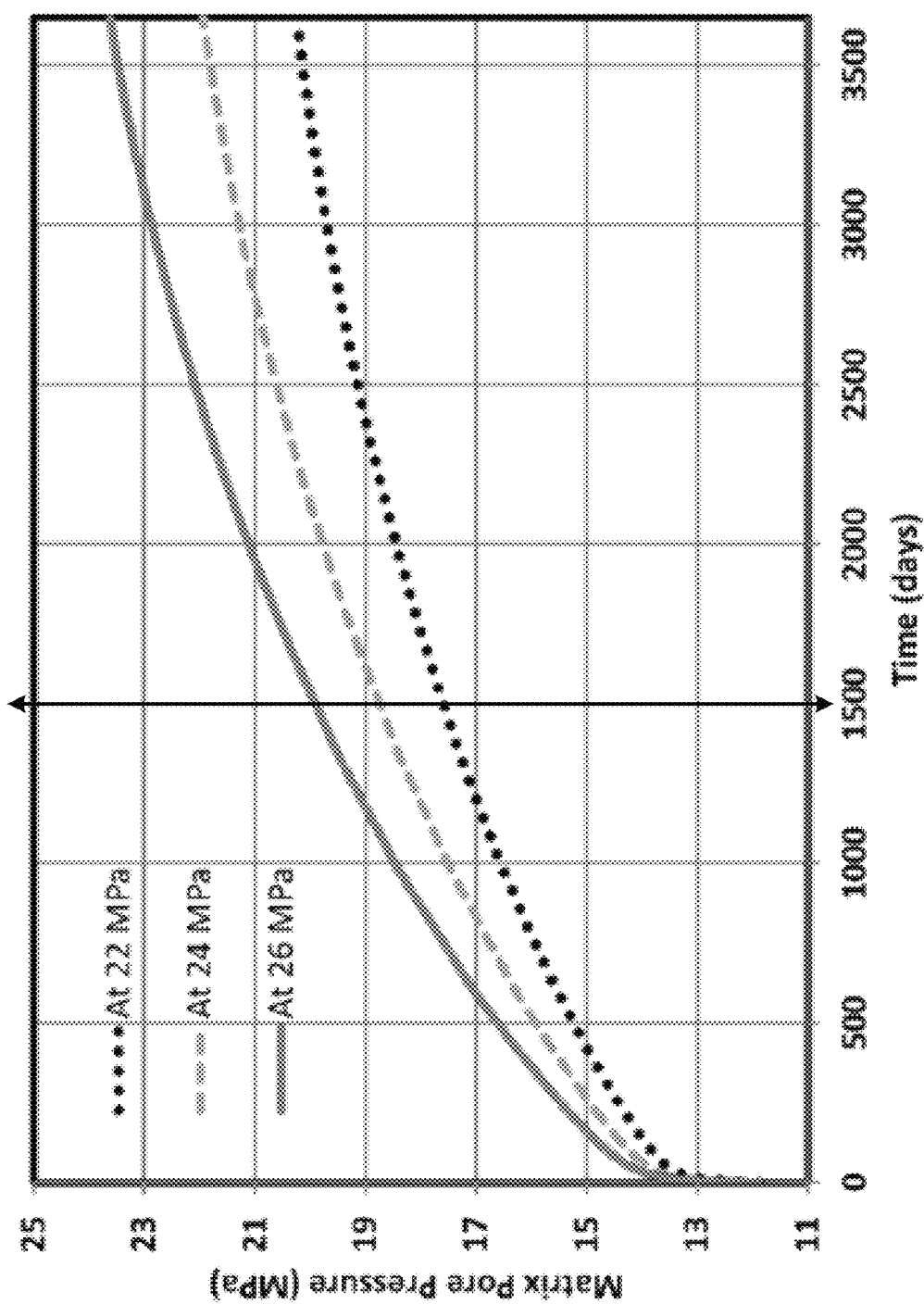
FIG. 36 illustrates the effect of injection pressure on the pore pressure buildup during ten years of carbon dioxide injection for the small reservoir model.
Figure 37:
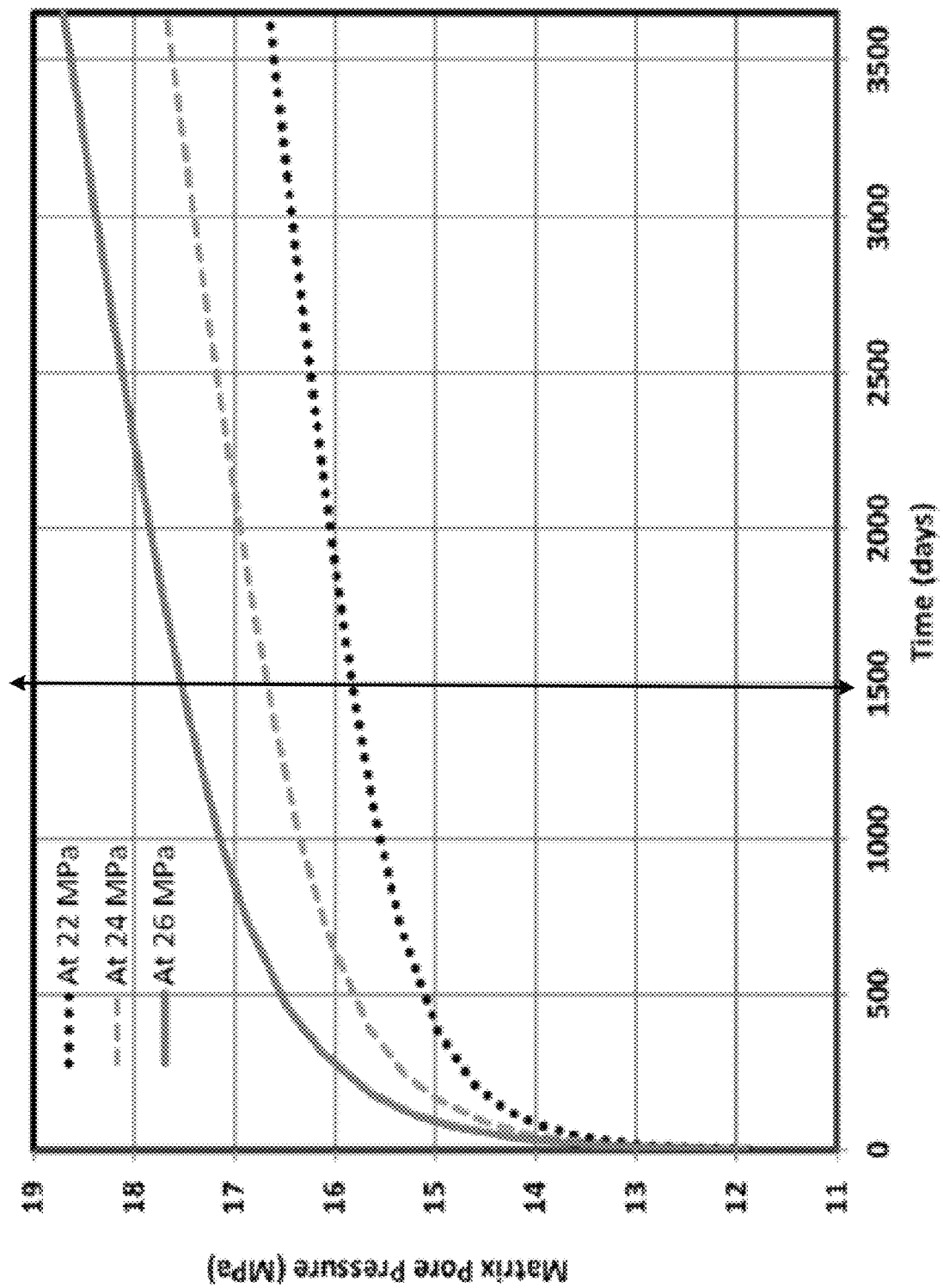
FIG. 37 illustrates the effect of injection pressure on the pore pressure buildup during ten years of carbon dioxide injection for the large reservoir model.

Furthermore, the variation of pore pressure during ten years of carbon dioxide injection period is shown in FIG. 36 (small reservoir model) and FIG. 37 (large reservoir model), wherein the rate of pressure buildup in the case of the large model is lower than the small model due to the fact that in large model the closed boundaries of the reservoir are far away from the injection well which facilitates the rapid flow of carbon dioxide along the reservoir. In the small model, the closed boundaries of the reservoir restrict the flow of carbon dioxide and thus the rate of pore pressure buildup.

Figure 38A:
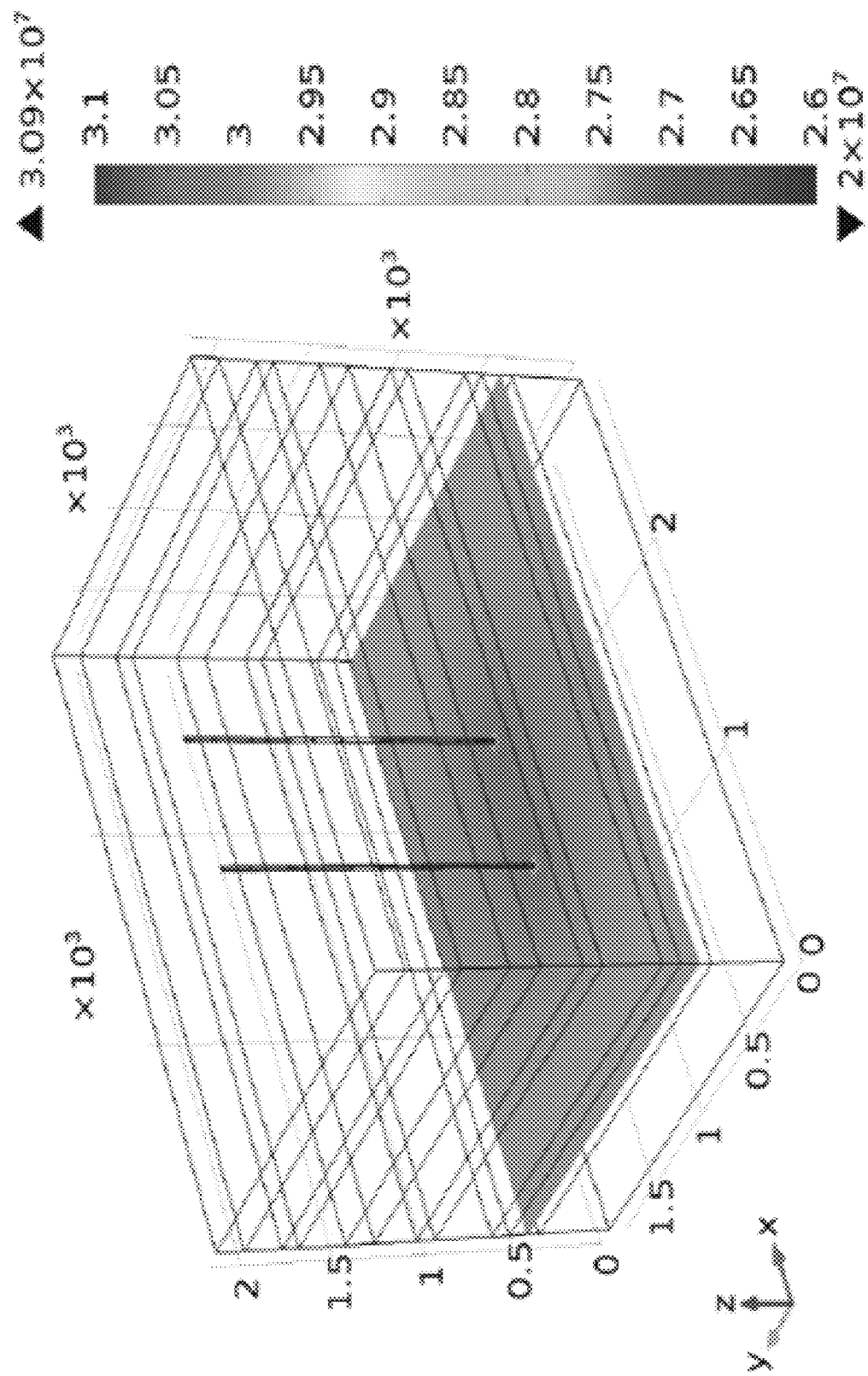
FIGS. 38A-38D illustrate the pore pressure buildup (in Pa) during carbon dioxide injection into various sized reservoirs A. (2800×1800) meters B. (3000×2000) meters C. (6000×4000) meters, D. (9000×6000) meters.
Figure 38B:
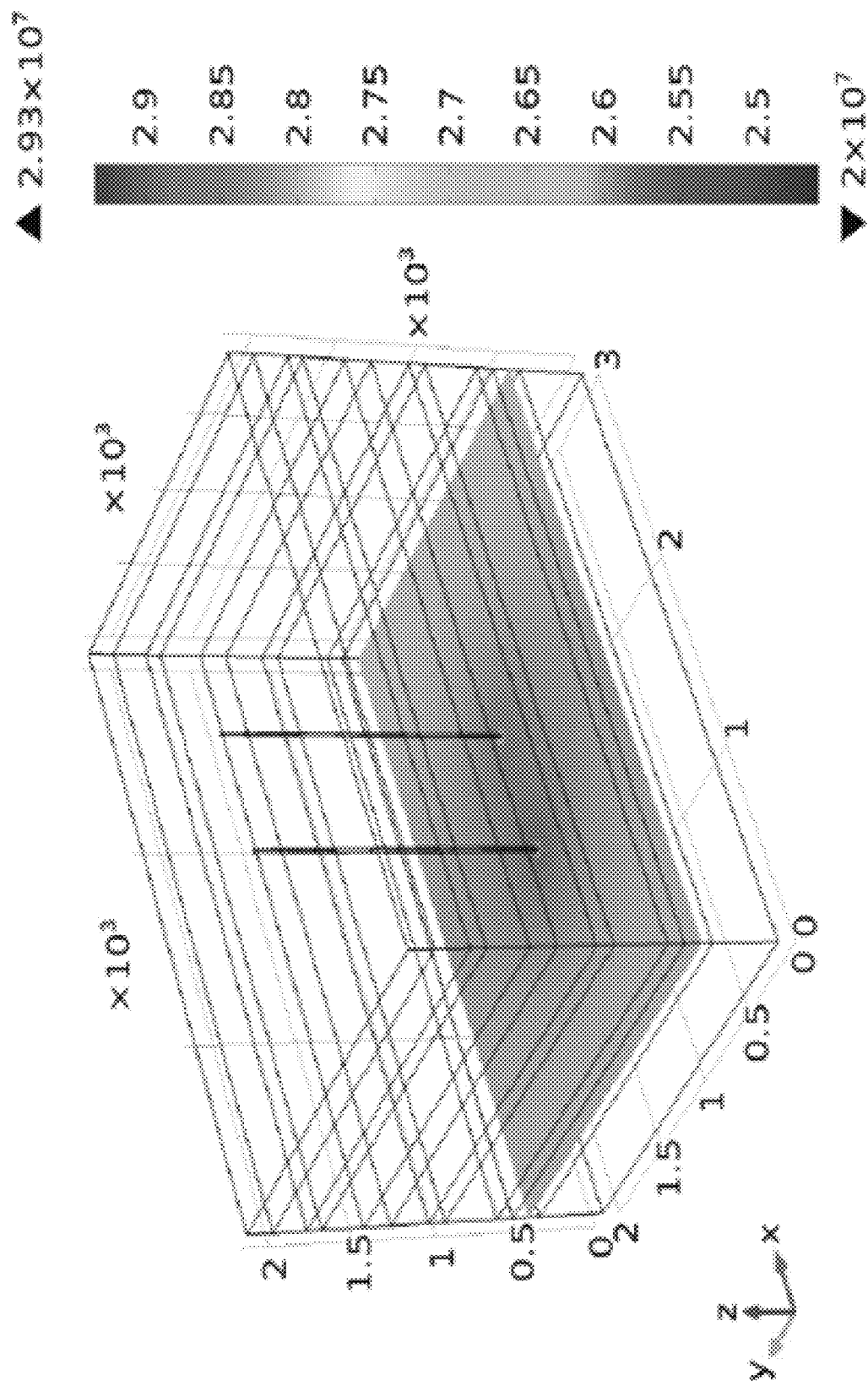
Figure 38C:
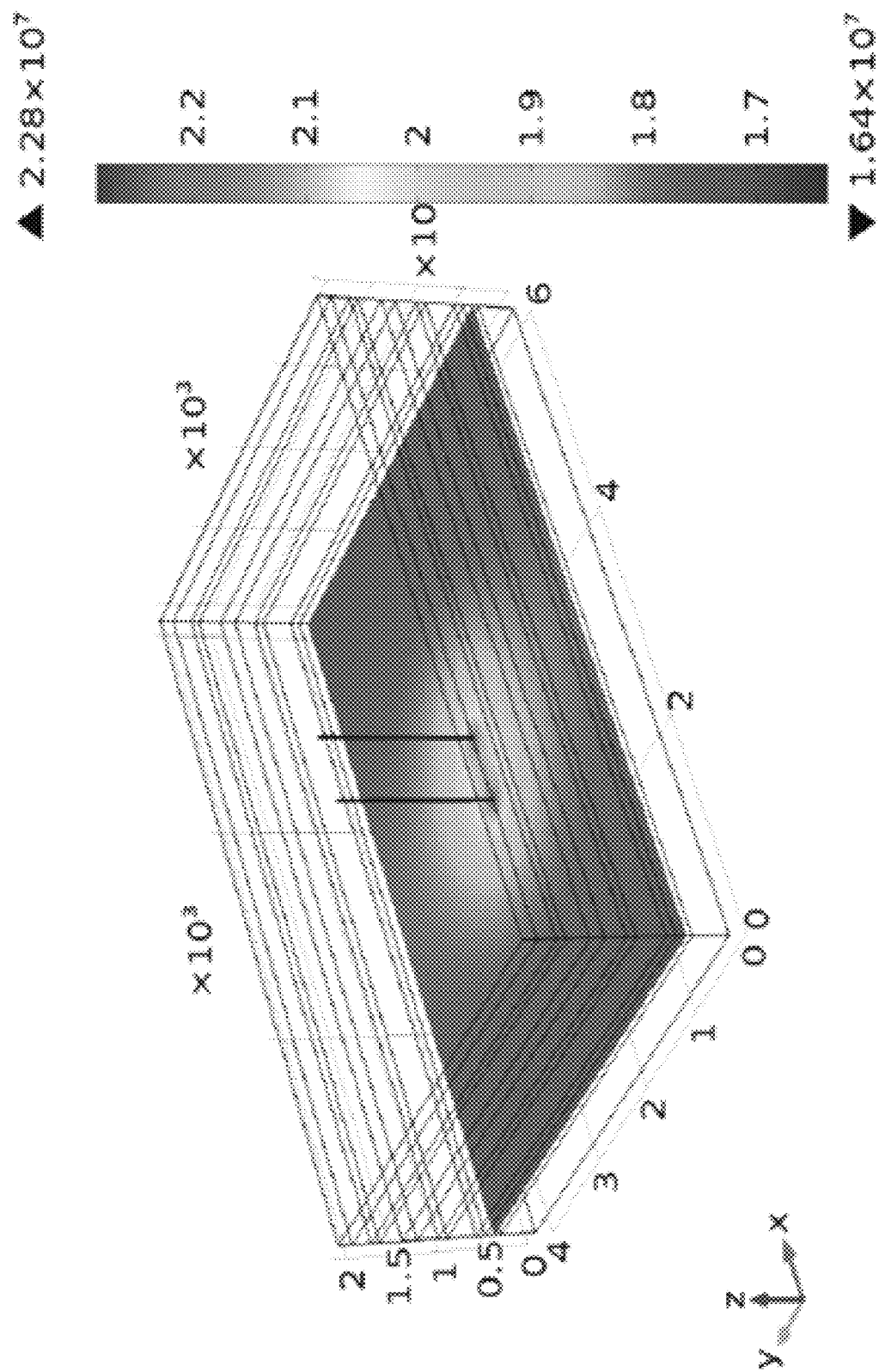
Figure 38D:
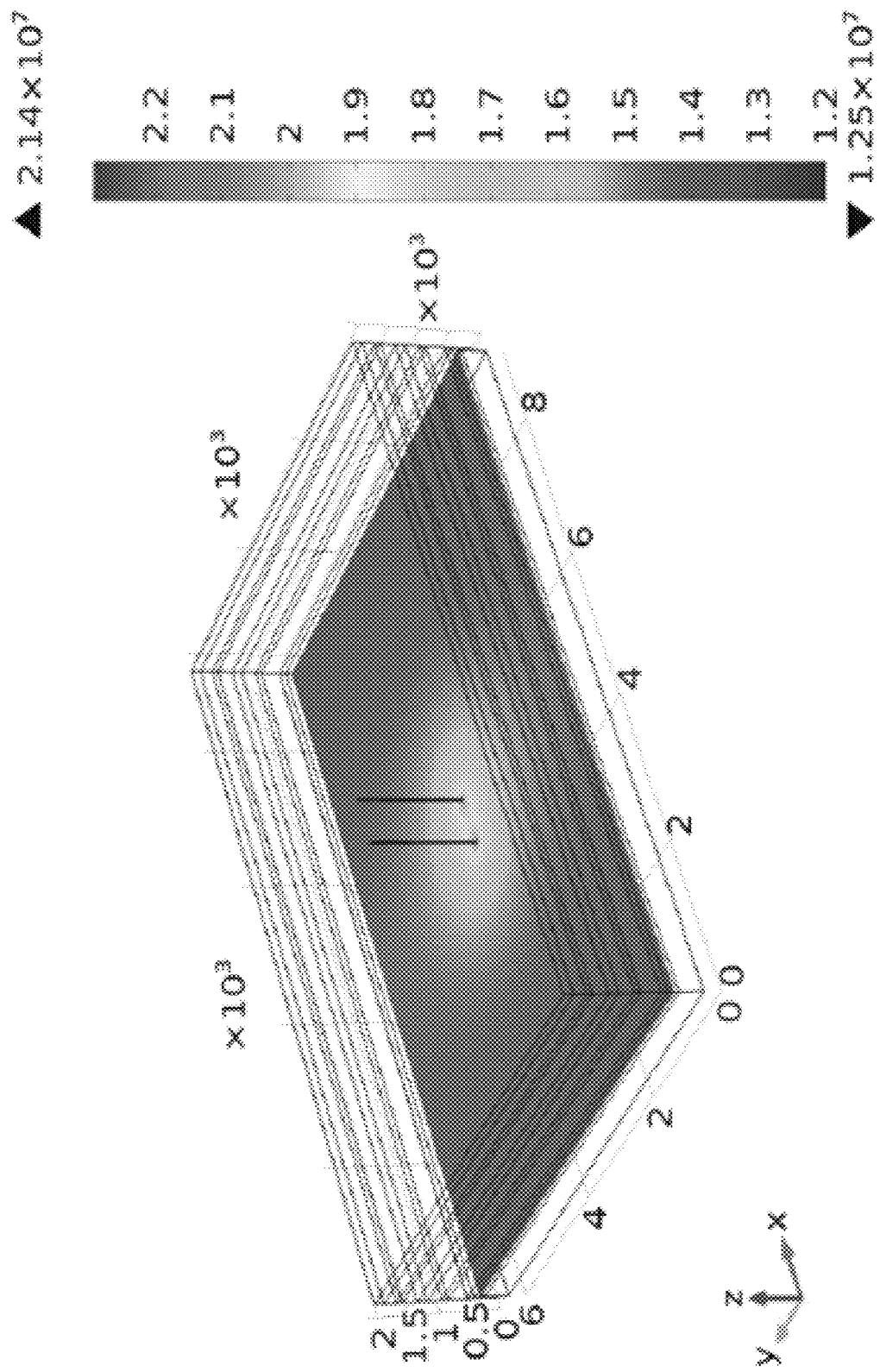

In order to see the effect of reservoir size on pore pressure buildup in the case of carbon dioxide injection with multiple injection wells, carbon dioxide was injected through two injection wells into reservoirs of different sizes. The two injection wells were placed in-line along the length of the reservoir at a distance of 600 meters from each another. The pore pressure buildup after carbon dioxide injection using two injection wells is shown in FIG. 38A-38D. The plots in FIG. 38A-38D show that the reservoir size selection has a significant effect on the pore pressure buildup. FIG. 38A depicts a reservoir of 2800×1800 meters with maximum pore pressure of $3.09 \times 10^7$ MPa, FIG. 38B depicts a reservoir of 3000×2000 meters with maximum pore pressure of $2.93 \times 10^7$ MPa, FIG. 38C depicts a reservoir of 6000×4000 meters with maximum pore pressure of $2.28 \times 10^7$ MPa and FIG. 38D depicts a reservoir of 9000×6000 meters with maximum pore pressure of $2.14 \times 10^7$ MPa. These results confirm that the magnitude of the pore pressure decreases as the size of the reservoir is increased during carbon dioxide injection with multiple injection wells. These results also show that the selection of a representative volume element of the actual reservoir that has a size different from that of the actual reservoir will tend to affect the estimate of the pore pressure buildup due to injection. The relatively lower pressure buildup in the case of injection into large model reservoir is due to the high potential for the spread of carbon dioxide over the reservoir, thus decreasing the pore pressure at any one location. The increase in the pore pressure of the smallest reservoir may be due to the effect of the boundaries that can cause pressure buildup, while the pressure buildup will be relatively lower when the reservoir boundaries are farther away, as in the case of largest reservoir model.

Figure 39:
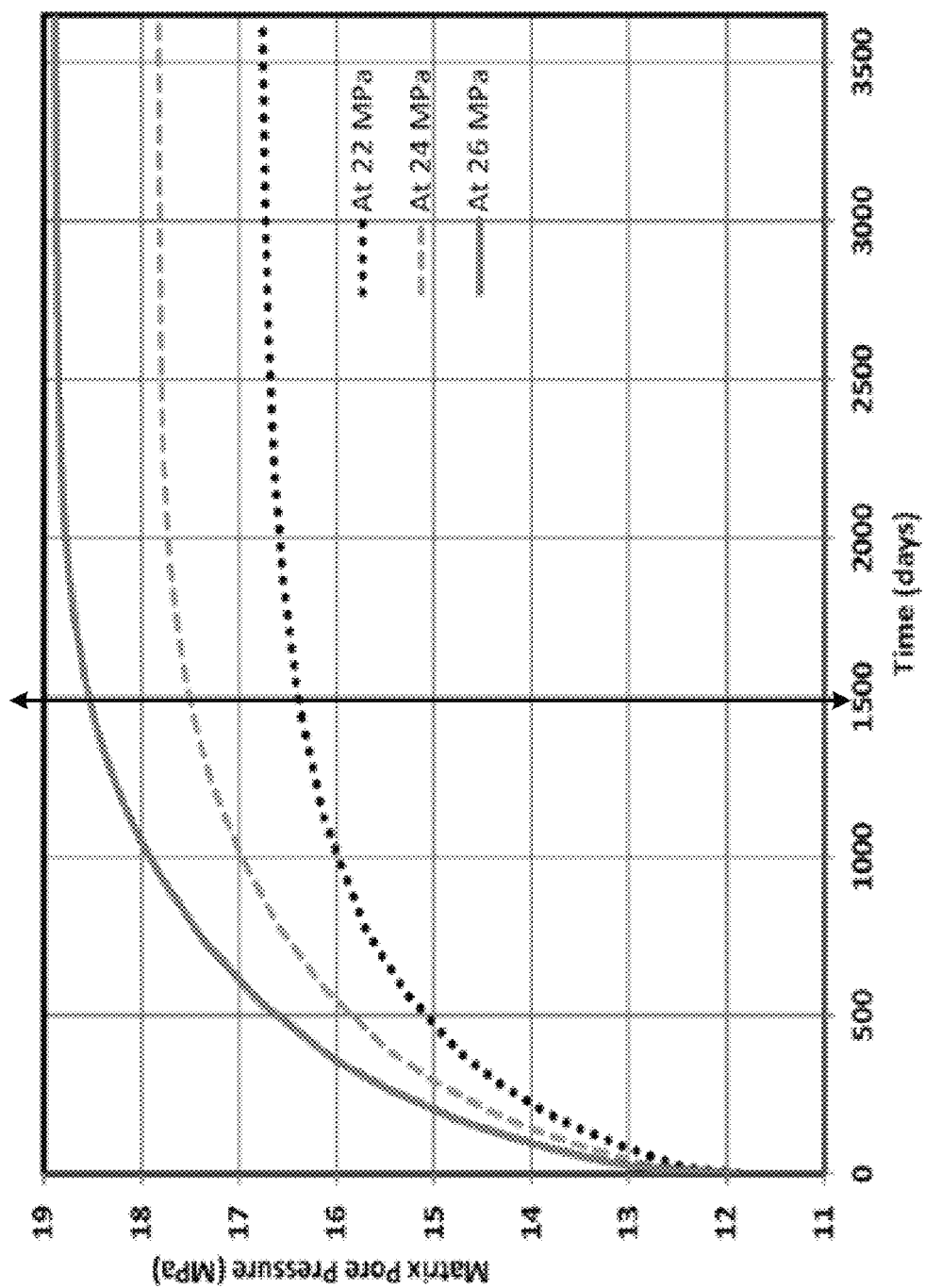
FIG. 39 illustrates the effect of boundary conditions on the pore pressure buildup during 10-year injection period for a small reservoir model with open boundary conditions.
Figure 40:
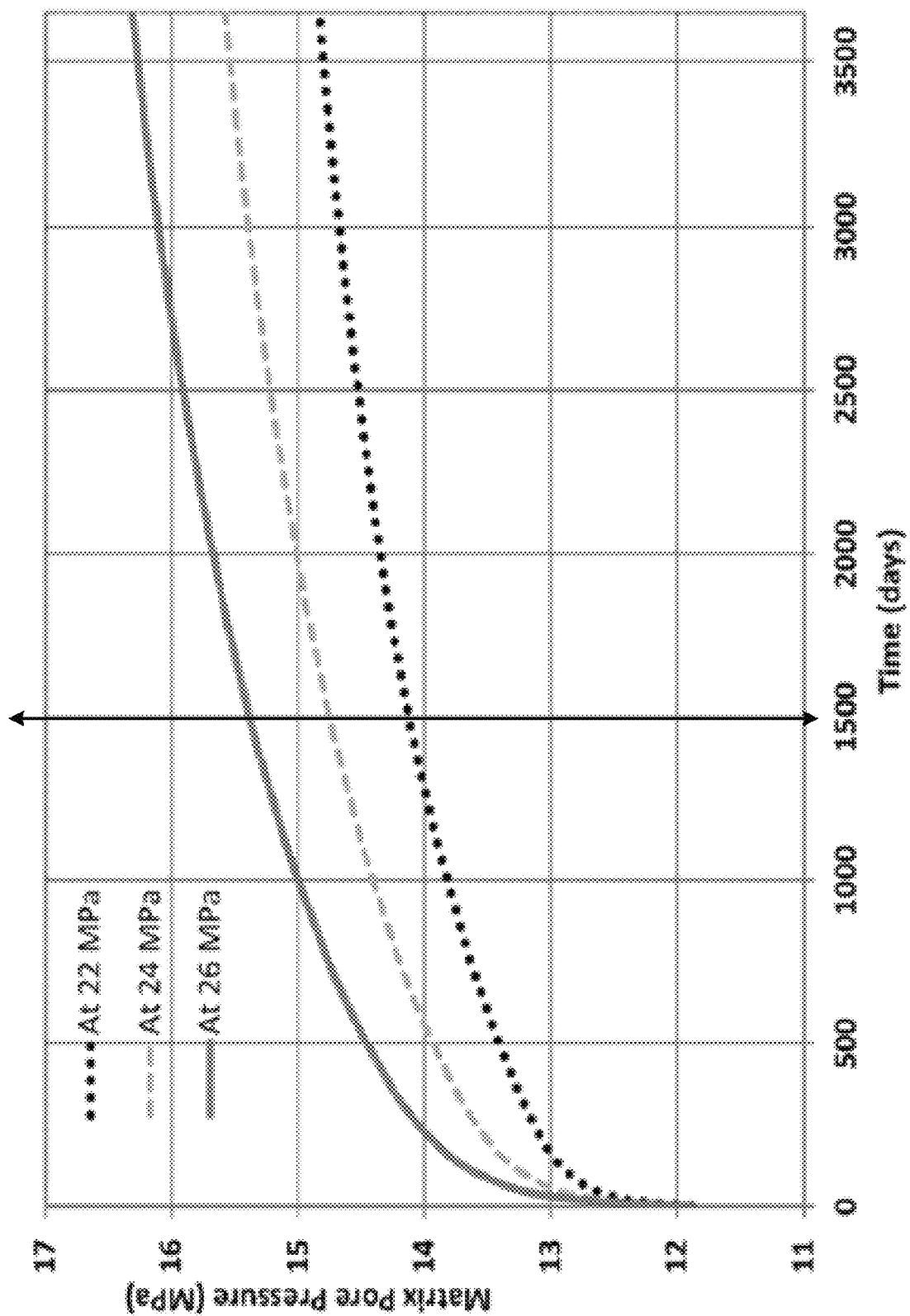
FIG. 40 illustrates the effect of boundary conditions on the pore pressure buildup during 10-year injection period for a large reservoir model with open boundary conditions.

In order to see the effect of boundary conditions on the pore pressure buildup during carbon dioxide injection, different boundary conditions were applied to both small and large reservoir models. The pore pressure buildup in FIG. 36 and FIG. 37 during $CO_2$ injection for ten years was presented for the case of the no-flow boundary condition. If carbon dioxide is allowed to flow across the reservoir boundaries, the magnitude of the pore pressure buildup was shown to be different. As shown in FIGS. 39 and 40 for open boundary conditions, the magnitude of pore pressure after ten years of injection is less as compared to the no-flow boundary condition. The variation of the pore pressure during the entire ten- year injection period is shown in FIG. 39 and FIG. 40, with open boundary conditions for the small (FIG. 39) and large (FIG. 40) reservoir models, respectively. It can be seen in FIG. 39 and FIG. 40 that in the case of the open boundary conditions, the pore pressure increases at a lower rate as carbon dioxide is injected into the reservoir. The effect of the injection pressure is less on the pore pressure buildup in the case of reservoir with open boundary conditions as compared to the no-flow boundary conditions. For large reservoir models, the effect of boundary conditions on the pore pressure buildup becomes much less significant as compared to the small reservoir models. Table 9 compares the maximum pore pressure at 1500 days at 26 MPa injection pressure for the closed boundary conditions of FIG. 36 and FIG. 37 to the open boundary conditions of FIG. 39 and FIG. 40.

TABLE 9

Comparison of maximum pore pressure at 1500 days

| Boundary | Model | Maximum Pore Pressure (MPa) (approximate) |
| --- | --- | --- |
| Closed | Small | 20 |
| Closed | Large | 19 |
| Open | Small | 18.5 |
| Open | Large | 15.4 |

Before carbon dioxide injection into the reservoir, the reservoir has an initial state of pore pressure and stresses. The injection of carbon dioxide causes an increase in the reservoir pore pressure which causes volumetric expansion of the reservoir structure due to its coupled geo-mechanical behavior. During the injection process, the reservoir expansion is allowed only in the vertical direction, while the movement of the reservoir in the lateral direction is normally restrained by the boundaries. Vertical movement of the reservoir causes ground uplift which needs to be monitored during the injection process. During the production process, the pore pressure inside the reservoir decreases and thus will cause the ground subsidence. In the methods of the present disclosure, only ground uplift was considered because carbon dioxide injection causes pore pressure buildup in the reservoir and thus causes ground uplift.

Figure 41A:
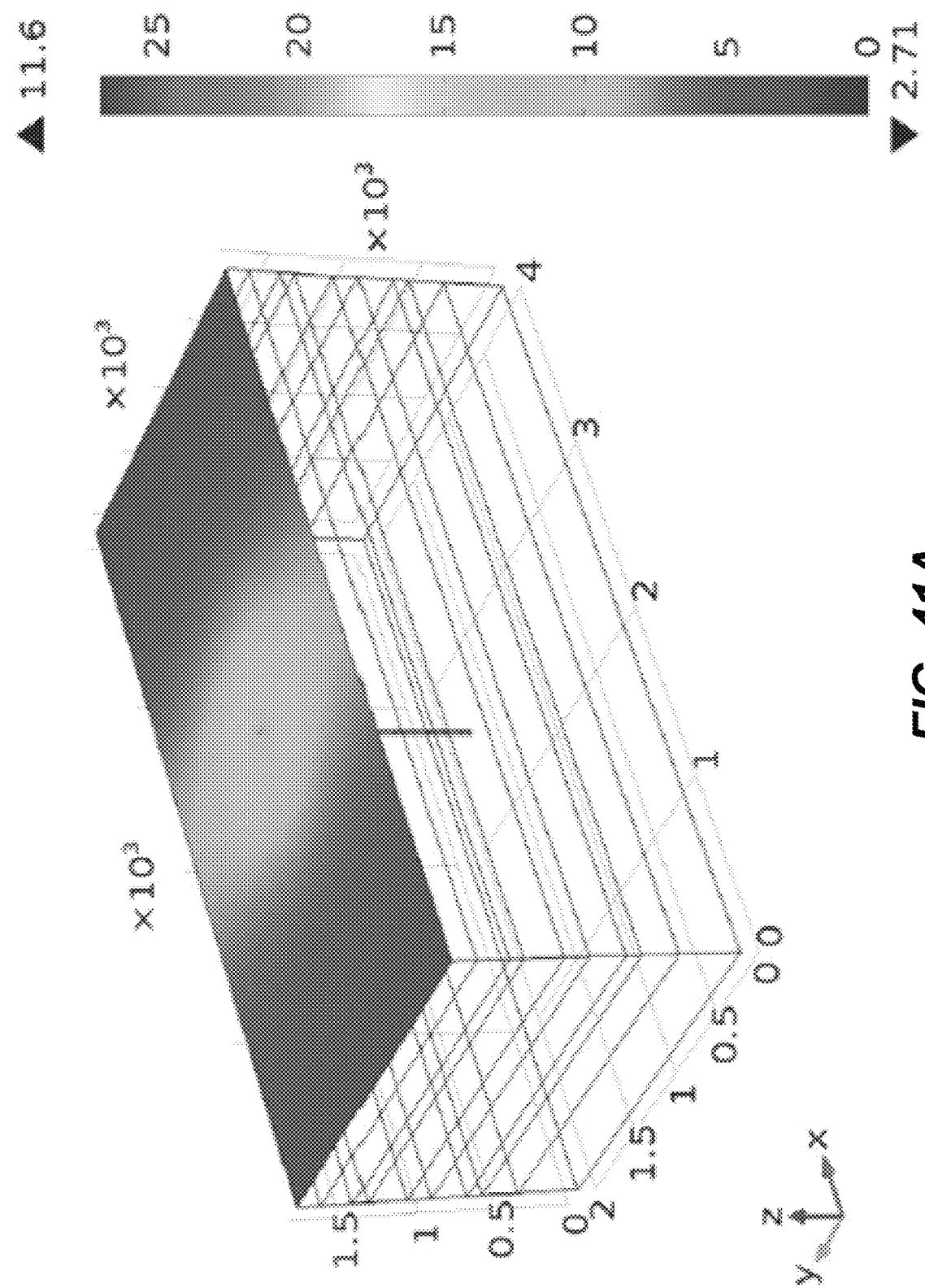
FIGS. 41A-41C illustrate the ground uplift (in mm) for the small reservoir model after various periods of carbon dioxide injection A. after 3-years B. after 6-years C. after 10-years.
Figure 41B:
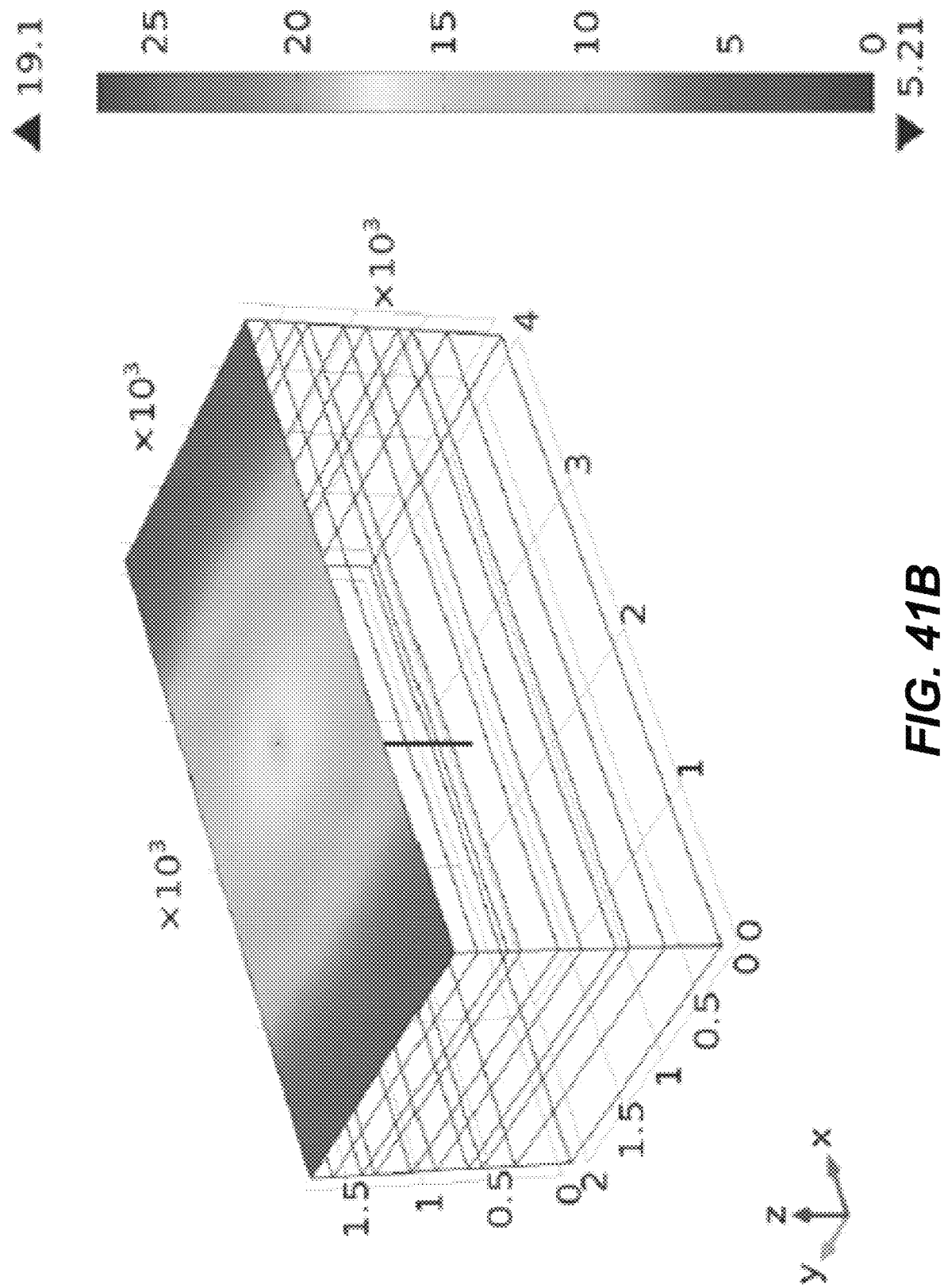
Figure 41C:
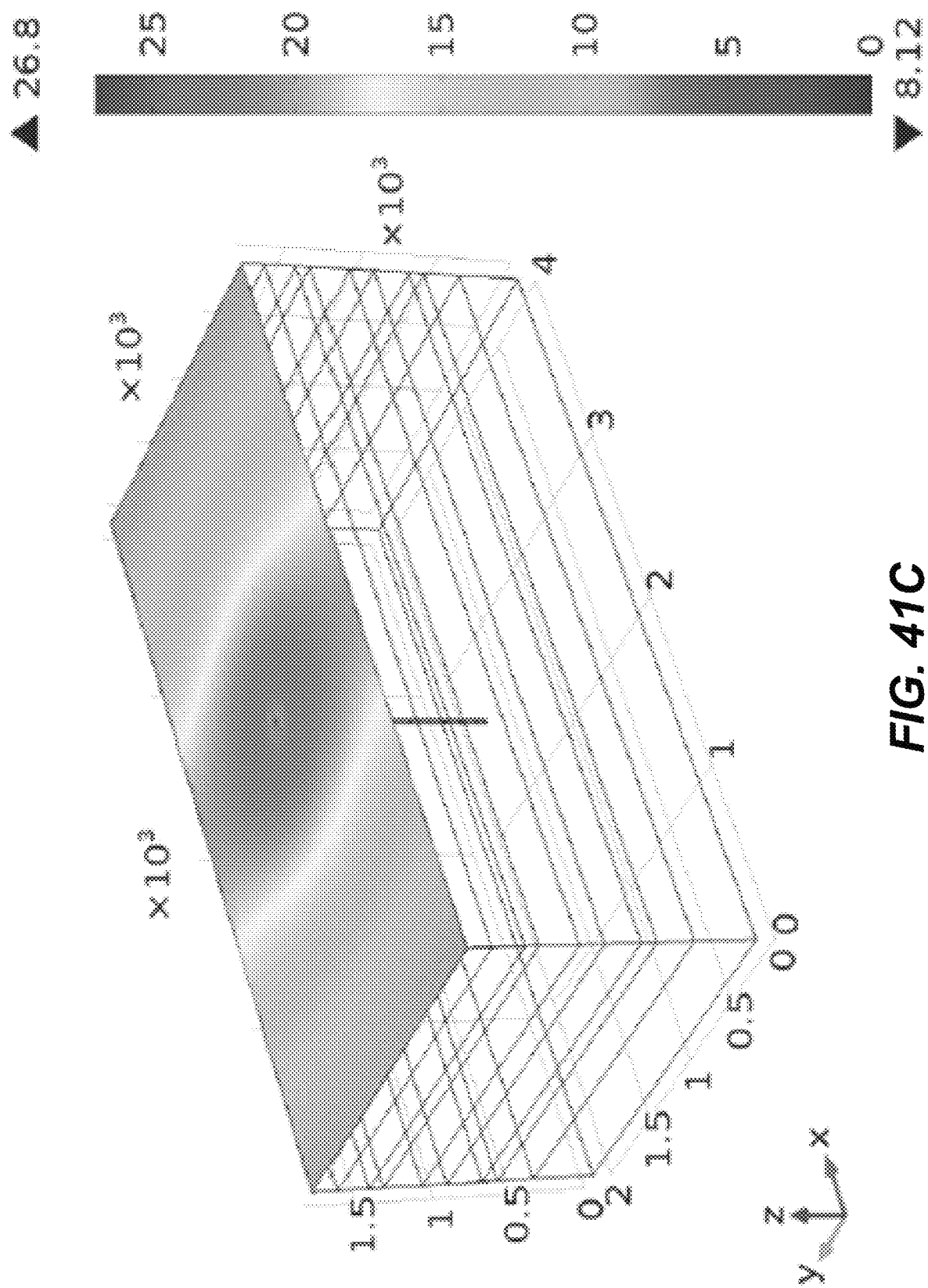

In order to see the effect of reservoir size selection on the ground uplift during carbon dioxide injection using a single injection well, carbon dioxide was injected for ten years, using both the small and large reservoir models. The ground uplift is shown in FIG. 41A-FIG. 41C (small model) and FIG. 42A-FIG. 42C (large model). The ground uplift is appreciably greater for the small model as compared to the large model, for the same injection parameters and injection period. The ground uplift attains its maximum value just above the injection point and extends for several kilometers around the injection point. As shown in FIG. 41A-FIG. 41C and FIG. 42A-FIG. 42C, the magnitude of the ground uplift increases with the injection of carbon dioxide into the reservoir.

Figure 43:
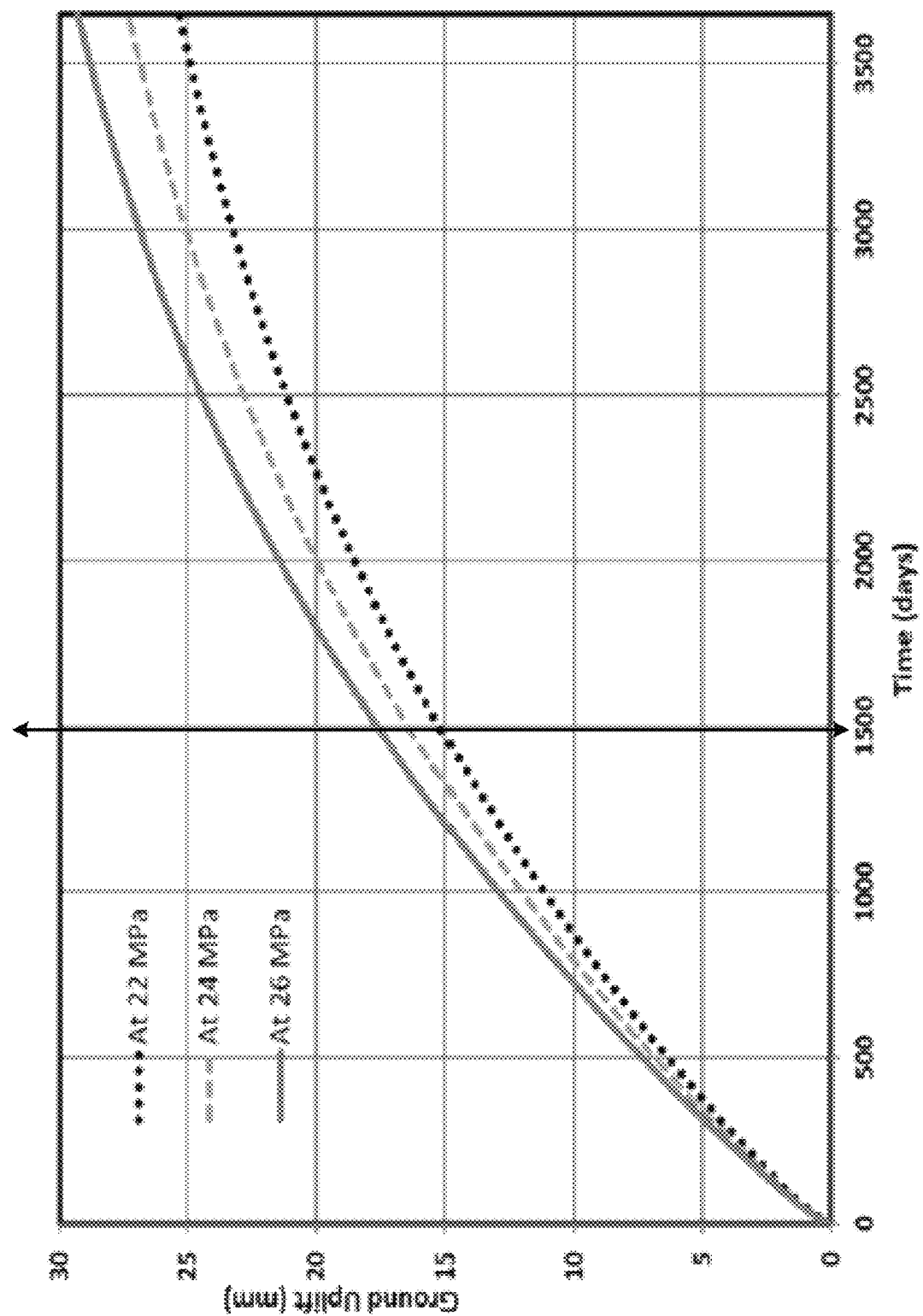
FIG. 43 illustrates the effect of injection pressure on the ground uplift for the small reservoir model after 10-year injection period.
Figure 44:
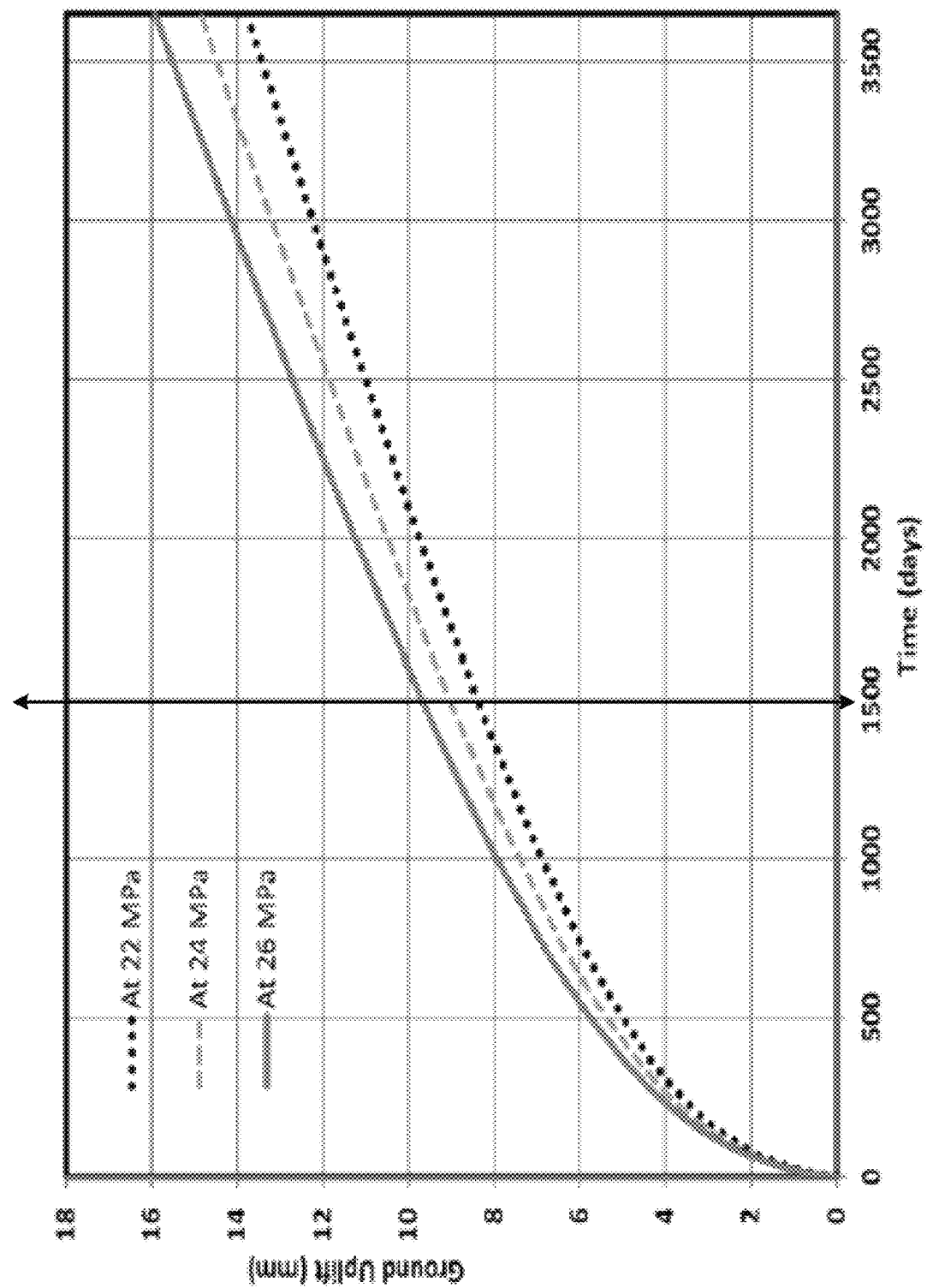
FIG. 44 illustrates the effect of injection pressure on the ground uplift for the large reservoir model after 10-year injection period.

FIG. 43 (small model) and FIG. 44 (large model) display the variation in the values of the ground uplift during ten years of injection at various injection pressures. The ground uplift increases steadily as carbon dioxide is injected into the reservoir, and its magnitude increases as the injection pressure increases. The injection of carbon dioxide for long time period at high injection pressure can cause high magnitude of ground uplift above the injection point. The ground uplift will extend for several kilometers and will affect the people in the vicinity of the injection reservoir.

Figure 42A:
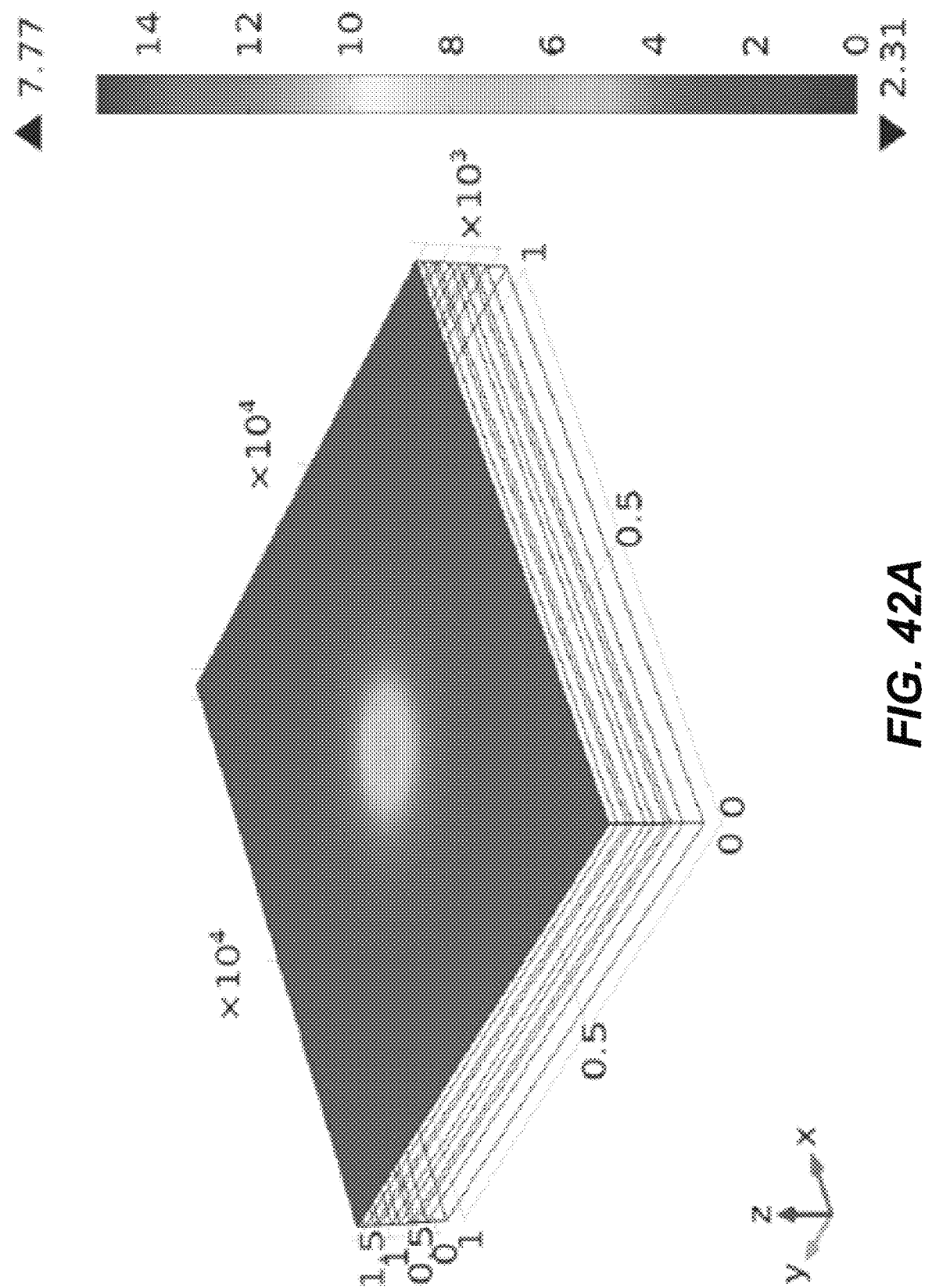
FIGS. 42A-42C illustrate the ground uplift (in mm) for the large reservoir model after various periods of carbon dioxide injection A. after 3-years B. after 6-years C. after 10-years.
Figure 42B:
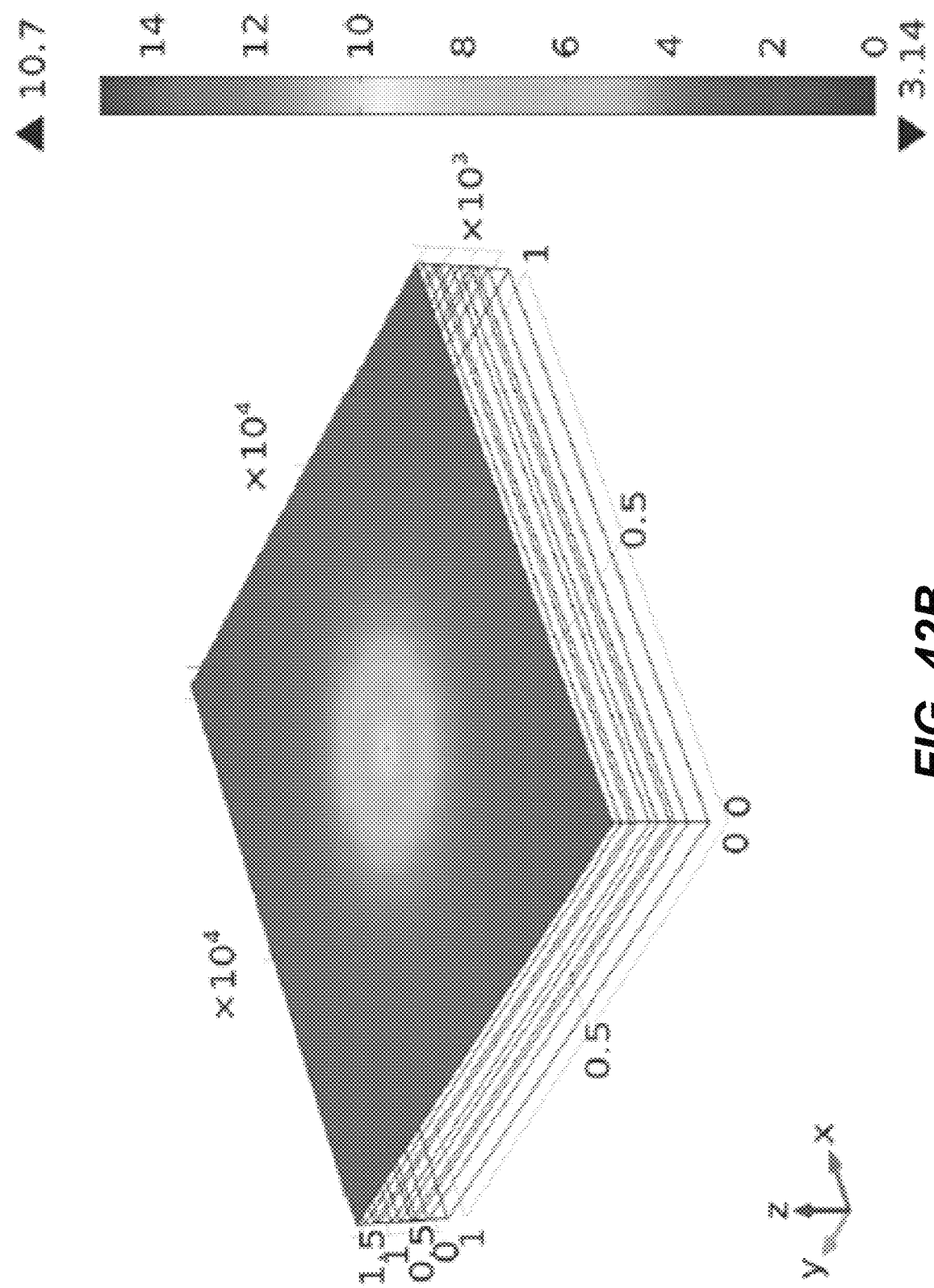
Figure 42C:
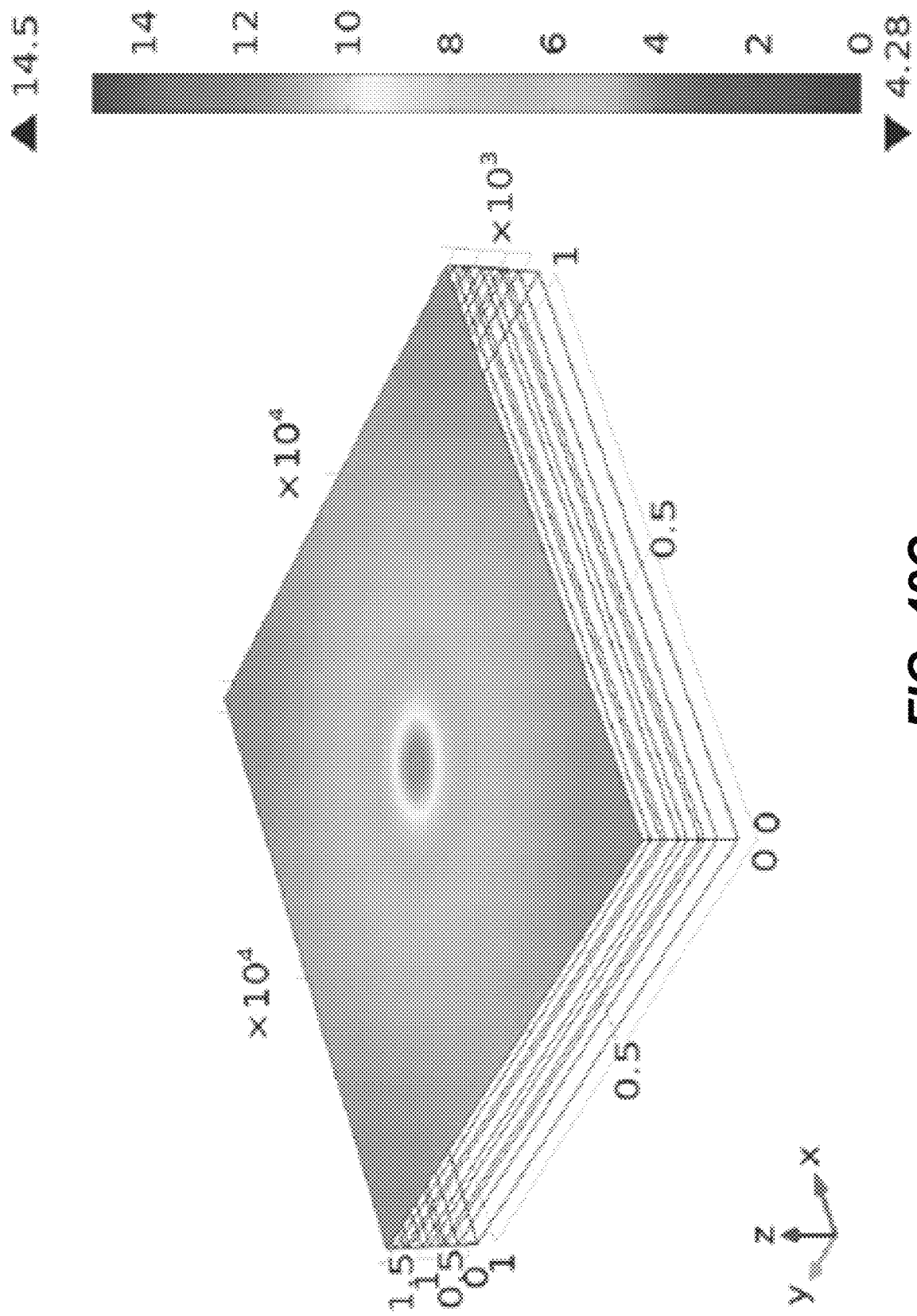

Table 10 summarizes the ground uplift for the small and large models for the 3, 6 and 10 year periods shown in FIG. 41A-FIG. 41C (small model), FIG. 42A-FIG. 42C (large model), FIG. 43 (small model) and FIG. 44 (large model).

TABLE 10

Ground uplift with respect to model size at different time periods.

| | Ground Uplift (mm) | | | |
|---|---|---|---|---|
| Reservoir Size | 3 years | 4.1 years (1500 days) (approximate) | 6 years | 10 years |
| Small | 11.6 | 17.5 | 19.1 | 26.8 |
| Large | 7.77 | 9.7 | 10.7 | 14.5 |

Figure 45A:
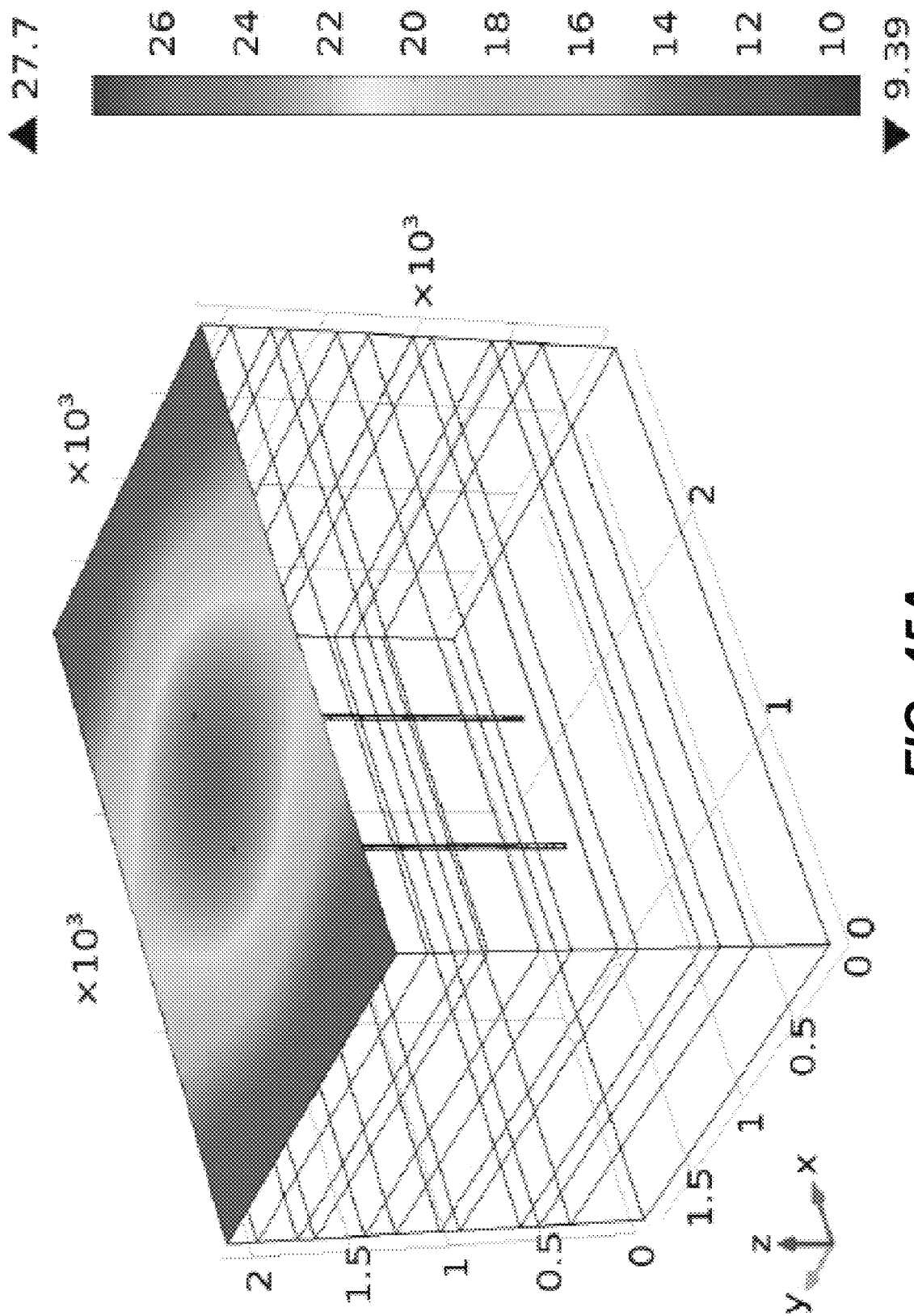
FIGS. 45A-45D illustrate the ground uplift (in mm) during carbon dioxide injection into different size models: A. (2800×1800) meters B. (3000×2000) meters C. (6000×4000) meters D. (9000×6000) meters.
Figure 45B:
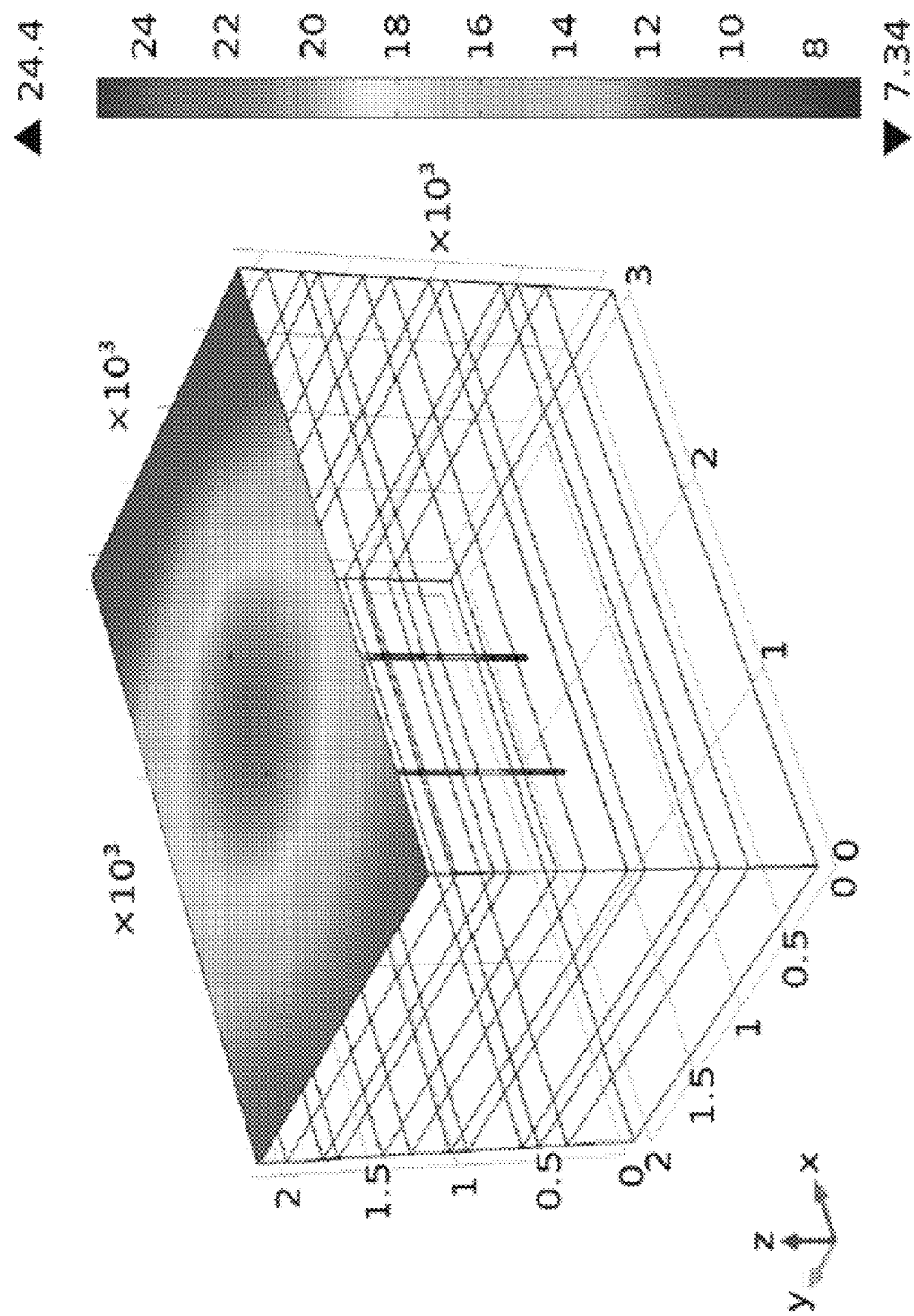
Figure 45C:
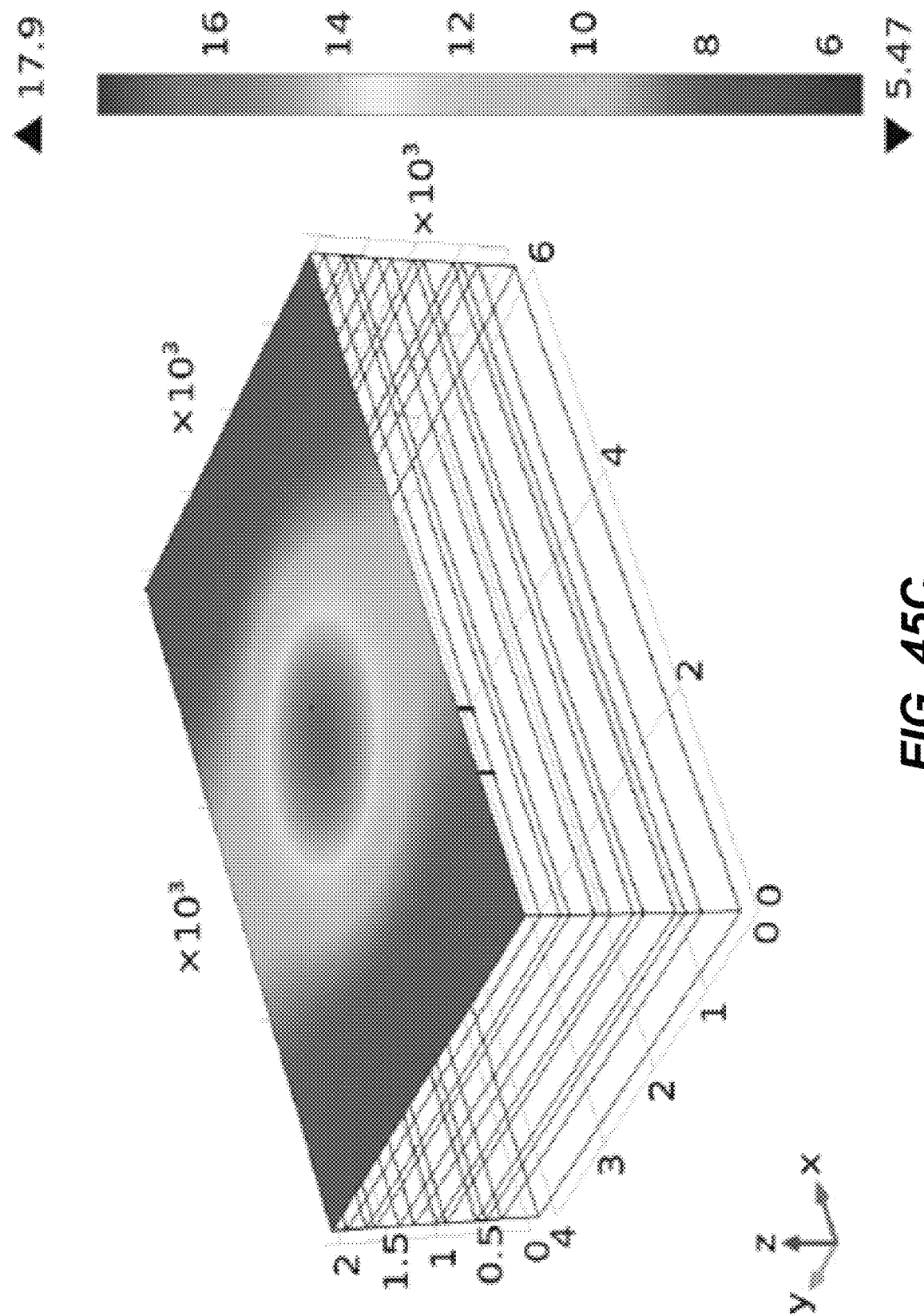
Figure 45D:
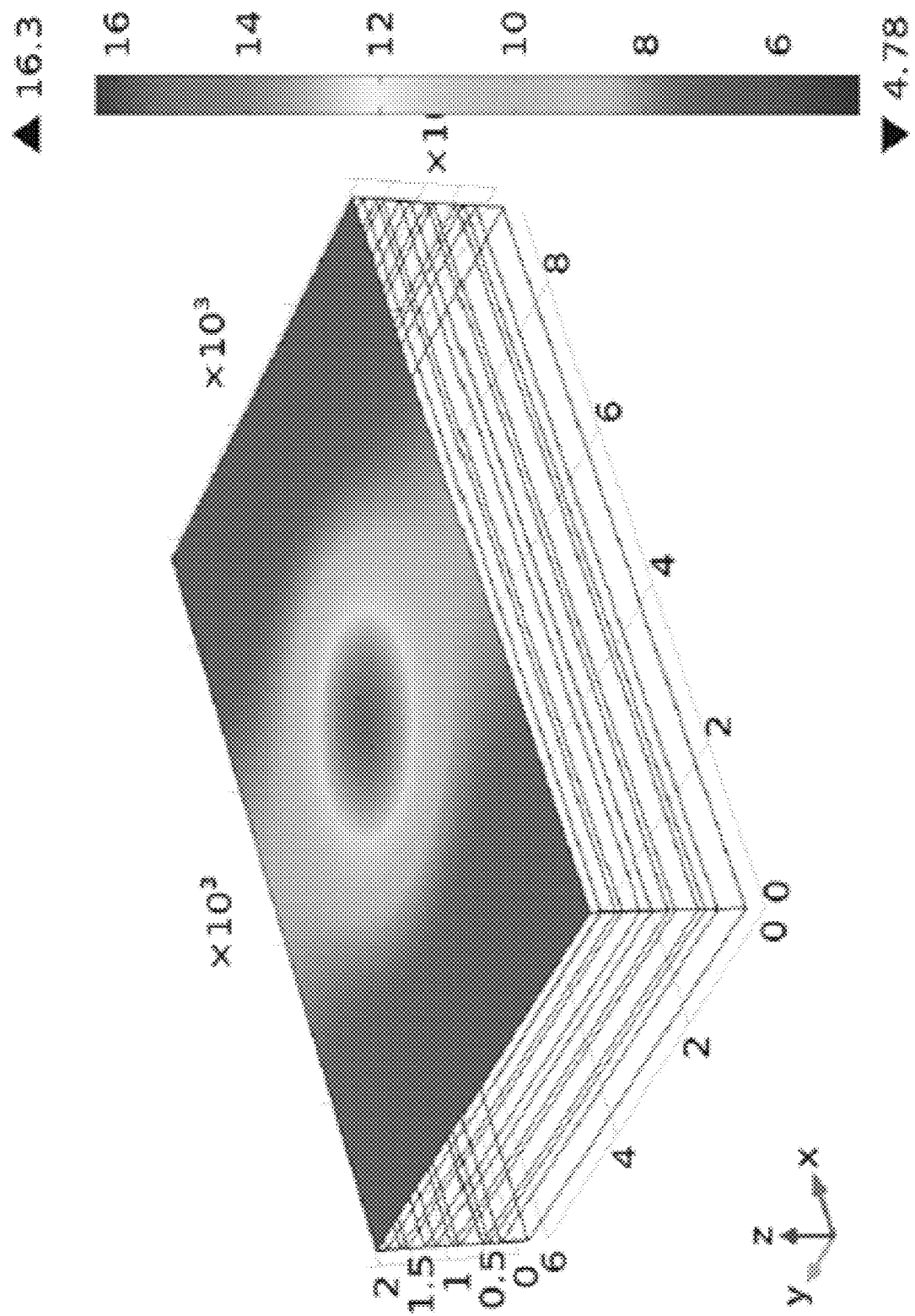

Carbon dioxide is normally injected using multiple injection wells. In the case of multiple injection wells, the pore pressure buildup is even more due to the reason that the pressure fronts from the two (or more) injection wells will interact and will exponentially increase the magnitude of the pore pressure and the ground uplift. In this case, ground uplift was calculated during carbon dioxide injection into reservoir using multiple injection wells. FIG. 45A-FIG. 45D show that, as the size of the reservoir is increased during the geo-mechanical modeling of the reservoir, the magnitude of the ground uplift decreases. FIGS. 45A-45D illustrate the ground uplift (in mm) during carbon dioxide injection into different size models: FIG. 45A in a reservoir of size 2800×1800 meters, FIG. 45B in a reservoir of size 3000× 2000 meters, FIG. 45C in a reservoir of size 6000×4000 meters and FIG. 45D in a reservoir of size 9000×6000 meters. The magnitude of the ground uplift is found to be higher in the case of carbon dioxide injection using multiple injection wells than that for the case of the single injection well as expected, as using multiple wells should result in higher volumes of sequestered $CO_2$.

Table 11 summarizes the effect of reservoir size on ground uplift for multiple injection wells.

TABLE 11

Ground uplift with respect to reservoir size in multiple injection wells.

| Reservoir Size | 2800 × 1800 | 3000 × 2000 | 6000 × 4000 | 9000 × 6000 |
|---|---|---|---|---|
| Ground Uplift (mm) | 27.7 7.77 | 24.4 9.7 | 17.9 10.7 | 16.3 14.5 |

Figure 46A:
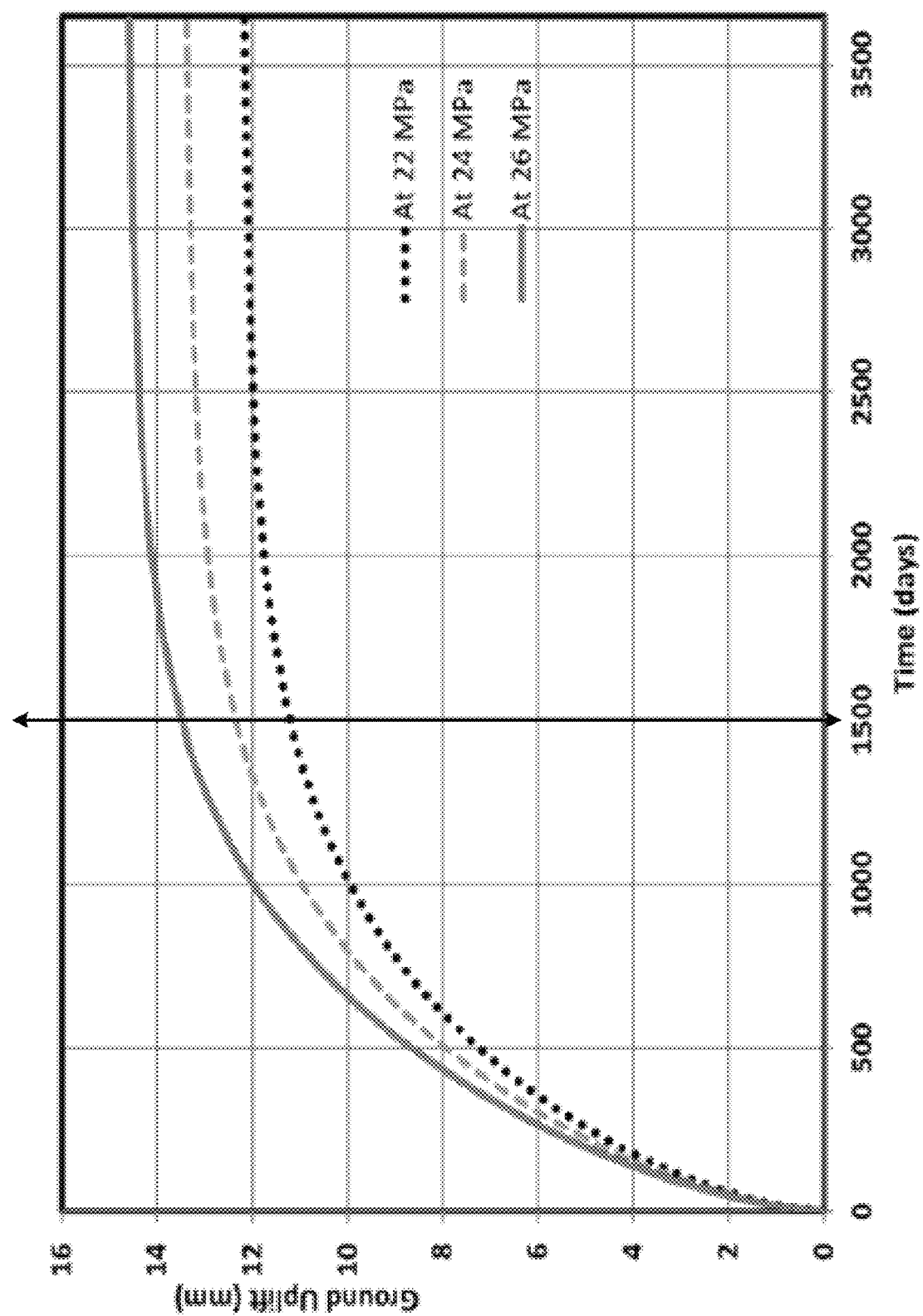
FIGS. 46A-46B illustrate the effect of boundary conditions on the ground uplift during ten years of carbon dioxide injection A. closed reservoir model B. open reservoir model.
Figure 46B:
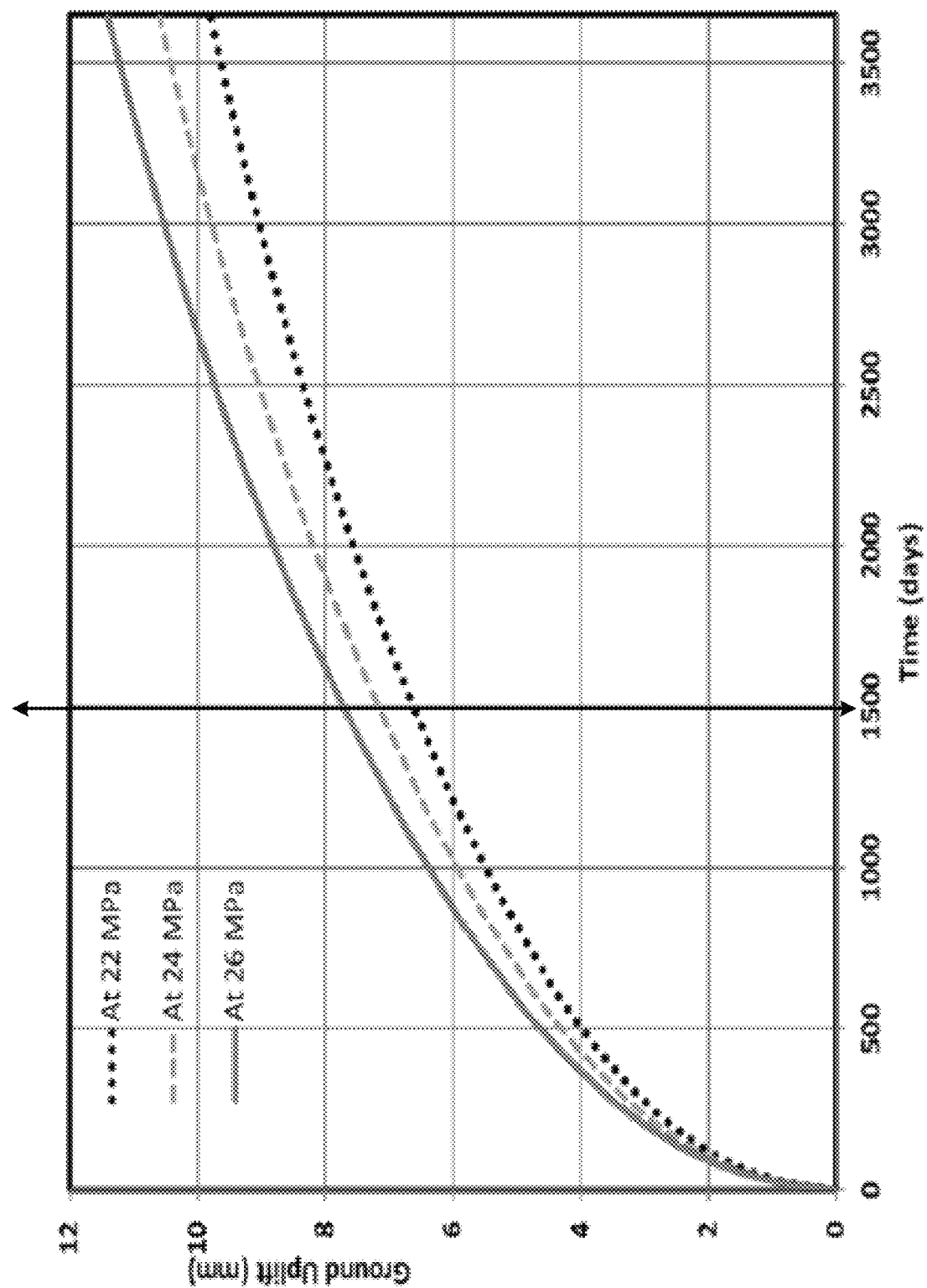

The reservoir is normally bound from all the sides with accompanying geological layers except the top surface of the reservoir that may be deformed during carbon dioxide injection process. The reservoir cannot deform freely horizontally due to the geological layers at the sides of the reservoir, however, if the permeability of the geological side-layers is high, then carbon dioxide may flow across the reservoir boundaries and penetrate into the side geological layers. The open boundary conditions will prevent the excessive pore pressure buildup during carbon dioxide injection, thus resulting in relatively less values of ground uplift in this case. FIG. 46A (closed boundary) and FIG. 46B (open boundary) show the effect of the boundary conditions on the ground uplift. The magnitude of the ground uplift in case of the open boundary conditions is less than that of the no-flow boundary conditions. FIG. 46A shows a ground uplift of about 13.5 mm for the closed boundary and FIG. 46B shows a ground uplift of about 7.5 mm for the open boundary. A no-flow boundary condition can occur geologically if the reservoir block is bounded from all sides by impermeable faults. In this case, the flow of the injected carbon dioxide will be restricted by the impermeable faults and thus the accumulation of the injected carbon dioxide will cause a high magnitude of pore pressure inside the reservoir and hence a high magnitude of ground uplift.

Figure 47A:
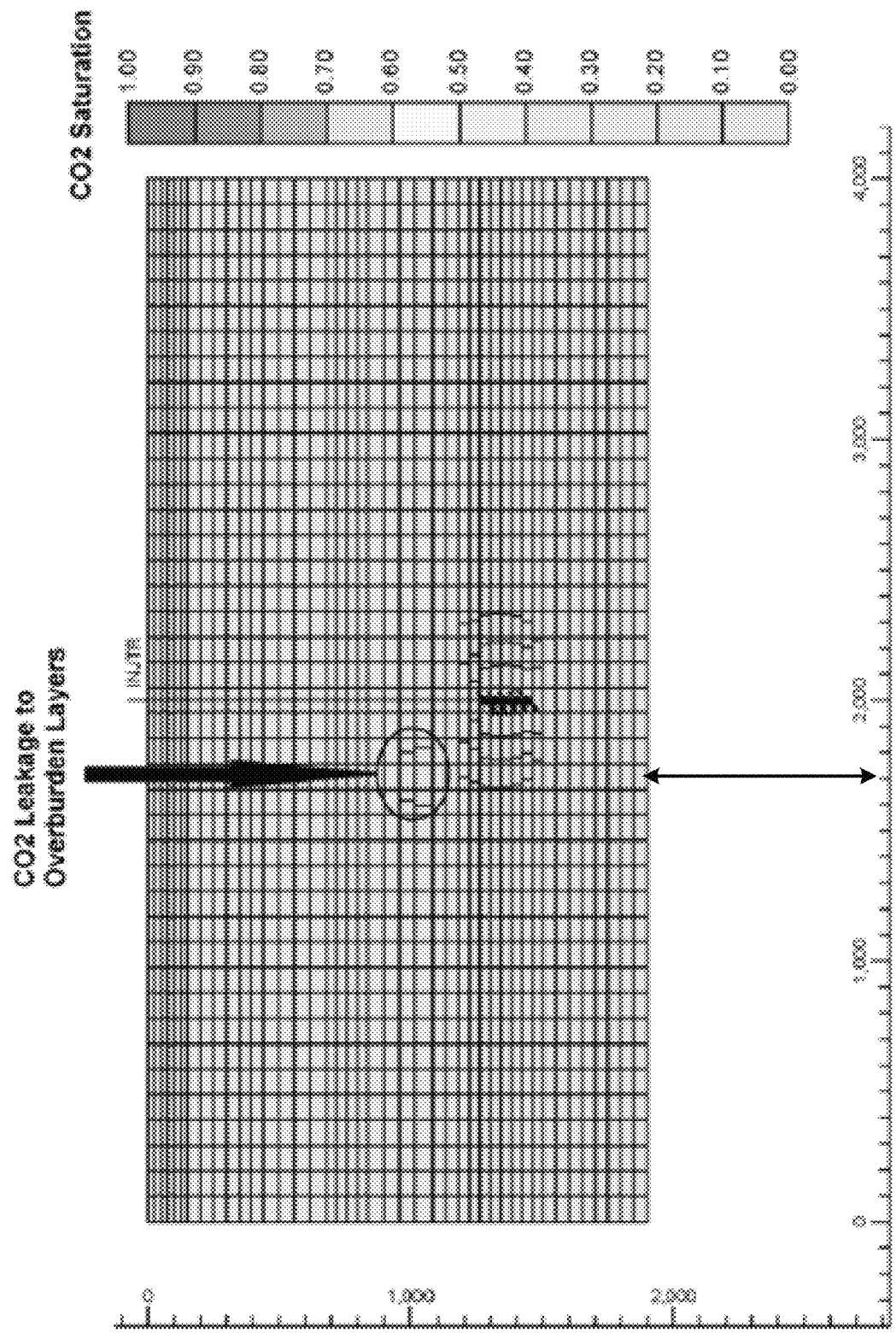
FIGS. 47A-47D illustrate the carbon dioxide saturation in the reservoir and overburden layers after carbon dioxide injection: A. for small model after 5 years, B. for small model after 10 years, C. for large model after 5 years and D. for large model after 10 years.
Figure 47B:
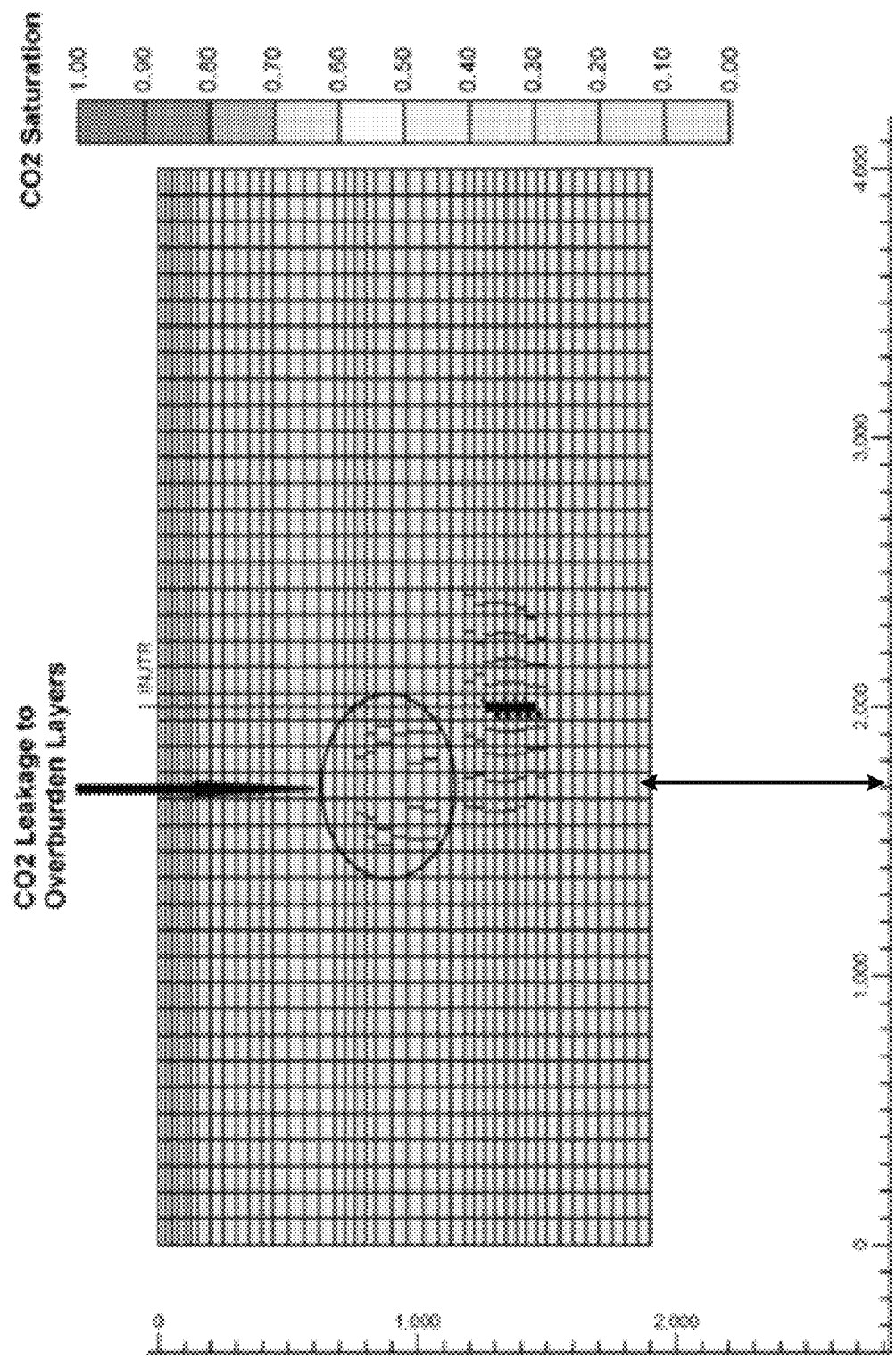
Figure 47C:
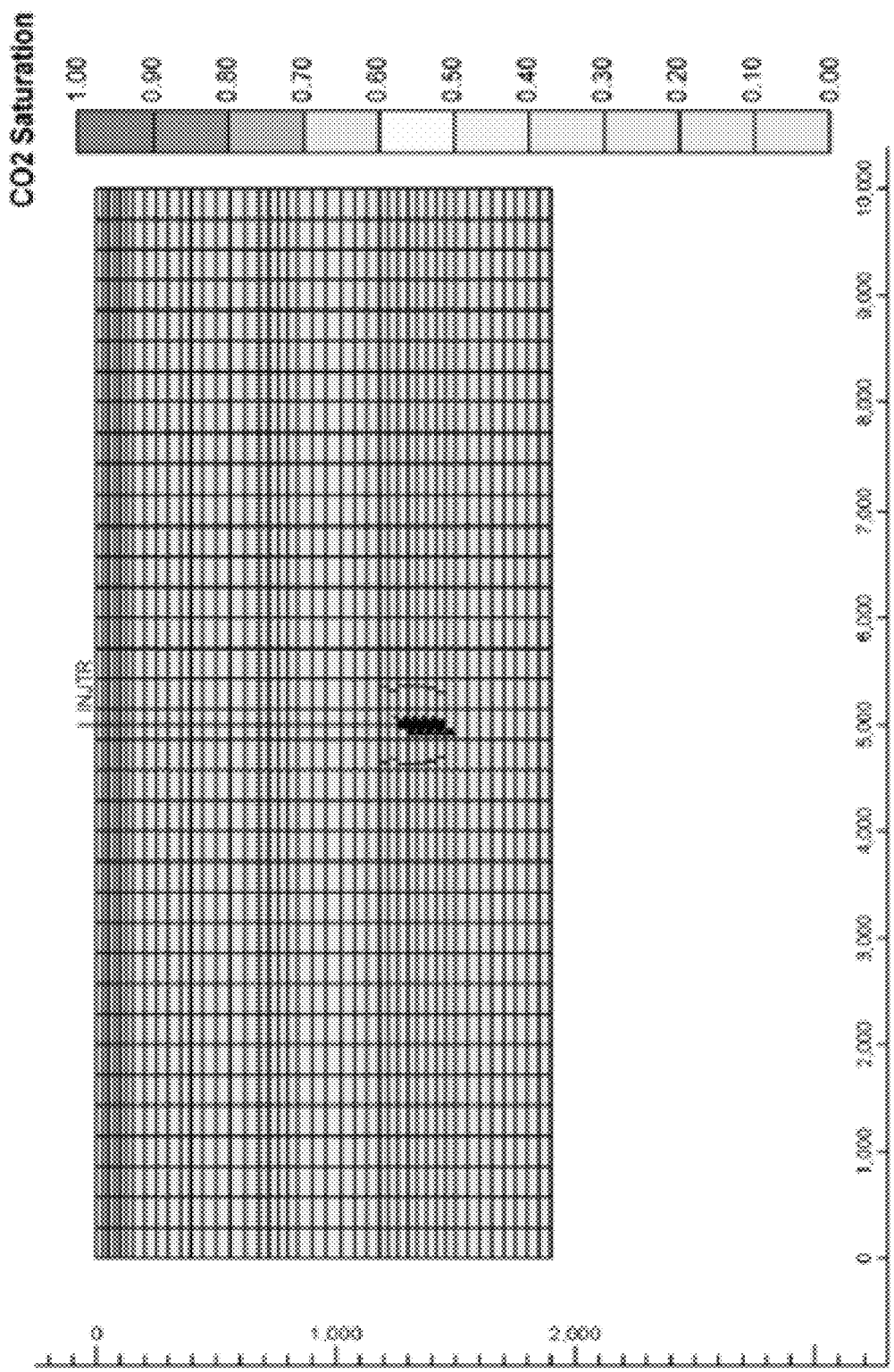
Figure 47D:
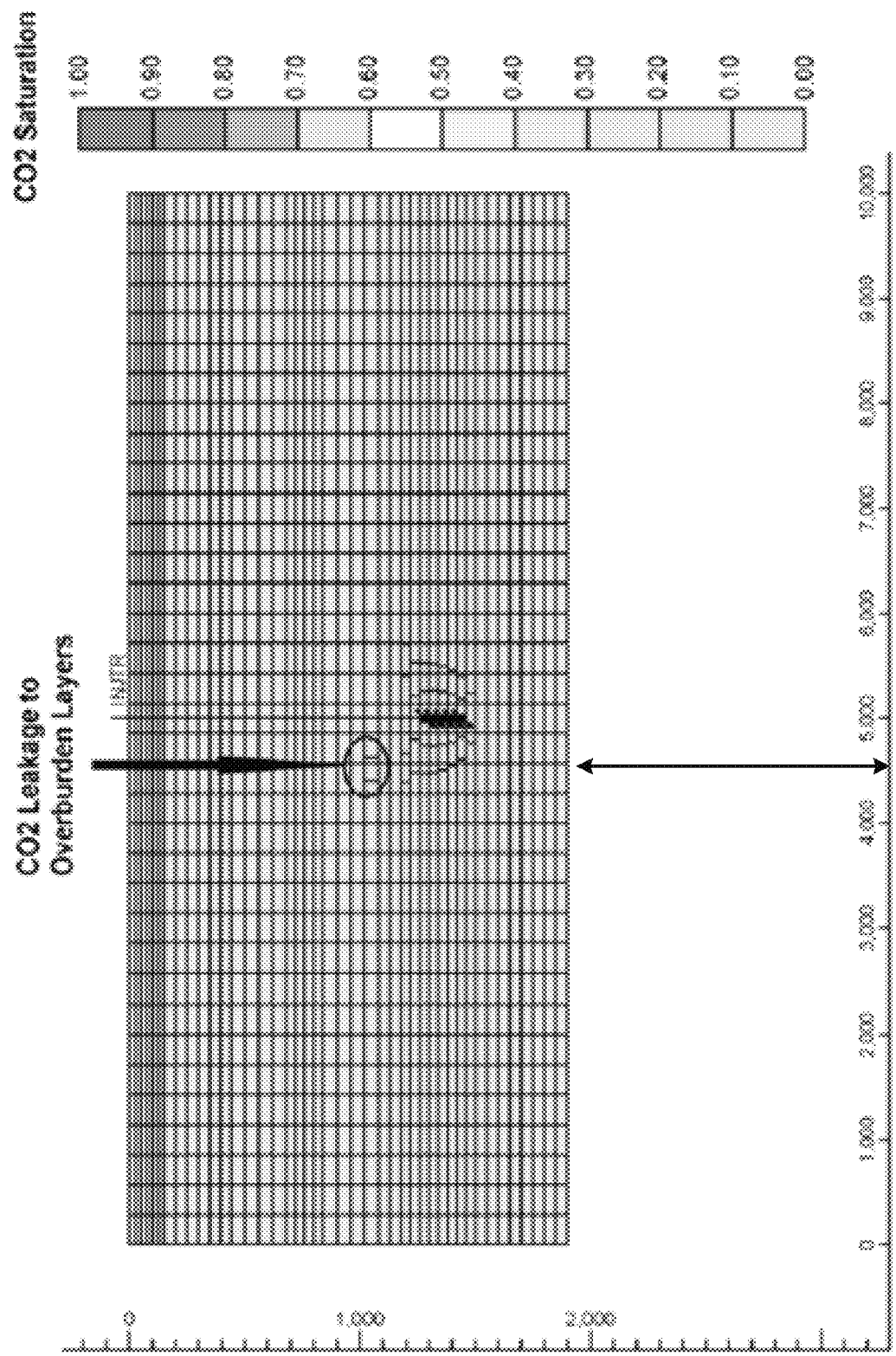
Figure 48A:
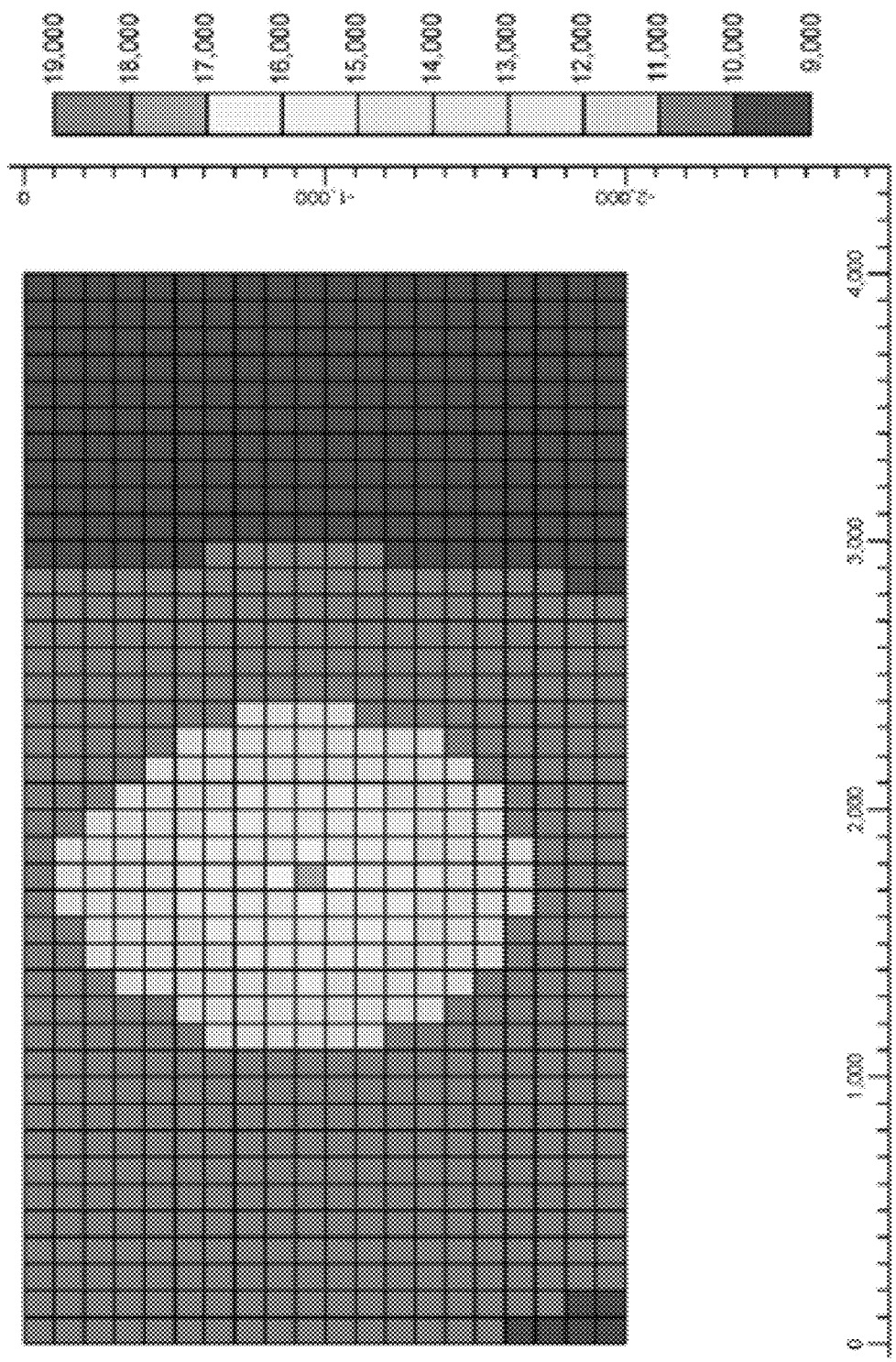
FIG. 48A-48B illustrates the pore pressure in Wasia overburden layer for a fault zone spaced at 200 meters from the injection well: A. small model B. large model.
Figure 48B:
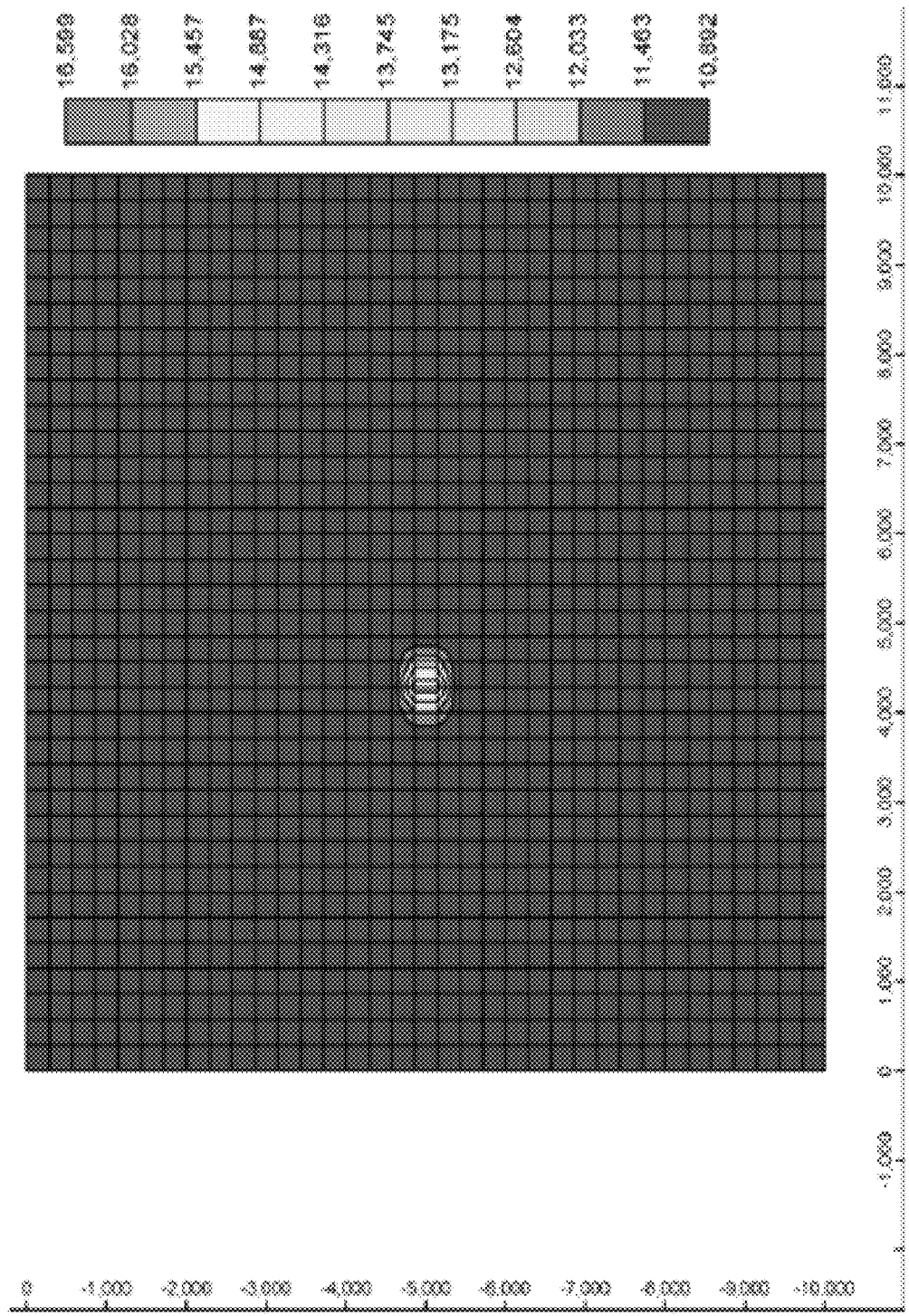
Figure 49:
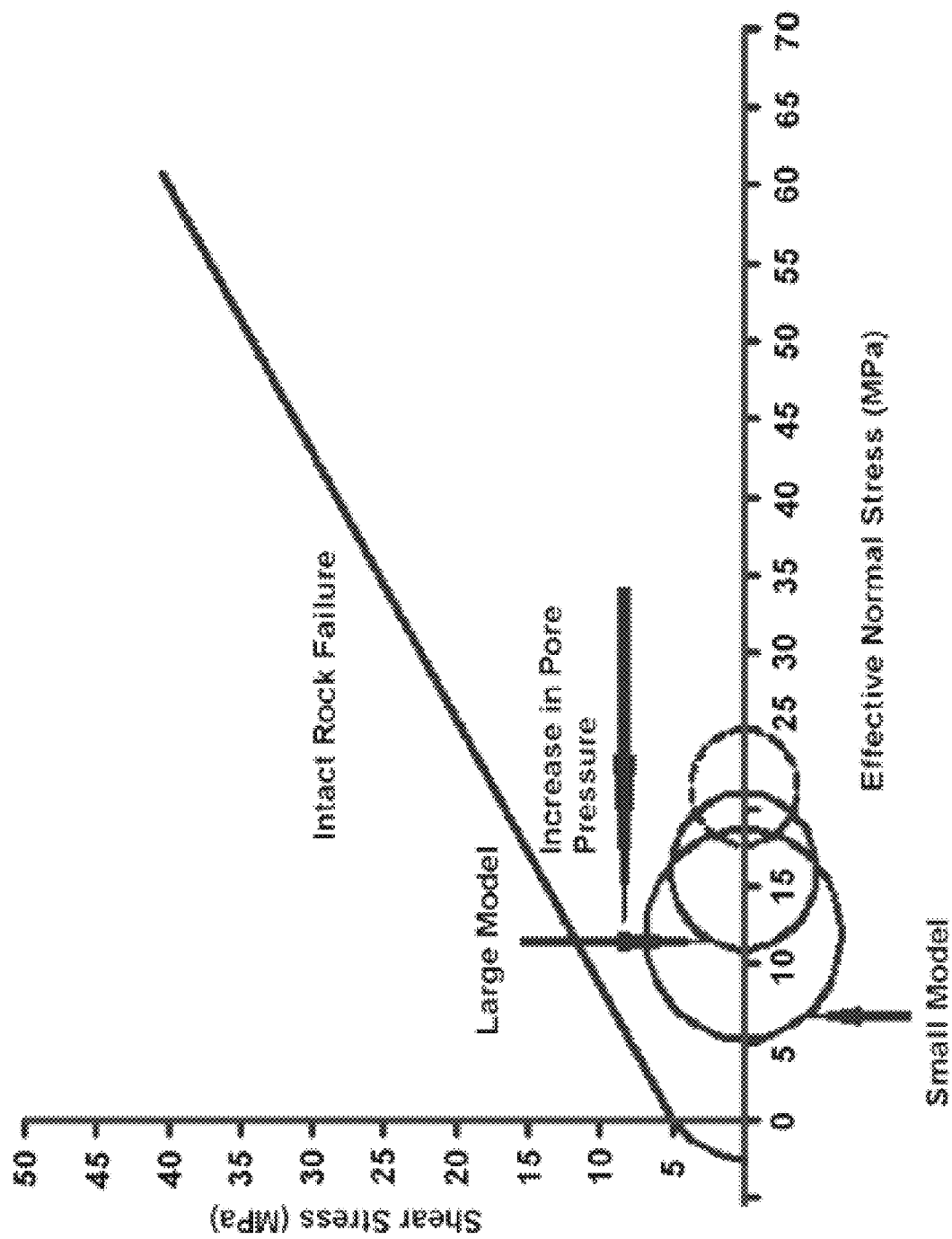
FIG. 49 illustrates the effect of reservoir size on the stability of the reservoir during $CO_2$ injection.

In order to see the effect of the reservoir size on the fault reactivation, carbon dioxide was injected at a depth of 1400 meters at an injection pressure of 26 MPa into the Biyadh reservoir (114, FIG. 1). Carbon dioxide was injected at a distance of 200 meters from a fault. FIG. 47A-47D illustrate the carbon dioxide saturation in the reservoir and overburden layers after carbon dioxide injection: FIG. 47A for a small model after 5 years, FIG. 47B for a small model after 10 years, FIG. 47C for a large model after 5 years and 47D for a large model after 10 years. The injection of carbon dioxide for ten years into the reservoir causes fault reactivation for both the small and large size reservoirs. Comparison of FIG. 47B with FIG. 47D illustrates that the saturation of carbon dioxide is greater in the overburden layers for the small size reservoir than for a large size reservoir after ten years of carbon dioxide injection. This leakage of a large quantity of carbon dioxide in the small size reservoir indicates an increase in the fault permeability, i.e. the fault reactivates or opens. FIG. 47A-FIG. 47B also show that the fault is reactivated earlier at in the case of carbon dioxide injection into the small size reservoirs at about 1700 days than into the large size reservoirs of FIG. 47C-FIG. 47D at about 4500 days. As shown in FIG. 48A and FIG. 48B, the magnitude of the pore pressure in the Wasia overburden layer is greater in the case of a small size reservoir (FIG. 48A) than in the large size reservoir (FIG. 48B). The high magnitude of the pore pressure in the Wasia overburden layer for the small size reservoir is due to the leakage of the large quantity of highly pressurized carbon dioxide.

A coupled stability analysis was performed for the Biyadh sandstone reservoir for both the small and large model sizes. For the stability analysis of the reservoir, the Mohr-Coulomb failure criterion was utilized to find the final stressed condition of the reservoir after carbon dioxide injection. The vertical stress due to the overburden layers was considered to be constant, while the changes in the horizontal stresses due to the pore pressure variation during carbon dioxide injection were allowed to vary. The pore pressure value corresponding to the maximum injection pressure was used for the stability analysis of the reservoir for both cases of small and large models. As shown in FIG. 48, the stressed conditions of the reservoir before carbon dioxide injection are shown by the dashed circle for both the small and large models, which were based on the initial values of reservoir stresses and pore pressure. As carbon dioxide was injected into the small and large reservoirs, the pore pressure increased, and eventually caused a change in the magnitude of the horizontal stresses in the reservoirs. The final stressed conditions for the small and large size models are shown by the solid circles which demonstrate that the stability is highly dependent on the size of the reservoir that is selected for the modeling procedure. The smaller the size of the reservoir model, the greater the pressure buildup that will move the reservoir closer to the failure condition, as compared to the larger model size.

The present disclosure describes methods for relating the rate of injection of $CO_2$ into a reservoir layer to pore pressure and effective stresses in fractured and non-fractured layers. The pore pressure and effective stresses are used to predict subsequent uplift of the caprock, leakage into the subsurface layers and long term stability of the reservoir.

Further, the above methods determine the effect on reducing the pore pressure build-up and increasing the reservoir storage capacity by varying both the number and arrangement of carbon dioxide injection wells.

Additionally, the present disclosure describes methods for determining the effects of reservoir model size and different boundary conditions on pore pressure buildup, ground uplift, fault reactivation, and stability of the reservoir by means of the geo-mechanical modeling of the reservoir. Further determined are the number and placement of injection wells and the relationship to pore pressure buildup, ground uplift, fault reactivation, and stability of the reservoir.

In summary:

i. For non-fractured caprock, carbon dioxide is restricted by the caprock to spread only within the reservoir, whereas for fractured caprock, carbon dioxide leaks into the overburden layers, as anticipated. Accordingly, the pressure buildup attains higher values in non-fractured caprock. On the other hand, for fractured caprock, the leakage of carbon dioxide tends to increase the local pore pressure of the overburden layers. The location of the fracture zone in the caprock was found to have an influence on the pore pressure in the overburden layers. It was observed that the pore pressure becomes higher as the fractured zone gets closer to the injection well. Excessive increase in pore pressure may cause leakage of carbon dioxide to the potable water layers and atmosphere. Therefore, $CO_2$ injection must be confined to injecting a safe quantity of carbon dioxide into reservoirs that do not include active geological faults and fractures.

ii. The injection of carbon dioxide causes a considerable increase in the pore pressure and the resulting ground uplift. For the case of the non-fractured caprock, the ground uplift reaches its highest value just above the injection point at the center of the reservoir. However, for the case of the fractured caprock, the ground uplift is centered above the fractured zone. It is important to note that the increase in the ground uplift just above the fractured zone can be instrumental in the identification and localization of the fractured zone in the caprock. Further, the location of the fracture zone in the caprock also influences the magnitude of the vertical ground displacement in that the magnitude of the ground uplift is higher as the fracture zone gets closer to the injection well. The induced ground uplift due to injection extends for several kilometers around the injection point.

iii. The permeability of the fractured zone has a significant influence on the amount of carbon dioxide leakage into the overburden layers, and hence on the vertical ground uplift. It was observed that the vertical ground displacement above the fractured zone decreases as the permeability of the fractured zone decreases. The Mohr-Coulomb failure criterion was used to perform the coupled stability analysis of the reservoir during injection. Because of carbon dioxide leakage into the overburden layers in the case of fractured caprock, the pressure buildup in the reservoir did not attain enough high values to cause failure of the reservoir structure. Even for higher values of pressure buildup, in the case of non-fractured caprock, the reservoir was found to maintain stability and remained on the safe side for the 10-year period of carbon dioxide injection. The injection period, together with the safe values of the injection parameters, such as flow rate and injection pressure, must be calculated before carbon dioxide injection to ensure that the stored gas does not leak into the atmosphere and that the climate change mitigation strategies are not be jeopardized. The estimated safe values of the injection parameters may be considered as benchmark data for performing similar carbon dioxide sequestration scenarios in reservoirs.

iv. Among various climate mitigation strategies, which may include renewable energy sources, retrofitting buildings to become more energy-efficient, and developing more sustainable support systems, the carbon capture and sequestration has great potential. The results of the present disclosure are demonstrated by a non-limiting example of a mitigation strategy exploring the potential of one of the largest sandstone reservoirs in Saudi Arabia for carbon dioxide storage. The Biyadh reservoir stretches over 250 km in length and 30 km in width, which is estimated to possess a storage capacity of 8 to 20 gigatons. Although the methods of the present disclosure have been described using a specific carbon dioxide injection scenario in a Saudi Arabian reservoir, the geo-mechanical modeling, stability analysis, and modeling of leakage are broadly applicable to other geological sites worldwide.

v. Increasing the number of injection wells causes an increase in the pore pressure which significantly decreases the effective stresses on the reservoir and drives the reservoir to move towards the failure line. Arranging injection wells in different patterns also affects the pore pressure and hence the stability of the reservoir. For multiple injection wells, if the injection wells are closer to each other, the pore pressure will significantly increase during carbon dioxide injection. For the various injection scenarios, the reservoir remained in a safe, stable condition. Four-injection well scenarios came closer to the failure line (of the Mohr-Coulomb failure envelope) as compared to the other injection scenarios.

vi. When increasing the number of injection wells in the system, the maximum occupancy of $CO_2$ must be monitored in order not to exceed the critical occupancy for the reservoir. The maximum occupancy was calculated for different numbers of injection wells. For the case of the boosted injection using four wells, the occupancy was found to be 1.64% of the available pore volume of the reservoir, which is less than the allowable 3% limit for the closed reservoir condition.

vii. Ground vertical uplift was noted to increase appreciably with an increase in the number of injection wells. Although the use of four injection wells did not exceed the maximum occupancy limit, it caused a significant reduction in the effective stresses in the reservoir. Consequently, the reservoir was driven towards the failure line, in addition to reaching higher values of ground uplift that extended for several kilometers surrounding the injection wells.

viii. One of the key factors for deciding the optimum number of injection wells and the optimum well arrangement is the accumulation of carbon dioxide during injection. The results of the numerical investigation demonstrate it is advisable to avoid placing the injection wells very close to each other or very close to the boundaries of the reservoir.

ix. For multi-well injection scenarios, the above results can easily suggest the best possible well arrangement. For instance, it was shown that two wells spaced at some optimum distance would achieve maximum reservoir stability, maximum reservoir storage capacity and lower values of the vertical ground uplift. For the three-well and four-well arrangements, although the storage capacity could reach higher values, this benefit is compromised by comparatively less reservoir stability and higher values of ground vertical uplift.

x. The pore pressure buildup in the case of the large reservoir model was found to be lower as compared to the small model due to the fact that in large model the closed boundaries of the reservoir are far away from the injection well and this facilitates the rapid flow of carbon dioxide along the reservoir. In the small model of the reservoir, the closed boundaries restrict the flow of carbon dioxide and thus the rate of pore pressure buildup increases. Furthermore, the pore pressure increases as the value of the carbon dioxide injection pressure is increased. Similarly in the case of multiple injection wells, the magnitude of the pore pressure decreases as the size of the reservoir is increased. It was concluded that the selection of a representative reservoir volume with a size different from that of the actual reservoir influenced the estimated pore pressure buildup due to carbon dioxide injection. Moreover, for the open boundary condition, the magnitude of pore pressure after carbon dioxide injection was found to be relatively lower compared to the no-flow boundary condition.

xi. The ground uplift was found to be higher for the small size reservoir model as compared to the large reservoir model for the same injection parameters and injection period. The ground uplift has a maximum value at the location just above the injection point, yet it extended for several kilometers around the injection point. The magnitude of the ground uplift is higher in the case of carbon dioxide injection using multiple injection wells as compared to the $CO_2$ injection using single injection well. The value of the ground uplift was found to be lower in the case of an open boundary condition. The Mohr-Coulomb failure criterion demonstrated that the stability analysis is highly dependent on the size of the reservoir used in the modeling procedure. It was also observed that the smaller the size of the reservoir, the larger the pressure buildup, and the final stress condition of the reservoir was closer to the failure envelope compared to the larger size reservoir model.

xii. An existing fault was shown to be reactivated earlier in the case of small size reservoir as compared to case of large size reservoir, and was shown to be followed by a higher saturation of carbon dioxide in the overburden layers. The leakage of a large quantity of carbon dioxide in the case of small size reservoir is an indication of the increase in the fault permeability. The magnitude of the pore pressure in the overburden layers was shown to be relatively higher in the case of small size reservoir due to the leakage of the large quantity highly pressurized carbon dioxide.

Additionally, the methods of the present disclosure provide the following benefits:

The method may calculate the dimensions of the fracture and identify the location of the fracture from the measured magnitude of the ground uplift during fluid injection into the reservoir. If the location of the fracture or fault is known, the resulting ground uplift can also be calculated using this technique during the fluid injection process. If the permeability of the fracture or fault is known, the resulting ground uplift can be calculated using this technique.

The methods may provide an alarming system for the newly initiated fractures, as well as the reactivation of the already existing fractures and faults, by continuously monitoring the ground uplift. The initiation of new fractures and the re-activation of the already existing fractures and faults will tend to change the ground uplift pattern which will help to identify the leakage point.

The methods may identify the saturation of the leaked fluid ($CO_2$ etc.) in the overburden layers after the activation of the fracture or fault in the caprock.

The methods may identify the magnitude of the pore pressure buildup in the overburden layers after the leakage of the injected fluid from the reservoir.

The methods may relate the pore pressure buildup in the overburden layers with the dimensions of the fracture or fault after the fluid leakage to the overburden layers.

The methods may relate the pore pressure buildup in the overburden layers with the location of the fracture or fault after the fluid leakage to the overburden layers.

The methods may perform the post injection monitoring of the ground uplift and can identify any potential fluid leakage from the reservoir and provide a leakage alarm.

The methods may be used to perform post injection monitoring of the pore pressure in the overburden layers and identify any potential fluid leakage from the reservoir and provide a leakage alarm.

The alarm may be an one of an audible alarm, a visual display indicator on a monitoring computer, a flashing light, an email, a text message, an automatic telephone call, and the like.

The sedimentary reservoirs that contain water in the rock matrix provide a more secure CO2 sequestration medium. The injection of carbon dioxide causes a huge increase in the reservoir pore pressure and provokes the subsequent ground uplift. An excessive increase in pore pressure may also cause leakage of carbon dioxide into the potable water layers and to the atmosphere, thus leading to severe global climatic changes. In order to maintain the integrity of the sequestration process, it is crucial to inject a safe quantity of carbon dioxide into the sequestration site. Accordingly, the injection period and the safe values of injection parameters, like flow rate and injection pressure, need to be calculated a priori to ensure that the stored carbon dioxide will not leak into the atmosphere and jeopardize a climate mitigation strategy. To model carbon dioxide injection in reservoirs having a base fluid, such as water, one has to perform a two-phase flow modeling for both the injected and base fluids. In the present disclosure, a simulation of carbon dioxide being injected into Biyadh reservoir is performed, wherein the two-phase flow through the reservoir structure is taken into account. This investigation aims to estimate the safe parameter values for carbon dioxide injection into the Biyadh reservoir, in order to avoid leakage of carbon dioxide through the caprock. In this context, the two cases of a fractured and non-fractured caprock are considered. To ensure a safe sequestration mechanism, the coupled reservoir stability analysis is performed to estimate the safe values of the injection parameters, thus furnishing data for a reliable global climate change mitigation strategy. The obtained results demonstrated that the injection of carbon dioxide has caused a maximum pore pressure increase of 25 MPa and a ground uplift of 35 mm.

The injection of CO2 into the reservoir, during long-term subsurface containment of CO2, increases the pore pressure, as well as the adsorption induced strains. The associated decrease in permeability causes the transport of the injected CO2 to decrease to a critical value, after which it becomes impossible to transport the injected carbon dioxide to regions of the reservoir far away from the injection well, regardless of its capacity. This problem initiated the need for multiple injection wells. The present investigation considers a dual porous carbonate reservoir. A new methodology is developed for reducing the pore pressure build-up and increasing the reservoir storage capacity by varying both the number and arrangement of the carbon dioxide injection wells. An equation-based finite element method is utilized for the numerical modelling of various carbon dioxide injection scenarios for Ghawar Arab-D carbonate reservoir. The obtained results demonstrated the significance of changing the number and arrangement of the injection wells and suggested the existence of an optimum arrangement.

One of the effective global mitigation strategies is sequestration of huge quantity of carbon dioxide deep below the ground level for a long period of time. During the carbon dioxide injection process, the reservoir pressure and deformation responses will be different for different reservoir's size and boundary conditions. In this investigation, the effects of reservoir size and boundary conditions are investigated by means of geo-mechanical modeling of the deep Biyadh sandstone reservoir in Saudi Arabia. Currently carbon dioxide is not injected into the actual Biyadh reservoir. In this investigative modeling, carbon dioxide was injected for an injection period of ten years using a single injection well at the center of the reservoir. The developed modeling scheme for a single injection well has been extended further to include multiple injection wells. For multiple injection wells, the reservoir size and locations of injection wells were varied to evaluate their effect on the pore pressure buildup and ground uplift. The reservoir stability analysis was performed using Mohr-Coulomb failure criterion for both small and large reservoir models, with the same injection parameters. The simulation results demonstrated that pressure buildup and ground uplift are relatively higher for reservoirs with small sizes and closed boundaries, while in the case of large sizes and open boundaries, the pore pressure buildup and ground uplift are relatively lower. Injecting carbon dioxide with multiple injection wells will cause pore pressure buildup of huge magnitudes. Moreover, the effect of the reservoir size and boundary conditions on the reactivation of faults during carbon dioxide injection has been evaluated. The stability analysis performed in this study shows that injecting carbon dioxide into larger size reservoir is safer as compared to smaller size reservoir.

Next, details of the hardware description of the computing environment used to run the COMSOL, CMG-GEM, MATLAB programs and utilize the Barton-Bandis model to relate changes in effective stresses to caprock fracture permeability, utilize the Mohr-Coulomb criterion to predict the stability of the reservoir, utilize the Warren and Root fracture model to predict fracture reactivation and to do the calculations according to exemplary embodiments is described with reference to FIG. 50. In FIG. 50, a controller 5000 is a computing device which includes a CPU 5001 which performs the processes described above/below. The process data and instructions may be stored in memory 5002. These processes and instructions may also be stored on a storage medium disk 5004 such as a hard drive (HDD) or portable storage medium or may be stored remotely.

Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claimed advancements may be provided as a utility application, background daemon, or component of an operating system, or combination thereof, executing in conjunction with CPU 5001 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 5001 may be a Xenon or Core processor from Intel of America or an Opteron processor from AMD of America, or may be other processor types that would be recognized by one of ordinary skill in the art. Alternatively, the CPU 5001 may be implemented on an FPGA, ASIC, PLD or using discrete logic circuits, as one of ordinary skill in the art would recognize. Further, CPU 5001 may be implemented as multiple processors cooperatively working in parallel to perform the instructions of the inventive processes described above.

The computing device in FIG. 50 also includes a network controller 5006, such as an Intel Ethernet PRO network interface card from Intel Corporation of America, for interfacing with network 5060. As can be appreciated, the network 5060 can be a public network, such as the Internet, or a private network such as an LAN or WAN network, or any combination thereof and can also include PSTN or ISDN sub-networks. The network 5060 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 5008, such as a NVIDIA GeForce GTX or Quadro graphics adaptor from NVIDIA Corporation of America for interfacing with display 5010, such as a Hewlett Packard HPL2445w LCD monitor. A general purpose I/O interface 5012 interfaces with a keyboard and/or mouse 5014 as well as a touch screen panel 5016 on or separate from display 5010. General purpose I/O interface also connects to a variety of peripherals 5018 including printers and scanners, such as an OfficeJet or DeskJet from Hewlett Packard.

A sound controller 5020 is also provided in the computing device such as Sound Blaster X-Fi Titanium from Creative, to interface with speakers/microphone 5022 thereby providing sounds and/or music.

The general purpose storage controller 5024 connects the storage medium disk 5004 with communication bus 5026, which may be an ISA, EISA, VESA, PCI, or similar, for interconnecting all of the components of the computing device. A description of the general features and functionality of the display 5010, keyboard and/or mouse 5014, as well as the display controller 5008, storage controller 5024, network controller 5006, sound controller 5020, and general purpose I/O interface 5012 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 51.

Figure 51:
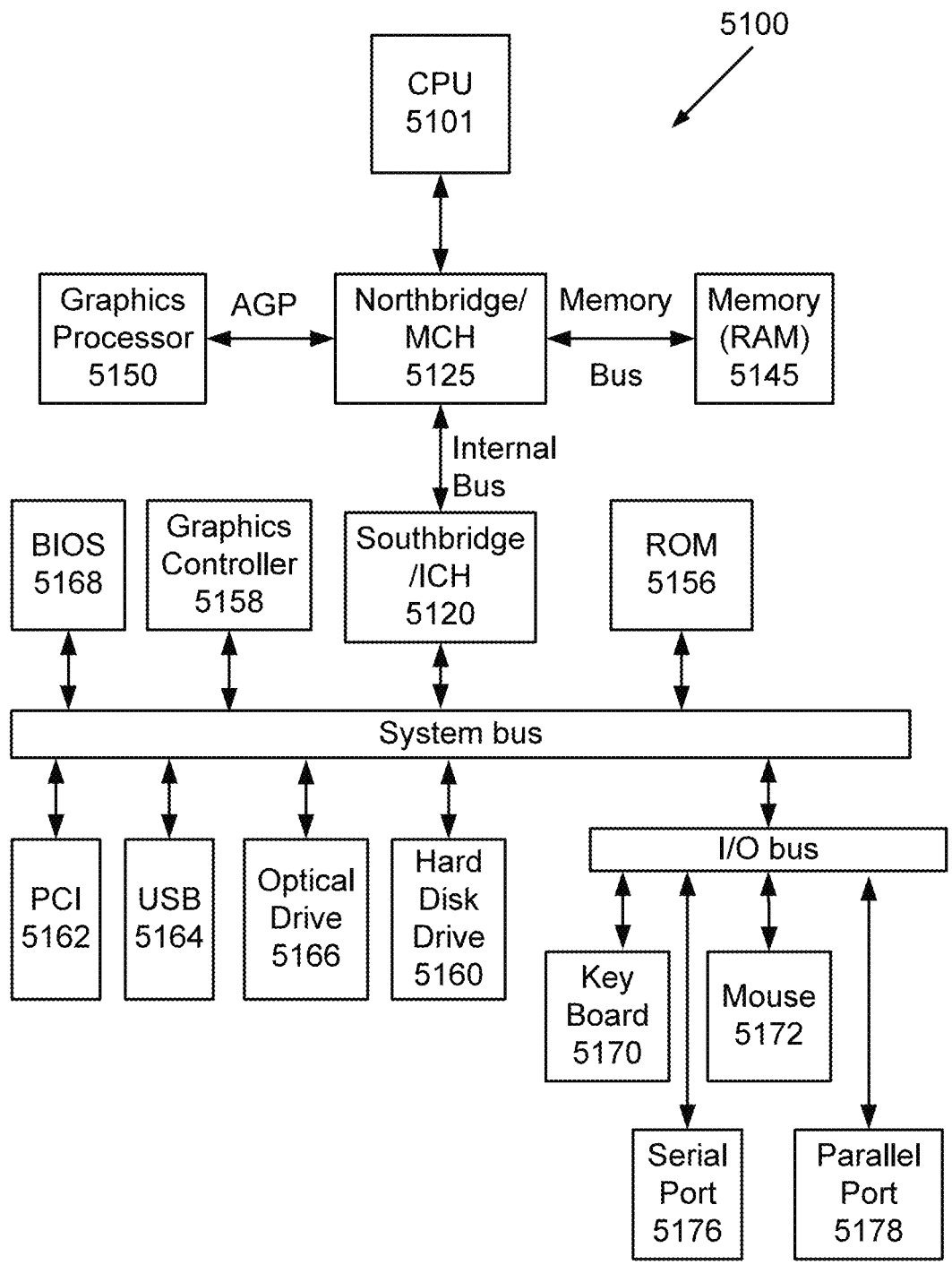
FIG. 51 is an exemplary schematic diagram of a data processing system used within the computing system, according to certain embodiments.

FIG. 51 shows a schematic diagram of a data processing system, according to certain embodiments, for performing the functions of the exemplary embodiments. The data processing system is an example of a computer in which code or instructions implementing the processes of the illustrative embodiments may be located.

In FIG. 51, data processing system 5100 employs a hub architecture including a north bridge and memory controller hub (NB/MCH) 5125 and a south bridge and input/output (I/O) controller hub (SB/ICH) 5120. The central processing unit (CPU) 5130 is connected to NB/MCH 5125. The NB/MCH 5125 also connects to the memory 5145 via a memory bus, and connects to the graphics processor 5150 via an accelerated graphics port (AGP). The NB/MCH 5125 also connects to the SB/ICH 5120 via an internal bus (e.g., a unified media interface or a direct media interface). The CPU Processing unit 5130 may contain one or more processors and even may be implemented using one or more heterogeneous processor systems.

Figure 52:
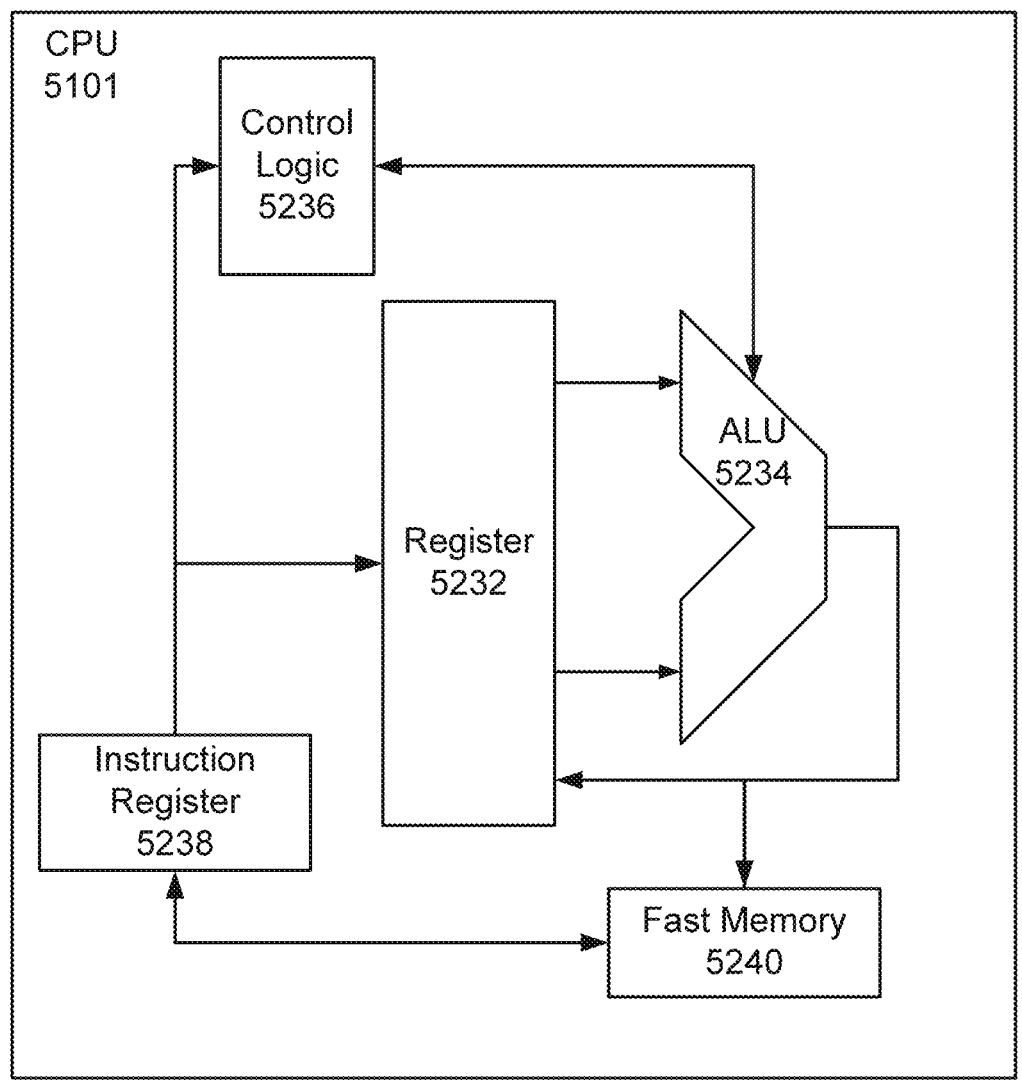
FIG. 52 is an exemplary schematic diagram of a processor used with the computing system, according to certain embodiments.

For example, FIG. 52 shows one implementation of CPU 5130. In one implementation, the instruction register 5238 retrieves instructions from the fast memory 5240. At least part of these instructions are fetched from the instruction register 5238 by the control logic 5236 and interpreted according to the instruction set architecture of the CPU 5130. Part of the instructions can also be directed to the register 5232. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 5234 that loads values from the register 5232 and performs logical and mathematical operations on the loaded values according to the instructions. The results from these operations can be feedback into the register and/or stored in the fast memory 5240. According to certain implementations, the instruction set architecture of the CPU 5130 can use a reduced instruction set architecture, a complex instruction set architecture, a vector processor architecture, a very large instruction word architecture. Furthermore, the CPU 5130 can be based on the Von Neuman model or the Harvard model. The CPU 5130 can be a digital signal processor, an FPGA, an ASIC, a PLA, a PLD, or a CPLD. Further, the CPU 5130 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 51, the data processing system 5100 can include that the SB/ICH 5120 is coupled through a system bus to an I/O Bus, a read only memory (ROM) 5156, universal serial bus (USB) port 5164, a flash binary input/output system (BIOS) 51651, and a graphics controller 51551. PCI/PCIe devices can also be coupled to SB/ICH 515151 through a PCI bus 5162.

The PCI devices may include, for example, Ethernet adapters, add-in cards, and PC cards for notebook computers. The Hard disk drive 5160 and CD-ROM 5166 can use, for example, an integrated drive electronics (IDE) or serial advanced technology attachment (SATA) interface. In one implementation the I/O bus can include a super I/O (SIO) device.

Further, the hard disk drive (HDD) 5160 and optical drive 5166 can also be coupled to the SB/ICH 5120 through a system bus. In one implementation, a keyboard 5170, a mouse 5172, a parallel port 5178, and a serial port 5176 can be connected to the system bus through the I/O bus. Other peripherals and devices that can be connected to the SB/ICH 820 using a mass storage controller such as SATA or PATA , an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 53:
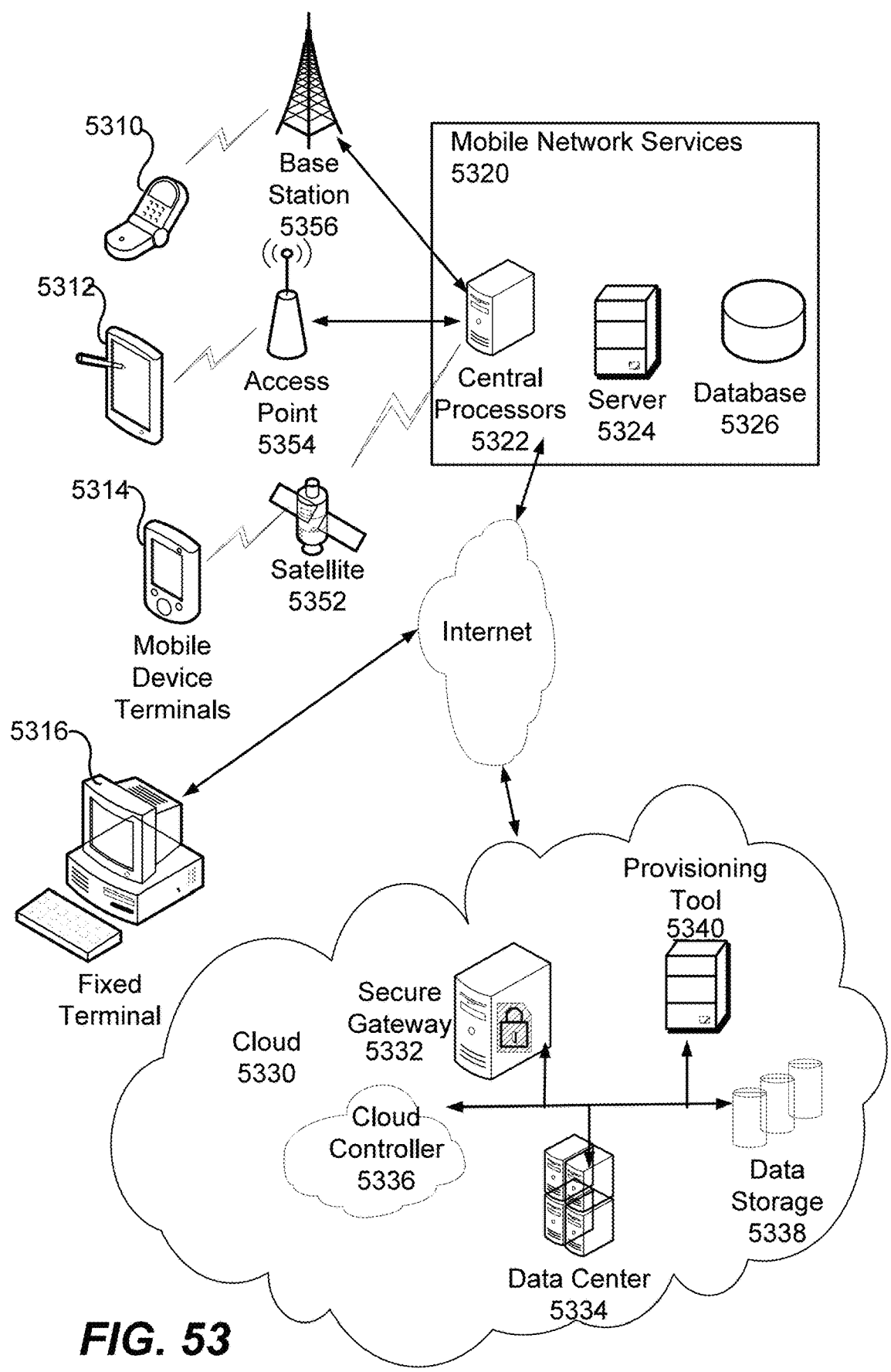
FIG. 53 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 53, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method for carbon dioxide sequestration in a geologic reservoir having a caprock and a plurality of subsurface layers between the geologic reservoir and the caprock, comprising:

constructing a reservoir model, by a computer having program instructions, a display and a reservoir database stored therein, that when executed by one or more processors of the computer, causes the one or more processors to construct the reservoir model which includes:

reservoir boundary conditions, a three dimensional size of the geologic reservoir, faults in the geologic reservoir, lithography, rock densities, porosities, and depths of the caprock and the plurality of subsurface layers;

initial values of horizontal stresses ($\sigma$), volumetric strain ($\varepsilon_v$), pore pressure of water ($P_{water}$), pore pressure of carbon dioxide ($P_{carbon\ dioxide}$), permeabilities ($k_0$), pressure wave velocities and shear wave velocities of the geologic reservoir, the caprock and the subsurface layers;

a plurality of injection wells located in an array formation in the geologic reservoir, each injection well supplying carbon dioxide at a supercritical injection pressure into at least one subsurface layer;

predicting, by the computer, changes in the porosity, the horizontal stresses, the pore pressures, the permeabilities, the pressure wave velocities and the shear wave velocities based on each supercritical_injection pressure;

calculating, by the computer, changes in a multiphase flow rate of carbon dioxide and water at each injection site at intervals over a selected period of time, wherein the period of time is selected from the range of one year to one hundred years;

updating, by the computer, each supercritical injection pressure at each interval based on the changes in the multiphase flow rate at each injection well;

wherein a flow rate of water, $Q_{water}$, at each injection site is given by:

$$Q_{water} = \frac{\partial}{\partial t}(\rho_{water}\emptyset^* S_{water}) - \nabla \cdot (\rho_{water} v_{water}),$$

where $\rho_{water}$ is a density of water, $\emptyset^*$ is an updated porosity of the reservoir, given by $\emptyset^*=(1-\varepsilon_v)$, where $\emptyset$ is an initial porosity of the reservoir, $\varepsilon_v$ is the volumetric strain in the reservoir, $S_{water}$ is a saturation of the water, $-V_{water}$ is a flow of the water per cross-sectional unit area;
wherein a flow rate of carbon dioxide, $Q_{carbon\ dioxide}$, at each injection site is given by:

$$Q_{carbon\ dioxide} = \frac{\partial}{\partial t}(\rho_{carbon\ dioxide}\emptyset^* S_{carbon\ dioxide}) - \nabla \cdot (\rho_{carbon\ dioxide} v_{carbon\ dioxide}),$$

where $\rho_{carbon\ dioxide}$ is a density of the carbon dioxide, $S_{carbon\ dioxide}$ is a saturation of the carbon dioxide, $v_{carbon\ dioxide}$ is a flow of the carbon dioxide per cross-sectional unit area;
wherein coupling between the saturation of the carbon dioxide and the saturation of water is given by:

$$S_{water}+S_{carbon\ dioxide}=1;$$

wherein coupling between the pore pressure of the carbon dioxide, $P_{carbon\ dioxide}$, and the pore pressure of water, $P_{water}$ is given by:

$$P_{carbon\ dioxide}(S_{water})=P_{carbon\ dioxide}-P_{water};$$

receiving, by the computer, a series of satellite surface images including topology images of the geologic reservoir over the period of time;
determining, by the computer, an amount of caprock uplift and a location of the caprock uplift based on changes in the topology images of the geologic reservoir at each interval of the period of time;
determining, by the computer, each volume of carbon dioxide sequestered in the geologic_reservoir at each updated supercritical injection pressure at each interval of the period of time;
correlating, by the computer, the updated supercritical injection pressure at each injection well at each interval of the period of time to the amount of caprock uplift over each injection well, and the volume of carbon dioxide sequestered in the geologic reservoir;
minimizing the caprock uplift and maximizing the volume of carbon dioxide sequestered by adjusting the number of injection wells, the array formation and the updated supercritical injection pressure at each injection well; and
rendering, on the display, a representation of the geologic reservoir displaying the number of injection wells, the array formation, the locations of caprock uplift and the updated injection pressures at each injection well which achieve the minimized caprock uplift and the maximized volume of carbon dioxide sequestered;
monitoring, by the computer, the caprock uplift over each injection well over each interval of the selected period of time;
when the caprock uplift over a particular injection well exceeds a threshold selected from the range of 0 mm to 25 mm, identifying carbon dioxide leakage from the particular injection well, and
transmitting, by the computer, an alarm to the particular injection well to lower the updated supercritical injection pressure.

2. The method of claim 1, wherein the geologic reservoir is a carbonate reservoir including porous rocks, wherein the porous rocks include at least one of grainstone, packstone, wackestone, mudstone, bafflestone, bindstone, framestone, floatstone, rudstone and shale, wherein the multiphase flow rate is lowered due to absorption of carbon dioxide into the porous rocks.

3. The method of claim 1, further comprising:
identifying, by the computer, the geologic reservoir as a sandstone reservoir including saline water;
calculating, by the computer, changes in the multiphase flow rate as the injected carbon dioxide dissolves in the saline water, wherein the changes in the multiphase flow rate result from an increased ratio of carbon dioxide to water.

4. The method of claim 1, wherein determining changes in the porosity is based on $\emptyset^*=\emptyset(1-\varepsilon_v)$, where $\emptyset$ is the porosity and $\emptyset^*$ is the changed porosity.

5. The method of claim 1, further comprising:
wherein the program instructions include a Mohr-Coulomb failure criterion; and
calculating, by the computer, the Mohr-Coulomb failure criterion to determine a stability of the geologic reservoir based on the changes in pore pressures, horizontal stresses and volumetric strains.

6. The method of claim 5, further comprising predicting safe values of the updated supercritical injection pressures based on the Mohr-Coulomb failure criterion.

7. The method of claim 1, further comprising:
wherein the program instructions include a Barton-Bandis model;
determining, by the computer, changes in the permeability of the caprock based on the Barton-Bandis model; and
identifying a fracture in the caprock based on a rise in the permeability of the caprock.

8. The method of claim 1, further comprising:
wherein the program instructions include a Warren and Root fracture model;
determining, by the computer, changes in the permeability of at least one fault based on the Warren and Root fracture model; and
identifying a reactivation of at the least one fault.

9. The method of claim 8, further comprising
calculating carbon dioxide saturation in the subsurface layers based on the changes in the permeability of the least one fault;
determining a fault location and fault dimensions of the least one fault; and
predicting the amount of caprock uplift due to the carbon dioxide saturation.

10. The method of claim 1, wherein the reservoir boundary conditions are at least one of an open boundary and a closed boundary.

11. The method of claim 1, further comprising configuring the number and array formation of the array of injection wells based on the three dimensional size of the geologic reservoir and the boundary conditions.

12. The method of claim 1, wherein the program instructions further include geo-mechanical modelling instructions; and
wherein the geo-mechanical modelling incorporates the initial values of geologic reservoir density, pressure wave velocity and shear wave velocity to calculate changes in the modulus of elasticity, the shear modulus, and a bulk modulus due to the changes in the supercritical injection pressures.

13. The method of claim 1, further comprising
performing post injection monitoring after the period of time, of the pore pressure in the subsurface layers;
identifying carbon dioxide leakage from the geologic reservoir based on decreased levels of the pore pressures; and
displaying, on the display, a leakage alert.

14. The method of claim 1, further comprising:
adjusting, by the computer, the array of injection wells to minimize the caprock uplift and maximize the volume of carbon dioxide sequestered by transmitting a command to each injection well in the array of injection wells to perform one of:
starting to inject carbon dioxide at the supercritical injection pressure,
continuing to inject carbon dioxide at the supercritical injection pressure,
ceasing the injection of carbon dioxide, and
changing the supercritical injection pressure to a commanded supercritical injection pressure.

15. An alarming system for leakage in a geologic reservoir sequestering carbon dioxide, the geologic reservoir having a caprock and a plurality of subsurface layers between the geologic reservoir and the caprock, comprising:
a satellite surface imaging database including a series of topology images of the geologic reservoir taken over a selected period of time, wherein the period of time is selected from the range of one year to one hundred years;
a memory storing the satellite surface imaging database, a reservoir database and program instructions;
a computer comprising a processor with circuitry configured to cause the one or more processors to perform the program instructions to construct a reservoir model which includes:
reservoir boundary conditions, a three dimensional size of the geologic reservoir, faults in the geologic reservoir, lithography, rock densities, porosities, and depths of the caprock and the plurality of subsurface layers;
initial values of horizontal stresses ($\sigma$), volumetric strain, ($\varepsilon_v$), pore pressure of water ($P_{water}$), pore pressure of carbon dioxide ($P_{carbon\ dioxide}$), permeabilities, pressure wave velocities and shear wave velocities of the geologic reservoir, the caprock and the subsurface layers;
a plurality of injection wells located in an array formation in the geologic reservoir, each injection well supplying carbon dioxide at a supercritical injection pressure into at least one subsurface layer;
wherein the computer is further configured to:
predict changes in the porosity, the horizontal stresses, the pore pressures, the permeabilities, the pressure wave velocities and the shear wave velocities of the geologic reservoir, the caprock and the subsurface layers, based on each supercritical injection pressure;
calculate changes in a multiphase flow rate of carbon dioxide and water at each injection site at intervals over the selected period of time;
update each supercritical injection pressure at each interval based on the changes in the multiphase flow rate at each injection well;
wherein a flow rate of water, $Q_{water}$, at each injection site is given by:

$$Q_{water} = \frac{\partial}{\partial t}(\rho_{water}\emptyset^* S_{water}) - \nabla \cdot (\rho_{water} v_{water}),$$

where $\rho_{water}$ is a density of water, $\emptyset^*$ is an updated porosity of the reservoir, given by $\emptyset^* = \emptyset(1-\varepsilon_v)$, where $\emptyset$ is an initial porosity of the reservoir, $\varepsilon_v$ is the volumetric strain in the reservoir, $S_{water}$ is a saturation of the water, $v_{water}$ is a flow of the water per cross-sectional unit area;
wherein a flow rate of carbon dioxide, $Q_{carbon\ dioxide}$, at each injection site is given by:

$$Q_{carbon\ dioxide} = \frac{\partial}{\partial t}(\rho_{carbon\ dioxide}\emptyset^* S_{carbon\ dioxide}) - \nabla \cdot (\rho_{carbon\ dioxide} v_{carbon\ dioxide}),$$

where $\rho_{carbon\ dioxide}$ is a density of the carbon dioxide, $S_{carbon\ dioxide}$ is a saturation of the carbon dioxide, $v_{carbon\ dioxide}$ is a flow of the carbon dioxide per cross-sectional unit area;
wherein coupling between the saturation of the carbon dioxide and the saturation of water is given by:

$$S_{water} + S_{carbon\ dioxide} = 1;$$

wherein coupling between the pore pressure of the carbon dioxide, $P_{carbon\ dioxide}$, and the pore pressure of water, $P_{water}$, is given by:

$$P_{carbon\ dioxide}(S_{water}) = P_{carbon\ dioxide} - P_{water};$$

determine undetermine an amount of caprock uplift and a location of the caprock uplift at each injection well based on comparing changes in the topology images of the geologic reservoir at each interval of the selected period of time;
compare the amount caprock uplift at each injection well at each interval to a threshold;
identify carbon dioxide leakage from a particular injection well when the caprock uplift over the particular injection well exceeds a threshold selected from the range of 0 mm to 25 mm;
a display operatively connected to the computer;
wherein the computer is further configured to:
render, on the display, a representation of the geologic reservoir displaying the plurality of injection wells, the array formation, the locations of caprock uplift and the updated supercritical injection pressure at each injection well;
display an alert on the display when the caprock uplift at the particular injection well exceeds the threshold; and
transmit an alarm to the particular injection well to lower the updated supercritical injection pressure.

16. The alarming system of claim 15, wherein the computer is further configured to:
determine a volume of carbon dioxide sequestered in the geologic reservoir at each updated supercritical injection pressure at each interval of the selected period of time;
correlate the updated supercritical injection pressure at each injection well at each interval of the period of time to the amount of caprock uplift and the volume of carbon dioxide sequestered in the geologic reservoir;
adjust the number of injection wells, the array formation and the updated supercritical injection pressure at each injection well to minimize the caprock uplift and maximize the volume of carbon dioxide sequestered in the geologic reservoir.

17. The alarming system of claim 16, wherein the computer is further configured to:
respond to the alarm by adjusting the number of injection wells, the array formation and the supercritical injection pressure at each injection well to minimize the caprock uplift and maximize the volume of carbon dioxide sequestered; and
transmit a command to each injection well in the array of injection wells to perform one of:
start injecting carbon dioxide at the supercritical injection pressure,
continue to inject carbon dioxide at the supercritical injection pressure,
cease the injection of carbon dioxide, and
change the supercritical injection pressure to a commanded supercritical injection pressure.

18. A non-transitory computer readable medium having instructions stored therein that, when executed by one or more processors, cause the one or more processors to perform a method for monitoring the sequestration of carbon dioxide in a geologic reservoir having a caprock and a plurality of subsurface layers between the geologic reservoir and the caprock, comprising:
constructing a reservoir model, from a reservoir database stored in the non-transitory computer readable medium, which includes:
reservoir boundary conditions, a three dimensional size of the geologic reservoir, faults in the geologic reservoir, lithography, rock densities, porosities, and depths of the caprock and the plurality of subsurface layers;
initial values of horizontal stresses ($\sigma$), volumetric strain ($\varepsilon_{84}$), pore pressures of water ($P_{water}$), pore pressures of carbon dioxide ($P_{carbon\ dioxide}$), permeabilities ($k_0$), pressure wave velocities and shear wave velocities of the geologic reservoir, the caprock and the subsurface layers;
a plurality of injection wells located in an array formation in the geologic reservoir, each injection well supplying carbon dioxide at a supercritical injection pressure into at least one subsurface layer;
predicting, by the computer, changes in the porosity, the horizontal stresses, the pore pressures, the permeabilities, the pressure wave velocities and the shear wave velocities based on each supercritical injection pressure;
calculating, by the computer, changes in a multiphase flow rate of carbon dioxide and water at each injection site at intervals over a selected period of time, wherein the period of time is selected from the range of one year to one hundred years;
updating, by the computer, each supercritical injection pressure at each interval based on the changes in the multiphase flow rate at each injection well;
wherein a flow rate of water, $Q_{water}$, at each injection site is given by:

$$Q_{water} = \frac{\partial}{\partial t}(\rho_{water}\emptyset^* S_{water}) - \nabla \cdot (\rho_{water} v_{water}),$$

where $\rho_{water}$ is a density of water, $\emptyset^*$ is an updated porosity of the reservoir, given by $\emptyset^* = \emptyset(1-\varepsilon_v)$, where $\emptyset$ is an initial porosity of the reservoir, $\varepsilon_v$ is the volumetric strain in the reservoir, $S_{water}$ is a saturation of the water, $v_{water}$ a flow of the water per cross-sectional is unit area;
wherein a flow rate of carbon dioxide, $Q_{carbon\ dioxide}$, at each injection site is given by:

$$Q_{carbon\ dioxide} = \frac{\partial}{\partial t}(\rho_{carbon\ dioxide}\emptyset^* S_{carbon\ dioxide}) - \nabla \cdot (\rho_{carbon\ dioxide} v_{carbon\ dioxide}),$$

where $\rho_{carbon\ dioxide}$ is a density of the carbon dioxide, $S_{carbon\ dioxide}$ is a saturation of the carbon dioxide, $v_{carbon\ dioxide}$ is a flow of the carbon dioxide per cross-sectional unit area;
wherein coupling between the saturation of the carbon dioxide and the saturation of water is given by:

$$S_{water} + S_{carbon\ dioxide} = 1;$$

wherein coupling between the pore pressure of the carbon dioxide, $P_{carbon\ dioxide}$, and the pore pressure of water, $P_{water}$ is given by:

$$P_{carbon\ dioxide}(S_{water}) = P_{carbon\ dioxide} - P_{water};$$

receiving, by the computer, a series of satellite surface images including topology images of the geologic reservoir over the period of time;
determining an amount of caprock uplift and a location of the caprock uplift based on changes in the topology images of the geologic reservoir at each interval of the period of time;
determining each volume of carbon dioxide sequestered in the geologic reservoir at each updated supercritical injection pressure at each interval of the period of time;
correlating the updated supercritical injection pressure at each injection well at each interval of the period of time to the amount of caprock uplift over each injection well, and the volume of carbon dioxide sequestered in the geologic reservoir;
minimizing the caprock uplift and maximizing the volume of carbon dioxide sequestered by adjusting the number of injection wells, the array formation and the updated supercritical injection pressure at each injection well; and
rendering on the display, a representation of the geologic reservoir displaying the number of injection wells, the array formation, the locations of caprock uplift and the updated injection pressures at each injection well which achieve the minimized caprock uplift and the maximized volume of carbon dioxide sequestered;
monitoring the caprock uplift over each injection well over each interval of the selected period of time;
when the caprock uplift over a particular injection well exceeds a threshold selected from the range of 0 mm to 25 mm, identifying carbon dioxide leakage from the particular injection well, and
transmitting an alarm to the particular injection well to lower the updated supercritical injection pressure.

19. The non-transitory computer readable medium method of claim 18,
wherein the program instructions include a Mohr-Coulomb failure criterion; and
calculating, by the computer, the Mohr-Coulomb failure criterion representing a stability of the geologic reservoir based on the changes in pore pressures, horizontal stresses and volumetric strains.

20. The non-transitory computer readable medium method of claim 18, further comprising:
- adjusting the array of injection wells to minimize the caprock uplift and maximize the volume of carbon dioxide sequestered by transmitting a command to each injection well in the array of injection wells to perform one of:
- starting to inject carbon dioxide at the supercritical injection pressure,
- continuing to inject carbon dioxide at the supercritical injection pressure,
- ceasing the injection of carbon dioxide, and
- changing the supercritical injection pressure to a commanded supercritical injection pressure.

* * * * *